US009043513B2

(12) United States Patent
Perego et al.

(10) Patent No.: US 9,043,513 B2
(45) Date of Patent: May 26, 2015

(54) METHODS AND SYSTEMS FOR MAPPING A PERIPHERAL FUNCTION ONTO A LEGACY MEMORY INTERFACE

(71) Applicant: Rambus Inc., Sunnyvale, CA (US)

(72) Inventors: Richard E. Perego, Thornton, CO (US);
Pradeep Batra, Santa Clara, CA (US);
Steven Woo, Saratoga, CA (US);
Lawrence Lai, San Jose, CA (US);
Chi-Ming Yeung, Cupertino, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/574,156

(22) Filed: Dec. 17, 2014

(65) Prior Publication Data
US 2015/0106560 A1 Apr. 16, 2015

Related U.S. Application Data

(63) Continuation of application No. 14/064,167, filed on Oct. 27, 2013, which is a continuation-in-part of application No. PCT/US2012/052000, filed on Aug. 23, 2012, and a continuation-in-part of application No.

(Continued)

(51) Int. Cl.
*G06F 9/26* (2006.01)
*G06F 12/02* (2006.01)
(Continued)

(52) U.S. Cl.
CPC .... *G06F 12/0246* (2013.01); *G06F 2212/2022* (2013.01); *G06F 2212/251* (2013.01);
(Continued)

(58) Field of Classification Search
CPC . G06F 12/10; G06F 2212/7201; G06F 12/00; G06F 13/4239
USPC ................... 711/103, 202; 710/3, 4
See application file for complete search history.

(56) References Cited

U.S. PATENT DOCUMENTS 5,237,673 A    8/1993   Orbits et al.
5,269,013 A    12/1993  Abramson et al.
(Continued)

FOREIGN PATENT DOCUMENTS

EP    0492938 B1    11/1995
EP    0664030 B1    5/1999
(Continued)

OTHER PUBLICATIONS

Advanced Micro Devices, "Programming Guide: AMD Accelerated Parallel Processing, Open CL," rev1.3c, Jun. 2011. 210 pages (sent in 3 parts).

(Continued)

*Primary Examiner* — Ernest Unelus
(74) *Attorney, Agent, or Firm* — The Neudeck Law Firm, LLC

(57) ABSTRACT

A memory system includes a CPU that communicates commands and addresses to a main-memory module. The module includes a buffer circuit that relays commands and data between the CPU and the main memory. The memory module additionally includes an embedded processor that shares access to main memory in support of peripheral functionality, such as graphics processing, for improved overall system performance. The buffer circuit facilitates the communication of instructions and data between CPU and the peripheral processor in a manner that minimizes or eliminates the need to modify CPU, and consequently reduces practical barriers to the adoption of main-memory modules with integrated processing power.

17 Claims, 53 Drawing Sheets

Related U.S. Application Data

PCT/US2012/052043, filed on Aug. 23, 2012, and a continuation-in-part of application No. PCT/US2012/052052, filed on Aug. 23, 2012, and a continuation-in-part of application No. PCT/US2012/052059, filed on Aug. 23, 2012.

(60) Provisional application No. 61/526,953, filed on Aug. 24, 2011, provisional application No. 61/647,986, filed on May 16, 2012, provisional application No. 61/670,874, filed on Jul. 12, 2012, provisional application No. 61/691,134, filed on Aug. 20, 2012.

(51) Int. Cl.
  *G06F 12/10* (2006.01)
  *G06F 13/42* (2006.01)
  *G06F 12/00* (2006.01)

(52) U.S. Cl.
  CPC ............ *G06F13/4239* (2013.01); *G06F 12/00* (2013.01); *G06F 2212/7201* (2013.01); *G06F 12/10* (2013.01)

(56) References Cited

U.S. PATENT DOCUMENTS

| | | |
|---|---|---|
| 6,286,092 B1 | 9/2001 | Frank et al. |
| 6,542,971 B1 | 4/2003 | Reed |
| 6,864,896 B2 | 3/2005 | Perego |
| 6,970,891 B1 | 11/2005 | Deo et al. |
| 7,024,518 B2 | 4/2006 | Halbert et al. |
| 7,032,158 B2 | 4/2006 | Alvarez, II et al. |
| 7,107,412 B2 | 9/2006 | Klein et al. |
| 7,162,627 B2 | 1/2007 | Chen |
| 7,171,494 B2 | 1/2007 | Karamanolis et al. |
| 7,287,103 B2 | 10/2007 | Ganfield et al. |
| 7,383,416 B2 | 6/2008 | Oeschay et al. |
| 7,424,552 B2 | 9/2008 | Burton |
| 7,480,830 B2 | 1/2009 | Cowell et al. |
| 7,490,211 B2 | 2/2009 | Schnepper |
| 7,506,110 B2 | 3/2009 | Neils et al. |
| 7,525,547 B1 | 4/2009 | Diard |
| 7,526,634 B1 | 4/2009 | Duluk, Jr. et al. |
| 7,539,812 B2 | 5/2009 | Tetrick |
| 7,623,134 B1 | 11/2009 | Danilak |
| 7,633,505 B1 | 12/2009 | Kelleher |
| 7,680,968 B2 | 3/2010 | Burton |
| 7,689,734 B2 | 3/2010 | Bellows |
| 7,694,093 B2 | 4/2010 | Shaw et al. |
| 7,716,411 B2 * | 5/2010 | Panabaker et al. ............ 711/101 |
| 7,796,414 B2 | 9/2010 | Hofstra |
| 7,870,323 B2 | 1/2011 | Matsumoto et al. |
| 7,941,591 B2 | 5/2011 | Aviles |
| 7,970,956 B2 | 6/2011 | Asaro et al. |
| 7,996,602 B1 | 8/2011 | Warnes et al. |
| 8,006,057 B2 | 8/2011 | LaBerge |
| 8,054,676 B2 | 11/2011 | Tanguay et al. |
| 8,131,913 B2 | 3/2012 | Pyeon |
| 8,364,867 B2 | 1/2013 | Karamcheti et al. |
| 2002/0059492 A1 | 5/2002 | Sabotta et al. |
| 2003/0154370 A1 | 8/2003 | Lai et al. |
| 2004/0049624 A1 | 3/2004 | Salmonsen |
| 2004/0230718 A1 | 11/2004 | Polzin et al. |
| 2004/0260864 A1 | 12/2004 | Lee et al. |
| 2005/0223303 A1 | 10/2005 | Zimmerman et al. |
| 2006/0200723 A1 | 9/2006 | Carnevale et al. |
| 2006/0248253 A1 | 11/2006 | Wang |
| 2006/0267990 A1 | 11/2006 | Rogers et al. |
| 2007/0064500 A1 | 3/2007 | Harmsze et al. |
| 2007/0079049 A1 | 4/2007 | LaBerge |
| 2007/0121389 A1 | 5/2007 | Wu et al. |
| 2007/0132770 A1 | 6/2007 | Stefanidis et al. |
| 2007/0195613 A1 | 8/2007 | Rajan et al. |
| 2007/0283337 A1 | 12/2007 | Kasahara et al. |
| 2007/0283358 A1 | 12/2007 | Kasahara et al. |
| 2008/0077740 A1 | 3/2008 | Clark et al. |
| 2008/0082488 A1 | 4/2008 | Terrell |
| 2008/0109592 A1 * | 5/2008 | Karamcheti et al. .......... 711/103 |
| 2008/0126690 A1 | 5/2008 | Rajan et al. |
| 2008/0155187 A1 | 6/2008 | Skerlj |
| 2008/0256416 A1 | 10/2008 | Ozawa |
| 2009/0037657 A1 | 2/2009 | Bresniker |
| 2009/0157989 A1 | 6/2009 | Karamcheti et al. |
| 2009/0248957 A1 * | 10/2009 | Tzeng ........................... 711/103 |
| 2009/0248958 A1 * | 10/2009 | Tzeng ........................... 711/103 |
| 2009/0248959 A1 * | 10/2009 | Tzeng ........................... 711/103 |
| 2009/0249015 A1 * | 10/2009 | Tzeng ........................... 711/165 |
| 2009/0276559 A1 | 11/2009 | Allen, Jr. et al. |
| 2009/0319719 A1 | 12/2009 | Perego et al. |
| 2009/0327596 A1 | 12/2009 | Christenson et al. |
| 2010/0017650 A1 | 1/2010 | Chin et al. |
| 2010/0211728 A1 | 8/2010 | Naujokat |
| 2010/0217924 A1 | 8/2010 | Panabaker et al. |
| 2010/0293420 A1 * | 11/2010 | Kapil et al. ................... 714/710 |
| 2011/0023040 A1 | 1/2011 | Hendry et al. |
| 2011/0035539 A1 | 2/2011 | Honda |
| 2011/0035575 A1 | 2/2011 | Kwon |
| 2011/0082971 A1 | 4/2011 | Berke |
| 2011/0099244 A1 | 4/2011 | Yang et al. |
| 2011/0145493 A1 | 6/2011 | Ahn et al. |
| 2011/0153916 A1 | 6/2011 | Chinnaswamy et al. |
| 2011/0153925 A1 | 6/2011 | Bains et al. |
| 2011/0239043 A1 | 9/2011 | Vedder et al. |
| 2012/0102292 A1 | 4/2012 | Rajan et al. |
| 2012/0204079 A1 | 8/2012 | Takefman et al. |
| 2013/0042056 A1 | 2/2013 | Shats et al. |
| 2013/0086309 A1 * | 4/2013 | Lee et al. ...................... 711/103 |
| 2013/0117503 A1 | 5/2013 | Nellans et al. |
| 2014/0223262 A1 | 8/2014 | Takefman et al. |

FOREIGN PATENT DOCUMENTS

| | | |
|---|---|---|
| EP | 1652058 | 5/2011 |
| WO | WO-2004-092904 A2 | 10/2004 |
| WO | WO-2006-122932 | 11/2006 |

OTHER PUBLICATIONS

International Search Report and Written Opinion dated Dec. 20, 2012 in International Application No. PCT/US2012/052043. 11 pages.
International Search Report and Written Opinion dated Dec. 26, 2012 in International Application No. PCT/US2012/052000. 11 pages.
International Search Report and Written Opinion dated Dec. 27, 2012 in International Application No. PCT/US2012/052059. 12 pages.
International Search Report and Written Opinion dated Jan. 2, 2013 in International Application No. PCT/US2012/052052. 8 pages.
PCI-SIG Engineering Change Notice, "Resizable BAR Capability," Jan. 22, 2008, Updated and Approved by PWG Apr. 24, 2008, PCI Express Base Specification version 2.0. 9 pages.
Stich, Timo, "GPU Computing on Clusters," Nvidia, Slide Show Presentation, GPU Technology Summit Israel, May 30, 2011. 28 pages.
Stuart et al., "Multi-Gpu MapReduce on Gpu Clusters," 2011 IEEE International Parallel & Distributed Processing Symposium, pp. 1068-1079, Oct. 11, 2009. 12 pages.
Wikipedia entry for "Serial Presence Detect" downloaded Jun. 6, 2012 from http://en.wikipedia.org/wiki/Serial_presence_detect. 20 pages.
Wikipedia entry for "Video BIOS" downloaded Jun. 6, 2012 from http://en.wikipedia.org/wiki/Video_BIOS. 1 page.

* cited by examiner

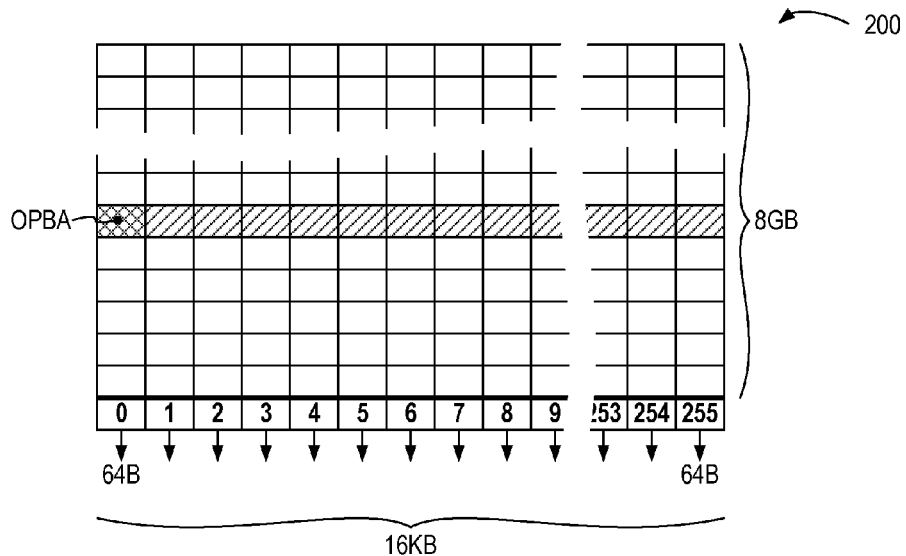
Fig. 2
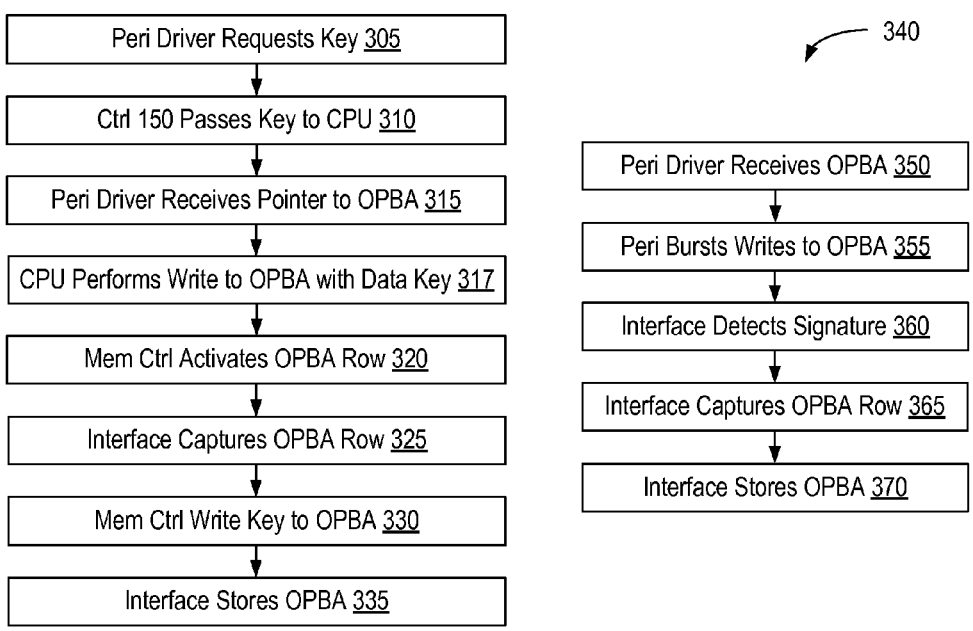
Fig. 3A
Fig. 3B

| Column Add | Protocol Field | QWORD Index | Data Bit Field ||||||
|---|---|---|---|---|---|---|---|---|
| | | | [63:20] | [19:17] | [16] | [15:8] | [7:0] ||
| 0 | Instruction | 0 | Reserved | PSB[2:0] | M[0] | BL[7:0] | OP[7:0] |
| | Address | 1 | ADDR[63:0] |||||
| | Write Data | 2 | WD[63:0] |||||
| | Write Mask | 3 | WM[63:0] |||||
| | Reserved | 4 | Reserved |||||
| | | 5 | |||||
| | | 6 | |||||
| | | 7 | |||||
| 1 | Write Data Line 0 | 0 | WD0[511:0] |||||
| | | 1 | |||||
| | | 2 | |||||
| | | 3 | |||||
| | | 4 | |||||
| | | 5 | |||||
| | | 6 | |||||
| | | 7 | |||||
| ... | | | | | | | |
| 255 | Write Data Line 254 | 0 | WD254[511:0] |||||
| | | 1 | |||||
| | | 2 | |||||
| | | 3 | |||||
| | | 4 | |||||
| | | 5 | |||||
| | | 6 | |||||
| | | 7 | |||||

| Column Add | Protocol Field | QWORD Index | Data Bit Field [63:0] |
|---|---|---|---|
| 0 | Read Data Line 0 | 0<br>1<br>2<br>3<br>4<br>5<br>6<br>7 | RD0[511:0] |
| 1 | Read Data Line 1 | 0<br>1<br>2<br>3<br>4<br>5<br>6<br>7 | RD1[511:0] |
| ⋮ | ⋮ | ⋮ | ⋮ |
| 255 | Read Data Line 255 | 0<br>1<br>2<br>3<br>4<br>5<br>6<br>7 | RD255[511:0] |

Fig. 6

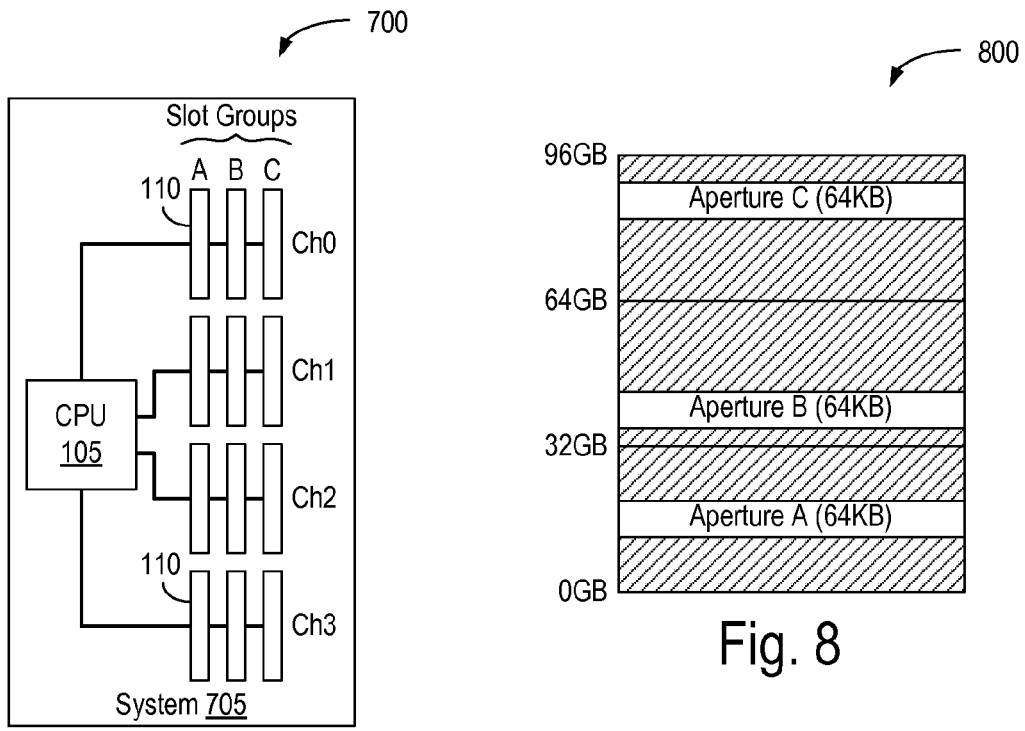
Fig. 7
Fig. 8
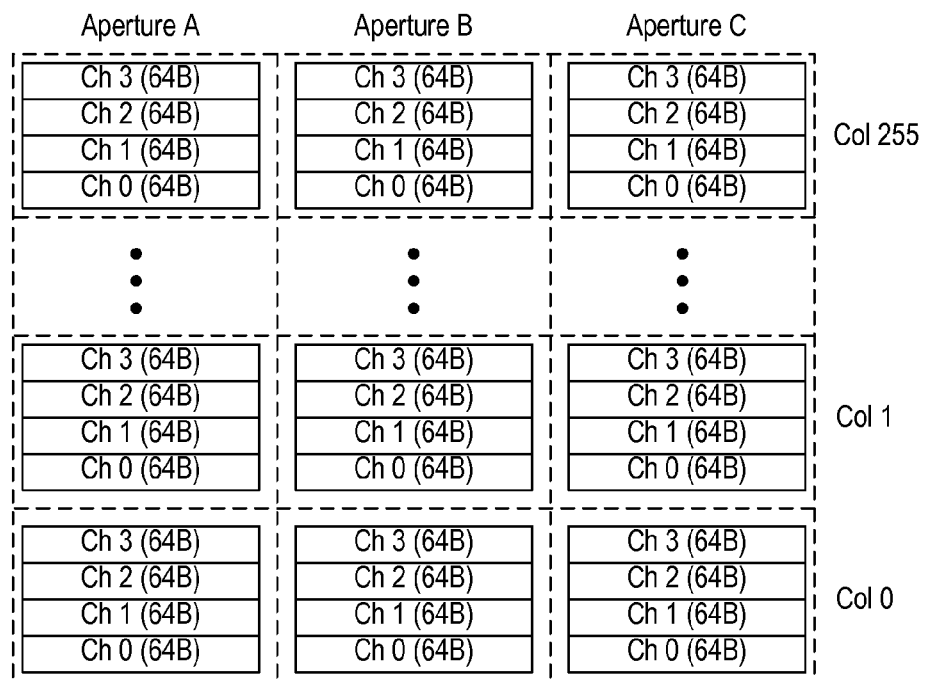
Fig. 9

1000

| Chan | Col Add | Protocol Field | QWORD Index | Data Bit Field ||||
|---|---|---|---|---|---|---|---|
| | | | | [63:20] | [19:17] | [16] | [15:8] [7:0] |
| 0 | 0 | Instruction | 0 | Reserved | PSB[2:0] | [M] | BL[7:0] OP[7:0] |
| | | Address | 1 | ADDR[63:0] ||||
| | | Write Data | 2 | WD[63:0] ||||
| | | Write Mask | 3 | WM[63:0] ||||
| | | Reserved | 7:4 | Reserved ||||
| 1 | 0 | Instruction | 0 | Reserved | PSB[2:0] | [M] | BL[7:0] OP[7:0] |
| | | Address | 1 | ADDR[63:0] ||||
| | | Write Data | 2 | WD[63:0] ||||
| | | Write Mask | 3 | WM[63:0] ||||
| | | Reserved | 7:4 | Reserved ||||
| 2 | 0 | Instruction | 0 | Reserved | PSB[2:0] | [M] | BL[7:0] OP[7:0] |
| | | Address | 1 | ADDR[63:0] ||||
| | | Write Data | 2 | WD[63:0] ||||
| | | Write Mask | 3 | WM[63:0] ||||
| | | Reserved | 7:4 | Reserved ||||
| 3 | 0 | Instruction | 0 | Reserved | PSB[2:0] | [M] | BL[7:0] OP[7:0] |
| | | Address | 1 | ADDR[63:0] ||||
| | | Write Data | 2 | WD[63:0] ||||
| | | Write Mask | 3 | WM[63:0] ||||
| | | Reserved | 7:4 | Reserved ||||
| 0 | 1 | WD L0-Ch0 | 7:0 | WD0C0[511:0] ||||
| 1 | | WD L0-Ch1 | 7:0 | WD0C1[511:0] ||||
| 2 | | WD L0-Ch2 | 7:0 | WD0C2[511:0] ||||
| 3 | | WD L0-Ch3 | 7:0 | WD0C3[511:0] ||||
| 0 | 255 | WD L254-Ch0 | 7:0 | WD254C0[511:0] ||||
| 1 | | WD L254-Ch1 | 7:0 | WD254C1[511:0] ||||
| 2 | | WD L254-Ch2 | 7:0 | WD254C2[511:0] ||||
| 3 | | WD L254-Ch3 | 7:0 | WD254C3[511:0] ||||

Fig. 10

| Col Add | Protocol Field | Byte Index | Data Bit Field ||||||||
|---|---|---|---|---|---|---|---|---|---|---|
| | | | [63:56] D7 | [55:48] D6 | [47:40] D5 | [39:32] D4 | [31:24] D3 | [23:16] D2 | [15:8] D1 | [7:0] D0 |
| 0 | Opcode | 0 | OP7[7:0] | OP6[7:0] | OP5[7:0] | OP4[7:0] | OP3[7:0] | OP2[7:0] | OP1[7:0] | OP0[7:0] |
| | Burst Length | 1 | BL7[7:0] | BL6[7:0] | BL5[7:0] | BL4[7:0] | BL3[7:0] | BL2[7:0] | BL1[7:0] | BL0[7:0] |
| | Masked WR | 2 | M7 | M6 | M5 | M4 | M3 | M2 | M1 | M0 |
| | Reserved | 7:3 | Reserved | Reserved | Reserved | Reserved | Reserved | Reserved | Reserved | Reserved |
| 1 | Address | 7:0 | A7[63:0] | A6[63:0] | A5[63:0] | A4[63:0] | A3[63:0] | A2[63:0] | A1[63:0] | A0[63:0] |
| 2 | WR Data | 7:0 | WD7[63:0] | WD6[63:0] | WD5[63:0] | WD4[63:0] | WD3[63:0] | WD2[63:0] | WD1[63:0] | WD0[63:0] |
| 3 | WR Mask | 7:0 | WM7[63:0] | WM6[63:0] | WM5[63:0] | WM4[63:0] | WM3[63:0] | WM2[63:0] | WM1[63:0] | WM0[63:0] |
| 4 | WR Data QW0 | 7:0 | WD70[63:0] | WD60[63:0] | WD50[63:0] | WD40[63:0] | WD30[63:0] | WD20[63:0] | WD10[63:0] | WD00[63:0] |

...

| 255 | WR Data QW251 | 7:0 | WD7251[63:0] | WD6251[63:0] | WD5251[63:0] | WD4251[63:0] | WD3251[63:0] | WD2251[63:0] | WD1251[63:0] | WD0251[63:0] |

| Col Add | Protocol Field | Word Index | Data Bit Field | | | | | | | | |
|---|---|---|---|---|---|---|---|---|---|---|---|
| | | | [63:48] D3 | | [47:32] D2 | | [31:16] D1 | | [15:0] D0 | | |
| | | | OP3[7:0] | BL3[7:0] | OP2[7:0] | BL2[7:0] | OP1[7:0] | BL1[7:0] | OP0[7:0] | BL0[7:0] | |
| 0 | Opcode/BL | 0 | OP3[7:0] | BL3[7:0] | OP2[7:0] | BL2[7:0] | OP1[7:0] | BL1[7:0] | OP0[7:0] | BL0[7:0] |
| | Mask/Reserved | 1 | M3 | Reserved | M2 | Reserved | M1 | Reserved | M0 | Reserved |
| | Reserved | 2:3 | Reserved | | | | | | | |
| 1 | Address | 3:0 | A3[63:0] (16x4) | | A2[63:0] | | A1[63:0] | | A0[63:0] | |
| 2 | WR Data | 3:0 | WD3[63:0] | | WD2[63:0] | | WD1[63:0] | | WD0[63:0] | |
| 3 | WR Mask | 3:0 | WM3[63:0] | | WM2[63:0] | | WM1[63:0] | | WM0[63:0] | |
| 4 | WR Data QW0 | 3:0 | WD30[63:0] | | WD20[63:0] | | WD10[63:0] | | WD00[63:0] | |

| 255 | WR Data QW251 | 7:0 | WD3251[63:0] | WD2251[63:0] | WD1251[63:0] | WD0251[63:0] |

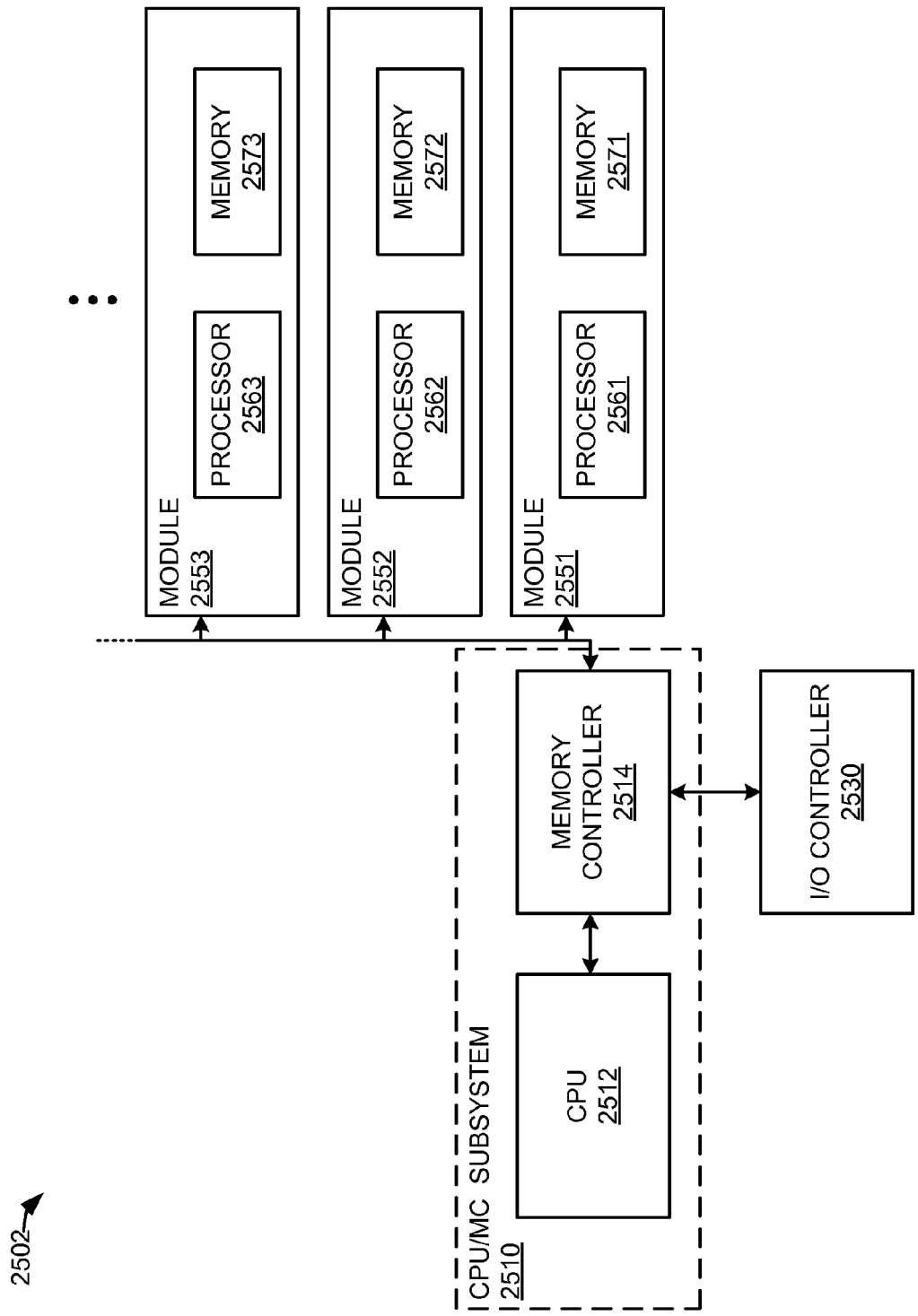

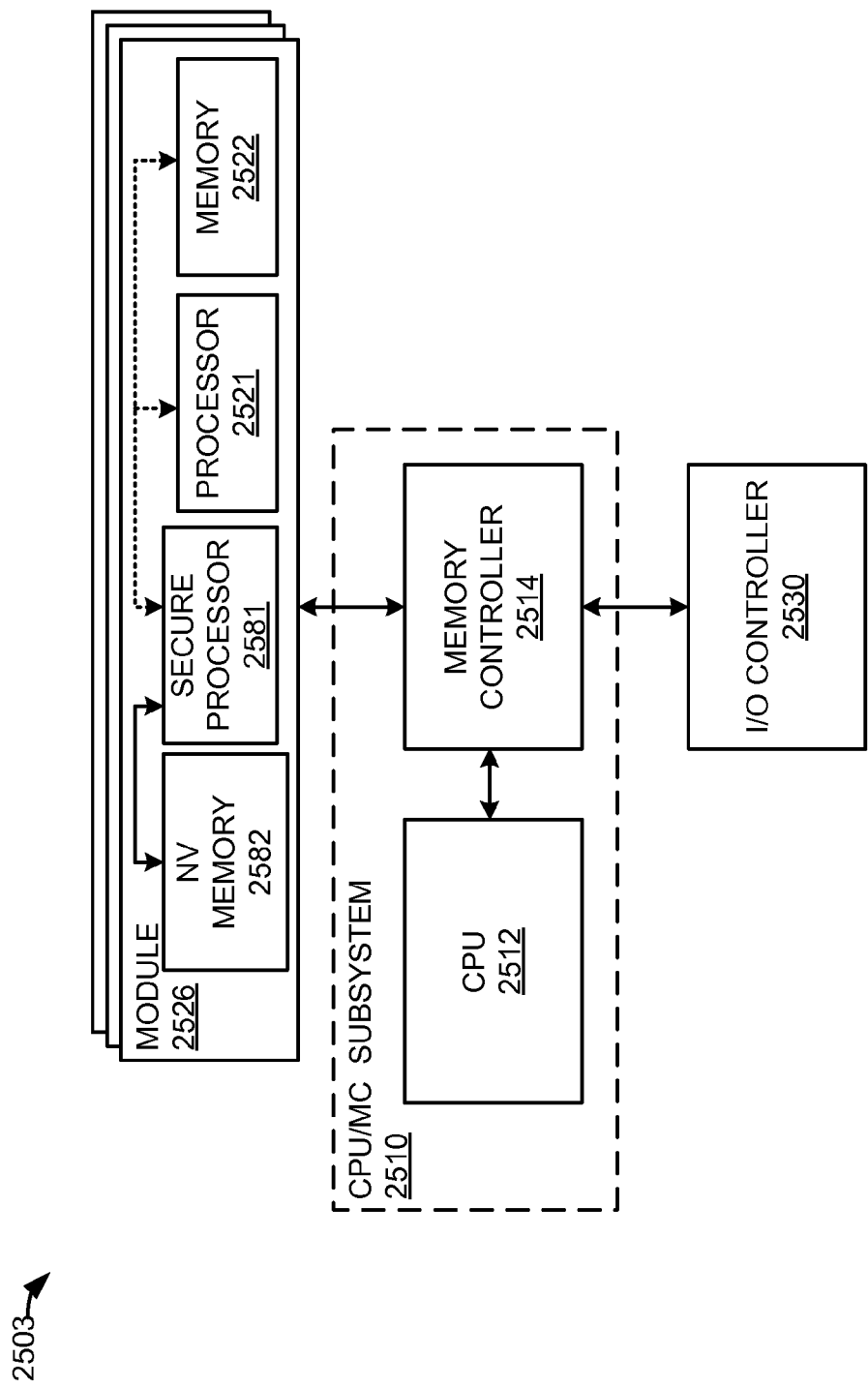

METHODS AND SYSTEMS FOR MAPPING A PERIPHERAL FUNCTION ONTO A LEGACY MEMORY INTERFACE

CROSS-REFERENCE TO RELATED APPLICATIONS

This application is a continuation of U.S. application Ser. No. 14/064,167 filed 27 Oct. 2013 titled COMMUNICATION VIA A MEMORY INTERFACE, which is a continuation-in-part of International Application PCT/US12/52052, filed Aug. 23, 2012, and titled METHODS AND SYSTEMS FOR MAPPING A PERIPHERAL FUNCTION ONTO A LEGACY MEMORY INTERFACE, which claims the benefit of U.S. Provisional Application Ser. No. 61/526,953, filed Aug. 24, 2011, and titled METHODS AND SYSTEMS FOR MAPPING A PERIPHERAL FUNCTION ONTO A LEGACY MEMORY INTERFACE, and claims the benefit U.S. Provisional Application Ser. No. 61/647,986, filed May 16, 2012, and titled METHODS AND SYSTEMS FOR MAPPING A PERIPHERAL FUNCTION ONTO A LEGACY MEMORY INTERFACE, and claims the benefit U.S. Provisional Application Ser. No. 61/670,874, filed Jul. 12, 2012, and titled METHODS AND SYSTEMS FOR MAPPING A PERIPHERAL FUNCTION ONTO A LEGACY MEMORY INTERFACE, and claims the benefit U.S. Provisional Application Ser. No. 61/691,134, filed Aug. 20, 2012, and titled METHODS AND SYSTEMS FOR MAPPING A PERIPHERAL FUNCTION ONTO A LEGACY MEMORY INTERFACE, all of which are hereby incorporated herein by reference for all purposes. U.S. application Ser. No. 14/064,167 is also a continuation in part of, and claims the benefit of, International Application PCT/US12/52000, filed Aug. 23, 2012, and titled METHODS AND SYSTEMS FOR MAPPING A PERIPHERAL FUNCTION ONTO A LEGACY MEMORY INTERFACE, and claims the benefit of International Application PCT/US12/52043, filed Aug. 23, 2012, and titled METHODS AND SYSTEMS FOR MAPPING A PERIPHERAL FUNCTION ONTO A LEGACY MEMORY INTERFACE, and claims the benefit of International Application PCT/US12/52059, filed Aug. 23, 2012, and titled METHODS AND SYSTEMS FOR MAPPING A PERIPHERAL FUNCTION ONTO A LEGACY MEMORY INTERFACE, all of which are hereby incorporated herein by reference for all purposes.

TECHNICAL FIELD

The present invention relates to memory systems and, in particular, to scalable memory systems that support parallel processing.

BACKGROUND

Personal computers commonly include a central processing unit (CPU) that executes instructions and stores data in main memory. The main memory is typically provided as one or more printed-circuit boards, each supporting integrated-circuit (IC) memory devices and coupled to the CPU via one or more main-memory buses. Specialized functions, such as graphics processing, can be passed to a separate card on a separate "expansion" bus. In a typical example, a CPU can assign resource-intensive graphics processes to a dedicated graphics card. Such systems improve overall performance, but are expensive and may not allocate communication resources efficiently. For example, relatively graphics-intensive processes may overwhelm the expansion bus, whereas less graphics-intensive processes may leave this resource underutilized.

U.S. Pat. No. 6,864,896 to Richard E. Perego details an improved computer architecture in which peripheral functionality is provided by "computing engines" located with the memory ICs on the main-memory modules. The computing engines can share main memory, which allows for more efficient memory allocation between the CPU and the peripheral engines, and communication bandwidth can be optimized over the common main-memory buses. These improvements can improve performance, save costs, or both.

BRIEF DESCRIPTION OF THE FIGURES

The present invention is illustrated by way of example, and not by way of limitation, in the figures of the accompanying drawings and in which like reference numerals refer to similar elements and in which:

FIG. 2 depicts an exemplary address space 200 for an eight gigabyte (8 GB) memory module in accordance with one embodiment.

FIG. 3A is a flowchart 300 illustrating a method of assigning a base address OPBA for peripheral interface 140 of FIG. 1 in accordance with one embodiment.

FIG. 3B is a flowchart 340 illustrating a method of assigning a base address OPBA for peripheral interface 140 of FIG. 1 in accordance with an embodiment in which controller 144 scrambles write data.

FIG. 5 illustrates a data structure 500 that peripheral driver 146 assembles and stores in cache 142 to convey commands and data to the OPBA command port in accordance with one embodiment.

FIG. 6 shows how the contents of read-data queue 168 may be arranged in accordance with one embodiment.

FIG. 7 depicts a memory system 700 in accordance with a multi-module embodiment.

FIG. 8 graphically depicts three apertures A, B, and C, one for each of the like-identified slot groups in FIG. 7.

FIG. 9 depicts the three apertures A, B, and C of FIG. 8 in more detail.

FIG. 10 illustrates a data structure 1000 that peripheral driver 146 assembles and stores in cache 142 to convey commands and data to the OPBA command ports in each of the four modules 110 in a single slot group.

FIG. 21 illustrates a data structure 2100 that a peripheral driver (e.g., driver 146 of FIG. 1) assembles and stores in a cache to convey instructions and data to the OPBA command ports of eight ×8 modules 1300 in accordance with the example of FIG. 20A.

FIG. 23 illustrates a data structure 2300 that a peripheral driver assembles and caches to convey instructions and data to the OPBA command ports of four ×16 modules 1300 in accordance with one embodiment of the example of FIG. 20B.

FIG. 25C is a block diagram illustrating an enhanced memory architecture.

FIG. 25D is a block diagram illustrating an enhanced memory architecture with secured features.

DETAILED DESCRIPTION

Figure 1:
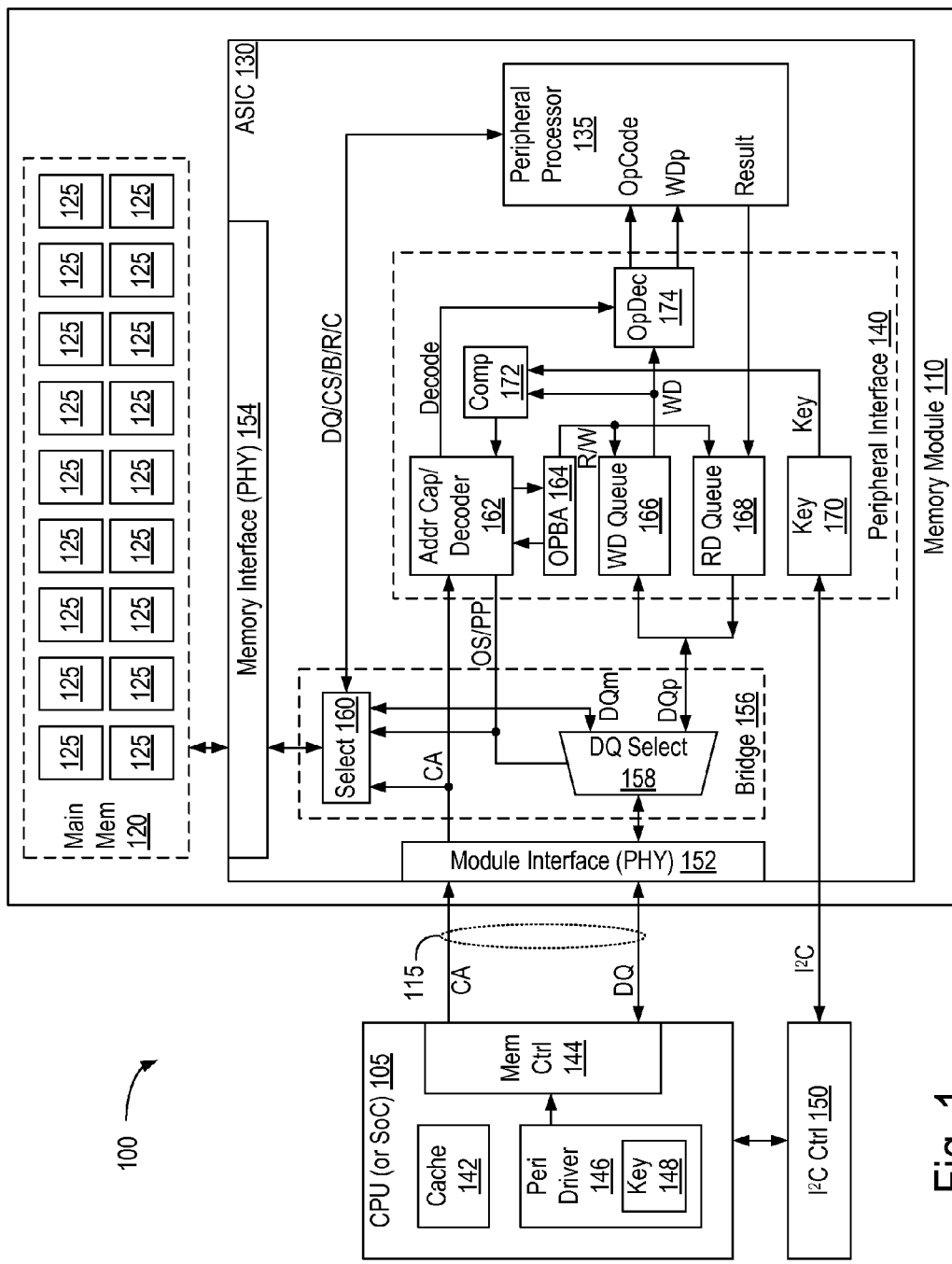
FIG. 1 depicts a memory system 100 in accordance with one embodiment. System 100 includes a CPU 105 that communicates data DQ and command and addresses CA with a memory module 110 via a main-memory interface 115.

FIG. 1 depicts a memory system 100 in accordance with one embodiment. System 100 includes a CPU 105 that communicates data DQ and command and addresses CA with a memory module 110 via a main-memory interface 115. Memory module 110 includes main-memory 120, consisting of a group of IC main-memory devices 125 in this example. Module 110 additionally includes an application-specific integrated circuit (ASIC) 130 that acts as a buffer device to relay commands and data between CPU 105 and main memory 120. ASIC 130 additionally includes an embedded processor 135 that shares access to main memory in support of peripheral functionality, such as graphics or computational processing, for improved overall system performance. A peripheral interface 140 facilitates the communication of peripheral commands and data between CPU 105 and peripheral processor 135 in a manner that minimizes or eliminates the need to modify CPU 105, and consequently reduces practical barriers to the adoption of main-memory modules with integrated processing support.

CPU 105, possibly a system-on-a-chip (SoC), includes a cache 142 and a memory controller 144, and executes a software peripheral driver 146. Driver 146 has access to key storage 148, and can be, e.g., a software and/or firmware driver provided in support of communication with module 110 as detailed herein. Driver 146 can be software loaded by a manufacturer or consumer, and may allow for legacy memory system compatibility with little or no hardware modifications.

An I2C controller 150 and related serial buses provide a reliable standardized channel that allows CPU 105 to access module-specific configuration information from module 110, which is typically stored in an EEPROM (not shown). This information is used to initialize the relatively high-performance interface 115 using techniques that are well known to those of skill in the art. These same resources are used in the depicted embodiment to share a key between peripheral interface 140 and key storage 148. Controller 150 can be integrated with other components of CPU 105.

ASIC 130 includes two physical interfaces (PHY), both of which can be conventional. The first is a module interface 152, which receives externally generated transactions like module commands, main-memory addresses, and module data, from controller 144. The second physical interface is a memory interface 154, which supports communication between ASIC 130 and main memory 120. Although the memory interface can be of the same type as the module interface, in some embodiments the memory interface can differ in the type of signaling employed, data width, command format, or other aspects that require translation by ASIC 130. A bridge circuit 156 includes select logic 158 and 160 that allow peripheral interface 140, based on bridging criteria specified using module commands, to bridge the communication of commands, addresses, and data between main memory 120 and either CPU 105 or peripheral processor 135. Bridge circuit 156 also allows peripheral interface 140 to capture module data that includes operational codes ("opcodes," or "peripheral commands"), addresses, data, and other control signals for peripheral processor 135. Module interface 152 may support a different number of parallel data channels than main-memory interface 154, in which case bridge circuit 156 can perform serialization/deserialization operations for memory data passed between the interfaces.

Peripheral interface 140 functionally resides between bridge circuit 156 and peripheral processor 135, and includes an address-capture/command decoder 162, an opcode-port base address (OPBA) register 164, write and read data queues 166 and 168, a key register 170, a comparator 172, and an opcode decoder 174. These elements collectively allow peripheral interface 140 to establish an opcode aperture, correlated to a specified capture range of one or more main-memory addresses, through which CPU 105 can communicate opcodes and data to peripheral processor 135. Responsive to such opcodes, peripheral processor 135 can support various aperture functions by executing instructions stored in main memory 120 or elsewhere. In some embodiments peripheral processor 135 has the capability to generate peripheral memory commands, addresses, and data responsive to opcodes. The specified capture range of the main-memory addresses used by the peripheral interface to capture module data represents a subrange of the memory addresses receivable at the module interface, and can lie outside of the full range of main-memory addresses used to address main memory.

Main memory 120 can include multiple independently accessible ranks or groups of ranks, and some of devices 125 can be used to store error-correction codes. In this context, a "rank" refers to a set of separately addressable memory devices used for a single memory access. In such embodiments different ranks or rank groups can support separate physical memory interfaces, such as one for each of CPU 105 and peripheral processor 135. Bridging criterion specified to decoder 162 may, in such embodiments, pass module commands, main-memory addresses, and module data from module interface 152 to at least one of the multiple ranks of memory devices, and pass peripheral memory commands, addresses, and data from the peripheral processor to at least one other of the multiple ranks of memory devices. Such bridging criterion may be dynamically selectable to support sequential or simultaneous access to main memory from both processors without loss of data in a selected one of the multiple ranks, or to change between passing module commands, main-memory addresses, and module data from the module interface to the selected one of the multiple ranks of memory devices and passing peripheral memory commands, addresses, and data from the peripheral processor to the selected one of the multiple ranks.

FIG. 2 depicts an exemplary address space 200 for an eight gigabyte (8 GB) memory module in accordance with one embodiment. Address space 200 includes horizontal rows, or pages, and 256 vertical columns. Each page is sixteen kilobytes (16 KB), and each column sixty-four bytes (64 B). One row is highlighted to indicate an assigned opcode-port row address, and column address zero in that row is designated the opcode-port base address OPBA. As detailed below, CPU 105 assigns module 110 the OPBA and thereafter employs that address to direct commands to peripheral processor 135. The OPBA information is sufficient to uniquely identify an opcode aperture, and may include bits that specify chip-select, bank, row, and column signals. Other embodiments can use different and/or additional columns and/or rows for OPBAs.

FIG. 3A is a flowchart 300 illustrating a method of assigning a base address OPBA for peripheral interface 140 of FIG. 1 in accordance with one embodiment. During system initialization (e.g., a power up), peripheral driver 146 requests a key via controller 150 (305). Peripheral interface 140 responds by passing back the contents of key register 170 (310), which driver 146 stores in key storage 148. The key is, in this example, a sixty-four byte string set by the module manufacturer.

Driver 146 requests a reserved memory region with the desired attributes from the operating system and receives a pointer to the start of the reserved memory region (315). In this case, as illustrated in FIG. 2, driver 146 requests a 16 KB region (a DRAM page, which maps to multiple physically contiguous operating-system pages) within the 8 GB space addressable on memory module 110. Driver 146 specifies to the operating system that the requested page is non-cacheable, reserved (i.e., not used or managed by the operating system) and preferably aligned to a memory module page boundary. The non-cacheable or uncacheable (UC) attribute is intended to enable memory accesses to bypass the CPU's on-chip caching hierarchy and forward requests to memory controller 144. In some CPU implementations, non-cacheable memory accesses are unoptimized and can therefore suffer from severe performance degradation. As an alternative to the uncacheable memory attribute, the write-combining (WC) memory attribute can also be used, which specifies a different type of uncacheable memory. Write combining allows multiple fine-grained memory accesses to be gathered in write-combining buffers up to a cache line granularity before the request is forwarded to the memory controller. This can boost write performance, but can also cause weak write ordering semantics, which can be problematic if the peripheral device needs to receive its commands and data in a sequential order. In the description that follows, the use of uncacheable memory is assumed, regardless of whether that memory has the write combining property.

Next, and again at the direction of driver 146, a write of the 64-byte data key is performed to the base address referenced by the pointer provided by the operating system (317). The write is forwarded to memory controller 144, which issues a command to activate the assigned OPBA row (320) of the target rank and bank, followed by a write operation (generally, to column address zero). The column write operation includes a write command, addresses, and a 64 B data key as write data. Address-capture/command decoder 162 decodes the write command and writes the key to write-data (WD) queue 166 (325). Comparator 172 alerts decoder 162 that the key in queue 166 is identical to the one stored locally in register 170, and decoder 162 stores the thus identified OPBA into register 164 (335). From that point forward, decoder 162 snoops command/address bus CA for activation commands directed to the OPBA row and access commands directed to the OPBA.

The OPBA is established in different ways in other embodiments, as by direct sharing via the I2C bus or a dedicated register within ASIC 130 that can be directly written by peripheral driver 146. The key comparison takes place after receipt of the corresponding address, and decoder 162 is configured to accommodate this latency to ensure the correct address is correlated to the key and stored in register 164. In some embodiments the latency used to correlate the key and OPBA is programmable.

Some memory controllers scramble data before writing it to an associated memory address. The scrambled data subsequently read from that address is descrambled to recover the original data. Such scrambling tends to reduce power supply noise, as detailed in U.S. Pat. No. 7,945,050 to Christopher Mozak, which is incorporated herein by reference. Data scrambling makes it difficult to pass a key to identify the OPBA assigned by the operating system. Other embodiments therefore use aperture signatures other than a key to assign an OPBA.

FIG. 3B is a flowchart 340 illustrating a method of assigning a base address OPBA for peripheral interface 140 of FIG. 1 in accordance with an embodiment in which controller 144 scrambles write data. As in the prior example, driver 146 requests and receives a pointer to a reserved memory region from the operating system (350) having specified the desired memory attributes as described above.

Next, and again at the direction of driver 146, the CPU issues a series of uncacheable writes to the reserved memory region, which the memory controller 144 forwards as a burst of back-to-back writes to the OPBA row(355). The number and rapidity of these writes to a common bank and row provide an aperture signature that decoder 162 can detect (360) in lieu of e.g. a data key. For example, a minimum number of accesses to a single memory row over a defined time period may define the aperture signature. With the signature detected, decoder 162 captures the associated address (365) and stores it in address-capture/command decoder 162 (370). From that point forward, decoder 162 snoops command/address bus CA for activation commands directed to the OPBA row and access commands directed to the OPBA.

In some embodiments there may be some probability that another start-up process will exhibit the aperture signature, in which case interface 140 could capture the wrong OPBA. The possibility of such errors can be reduced or eliminated if the address capture is executed as part of or immediately subsequent to the boot sequence, during which time little memory traffic is expected for other applications. In any event, applications are unlikely to write the same set of addresses repeatedly over a short period of time, and if they did so such writes would likely be to cache rather than to main memory. The number of such writes can be sufficiently high to reduce the effective likelihood to zero. Request apertures assigned by an operating system can be conveyed to the peripheral interface using other recognizable patterns in other embodiments. However the aperture base address is captured, the memory system can issue a command to that aperture to verify the address is correct, and can restart the process of FIG. 3B if the verification fails.

Data communicated to ASIC 130 may be scrambled using a key that is not known to peripheral interface 140. For example, some memory controllers may XOR data to be written to a specified column with a key created from the column write address and an unpublished binary string. In some embodiments, peripheral interface 140 can work with driver 146 to discover and store the key for each column of the OPBR row, which enables interface 140 to unscramble and scramble commands and data conveyed to and from the aperture.

The following list details a process of discovering and storing keys for each column of the OPBA row in accordance with one embodiment. As before, this process starts with driver 146 requesting a receiving a row address from the operating system having specified that the requested page is non-cacheable, non-paged, write-combined, and preferably aligned to a memory module page boundary.

1) Driver 146 writes all zeroes, scrambled by memory controller 144, to a column in the OS-assigned OPBA row N times, thereby assigning the OPBA.
2) The address capture/decoder on ASIC looks for N writes to same address, and captures the OPBA and the scrambled data. The scrambled data in WD Queue 166 at column zero are the XOR of the OPBA key and all zeroes, and thus represents the key for the OPBA.
3) Driver 146 issues a read instruction to the OPBA. Decoder 162 XORs the scrambled-zero data (the key) with all ones to return the complement of the key to driver 146.
4) Memory controller 144 unscrambles the received data. Peripheral driver 146 determines whether the unscrambled data is all ones. If so, then the OPBA is initialized. If not, then driver 146 retries steps 1-3 until initialization succeeds, or until initialization fails M times.
5) Driver 146 next sends a command packet to the OPBA instructing interface 140 to go in a sequential column capture mode to initialize the remaining column addresses of the OPBA row. As discussed below, this mode enables ASIC 130 to create a mapping table correlating column addresses specified by driver 146 with physical columns in the OPBA row.
6) Driver 146 initializes column one of the OPBA row by first writing all zeros to the next column address N times, as was done in step one for the OPBA. Address capture/decoder 162 senses this pattern and captures the key. For processors that combine writes, which can reorder column accesses, the column specified by this initialization step may not be column one. Interface 140 saves a mapping of the driver-specified column address to column address one. The scrambled data (XOR key for column) is written into column one as in the initialization sequence for the OPBA. (Subsequent accesses to the same driver-specified column of the OPBA row will likewise be redirected to column one.)

7) Driver 146 issues a read to column one of the OPBA row. Address capture/decoder 162 XORs the scrambled-zero data (the key for column one of the OPBA row) with all ones to return the complement of the key.

8) Memory controller 144 unscrambles the complement of the key. If all ones, column one of the OPBA row is initialized; if not, then driver 146 retries steps 6-8 until initialization succeeds, or until initialization fails M times.

9) Steps 6, 7, and 8 are repeated for each successive column of the OPBA row.

10) Driver 146 sends a command packet to the OPBA instructing interface 140 out of the sequential column capture mode.

If the initialization completed successfully, interface 140 has a populated table listing the key for each column of the OPBA row and any required mapping between driver-specified and physical column addresses for the OPBA row.

Figure 4:
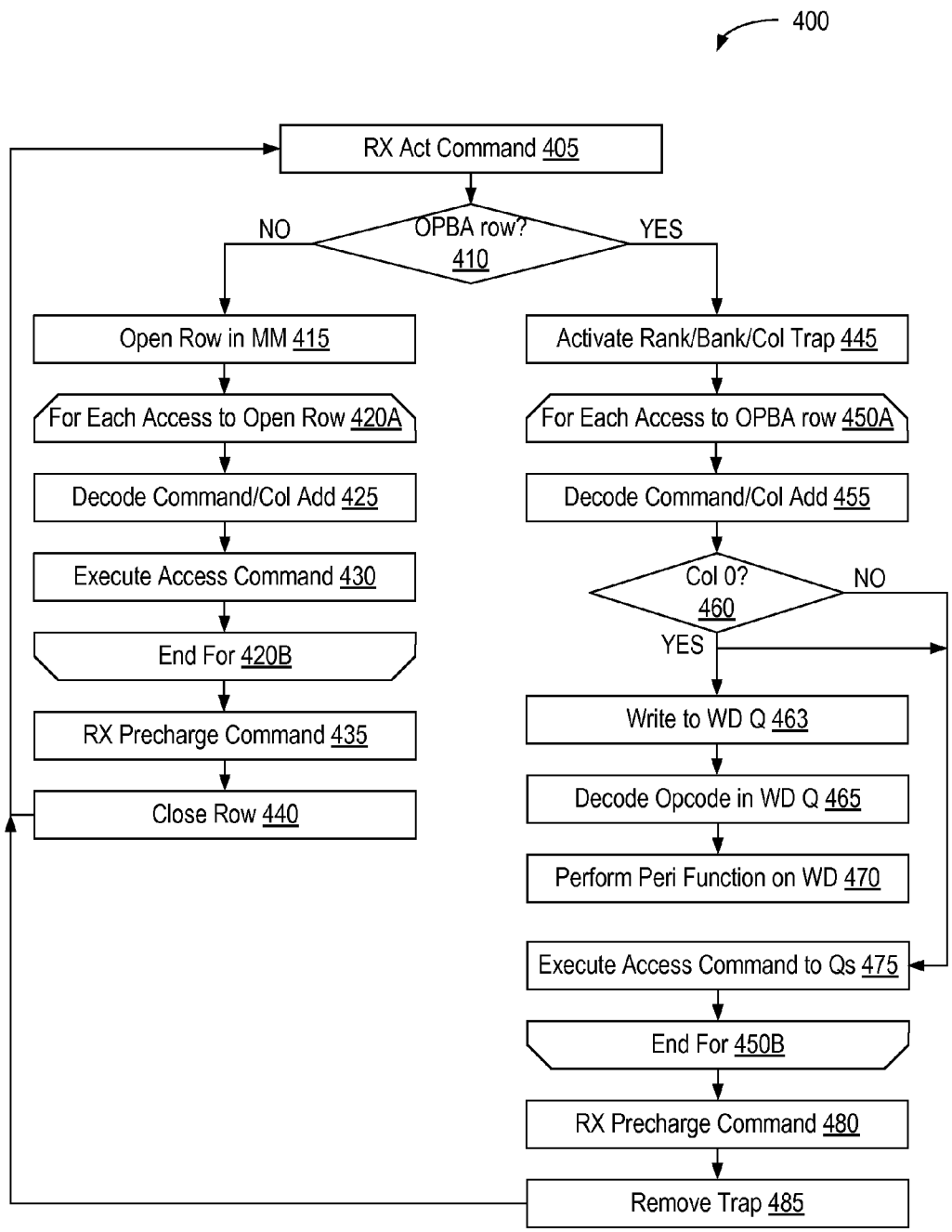
FIG. 4 is a flowchart 400 illustrating how memory module 110 of FIG. 1 manages OS requests from CPU 105 for access to main memory 120 and support from peripheral processor 135 in accordance with one embodiment.

FIG. 4 is a flowchart 400 illustrating how memory module 110 of FIG. 1 manages OS requests from CPU 105 for access to main memory 120 and support from peripheral processor 135 in accordance with one embodiment. Both main-memory and peripheral-processor requests can be initiated and directed using access commands directed to main-memory addresses.

At 405, decoder 162 in peripheral interface 140 captures an activate command ACT from memory controller 144 via command/address bus CA. Decoder 162 references register 164 to determine whether the main-memory address to which the command is directed matches the stored OPBA row (decision 410). If not, then the command is a conventional main-memory command. Decoder 162 directs the command to main memory 120 via select logic 160 to activate (open) the addressed row in devices 125 (415). Module 110 subsequently receives one or more access commands directed to columns within the open row. In this embodiment such access commands specify the bank and rank of the OPBA but lack the row address. As indicated in the For-loop 420A/B, main-memory devices 125 decode and execute these commands (425 and 430). Eventually module 110 will receive a precharge command (435) and devices 125 will close the open row (440) in preparation for the next main-memory access.

Returning to decision 410, and assuming the received command is directed to the OPBA row, decoder 162 activates a trap for subsequent column accesses to the rank and bank address corresponding to the OPBA row (445). Column commands generally do not explicitly identify the open row to which the command is directed, but most DRAM devices and controllers allow only one row to be open in each rank and bank. Accordingly, once the OPBA row has been "activated," any column access commands directed to the OPBA rank and bank address can be trapped as data transfers with either WD queue 166 or RD queue 168. Activations to the OPBA row and column commands directed to an activated OPBA row may also be passed to memory interface 154 in parallel with comparisons performed by decoder 162 to avoid potential added latency for the comparison operations. Parallel forwarding of OPBA row activity to memory interface 154 can cause activity on main-memory devices 125—this activity is of no consequence, however, as bridge circuit 156 will not pass the addressed data to or from main memory 120 if the OPBA row is selected. Decoder 162 also controls select logic 158 to connect data bus DQ to a pair of queues 166 and 168, which respectively serve as write and read buffers.

Each of queues 166 and 168 stores one page (16 KB) divided into 256 64 B subsections that are uniquely identified by a column address, e.g., an addressing structure that mirrors that of a page of main memory 120. Write queue 166 effectively takes the place of the OPBA row address in main memory for write operations, while read queue 168 does the same for read operations. Queues 166 and 168 are static random-access memory (SRAM) in this example, and thus do not require "activation" in the sense that a DRAM row requires activation.

Once decoder 162 identifies a row activation as directed to the OPBA row, and thus to the "open" queues, decoder 162 awaits an access command specifying an operation and a column to which the operation is directed. Decoder 162 then decodes each subsequent access command to the OPBA row address (For loop 450A/B). If a write access is to column zero, the assigned OPBA in this example, then decoder 162 issues a control signal Decode to OpCode decoder 174, causing decoder 174 to decode an opcode from the column zero address in write-data queue 166 (465), and pass the decoded opcode OpCode and any associated peripheral write data WDp to peripheral processor 135. Peripheral processor 135 executes the opcode OpCode to perform some peripheral function (470), and in so doing may alter the contents of main memory via bridge circuit 156.

Access commands to the OPBA row can be to any of the 256 columns. Decoder 162 decodes the command information in each case and performs the commanded function on queues 166 and 168 (475). A read command to any column of the row address for the OPBA, for example, reads from the specified subset of locations in read queue 168, and a write command to any column of the same row address writes to the corresponding subset of locations in write queue 166. Eventually, module 110 will receive a precharge command (480) for the rank and bank assigned to the OPBA, and decoder 162 will release the column-address trap (485). Module 110 thereafter awaits the next command. It is also of note that although flowchart 400 shows separate paths for main memory accesses and OPBA row accesses, a typical memory controller will interleave memory commands to multiple banks and/or ranks—thus in many instances CPU 105 can be accessing main memory 120 and communicating with peripheral interface 140 in consecutive column access commands directed to different ranks and/or banks.

FIG. 5 illustrates a data structure 500 that peripheral driver 146 assembles and stores in cache 142 to convey instructions and data to the OPBA command port in accordance with one embodiment. Data structure 500 specifies the information to be stored in write-data queue 166 over one or more write operations to the OPBA row. The information is divided into 256 logical columns in the same manner as write-data queue 166, and each logical column is further divided into eight 64-bit fields, an instruction field, an address field, a write-data field, a write-mask field, and four fields that are reserved. These fields are uniquely designated by a "Qword Index" in FIG. 5. The term "Qword" stands for "quad-word," with a word being sixteen bits.

Eight bits OP[7:0] of the instruction field are used to represent an opcode to be decoded by OpCode decoder 174 (or passed to peripheral processor 135 for decoding). Eight more bits BL[7:0] store a burst-length variable, which can be used to specify the number of subsequent write accesses to be burst into queue 166. Embodiments thus allow for high-efficiency open-page write and read data bursts of up to 256 columns. Processor 135 may be required to complete a specified burst before executing whatever instruction is encoded in the bits OP[7:0] to avoid a race condition. The next instruction bit M[0] indicates whether to apply a data mask specified in the write-mask field. Bits PSB[2:0] are optional peripheral-select bits, so called because they specify one or more peripheral processors that are the target of broadcast commands. An embodiment that uses PSB bits to allow commands receives at a plurality of modules to be executed by any one or combination of their respective peripheral processors is detailed in connection with FIGS. 13-15. The remaining bits 63:20 of the instruction field are reserved.

The address field allows CPU 105 to specify a memory address to peripheral processor 135, such as to identify a location in main memory, a register on module 110, or some other memory or function. These addresses can map to anywhere in the memory hierarchy of ASIC 130 and in any way desired between driver 146 and ASIC 130 with little or no impact on CPU 105 or the operating system.

The write-data field in the OPBA column allows opcodes to the OPBA to communicate up to sixty-four bits of write data. Each of the remaining 255 columns of the OPBA row can contain up to 512 additional bits of write data. All of this write data can be passed to peripheral processor 135, as peripheral write data WDp, for storage and manipulation. Such data might include, for example, processor instructions to be stored in main memory 120 or elsewhere for execution by processor 135.

As noted previously, data structure 500 is created in cache 142 and written into write-data queue 166. Processor 135 can manipulate or store this information and return the results of such manipulation or data read from memory to CPU 105 via read-data queue 168. A non-exhaustive list of possible operations and their associated opcodes are noted below.

FIG. 6 shows how the contents of read-data queue 168 may be arranged in accordance with one embodiment. As with the write-data queue 166, read-data queue 168 is divided into 256 logical columns, and each logical column supports storage for up to 512 bits of read data. CPU 105 can access any of this data by issuing a read command to the corresponding column within the OPBA row. To read from another address location via peripheral processor 135, CPU 105 issues a write command to the OPBA that includes the requisite opcode and address for processor 135 to retrieve (and/or calculate) the requested information and store it in read-data queue 168. CPU 105 then follows up with a read command to the read-data queue when the requested information is available. To ensure the requested information is available when read from queue 168, CPU 105 may periodically read a status bit controlled by peripheral processor 135 in, e.g., read-queue 168 or elsewhere, or peripheral processor 135 or interface 140 may issue an interrupt signal to indicate completion of the read. CPU 105 may likewise be alerted to the completion of other processes carried out by the peripheral processor. Interface 115 may be modified to support such interrupts in other embodiments.

FIG. 7 depicts a memory system 700 in accordance with a multi-module embodiment. System 700 includes features in common with system 100 of FIG. 1, with like-identified elements being the same or similar. Such elements include a CPU 105 and twelve modules 110 supported by a common motherboard 705. Modules 110 are arranged in three slot groups A, B, and C and four channels Ch[3:0] (each corresponding, e.g., to a embodiment of channel 115 of FIG. 1). Each module is 8 GB, for a total of 96 GB. Rather than a single 16 KB page in one module serving as the opcode aperture, each aperture is extended across a slot group for a total of 64 KB.

FIG. 8 graphically depicts three apertures A, B, and C, one for each of the like-identified slot groups in FIG. 7. Each slot group provides 32 GB (4×8 GB) of memory, one row address (extended across the slot group) within each slot group is assigned the role of OPBA row, and four columns zero are assigned the roles of OPBA for the respective modules in each slot group.

FIG. 9 depicts the three apertures A, B, and C of FIG. 8 in more detail. With reference to aperture A, that OPBA row includes 256 columns for each of four channels Ch[3:0], for a total address space of 64 B×4×256=64 KB. Apertures B and C likewise provide the same address-space configuration at their respective starting locations.

FIG. 10 illustrates a data structure 1000 that peripheral driver 146 assembles and stores in cache 142 to convey commands and data to the OPBA ports in each of the four modules 110 in a single slot group. Data structure 1000 is similar to data structure 500 of FIG. 5, but includes the likes of data structure 500 for each of the four channels Ch[3:0], interleaved in the same manner that the memory controller interleaves the memory channels to, e.g., facilitate efficient parallel communication to and from the peripheral processors.

Figure 11:
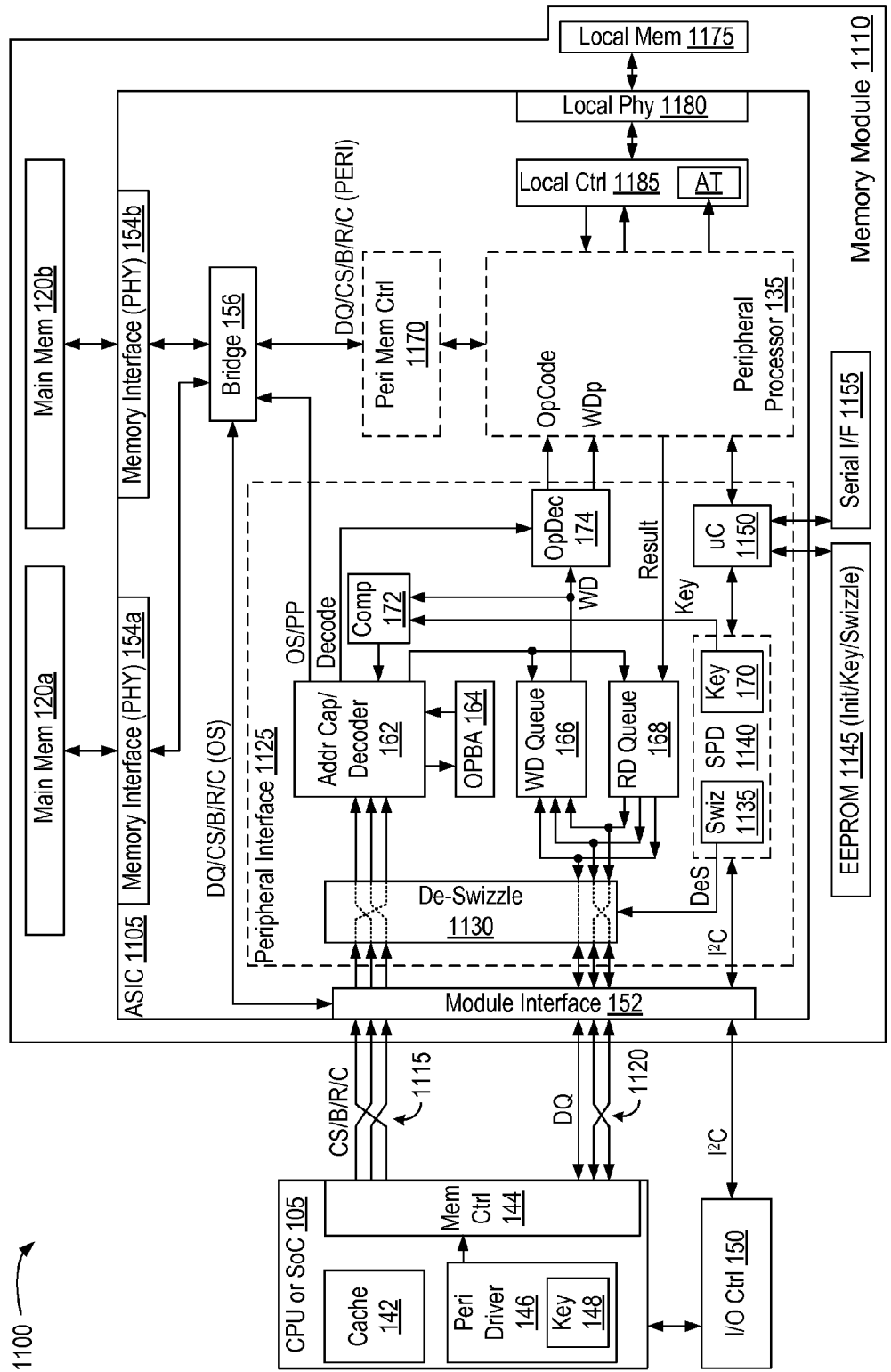
FIG. 11 depicts a memory system 1100 in accordance with another embodiment.

FIG. 11 depicts a memory system 1100 in accordance with another embodiment. System 1100 includes features in common with system 100 of FIG. 1, with like-identified elements being the same or similar. Discussions of common features are largely omitted here for brevity.

System 1100 includes CPU 105 and a memory module 1110 interconnected by a main-memory interface that includes a command/address bus 1115 and a data bus 1120, each of which includes a number of parallel channels. Command/address bus 1115 conveys chip-select, bank, row, and column (CS/B/R/C) address signals, and data bus 1120 conveys data signals DQ. Buses 1115 and 1120 are both shown to include signal conductors that switch positions en route to module 1110. The crossings illustrate signal-routing choices made in some systems to simplify part placement and trace routing on the printed-circuit board (e.g., motherboard) supporting CPU 105 or to improve signal integrity by reducing trace length or stub length. For memory operations, some bit positions of data, or of addresses, can often be switched without affecting circuit performance providing the switching applies to both reads and writes. Some signal traces may therefore be routed in a manner that is more convenient or efficient without introducing logic errors—as long as the memory module does nothing but stores and reads. This common practice is sometime referred to as "swizzling."

Swizzled data or address lines that do not affect main-memory accesses may nevertheless interfere with commands to peripheral interface 1125. Swapping data bits may, for example, change an opcode embedded in write data for peripheral processor 135. Peripheral interface 1125 therefore includes a programmable de-swizzling circuit 1130 and associated swizzle register 1135, the latter of which may be connected to or part of some serial-presence-detect (SPD) logic 1140. Before module 1110 is placed in system 1100, an EEPROM 1145 or other memory is programmed with swizzle information for the motherboard, the key for register 170, and other initialization information (the EEPROM can also be programmed by the system the first time the module is connected, or swizzle register 1135 can be explicitly loaded by the system after each reset). A microcontroller 1150 then loads registers 1105 and 170 as part of an initialization routine that calibrates, e.g., the module and memory interfaces. De-swizzling circuit 1130 thus counteracts on-board swizzling responsive to a de-swizzle signal DeS from register 1135 by reordering the module data received concurrently at the module interface.

A conventional serial interface 1155 provides test and control access to controller 1150. Peripheral interface 1125 otherwise operates as described above in connection with FIG. 1, so a detailed treatment is omitted here. The information in EEPROM 1145 includes boot code that can be executed by controller 1150 so that when system 1100 completes a power-on reset the module and memory interfaces 152, 154, and 1180 are calibrated. These calibration procedures can be transparent to CPU 105.

De-swizzling circuit 1130 is not shown as affecting memory traffic between the module interface 152 and bridge circuit 156. In an alternate embodiment, all memory traffic is "de-swizzled," such that data stored in main memory can be directly accessed by the peripheral processor in a consistent storage format.

To the right of interface 1125, peripheral processor 135 interfaces with a peripheral memory controller 1170, which manages access to main memory 120 for processor 135 in the same manner that memory controller 144 manages access for CPU 105.

Peripheral processor 135 has access to additional peripheral local memory device(s) 1175 in this embodiment, and gains and manages access via a local physical interface 1180 and controller 1185. Local controller 1185 may include support for address translation between an addressing scheme employed by main memory and one specific to the local memory. Peripheral memory controller 1170 may likewise include support for address translation depending upon the needs of processor 135.

Peripheral memory device(s) 1175 might be, e.g., high performance but have a smaller addressable space relative to main memory to support improved peripheral performance. Peripheral processor 135 may, for example, execute peripheral graphics instructions stored in peripheral memory device(s) 1175. Rather than or in addition to graphics processing, peripheral functions can include network support, data compression/decompression, encryption/decryption, scientific computation, etc. Different memory modules can support the same or different types of peripheral processing, or only a subset of the modules may include such support. The operands for the peripheral functions can be provided as or derived from peripheral write data WDp.

Figure 12:
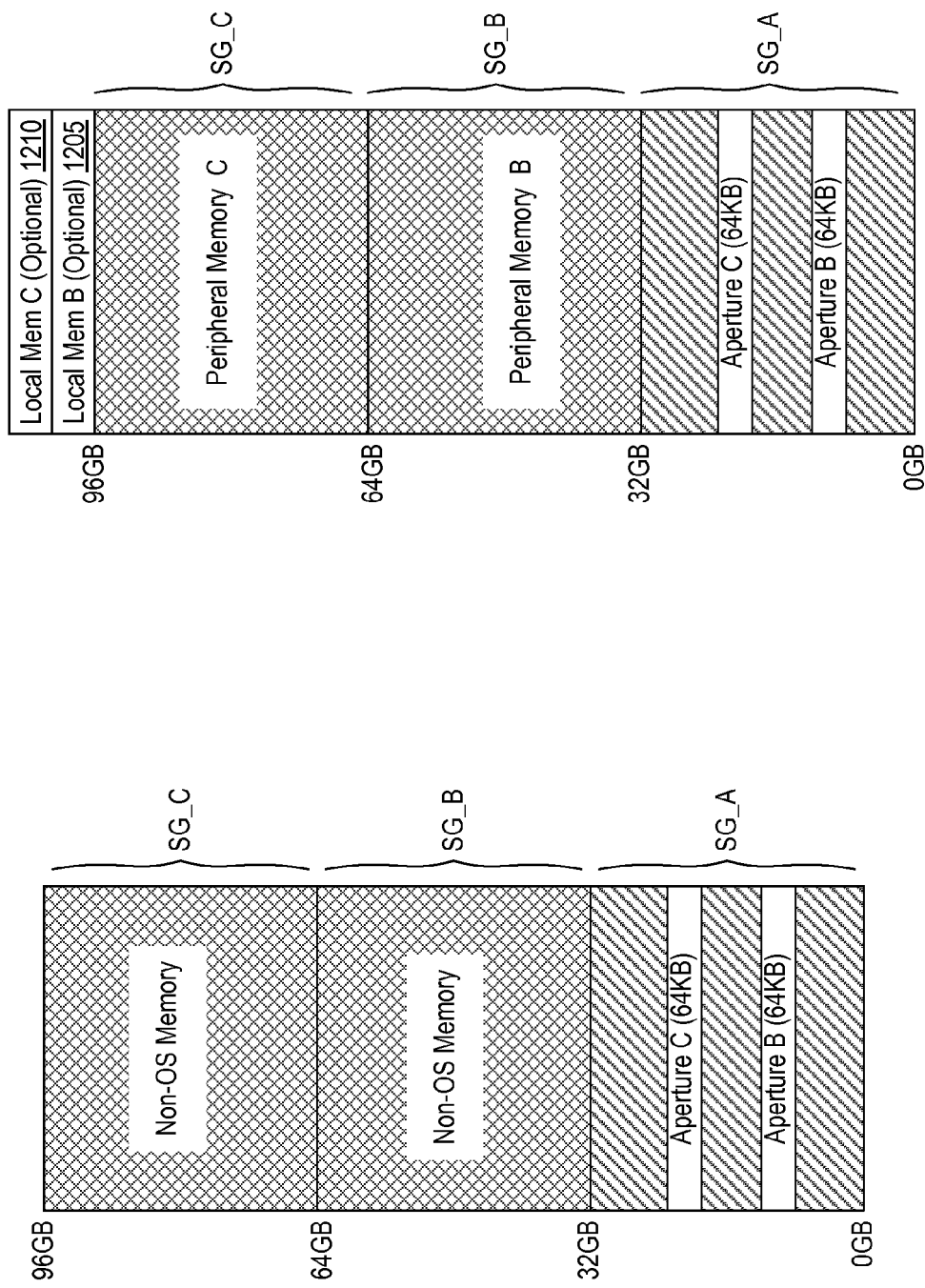
FIGS. 12A and 12B illustrate how different memory modules can support different operational modes in accordance with some embodiments.

FIGS. 12A and 12B illustrate how different memory modules can support different operational modes in accordance with some embodiments. In FIG. 12A, two apertures B and C are within the address range of a slot group A (SG_A), and all of the main memory within slot groups B and C (SG_B and SG_C) is dedicated to the peripheral processor. That is, slot groups B and C do not provide direct main-memory access via, e.g., module interface 152 communicating through memory interface 154, but rather require such access be made via peripheral driver 146 commands directed to processor 135 via apertures C and B. The peripheral interfaces in slot groups B and C are programmed to respond to their respective aperture addresses, which actually indicate bank and rank addresses assigned to slot group A. The peripheral interfaces in slot group A are programmed to not respond to accesses to the slot group B and C apertures. From the perspective of the CPU, as illustrated in FIG. 12A, slot group A offers 32 GB of memory and slot groups B and C are unreachable. From the perspective of peripheral driver 146, as shown in FIG. 12B, each of slot groups B and C offers an additional 32 GB of memory via a respective aperture. Address space associated with one or more additional memories 1205 and 1210 may also be available via the same apertures.

Each memory module can be configured to support apertures, to provide peripheral memory, or both, and the balance between the relative quantities of main memory available to the CPU and peripheral processor can be changed, e.g., at initialization or dynamically. With reference to FIG. 11, for example, a write instruction to the OPBA or a register setting can cause decoder 162 to control bridge circuit 156 such that access to main memory 120 is always via one of controllers 144 and 1170. Alternatively, such instructions can be used to switch access between controllers at will depending upon the needs of system 1100.

For a legacy system, memory controller 144 may not be able to share overlapped access with the peripheral processor to the same main memory ranks, as memory controller 144 will expect certain timing for activate, precharge, column access, and refresh commands. This timing could be violated if the peripheral processor has, e.g., opened a row in main memory when memory controller 144 considered the bank precharged. Accordingly, several different shared access modes are contemplated.

In one access mode, main memory on a given module 1110 is dedicated (e.g., during operating system configuration) for use either by the peripheral processor 135 or by CPU 105. If main memory is dedicated to the CPU, bridge circuit 156 is configured to connect the memory interface with the module interface 152 and to ignore memory requests from peripheral memory controller 1170. If main memory is dedicated to the peripheral processor 135, bridge circuit 156 is configured to allow memory requests from peripheral memory controller 1170 and ignore memory requests from the module interface 152 (in this mode, the module interface is used only to communicate with the peripheral interface 1125).

In another access mode, useful for example in the FIG. 11 embodiment having separate memory interfaces 154a and 154b to two different main memory ranks 120a and 120b, bridge circuit 156 can be configured to connect the module interface with one rank and the peripheral main memory controller 1170 with the other rank, allowing the two processors to share main memory. Each memory controller independently manages the rank(s) assigned to it by the peripheral driver 146. The active aperture is to an address within the rank(s) assigned to memory controller 144. Bridge circuit 156 can therefore bridge main-memory commands and addresses from module interface 152 to main-memory interface 154a, and peripheral memory commands and addresses from processor 135 and main-memory interface 154b.

It may also be useful to "switch" a rank or ranks from control by memory controller 144 to control by peripheral memory controller 1170. For instance, main memory rank 120a could be assigned to CPU 105 while main memory rank 120b is used to make some calculations and store results in main memory, and then the two roles could be switched. Although peripheral memory controller 1170 can readily be designed to allow such switching using opcodes passed through the opcode aperture, as the ASIC can be designed to understand the existence of another memory controller, a legacy memory controller 144 may not. One way to allow such a mode is to construct two apertures, one in the memory space of each of two ranks, with the peripheral driver 146 communicating with the peripheral processor 135 using the aperture within a rank that is active from the perspective of controller 144. The peripheral driver 146 can then command memory controller 144 to place another rank in self-refresh mode (e.g., a mode in which a main-memory device retains its contents, with no input from the memory controller until a wake-up signal is sent). Peripheral interface 1125 and bridge circuit 156 are configured, in this switching mode, to allow peripheral memory controller 1170 to access and control a rank that has been placed in self-refresh mode by memory controller 144 (ASIC 1105 is programmed to not pass the self-refresh mode command through to the memory, but to instead alert peripheral processor 135 that it may either use the memory rank, or place the memory in self-refresh mode).

The following list provides examples of the types of opcodes and other information that may be directed to opcode apertures (e.g., addressed to an OPBA) in accordance with some embodiments.

Opcode 0: NOP. Specifies no operation is to be done, and might be used when writing to an OPBA column without seeking a peripheral operation.

Opcode 1: Reserved.

Opcode 2: ASIC Register Write. Accompanied by address bits specifying a register on the ASIC and commanding a peripheral processor to write specified data to the register.

Opcode 3: ASIC Register Read Trigger. Accompanied by address bits specifying a register on the ASIC and commanding the peripheral processor to load data from the register into the read-data queue.

Opcode 4: Peripheral Host Write. Accompanied by address bits specifying a register on the module and commanding the peripheral processor to write specified data to the register.

Opcode 5: Peripheral Host Read Trigger. Accompanied by address bits specifying a register on the module and commanding the peripheral processor to load data from the register into the read-data queue.

Opcode 6: ROM 64-bit Write. Accompanied by address bits specifying a programmable read-only memory (PROM) address on the module and commanding the peripheral processor to write specified data to the PROM.

Opcode 7: ROM 64-bit Read Trigger. Accompanied by address bits specifying a ROM address on the module and commanding the peripheral processor to load data from the ROM into the read-data queue (the targeted ROM can be a PROM).

Opcode 8: Local Memory Burst Write. Accompanied by address bits specifying an address in a local memory and burst-length bits specifying a burst length, commands the peripheral processor to write specified data to local memory as a burst of column-sized (64 B) chunks. Burst length can be specified from one to 256.

Opcode 9: Local Memory Burst Read Trigger. Accompanied by address bits specifying an address in local memory and burst-length bits specifying a burst length, command the peripheral processor to load data from a local memory into the read-data queue as a burst of column-sized chunks. Burst length can be specified from one to 256.

Opcode 10: Main Memory Burst Write. The same as Opcode 8 but applied to main memory.

Opcode 11: Main Memory Burst Read Trigger. The same as Opcode 9 but applied to main memory.

Opcode 12: ROM Burst Write. The same as Opcode 8 but applied to a PROM.

Opcode 13: ROM Burst Read Trigger. The same as Opcode 9 but applied to ROM.

Opcodes 14-255: Reserved.

Figure 13:
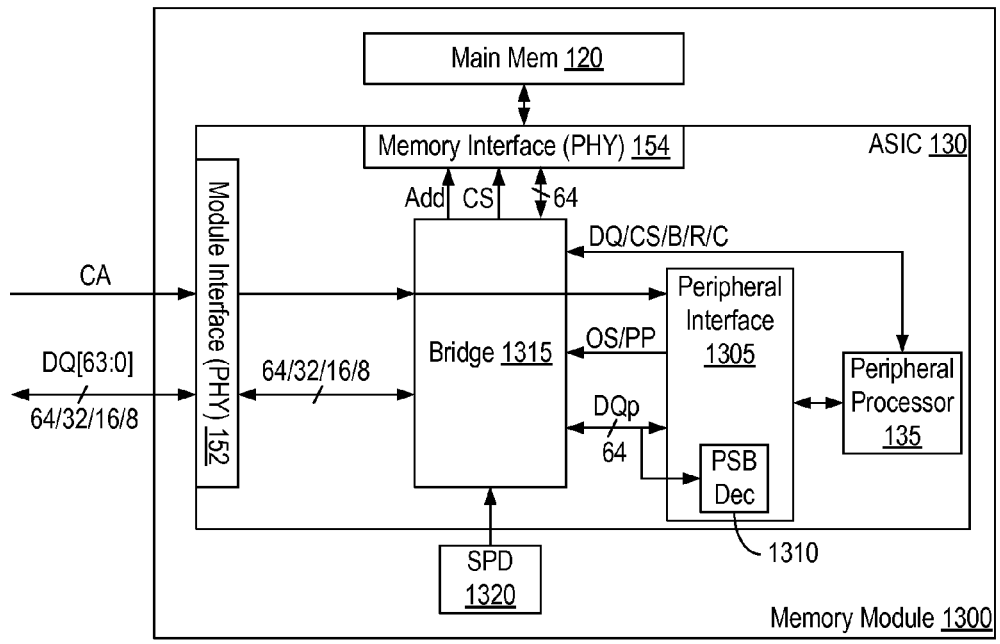
FIG. 13 depicts a memory module 1300 in accordance with an embodiment that supports peripheral-command broadcasting and configurable data widths.

FIG. 13 depicts a memory module 1300 in accordance with an embodiment that supports peripheral-command broadcasting and configurable data widths. Memory module 1300 is similar to module 110 of FIG. 1, with like-identified elements being the same or similar. Module 1300 differs from module 110 in that its embodiment of a peripheral interface 1305 includes a peripheral-select-bit (PSB) decoder 1310 that allows peripheral interface 1305 to determine whether broadcast peripheral commands are directed to the resident processor 135. This aspect of module 1300 is detailed below in connection with FIGS. 14 and 15. Module 1300 also differs from module 110 in that its bridge 1315 is configurable, based on a control input from a serial-presence detect (SPD) memory 1320, to communicate data of width eight, sixteen, thirty-two, or sixty-four via all or a subset of data lines DQ[63:0]. Modules that support multiple data widths can be used, e.g., to implement Dynamic Point-to-Point (DPP) memory architectures. Briefly, DPP architectures combine the performance benefits of point-to-point signaling with the flexibility of multi-drop topologies. Module 1300 combines support for DPP with the ability to accomplish peripheral processes in the manner detailed previously. SPD memory 1320 is initialized at start-up, using well known techniques, to select the desired width.

Command broadcasting, in this context, refers to the simultaneous delivery of the same command to multiple peripheral processors instantiated on the same or different modules. It is sometimes desirable to break up a job into multiple similar tasks and execute each on a separate peripheral processor. In video processing, for example, a technique known as split frame rendering allocates a rending process to be performed on a single video frame among multiple graphics processors. The processors work in parallel on different subsets of the frame to expedite the rendering process. Such parallel processing can be used to advantage in many areas beyond graphics. A memory system with multiple instances of module 1300 can broadcast the same command to multiple modules in support of parallel processing. In some embodiments commands can specify one or more target processor, and can thus be conveyed to one or any combination of multiple peripheral processors.

Figure 14:
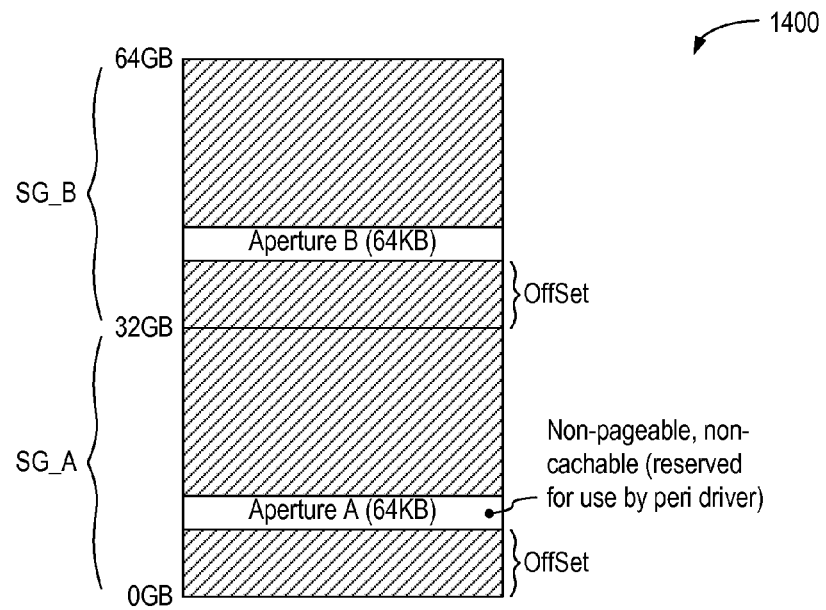
FIG. 14 depicts an address range 1400 to illustrate how different memory modules can support broadcast commands in accordance with one embodiment.

FIG. 14 depicts an address range 1400 to illustrate how different memory modules can support broadcast commands in accordance with one embodiment. Two apertures A and B are within the address ranges of respective slot groups SG_A and SG_B. Aperture A is a non-pageable, non-cacheable row reserved for use by a peripheral processor. The rest of the address space in both slot groups, including the row in slot group SG_B that shares the address of Aperture B, is available to the CPU (e.g., CPU or SoC 105 of FIG. 1) as main memory. In this example the addresses for both apertures are offset from address zero in their respective slot groups by the same number of address locations, though different schemes can also be used.

Apertures A and B provide access to respective peripheral processors as detailed in connection with earlier figures. A module 1300 associated with aperture B can additionally respond to commands directed to a module associated with aperture A so that the same command can be issued to both modules simultaneously. The module 1300 associated with slot group B uses chip-select signals to distinguish between accesses to apertures A and B. As detailed below, the module 1300 of slot group B senses memory commands directed to the row address of aperture B and treats them differently depending upon whether such commands are accompanied by a chip-select signal CS specifying that module. If a chip select is asserted, the module responds conventionally to the command to provide access to main memory. If a chip select is not asserted when a command is addressed to the row address of aperture B, however, then the command is addressed to Aperture A in another module. Interface 1305 employs PSB decoder 1310 to determine whether module 1300 of slot group B is to respond to the command to aperture A. PSB decoder 1310 considers information accompanying the command that specifies the target peripheral processor or processors. In a two-module system, for example, a command provided via a common data channel can be executed in slot group A, slot group B, or both slot groups simultaneously.

Figure 15A:
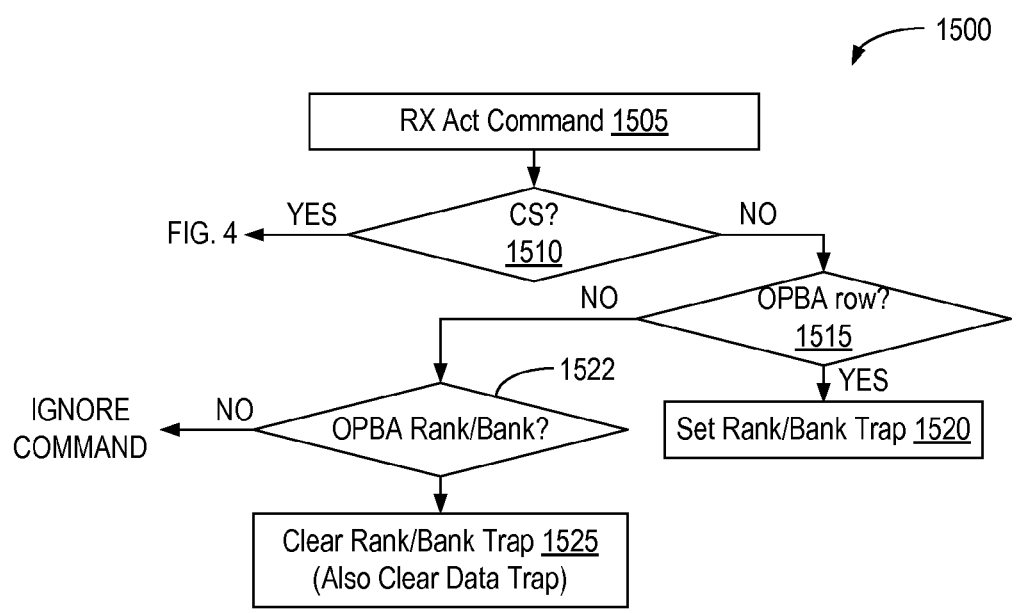
FIG. 15A is a flowchart 1500 illustrating how module 1300 of FIG. 13 responds to activate commands on a command/address bus CA common to two such modules.

FIG. 15A is a flowchart 1500 illustrating how module 1300 of FIG. 13 responds to activate commands on a command/address bus CA common to two such modules. This example pertains to a module 1300 for which the aperture address is available to the memory controller as a page of main memory, as was the case for a module 1300 that supports aperture B of slot group B of FIG. 14. That is, a memory controller (not shown) can access either (1) a page of main memory at aperture B by asserting a chip select signal, or (2) a peripheral processor via aperture B by setting an appropriate PSB bit and failing to assert the chip select signal. In other embodiments aperture B is unavailable as main memory, and commands to aperture B accompanied by a chip select to a module 1300 within slot group B are treated as peripheral commands in the manner detailed above.

Figure 15B:
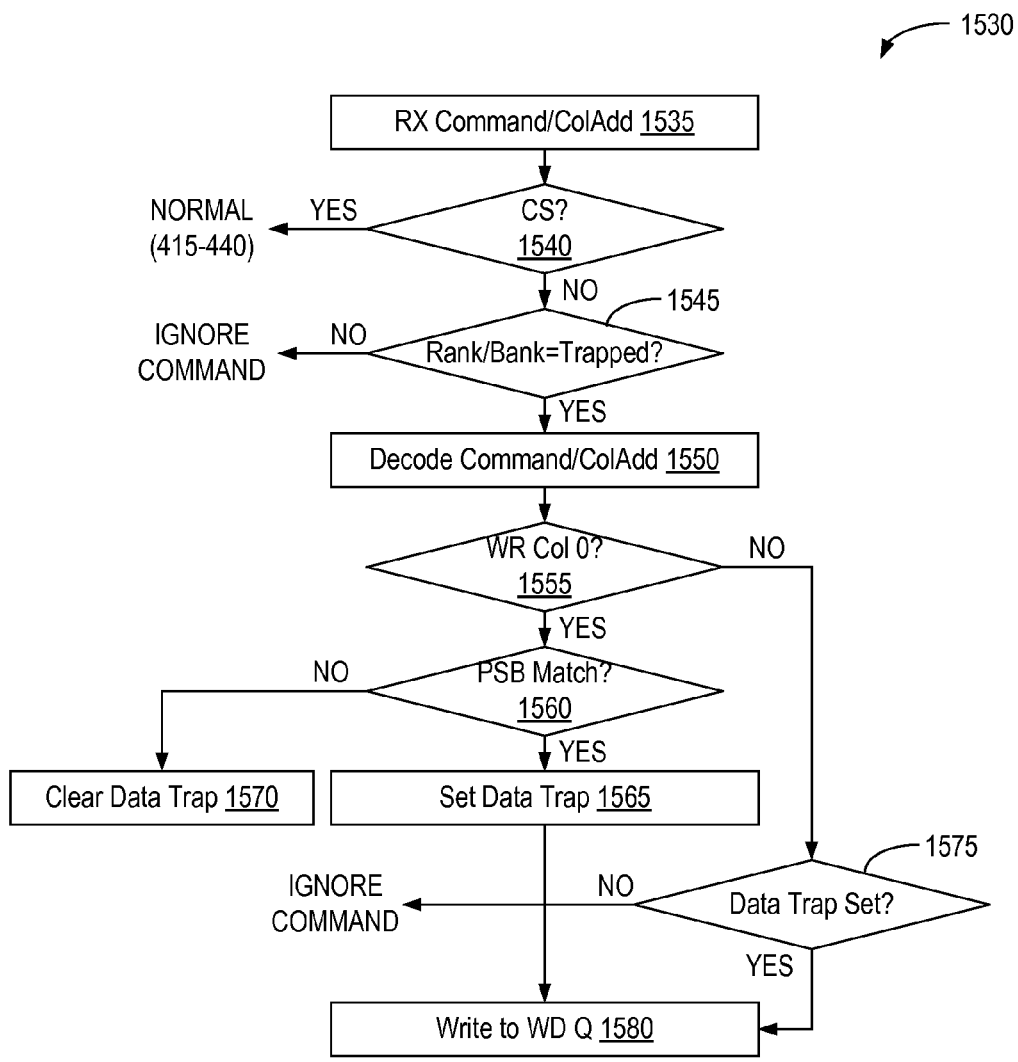
FIG. 15B is a flowchart 1530 depicting how a module 1300 associated with aperture B of FIG. 14 responds to a column-access command 1535.

Beginning at 1505, module 1300 receives an activate command on bus CA. As is conventional in some memory systems, the activate command specifies a chip-select CS, rank, bank, and row. In decision 1510, if the chip-select indicates the command is directed to a module 1300 in slot group B, then peripheral interface 1305 causes the module to respond normally to the memory request (e.g., to read from or write to main memory 120). If chip-select is not asserted, however, interface 1305 determines whether the command is nevertheless directed to its peripheral processor 135 by way of aperture B. Per decision 1515, if the row address (rank/bank/row) corresponds to the aperture row OPBA, then the command is to the aperture address, and may therefore be for either or both of the peripheral processors associated with slot groups A and B. In that case interface 1305 of the module in slot group B sets a rank/bank trap for subsequently received column-access commands (1520). As described below, this trap is to distinguish between column commands subsequently directed to the aperture from those directed to different ranks or banks. If the received command is neither to the OPBA row nor to the OPBA rank and bank (1522), then the command is simply ignored by the module 1300 of slot group B. If the received command is to the same rank and bank per decision 1522, then the command is to another row in the same rank and bank. In that case any trap set in 1520 for an earlier command is cleared (1525). A data trap, the purpose for which is explained below in connection with FIG. 15B, is also cleared in 1525. Module 1300 thus prepares itself to either consider or ignore subsequent column-access commands based on a specified OPBA row address despite the absence of a respective chip-select signal.

FIG. 15B is a flowchart 1530 depicting how a module 1300 associated with aperture B of FIG. 14 responds to a column-access command 1535. As is conventional, the column-access command specifies the rank and bank, but does not specify the row. If the command includes or is accompanied by a chip-select to module 1300, then interface 1305 perceives the command as a normal column access to main memory and responds accordingly by e.g. reading from or writing to main memory 120. If chip-select CS is not asserted, however, interface 1305 either ignores or decodes the command based upon whether the specified rank and bank corresponds to the OPBA row and the rank/bank trap was set in 1520 of FIG. 15A. As detailed previously, the rank/bank trap is set when an activate command is directed to the OPBA row absent a chip select signal. Subsequent column accesses to a different rank and bank that are not accompanied by a chip select are not to the OPBA, and are thus ignored. Subsequent column accesses to the same rank and bank are necessarily to the OPBA row if the trap remains set, however, and further consideration is necessary to determine whether such commands are directed to the module 1300 of slot group B.

In 1550, the command received in 1535 is decoded. If the command is a write to column zero, the designated OPBA in the examples used herein, then interface 1305 decodes a portion of the data that accompanies the column access command on data lines DQ using PSB decoder 1310. A field within the data, introduced above in connection with FIG. 10, is encoded to designate one or more modules. Any one or combination of modules on a given channel can therefore be selected to respond to a given command. If the PSB bits assigned to module 1300 match that of decoder 1310 (decision 1560), then interface 1305 sets a data trap 1565 and writes the incoming data to the write-data queue (1580). If the PSB bits do not refer to module 1300, then the incoming command is not for module 1300 and is consequently ignored. Interface 1305 clears the data trap, if set, and awaits the next command. PSB decoder can be configured at start-up or otherwise to uniquely identify the corresponding module 1300 on a given channel.

Returning to decision 1555, if the command is not a write to column zero, and the data trap was not set responsive to an earlier command, then the instant command is ignored. If the data trap was set, however, then the command writes data to the write-data queue (1580). Other operational steps of module 1300 are as detailed previously.

Figures 16, 17:
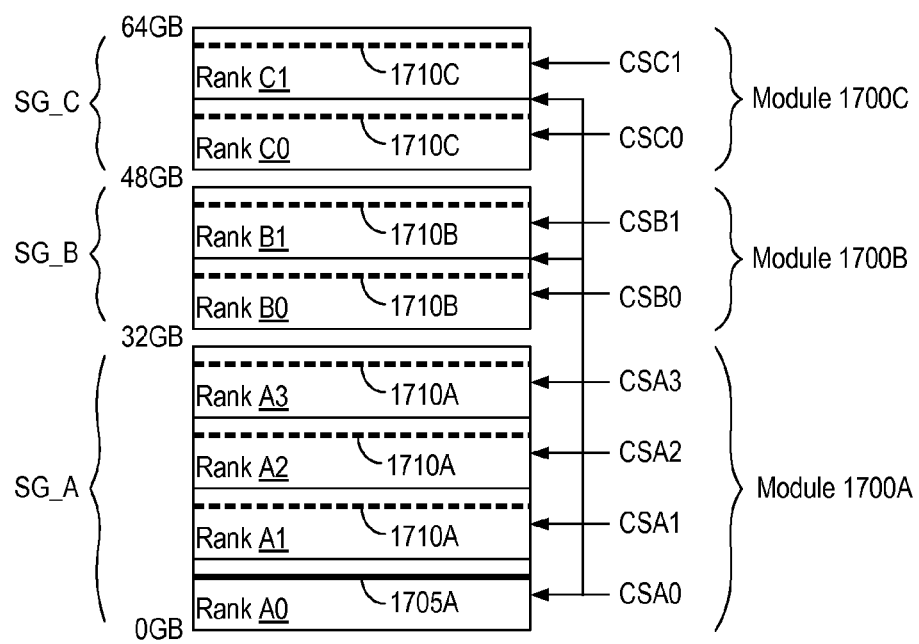
FIG. 16 is a table 1600 relating eight banks zero through seven to respective operations to be directed to one of apertures A, B, and C.
FIG. 17 depicts an address range 1700 spanning three memory modules 1700A, 1700B, and 1700C to illustrate how different memory modules can support broadcast commands in accordance with another embodiment.

FIG. 16 is a table 1600 relating eight bank addresses zero through seven to respective operations. In this embodiment the OPBA row address specifies the bank of the OPBA in addition to the row. The specified bank is used to direct an operation to any one or various combinations of apertures A, B, and C by specifying a corresponding bank address. Apertures A, B, and C may correspond to respective slot groups as detailed in connection with e.g. FIGS. 7-9. Bank bits are commonly low-order bits in the physical address mapping, and can be convenient for distinguishing between apertures or groups of apertures. Other bits may be used in other embodiments.

In the example of table 1600, write and read commands can be addressed to any one of apertures A, B, and C by specifying the respective one of banks zero, one, or two in the OPBA row address. Broadcast commands directed to the OPBA can specify one of banks four through seven to select any two or all three of apertures A, B, and C. Bank address bits can thus serve as peripheral select bits in a manner similar to what that detailed above in connection with FIGS. 13-15B. In this embodiment each module can be configured such that its peripheral interface recognizes a unique set of bank addresses associated with the OPBA row address. For example, the module supporting aperture A of table 1600 would be configured to respond to commands directed to recognize banks zero, four, five, and seven of the OPBA address row address.

FIG. 17 depicts an address range 1700 spanning three memory modules 1700A, 1700B, and 1700C to illustrate how different memory modules can support broadcast commands in accordance with another embodiment. In this example each module can include up to four ranks, and each rank is controlled by a respective chip-select signal (e.g., module 1700A includes ranks A[3:0], which are controlled by respective one-hot chip-select signals CSA[3:0]). All broadcast commands are directed to aperture address 1705A and accompanied by the assertion of chip-select signal CSA0 in this embodiment. Modules 1700B and 1700C examine peripheral select bits (e.g., bank bits) to determine whether to execute a command directed to aperture address 1705A.

Chip-select signal CSA0 is conveyed to modules 1700B and 1700C in this embodiment to allow them to distinguish between accesses to aperture address 1705A and the same address in other ranks. For example, addresses 1710A, 1710B, and 1710C are identical to aperture address 1705A: a memory controller (e.g. controller 144 of FIG. 1) uses the chip-select signals to distinguish between ranks Routing chip-select signal CSA0 to module 1700C allows module 1700C to distinguish between commands directed to aperture address 1705A and those directed to addresses 1710A or 1710B. Routing signal CSA0 to module 1700B likewise allows that module to distinguish between command directed to aperture address 1705A and those directed to addresses 1710A or 1710C.

More or different chip-select signals can be routed among the modules to provide greater flexibility in other embodiments. If each module has access to all chip-select signals, for example, the chip-select signals can be decoded in lieu of other peripheral select bits to select any one or combination of aperture addresses. Moreover, the modules can support additional apertures under control of their respective chip-select signals, as detailed above.

Figure 18:
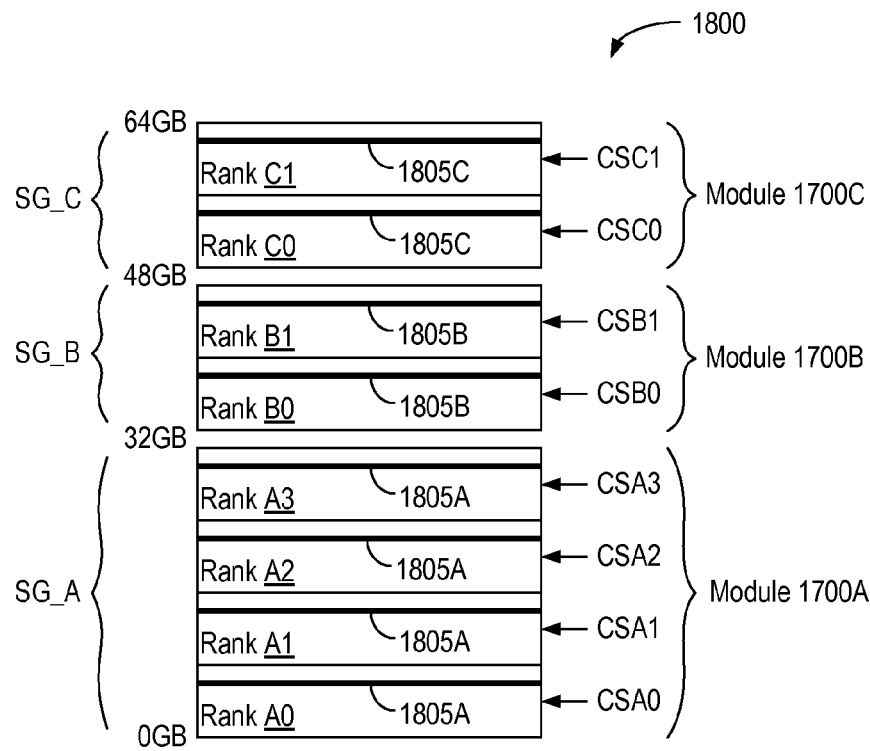
FIG. 18 depicts an address range 1800 spanning the three memory modules 1700A, 1700B, and 1700C introduced in FIG. 17 to illustrate how different memory modules can support broadcast commands without shared chip-select signals.

FIG. 18 depicts an address range 1800 spanning the three memory modules 1700A, 1700B, and 1700C introduced in FIG. 17 to illustrate how different memory modules can support broadcast commands without shared chip-select signals. This embodiment may be useful, for example, when the routing of chip-select signals to more than one module is incompatible with legacy memory systems. In this example, all broadcast commands are directed to four aperture addresses 1805A, one in each rank of module 1700A. The same address in each rank of modules 1700B and 1700C, respectively designated address 1805B and 1805C, is likewise set aside for each rank in those modules to serve as an aperture. All modules consider commands directed to the assigned aperture address in any rank of any module, and consider some form of peripheral select bits to determine whether to respond. A memory controller can thus issue commands to one or a combination of modules 1700A-C. Because the aperture is repeated for each rank, the modules can ignore the chip-select signals. As in other examples, the modules can support additional apertures under control of their respective chip-select signals.

Figure 19:
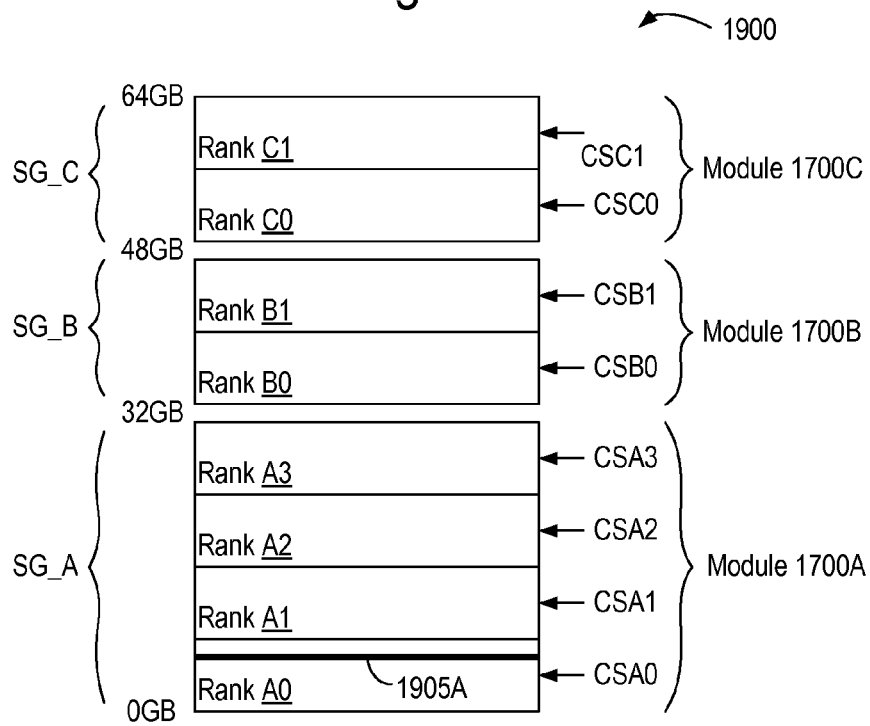
FIG. 19 depicts an address range 1900 similar to those of FIGS. 17 and 18 in accordance with an embodiment that employs a data key to distinguish broadcast commands absent a chip-select signal.

Other embodiments identify broadcast commands using a broadcast key. With reference to FIG. 5, for example, one quad-word (e.g., at QWORD Index 7) for each column address can be used to convey a 64-bit broadcast key. Each module could then examine each column-access command directed to the assigned aperture row address to determine whether it carried the broadcast key. With reference to FIG. 19, an address range 1900 similar to those of FIGS. 17 and 18, a single row address 1905A serves as the aperture for three modules 1700A-C. Module 1700A can distinguish aperture commands from other types of commands using chip-select CSA0, and modules 1700B and 1700C can use the embedded broadcast key to do the same.

The incorporation of keys to distinguish broadcast commands reduces the effective payload of such commands. There is also a probability that a non-broadcast command to the aperture row many inadvertently express the key, and thus be misinterpreted. For graphics applications, the result of such an error would likely be insignificant (e.g., the creation of an erroneous graphic artifact). Further, a sixty-four bit key gives a low likelihood of a false signature, and more or fewer bits can be used depending on the error sensitivity in a given solution. The key can also be a function of other bits in the broadcast command to reduce the likelihood of a false signature; this solution requires some processing overhead at both ends of the memory channel. In some embodiments broadcast commands can be disabled entirely for use with particularly sensitive operations.

Returning to FIG. 13, module 1300 combines the ability to accomplish peripheral processes, in the manner detailed previously, with support for DPP. SPD memory 1320 is initialized at start-up, using well known techniques, to configure bridge 1315 to manage a desired width. Module 1300 supports four data widths in this example, but more, fewer, or different widths can be available in other embodiments.

Figure 20A:
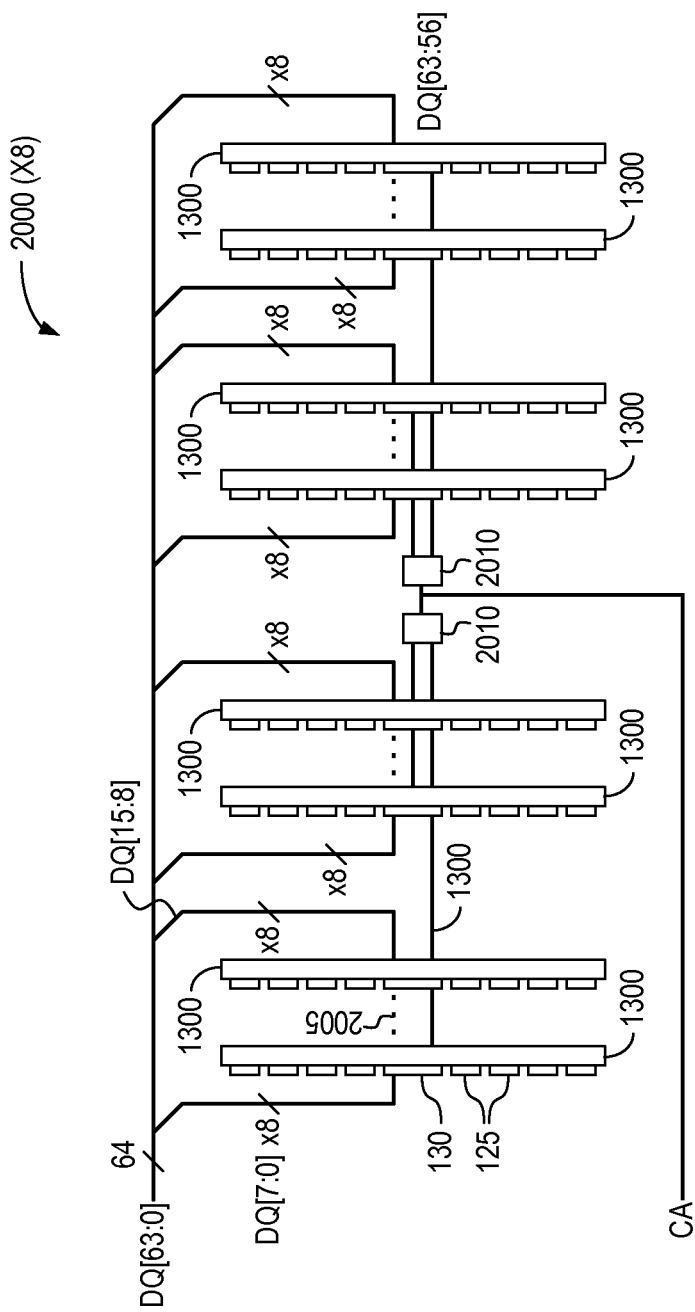
FIG. 20A depicts a DPP memory system 2000 in which each of eight modules 1300 is configured to support eight direct data connections to a memory controller (e.g., controller 144 of FIG. 1).

FIG. 20A depicts a DPP memory system 2000 in which each of eight modules 1300 is configured to support eight direct data connections to a memory controller (e.g., controller 144 of FIG. 1). The collection of modules 1300 is therefore able to communicate data DQ of width 64. Using the example of the leftmost two modules 1300, the far left module 1300 is directly connected to the controller via data lines DQ[7:0], and its neighbor via lines DQ[15:8]. An additional eight-wide data path 2005 extending between these two modules is not used in this configuration, and is therefore illustrated using a dashed line. The same command and address bus CA extends to each module 1300 via buffers 2010 that can be provided to ensure the modules do not unduly load the command and address signals, and consequently adversely impact signal integrity or speed performance.

Figure 20B:
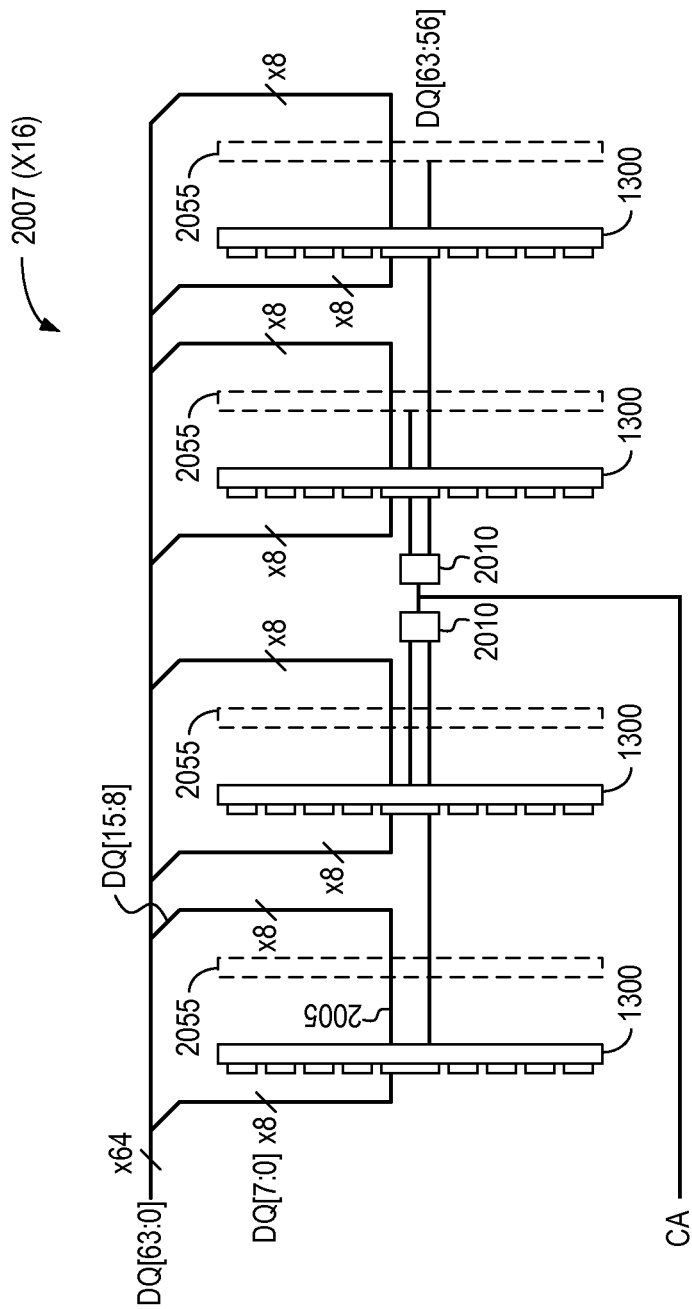
FIG. 20B depicts a DPP memory system 2007 in which each of four modules 1300 is configured to support sixteen direct data connections to the memory controller.

FIG. 20B depicts a DPP memory system 2007 in which each of four modules 1300 is configured to support sixteen direct data connections to the memory controller. Using the example of the leftmost module 1300, that module is directly connected to the controller via data lines DQ[15:0] (i.e., both set DQ[7:0] and set DQ[15:8]). Data path 2005 connects lines DQ[15:8] to ASIC 130 to provide the additional eight data connections. In some embodiments these connections are made using a shorting module 2055 in place of the absent module 1300. Other alternatives, such as various types of switches, shorting connectors, and trace options on printed circuit boards, might also be used to establish the requisite additional data connections. In still other embodiments the modules are fixed in place, as by soldering, in which case they are configured at manufacturing.

Returning to FIG. 13, module 1300 has state storage, such as SPD memory 1320, that is one-time or repeatedly programmable to indicate different data widths. The programmed state is used within bridge 1315 to set the effective data width of module 1300. Various types of state storage are possible. In the described embodiment, the state storage takes the form of a width selection register or latch. This type of state can be easily changed via software during system operation, allowing a high degree of flexibility, and making configuration operations that are transparent to the end user. However, other types of state storage are possible, including but not limited to manual jumper or switch settings. In any event, the value residing in the state storage changes or is changed when a module 1300 is added or removed from the system.

The memory capacity of each module 1300 does not change with width. Rather, wider data widths provide fewer address locations, and vice versa. Bridge circuit 156 is configurable to communicate ×64, ×32, ×16, or ×8 data via all or a subset of data lines DQ[63:0]. Data in widths less than ×64 are assembled into ×64 columns and communicated between main memory 120 and bridge 1315 via a 64-line bus. In other embodiments narrower data widths access fewer memory devices, or the devices themselves are width configurable.

The width configuration of installed memory modules 1300 need not be apparent to the memory controller. With reference to system 2000 of FIG. 20, for example, system 2000 can handle routine memory transactions conventionally. The memory controller issues commands CA associated with ×64 data on lines DQ[63:0], and each of the eight installed modules 1300 manages one-eighth of the data associated with the command.

Each module 1300 in the different width configurations of FIGS. 20A and 20B is capable of receiving commands directed to its respective peripheral processor. Peripheral commands can be conveyed to the modules simultaneously, with the number of simultaneous commands being equal to the number of modules 1300.

FIG. 21 illustrates a data structure 2100 that a peripheral driver (e.g., driver 146 of FIG. 1) assembles and stores in a cache to convey instructions and data to the OPBA command ports of eight ×8 modules 1300 in accordance with the example of FIG. 20A.

The memory controller communicates data over lines DQ[64:0] in bursts of eight. Peripheral commands are not that wide, however, as each module 1300 receives peripheral commands via only eight DQ lines. Peripheral commands are thus conveyed over the data lines as ×8 bytes, again in bursts of eight, for a total of 64 bits. Modules 1300 can distinguish between peripheral commands and data in the manner detailed above in connection with earlier embodiments.

Each burst is directed to a single column address, and the format for each burst to the aperture address is as detailed in FIG. 21 in this embodiment. With reference to data bit field D7, which corresponds to data lines DQ[63:56] and one of eight modules 1300, commands to column address zero include a Opcode OP7[7:0] at byte index zero; a burst-length field BL7[7:0] at byte index one; a write-mask bit M7 at one of eight bit positions in byte index 2. The five remaining bytes at indices three through seven are reserved.

Continuing with data field D7, a burst directed to column address 1 expresses a 64-bit address A7[63:0] as a burst of eight bytes 7:0; a burst directed to column address 2 includes 64 bits of write data WD7[63:0]; a burst directed to column address 3 conveys a write-data mask WM7[63:0]; a burst to any of the remaining column addresses 3:255 conveys additional write data. The remaining seven modules receive similar information via their respective data bit fields D[6:0].

Figure 22:
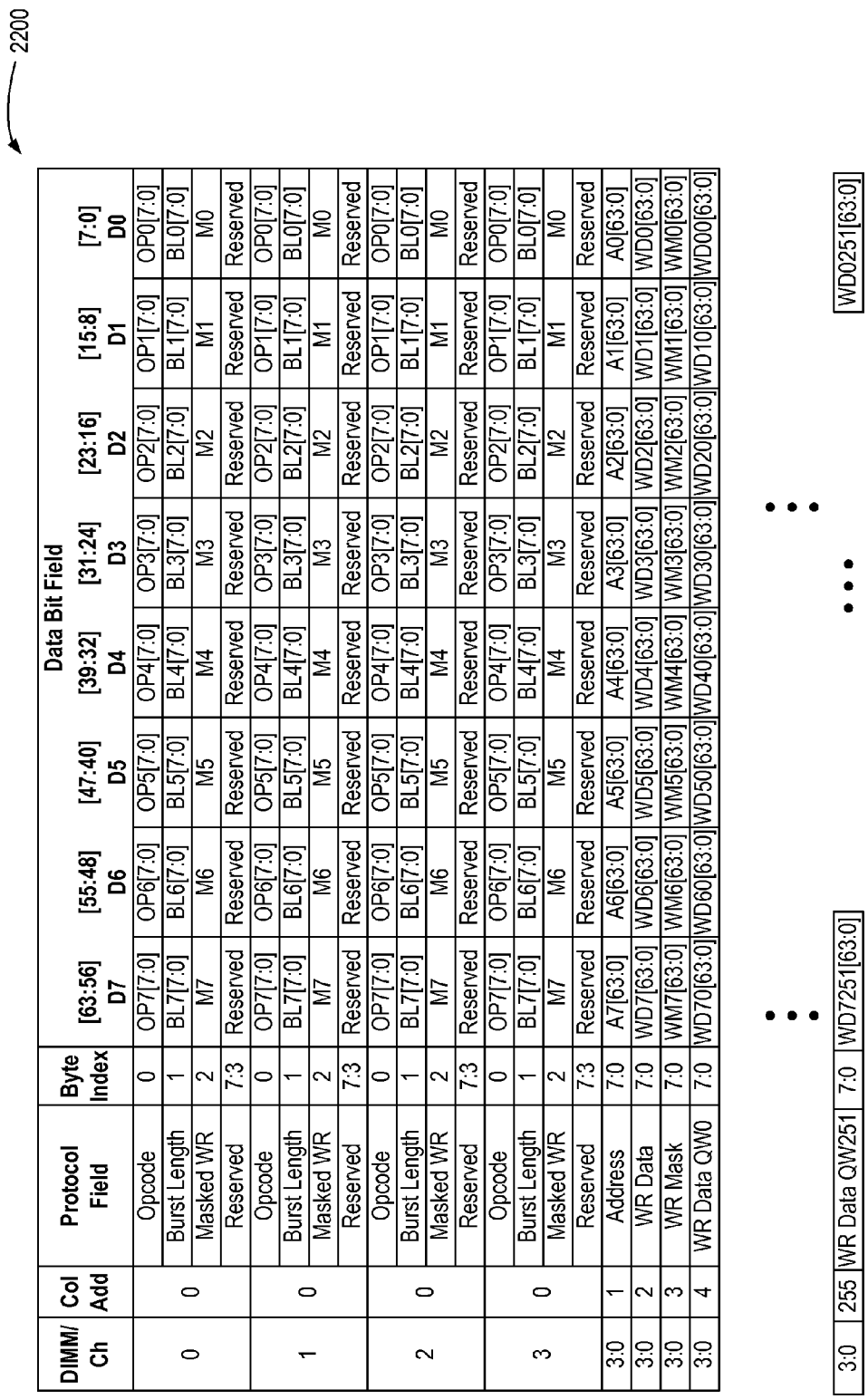
FIG. 22 illustrates a data structure 2200 that a peripheral driver (e.g., driver 146 of FIG. 1) assembles and stores in a cache to convey instructions and data to the OPBA command ports of thirty-two modules 1300, eight ×8 modules on each of four memory channels.

FIG. 22 illustrates a data structure 2200 that a peripheral driver (e.g., driver 146 of FIG. 1) assembles and stores in a cache to convey instructions and data to the OPBA command ports of thirty-two modules 1300, eight ×8 modules on each of four memory channels. The modules are dual in-line memory modules (DIMMs) in this example, but other module types can also be used. Data structure 2200 is similar to data structure 2100 of FIG. 21, but the format is extended to the four channels Ch[3:0] identified in the leftmost column. A four-channel memory system with fewer modules per channel is depicted in FIG. 7. Some embodiments additionally support PSB bit fields in support of broadcast commands in the manner detailed in connection with FIGS. 13, 14, 15A, and 15B.

FIG. 23 illustrates a data structure 2300 that a peripheral driver assembles and caches to convey instructions and data to the OPBA command ports of four ×16 modules 1300 in accordance with one embodiment of the example of FIG. 20B. Due to the greater number of DQ lines, the memory controller can communicate peripheral commands and related information as bursts of sixteen-bit words. Because the words are twice as wide as in the ×8 example, bursts are only half as long to convey the same total of 64 bits. The command format is otherwise identical to the example of FIG. 21.

Memory controllers buffer write data while awaiting write access. Memory controller that support "data forwarding" can respond to a processor read request for buffered data by forwarding the buffered data immediately rather than forcing the write operation to the memory, followed by a read access. In effect, the write buffer in the memory controller is used as a data cache. Memory modules in accordance with some embodiments support non-overlapping write and read address spaces within the command aperture to prevent data forwarding from interfering with commands directed to the OPBA.

Figure 24:
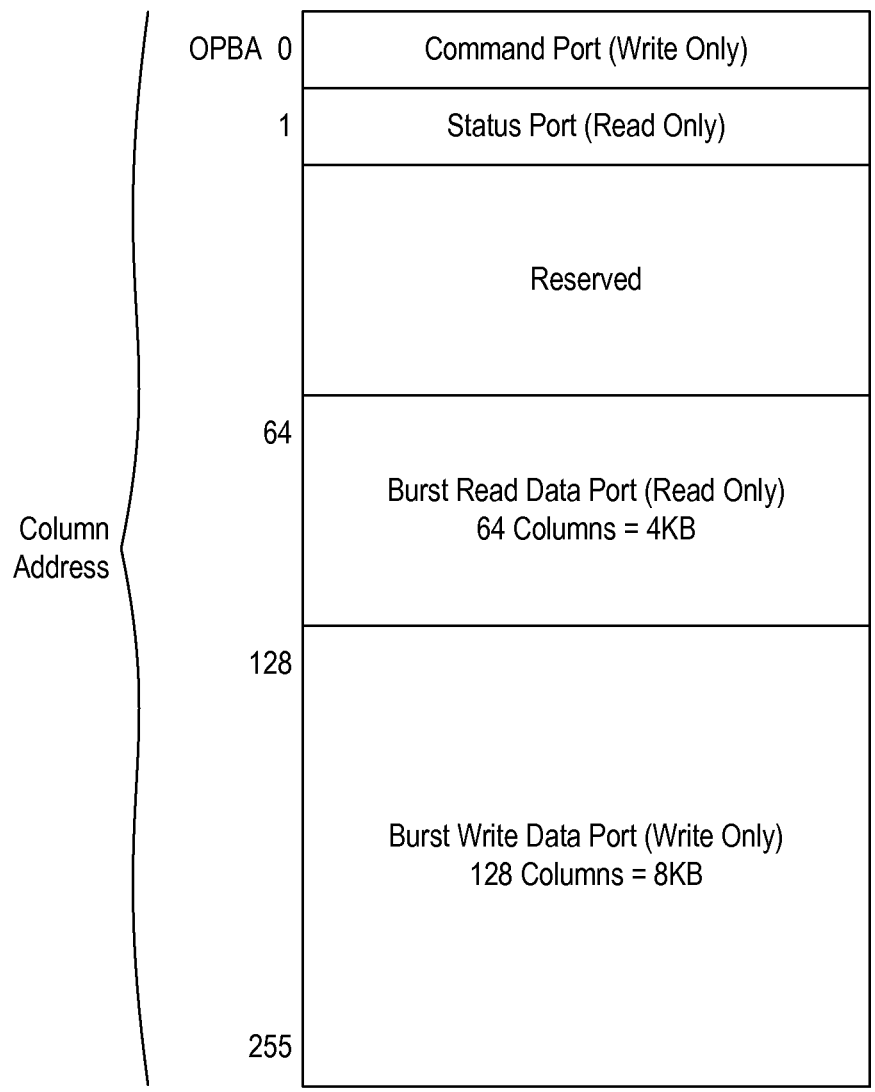
FIG. 24 provides an example of how a command aperture 2400 for a given memory channel can support non-overlapping write and read address spaces.

FIG. 24 provides an example of how a command aperture 2400 for a given memory channel can support non-overlapping write and read address spaces. Aperture 2400 includes a write command port at column address zero, a read status port at column address one, a burst-read data port at column addresses 64-127, and a burst-write data port at columns 128-255.

In operation, write commands directed to column address zero can be used to fill addresses 128-255, and read command directed to column address one can be used to read from addresses 64-127. The write and read address spaces do not overlap, so read commands are not directed to addresses that are potentially cached in the memory controller. The separate allocation of write and read address space thus avoids data forwarding hazards for commands directed to the aperture.

Figure 25A:
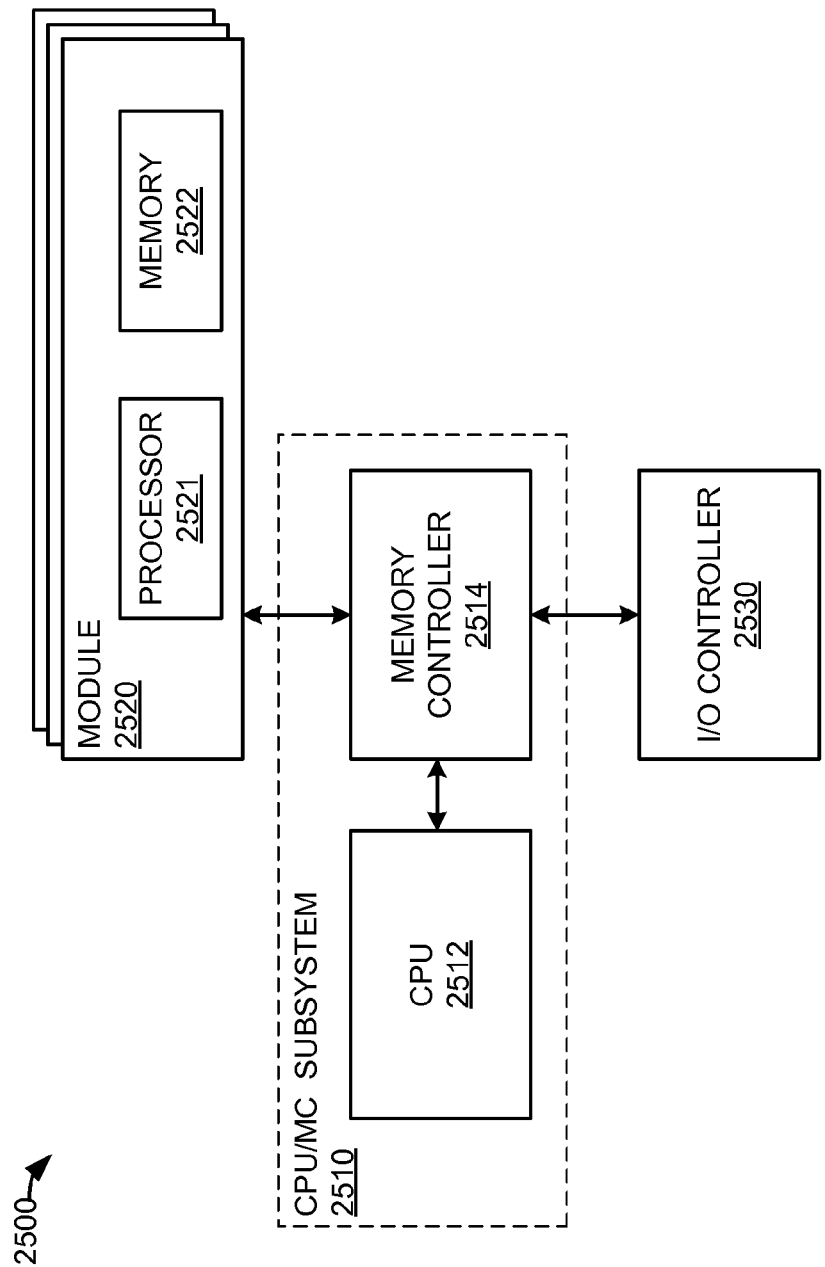
FIG. 25A is a block diagram illustrating an enhanced memory architecture.

FIG. 25A is a block diagram illustrating an enhanced memory architecture. In FIG. 25A, computer system 2500 comprises CPU/memory controller subsystem 2510, I/O controller 2530, and memory modules 2520. CPU/memory controller subsystem 2510 includes a CPU 2512 coupled to a memory controller 2514. One or more memory modules 2520 are coupled to memory controller 2514 in subsystem 2510. Each memory module 2520 includes a processor 2521 and memory 2522. Memory 2522 typically contains instructions and/or data used by the CPU 2512 and/or processor 2521. It should be understood that CPU 2512 may include multiple processor cores. CPU 2512 may include stacked die devices having one or more processors and/or memory stacked using, for example, though-silicon vias. CPU 2512 may include and/or be a specialized processor such as, for example, a digital signal processor, graphics processing unit (GPU), an array processor, storage management processor, data analytic processor (e.g., Hadoop distributed file system processor or a MapReduce processor), pattern recognition processor, and/or image manipulation processor (i.e., image processor). CPU 2512 can divide up and coordinate compute processes and tasks among modules 2520.

Processor 2521 may also be referred to as a "compute engine," "computing engine," "graphics processor," "rendering engine," "processing unit," "accelerator", "offload engine," and/or GPU. Processor 2521 may include and/or be a heterogeneous processing unit that includes the functions of one or more of a CPU, GPU, video processor, etc. Processor 2521 may include, or be, a serial-ATA (SATA), serial attached SCSI (SAS), eSATA, PATA, IEEE 1394, USB (all revisions), SCSI Ultra, FiberChannel, Infiniband, Thunderbolt, or other industry standard I/O interfaces (such as PCI-Express—PCIe). Processor 2521 may include, or be, a network processor unit (NPU) such as a TCP offload engine (TOE), a protocol translator (e.g., TCP over SATA, TCP over PCI-Express, accelerated SCSI interconnect, etc.), and/or a protocol packet translator. Processor 2521 may include, or be, a fixed function graphics processing unit, an encryption/decryption accelerator/offload engine (e.g., for implementing/accelerating SSL, AEC, DEC, etc.), a digital signal processor (DSP), a signal path processor, a Fourier transform processor, an inverse Fourier transform processor, and/or a media format encoder/decoder (e.g., JPEG, DVX, AVI, MP2, MP3, MP4, Blu-ray, HD-DVD, DVD, etc.). It should also be understood that module 2520 may be coupled to a local SSD/HDD and/or enterprise storage type systems such as external disks, external disk arrays, JBODs, RAID arrays, tape drives, optical drives, and the like.

Memory 2522 typically includes multiple memory devices coupled together to form a block of storage space. Memory 2522 may be, or comprise, but is not limited to, SRAM, DDR3, DDR4, DDR5, XDR, XDR2, GDDR3, GDDR4, GDDR5, LPDDR, and/or LPDDR2 and successor memory standards and technologies. Memory 2522 may be or comprise a stack of devices such as a through-silicon-via (TSV) stack and/or a hybrid memory cube (HMC). Further information about HMC is available from the Hybrid Memory Cube Consortium (http://hybridmemorycube.org/).

Each processor 2521 is capable of performing various memory access and/or data processing functions. For the embodiment shown in FIG. 25A, memory controller 2514 is also coupled to an I/O controller 2530 which controls the flow of data into and out of the system. An optional video input port (not shown in FIG. 25A) can provide data to memory controller 2514. A display interface (not shown in FIG. 25A) can provide data output to one or more devices (such as display devices or storage devices). For systems which support video input or capture capability, a video input port on the memory controller 2514 is one way to handle the delivery of video source data. Another means of delivery of video input data to the system would include delivering the data from a peripheral module through the I/O controller 2530 to memory controller 2514.

In the example of FIG. 25A, CPU/memory controller subsystem 2510 is coupled to multiple distinct memory modules 2520. Each memory module 2520 includes a processor 2521 and memory. Each processor 2521 is capable of performing various data processing functions. Thus, the processor 2521 on different (or the same) memory modules are capable of performing different processing functions simultaneously (i.e., parallel processing). The processors 2521 on different (or the same) memory modules are capable of performing vector parallel processing where functions are vectorized and divided among the processors 2521. The processors 2521 on different (or the same) memory modules are capable of performing cluster parallel processing where the processors 2521 cooperate to work on the same problem simultaneously (or concurrently). Further, each processor 2521 is capable of communicating with other processors 2521 on other memory modules 2520.

Each processor 2521 is capable of communicating with other processors 2521 on other memory modules 2520 with the aid of CPU 2512 and/or memory controller 2514. Modules 2520 and/or processors 2521 may be heterogeneous. In other words, modules 2520 and/or processors 2521 may not all be identical. Processors 2521 may include multiple processor cores that are not all identical. For example, processors 2521 may comprise a mix of CPU type and GPU type processing cores. Modules 2520 and/or processors 2521 may perform different functions at the same time. Modules 2520 and/or processors 2521 may be produced by different vendors. Modules 2520 and/or processors 2521 produced by different vendors may be added, subtracted, and used interchangeably in a plug-and-play manner. Modules 2520 and/or processors 2521 may function in parallel running independent (and non-independent) copies of software, processes, applications, and operating systems similar to how virtual machines operate.

CPU 2512 can control memory controller 2514 to distribute particular processing tasks (such as graphical processing tasks) to processors 2521, and can perform certain processing tasks itself. These tasks may include data to be processed and/or instructions to be executed. Although three memory modules 2520 are shown in FIG. 25A, alternate system may contain any number of memory modules coupled to memory controller 2514. The ability to add and remove memory modules 2520 can provide an upgradeable and scalable memory and computing architecture.

CPU 2512 may communicate with processor 2521 by reading from, and writing to, an address aperture associated with processor 2521. CPU 2512 can be configured to use any cache policy supported by processor CPU 2512 to read from, and write to, this address aperture (or portions thereof). However, it should be understood that, in an embodiment, the most useful cache policies may be limited to configuring the address aperture (or portions thereof) to be treated by CPU 2512 as uncacheable memory (UC), write combining memory (WC), or write back (WB). In an embodiment, these cache policies may be combined with the use of certain instructions (e.g., fence instructions, streaming load instructions, and/or streaming write instructions) to achieve an optimal (e.g., highest) communication bandwidth CPU 2512 and processor 2521. In addition, when the address aperture (or portions thereof) are configured to be treated as WC or WB, at least a minimum burst size may be used to achieve an optimal (e.g., highest) communication bandwidth between CPU 2512 and processor 2521. In other words, small burst sizes (e.g., less than a certain, implementation dependent, number of column addresses per burst) may result in less than optimal communication bandwidth between CPU 2512 and processor 2521. Larger sizes (e.g., greater than a certain, implementation dependent, number of column addresses per burst) may approach (or approximate) an optimal (e.g., highest) communication bandwidth between CPU 2512 and processor 2521.

It may also be useful to configure the address aperture (or portions thereof) to be UC for testing, ease of implementation, and/or when the bandwidth between CPU 2512 and processor 2521 is not a relatively high priority. Configuring the address aperture (or portions thereof) to be WB may be most useful for testing purposes. Configuring the address aperture (or portions thereof) to be WC may, in some embodiments, result in the highest bandwidth between CPU 2512 and processor 2521.

The architecture of FIG. 25A allows CPU 2512 to issue high level primitive commands to the processors 2521 via memory controller 2514. These high level primitive commands may include graphics commands. This can reduce the volume or bandwidth of data that must be communicated between the memory controller 2514 and memory modules 2520. Thus, the partitioning of memory among multiple memory modules 2520 improves data throughput relative to systems in which a single CPU 2512 and/or graphics controller performs all processing tasks. A bandwidth reduction to/from CPU 2512 can occur because primitive commands and data sent to memory modules 2520 typically require significantly less data than the amount of data referenced when rendering the primitive. This is because graphics primitives are typically expressed at a higher level of abstraction. For example, a tessellated surface involving many thousands of primitives (i.e., triangles) is not send though as many thousands of primitives. Instead, a parametric function describing the surface is sent though, thus saving memory bandwidth. Additionally, the system partitioning described allows aggregate bandwidth between processors 2521 and memory 2522 to be much higher than the bandwidth between memory controller 2514 and memory modules 2520. Thus, the effective system bandwidth can increased for processing tasks.

Figure 25B:
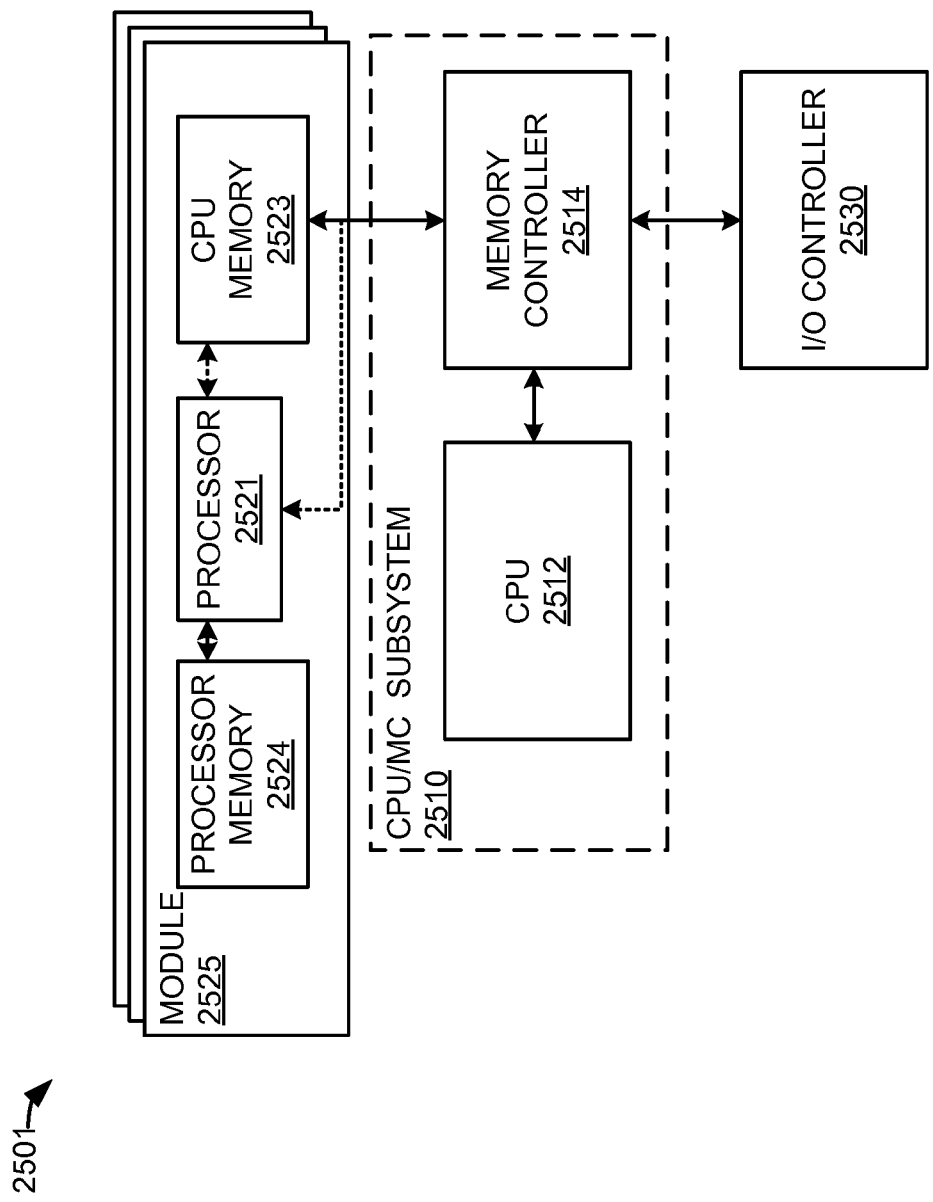
FIG. 25B is a block diagram illustrating an enhanced memory architecture with allocated local memory.

FIG. 25B is a block diagram illustrating an enhanced memory architecture with allocated local memory. In FIG. 25B, computer system 2501 comprises CPU/memory controller subsystem 2510, I/O controller 2530, and memory modules 2525. CPU/memory controller subsystem 2510 includes CPU 2512 coupled to memory controller 2514. One or more memory modules 2525 are coupled to memory controller 2514 in subsystem 2510. Each memory module 2525 includes a processor 2521, CPU memory 2523, and processor memory 2524. CPU memory 2523 typically contains instructions and/or data used by the CPU 2512. Processor memory 2524 typically contains instructions and/or data used by processor 2521. Processor memory 2524 may be a local memory dedicated for use by processor 2521, such as a cache to other memory, scratchpad memory, or memory on a system-on-a-chip—SoC—that includes processor 2521. Processor memory 2524 may be DRAM memory dedicated for use by processor 2521, or DRAM memory that is flexibly allocated between use by processor 2521 and use by CPU 2512.

FIG. 25C is a block diagram illustrating an enhanced memory architecture. In FIG. 25C, computer system 2502 comprises CPU/memory controller subsystem 2510, I/O controller 2530, and memory modules 2551-2553. CPU/memory controller subsystem 2510 includes a CPU 2512 coupled to a memory controller 2514. One or more memory modules 2551-2553 are coupled to memory controller 2514 in subsystem 2510. Each of memory modules 2551-2553 includes a processor 2561-2563, respectively, and memory 2571-2573, respectively. Memories 2571-2573 typically contain instructions and/or data used by the CPU 2512 and/or a processor 2561-2563 on a respective memory module 2551-2553. As described herein, CPU 2512 can divide up and coordinate compute processes and tasks among modules 2551-2553.

Each processor 2561-2563 is capable of performing various memory access and/or data processing functions. It should be understood that processors 2561-2563 on modules 2551-2553 correspond to processor 2521 on modules 2520 described herein. Accordingly, for the sake of brevity, the discussion of the types of processors that processors 2561-2563 can be, and the functionality of processors 2561-2563, and their relationship to the other elements (e.g., CPU 2512) of system 2502 will not be repeated here. Likewise, it should be understood that memories 2571-2573 on modules 2551-2553 correspond to memory 2522 described herein. Accordingly, for the sake of brevity, the discussion of the types of memory devices that memories 2571-2573 can be, the functionality of memories 2571-2573 and their relationship to other elements of system 2502 will not be repeated here.

FIG. 25D is a block diagram illustrating an enhanced memory architecture with secured features. In FIG. 25D, computer system 2503 comprises CPU/memory controller subsystem 2510, I/O controller 2530, and memory modules 2526. CPU/memory controller subsystem 2510 includes CPU 2512 coupled to memory controller 2514. One or more memory modules 2526 are coupled to memory controller 2514 in subsystem 2514. Each memory module 2526 includes processor 2521, secure processor 2581, memory 2522, and nonvolatile memory 2582. Memory 2522 typically contains instructions and/or data used by the CPU 2512 and/or processor 2521. Nonvolatile memory 2582 typically contains instructions and/or data used by secure processor 2581. For example, nonvolatile memory 2582 may contain data that enable/disables various functions/circuitry on modules 2526.

The module 2526 illustrated in FIG. 25D includes a multiple time programmable nonvolatile memory 2582 and a secure processor 2581. Secure processor 2581 may be used to prevent module 2526 from being used for/in/by unauthorized: applications, systems, OEMs, configurations. Thus, secure processor 2581 can be configured to allow only authorized users to access nonvolatile memory 2582 which controls and/or initializes module 2526. Secure processor 2581 can be configured so that certain functions of the module 2526 can only be performed if the correct key is provided. These functions may relate to anti-counterfeiting measures; IP licensing; video content protection (e.g., when processor 2521 is an MPEG decoder), and configuration for multiple SKU's (e.g., shutdown of processor 2521 cores on low cost memory modules, etc.).

It should be understood that memory modules 2520, memory modules 2525, memory modules 2526, and/or memory modules 2551-2553 may be and/or contain elements of memory module 110 and memory module 1110, described previously. Thus, for example, processor 2521 may be, correspond to, or function like, peripheral processor 135, described previously. Similarly, it should be understood that memory modules 2520, memory modules 2525, memory modules 2526, and/or memory modules 2551-2553 may include other circuitry not shown in FIG. 25A, FIG. 25B, or FIG. 25C. For example, memory modules 2520, memory modules 2525, memory modules 2526, and/or memory modules 2551-2553 may include, for example, ASIC 130 and/or ASIC 1105, and/or any of their components, and/or functionality, as described previously, or hereinafter. Memory modules 2520, memory modules 2525, memory modules 2526, and/or memory modules 2551-2553, ASIC 130 and/or ASIC 1105, and/or any of their components, and/or functionality, as described previously, or hereinafter may be, or comprise, package-on-package (POP) devices, through-silicon-via packaged devices, die stacks, thinned dies, micro-bump packages, flip-chip stacked devices, flip-chip stacking of thinned TSV micro-bumped die, die-to-substrate flip-chip attached devices, die-to-die flip-chip micro-stacked devices, die-to-wafer stacked device, or other present or future "module-in-a-package" technologies.

Figure 26A:
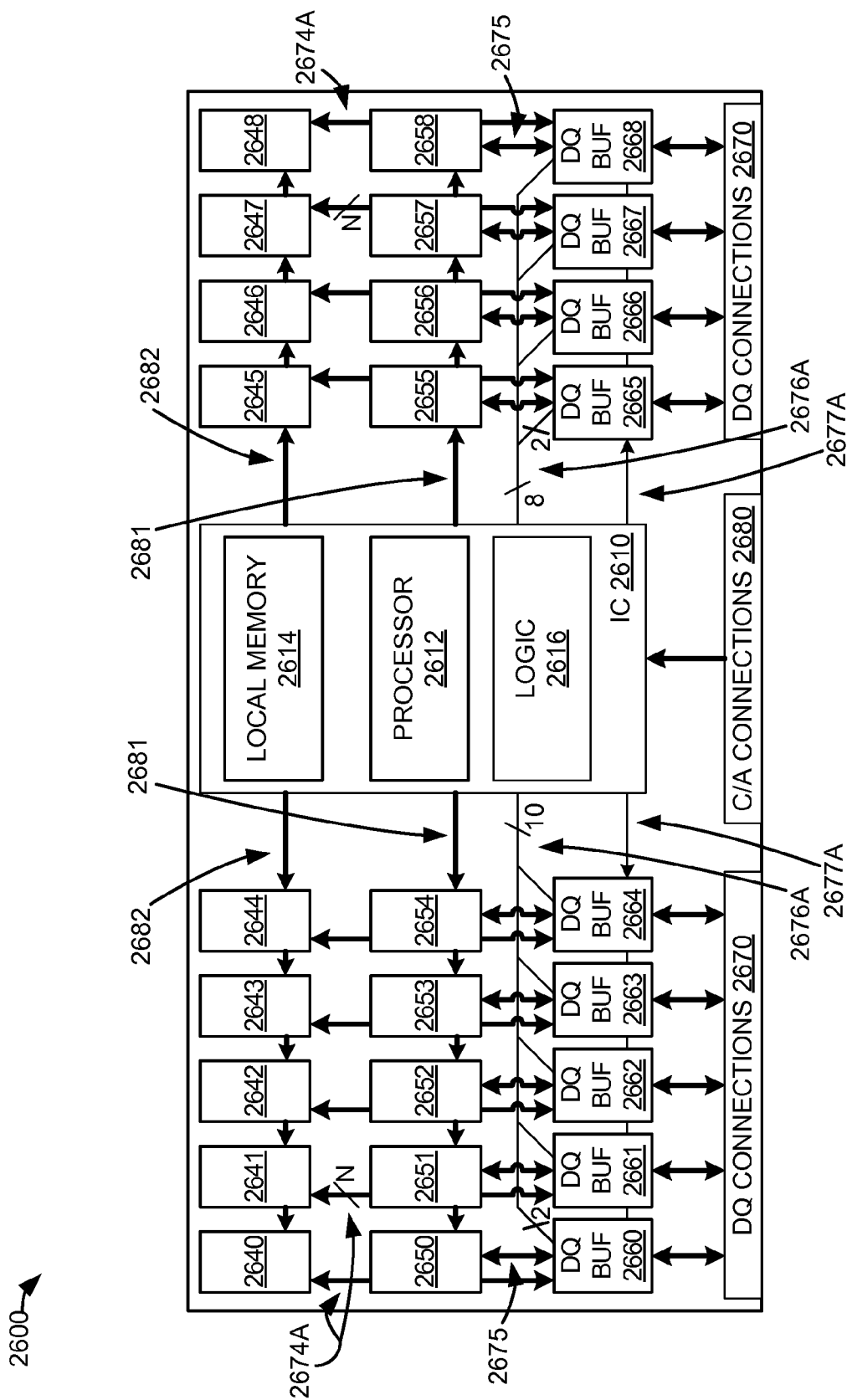
FIG. 26A is a block diagram illustrating a compute accelerated memory module.

FIG. 26A is a block diagram illustrating a compute accelerated memory module. FIG. 27A is a block diagram illustrating further detail of a compute accelerated memory module. Memory module 2600 illustrated in FIG. 26A and FIG. 27A may be used as one or more of memory modules 2520, memory modules 2525, and/or memory modules 2526, discussed herein. Memory module 2600 comprises integrated circuit (IC) 2610, first rank of memory 2640-2648, second rank of memory 2650-2658, DQ buffers 2660-2668, DQ connections 2670, and command/address (C/A) connections 2680. IC 2610 can include local memory 2614, processor 2612, and logic 2616. In FIGS. 26A-26C and FIGS. 27A-27C local memory 2614 is shown as part of IC 2610. However, it should be understood that in some embodiments local memory 2614 may not be part of IC 2610. Local memory 2614 may comprise an integrated circuit(s) or module(s) (discrete parts or through-silicon-via memory stack) separate from IC 2610. Local memory 2614 may be, for example, stacked with IC 2610. Similarly, first rank of memory 2640-2648 and/or second rank of memory 2650-2658 may be, or comprise, stacked integrated circuits or integrated circuit packages.

In the configuration shown in FIG. 26A and FIG. 27A, C/A signals received at C/A connections 2680 are buffered by IC 2610 and sent to memories 2650-2658 via links 2681. C/A signals received at C/A connections 2680 are also buffered by IC 2610 and sent to memories 2640-2648 via links 2682. Thus, IC 2610 necessarily includes command/address interfaces (not explicitly shown in FIG. 26A) configured to connect to memories 2640-2648 and memories 2650-2658. DQ signals received/sent by DQ buffers 2660-2668 from DQ connections 2670 are sent/received to/from memories 2650-2658 via N bit wide links 2675. DQ signals received/sent by DQ buffers 2660-2668 from DQ connections 2670 are sent/received to/from memories 2640-2648 via N bit wide links 2674A. DQ signals received/sent by DQ buffers 2660-2668 from DQ connections 2670 are sent/received to/from IC 2610 via high speed unidirectional serial links 2676A. There are two serial links 2676A per DQ buffer 2660-2668—one for sending data to IC 2610, and one for receiving data from IC 2610. In an embodiment, these serial links 2676A operate at N times the rate of DQ connections 2670. In another embodiment, these serial links 2676A operate at M times the rate of DQ connections 2670, where M<=N. Thus, for example, when N=8 and M=8, the serial links 2676A are able to send/receive data to/from IC 2610 at the same rate data is being sent/received by memories 2640-2648 and 2650-2658. DQ buffers 2660-2668 may be controlled by IC 2610 to send/receive data on links 2676A and/or capture DQ data by one or more buffer control signals 2677A.

Processor 2612 can communicate with a memory controller by emulating a range of memory (i.e., an aperture) as described previously. Processor 2612 (or IC 2610) can send/receive data via links 2676A and the DQ connections 2670 to/from the memory controller.

Two unidirectional (one read data, one write data) high-speed serial connections between the DQ buffers 2660-2668 and IC 2610 provide for communication between the memory controller and IC 2610. This allows data captured by the DQ buffers (registers) 2660-2668 to be sent/received in parallel to the memory ranks 2640-2648 and 2650-2658 while being simultaneously sent/received to/from IC 2610 via the serial links 2676A. The serial links 2676A operate at, for example, 8 times the rate of the DQ links 2674A and 2675 to the memories 2640-2648 and 2650-2658. Serial links 2676A may operate at, for example, 8× the DDR3 rate in order to transfer to the processor, in the same amount of time as it would take to complete a transfer to memory, the 8 bits being transferred to/from the memory controller. In various embodiments, serial links 2676A may operate at other multipliers (e.g., 4× or 16×) and at, or more than, the data rates of other memory technologies mentioned herein (e.g., DDR4, DDR5, etc.) In FIG. 26A and FIG. 27A, all of the memory ranks 2640-2648 and 2650-2658 are configured as operating system (OS) visible memory (i.e., CPU memory 2523). Processor 2612 can use local memory 2614 to perform its assigned tasks and/or as a cache for one or both of memory ranks 2640-2648 and 2650-2658.

In an embodiment, it should be understood that memory module 2600 includes a memory interface (e.g., C/A connections 2680) configured to interface to a memory controller (e.g., memory controller 2514 and/or memory controller 144.) Memory module 2600 includes an integrated circuit device (e.g., IC 2610) that is coupled to the memory interface. The integrated circuit device includes a processor (e.g., processor 2612), a first command/address interface coupled to the processor and configured to connect to a first plurality of dynamic memory integrated circuits (e.g., the interface coupled to links 2681), and a second command/address interface coupled to the processor and configured to connect to a second plurality of dynamic memory integrated circuits (e.g., the interface coupled to links 2682).

Memory module 2600 also includes the first plurality of dynamic memory integrated circuits (e.g., memories 2650-2658), the second plurality of dynamic memory integrated circuits (e.g., memories 2640-2648), and at least one data buffer integrated circuit (e.g., one or more of DQ buffers 2660-2668). The first plurality of dynamic memory integrated circuits are coupled to the first command/address interface (e.g., by links 2681). The second plurality of dynamic memory integrated circuits are coupled to the second command/address interface (e.g., by links 2682). The at least one data buffer integrated circuit is coupled to the first plurality of dynamic memory integrated circuits (e.g., by links 2674A) and the second plurality of dynamic memory integrated circuits (e.g., by links 2675). The at least one data buffer integrated circuit is coupled to the memory interface (e.g., DQ connections 2670). The at least one data buffer integrated circuit are each coupled to the integrated circuit device by at least a read serial link and a write serial link (e.g., links 2676A).

DQ buffers 2660-2668 may communicate data from the integrated circuit device in response to a transaction on the memory interface that is directed to a memory aperture associated with IC 2610 (for example, as described previously DQ buffers 2660-2668 may transfer data to and from memories 2650-2658 and 2640-2648 at a first information rate (e.g., the DDR3—or other memory technology mentioned herein—byte rate) and links 2676A may be configured to transfer data to and from IC 2610 at a second information rate that is at least the first information rate (e.g., the DDR3—or other memory technologies mentioned herein—byte rate or higher—or equivalently, a bit rate of 8× the DDR3 byte rate, or higher). Links 2676A may be serial links, or may have a width greater than one bit so long as the second information rate of links 2676A is at least the first information rate. IC 2610 may include a local memory interface that is coupled to processor 2612. This local memory interface may be coupled to at least one integrated circuit memory device (e.g., local memory 2614). It should also be understood that, in some embodiments, links 2676A can use single-ended signaling and other embodiments use differential signaling. Likewise, in some embodiments, links 2676A can be unidirectional and in other embodiments links 2676A can be bidirectional.

In another embodiment, an integrated circuit device (e.g., IC 2610) may receive, from a memory interface (e.g., C/A connections 2680), a first memory command directed to a first rank of dynamic memory integrated circuit devices disposed on the memory module (e.g., a read command directed to an address stored in memories 2640-2648). The integrated circuit device can include a processor (e.g., processor 2612). For example, IC 2610 may receive, via C/A connections 2680, a memory read command from a memory controller. This memory read command may select memories 2640-2648. IC 2610 may relay this command to memories 2640-2648 thereby initiating a read burst from memories 2640-2648.

In response to the first memory command, data from the first rank of dynamic memory integrated circuit devices that is associated with the first memory command is stored in at least one data buffer integrated circuit. For example, in response to a read command directed to an address stored in memories 2640-2648, DQ buffers 2660-2668 may latch (store) the read data output by memories 2640-2648 as a response to the read command (as relayed by IC 2610).

Under the control of the integrated circuit device, the data associated with the first memory command is communicated from the at least one data buffer integrated circuit to the memory interface such that the first rank of dynamic memory integrated circuit devices are accessible to the memory controller. For example, IC 2610 may use one or more buffer control signals 2677A to cause DQ buffers 2660-2668 to output the read data they latched onto DQ connections 2670. The memory controller can receive this read data from DQ buffers 2660-2668 thereby completing a read access, of memories 2640-2648, by the memory controller.

The integrated circuit device may receive, from the memory interface, a second memory command directed to the first rank of dynamic memory integrated circuit devices (e.g., a second read command directed to an address stored in memories 2640-2648). This memory read command may or may not select memories 2640-2648. IC 2610 may optionally relay this command to memories 2640-2648 thereby initiating a read burst from memories 2640-2648. IC 2610 may, for example, intercept this read command and not relay it to memories 2640-2648. This may reduce power consumption. IC 2610 may use the memory cycles associated with this command for its own purposes.

In response to the second memory command, data from the integrated circuit that is associated with the second memory command is stored in at least one data buffer integrated circuit. For example, in response to a read command directed to an aperture associated with IC 2610, IC 2610 may send, via links 2676A, data to DQ buffers 2660-2668 to be latched (stored).

Under the control of the integrated circuit device, the data associated with the second memory command is communicated from the at least one data buffer integrated circuit to the memory interface such that data processed by the processor is accessible to the memory controller. For example, IC 2610 may use one or more buffer control signals 2677A to cause DQ buffers 2660-2668 to output, on DQ connections 2670, the data received from IC 2610 via links 2676A. This data may have been processed by processor 2612. The memory controller can receive this read data from DQ buffers 2660-2668 thereby completing a read access, by the memory controller, of the aperture associated with IC 2610 (and thereby also associated with processor 2612).

The integrated circuit device may also control the at least one data buffer integrated circuit to communicate the data associated with the first memory command to the integrated circuit. For example, IC 2610 may use one or more buffer control signals 2677A to cause DQ buffers 2660-2668 to output the read data associated with the first memory command onto one or more links 2676A. In this manner, IC 2610 can "snoop" all or part of the data associated with memory transactions that read memories 2640-2648. In other words, IC 2610 can see and/or capture all or part of the data associated with memory transactions that read memories 2640-2648 so that IC 2610 may use this data and/or memory transactions for its own purposes independent of the data stored in memories 2640-2648. For example, snooping may be used for cache-coherency. Typical programs and data that may be used by processor 2612 may exhibit spatial and temporal locality. Thus, using local memory 2614 as a cache for dedicated dynamic memory may provide a performance benefit.

The integrated circuit device may also be coupled to a memory that its processor uses as a local memory or cache. This cache may be used to cache data stored in the first rank of dynamic memory integrated circuit devices. The data supplied to the at least one data buffer integrated circuit may have been stored in this local memory (or cache) prior to being sent by the integrated circuit device to the at least one data buffer integrated circuit. For example, IC 2610 may satisfy the read of the aperture associated with IC 2610 using data that was stored in local memory 2614 at one time or another prior to the read of the aperture by the memory controller. Similar to the access steps described above, a third memory command may cause data stored in a second rank of dynamic memory integrated circuit devices to be stored in the at least one data buffer integrated circuit. For example, data stored in memories 2650-2658 may be read by the memory controller using similar steps to previously described for accessing (and snooping) memories 2640-2648.

A write to the first rank of dynamic memory integrated circuit devices is performed in a similar manner to a read, except with the data flows reversed. In other words, to perform a write to memories 2640-2648: (1) a write command is received by IC 2610 via C/A connections 2680 and relayed to memories 2640-2648; (2) the write data is latched from DQ connections 2670 into DQ buffers 2660-2668; and, (3) the write data is communicated to memories 2640-2648 via links 2674A at the appropriate time. Likewise, a write to the aperture associated with the integrated circuit device is performed in a similar manner to a read with the data flows reversed. In other words, to perform a write to the aperture associated with IC 2610: (1) a write command is received by IC 2610 via C/A connections 2680 and may optionally be relayed to memories 2640-2648; (2) the write data is latched from DQ connections 2670 into DQ buffers 2660-2668; and, (3) the write data is communicated to IC 2610 via links 2676A. This write operation gives processor 2612 and any other part of IC 2610 access to data being written to the aperture associated with IC 2610. IC 2610 can also snoop data being written to memories 2640-2648. In other words, IC 2610 can see and/or capture all or part of the data associated with memory transactions that write memories 2640-2648 so that IC 2610 may use this data and/or memory transactions for its own purposes independent of the data stored (or being stored) in memories 2640-2648.

Figure 26B:
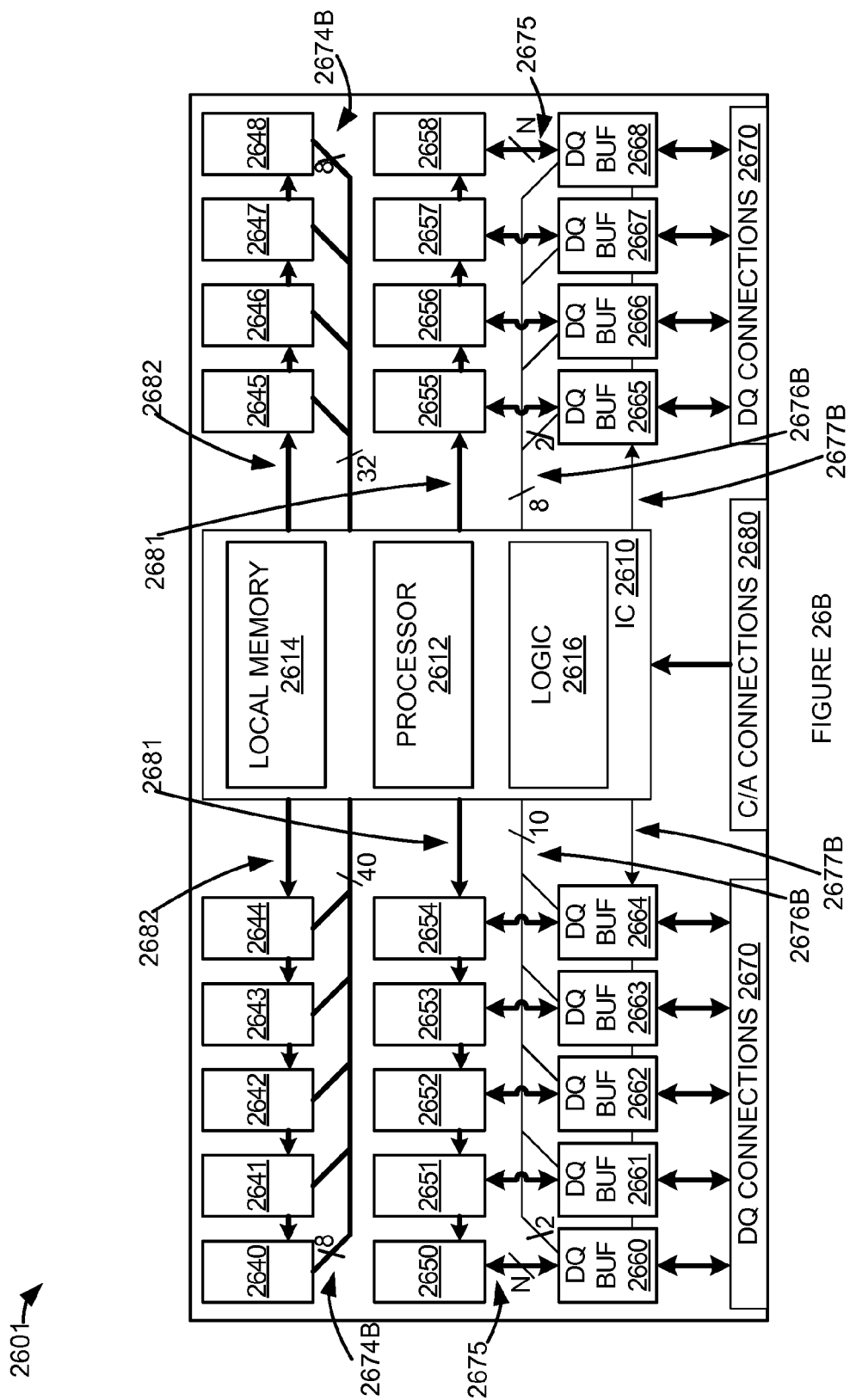
FIG. 26B is a block diagram illustrating a compute accelerated memory module with dedicated memory.
Figure 27A:
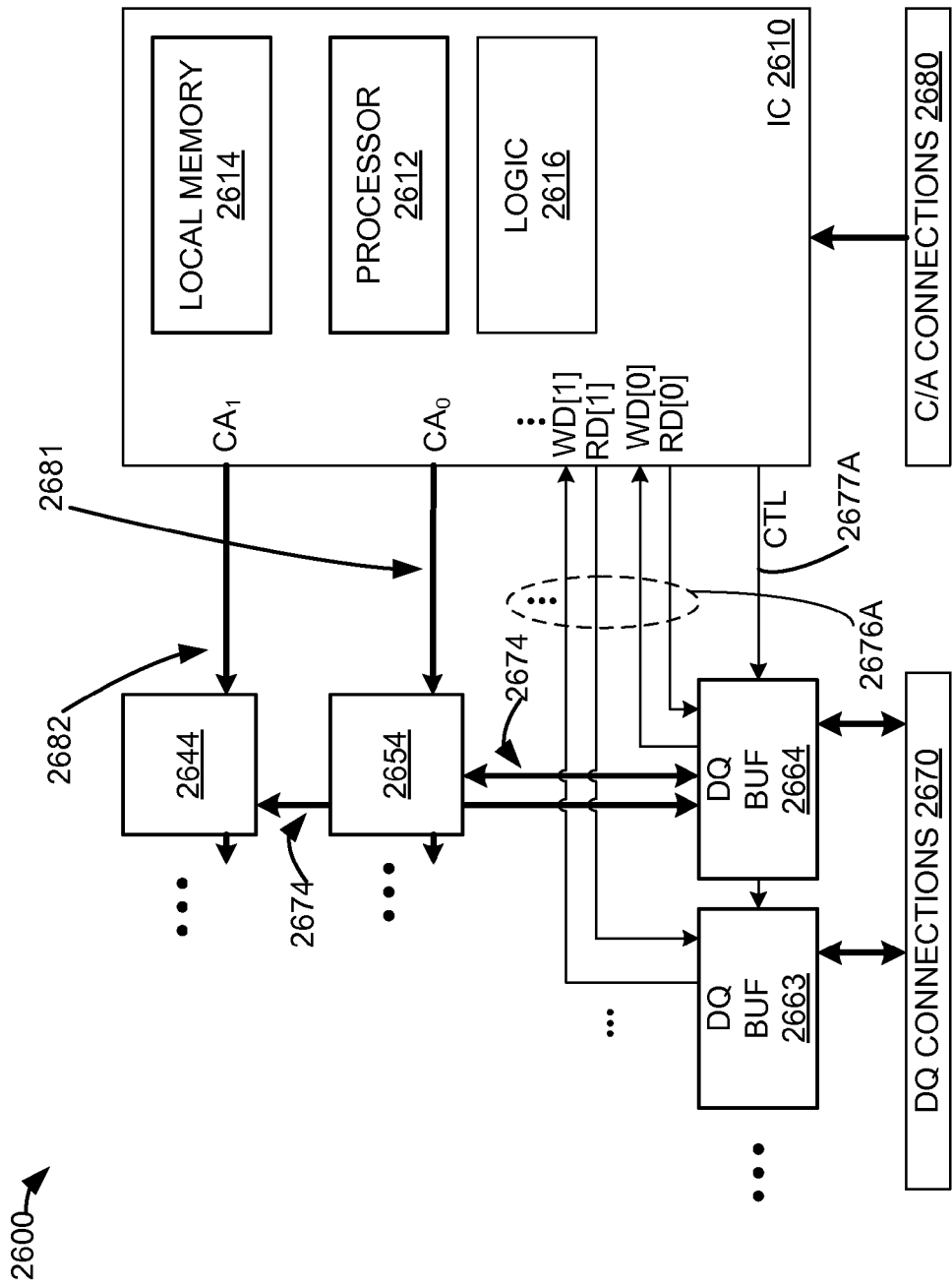
FIG. 27A is a block diagram illustrating further detail of a compute accelerated memory module.
Figure 27B:
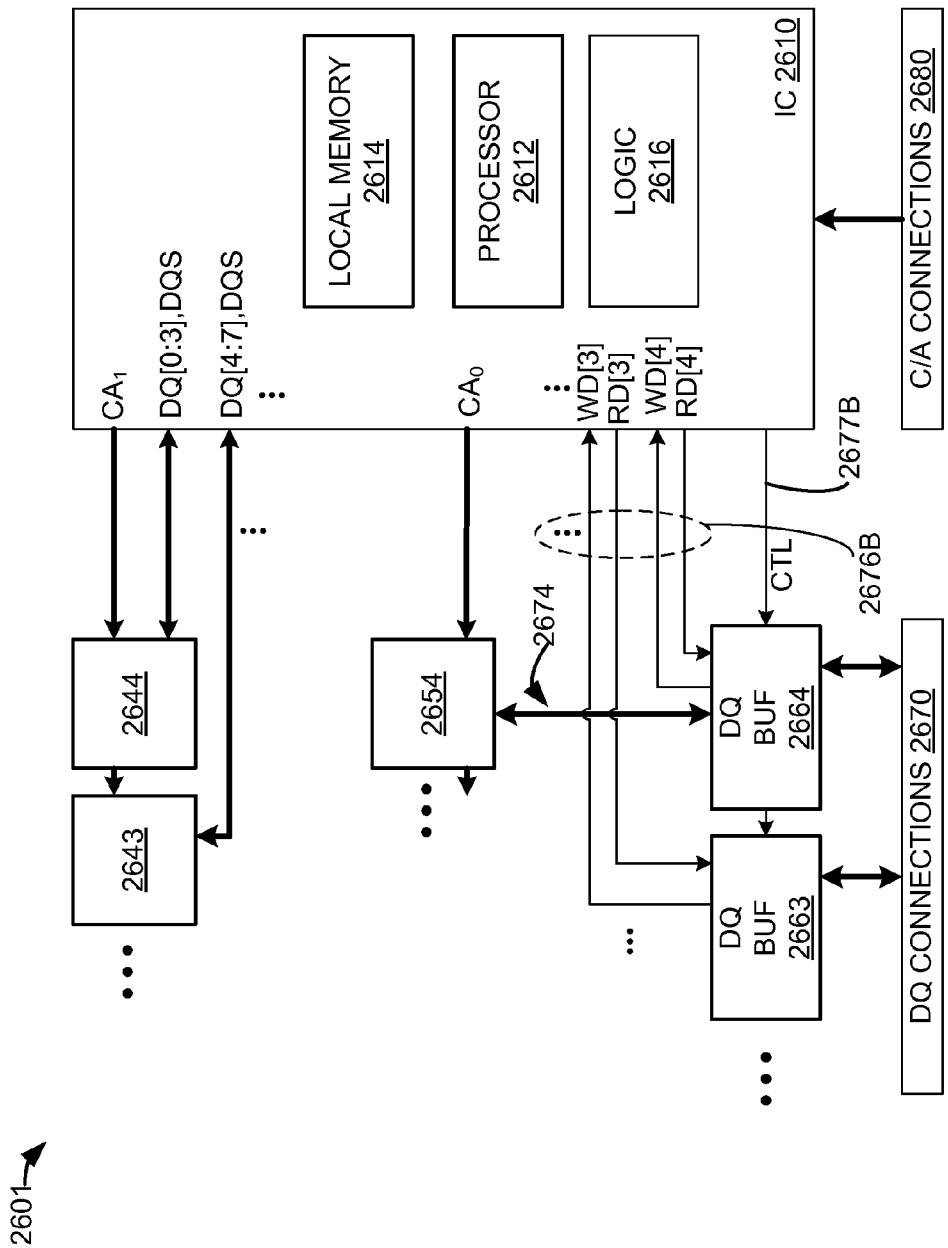
FIG. 27B is a block diagram illustrating further detail of a compute accelerated memory module with dedicated memory.

FIG. 26B is a block diagram illustrating a compute accelerated memory module with dedicated memory. FIG. 27B is a block diagram illustrating further detail of a compute accelerated memory module with dedicated memory. Memory module 2601 illustrated in FIG. 26B and FIG. 27B may be used as one or more of memory modules 2620 and/or memory modules 2625, discussed herein. Memory module 2601 comprises IC 2610, first rank of memory 2640-2647, second rank of memory 2650-2658, DQ buffers 2660-2668, DQ connections 2670, and C/A connections 2680. IC 2610 can include local memory 2614, processor 2612, and logic 2616.

In the configuration shown in FIG. 26B and FIG. 27B, C/A signals received at C/A connections 2680 are buffered by IC 2610 and sent to memories 2650-2658 via links 2681. C/A signals received at C/A connections 2680 can be buffered by IC 2610 and sent to memories 2640-2648 via links 2682. C/A signals sent to memories 2640-2648 via links 2682 can also be internally generated by IC 2610 so that processor 2612 can directly access memories 2640-2648. DQ signals received/sent by DQ buffers 2660-2668 from DQ connections 2670 are sent/received to/from memories 2650-2658 via N bit wide links 2675.

DQ signals received/sent by DQ buffers 2660-2668 from DQ connections 2670 are sent/received to/from IC 2610 via high speed unidirectional serial links 2676B. There are two serial links 2676B per DQ buffer 2660-2668—one for sending data to IC 2610, and one for receiving data from IC 2610. In an embodiment, these serial links 2676B operate at N times the rate of DQ connections 2670. In another embodiment, these serial links 2676B operate at M times the rate of DQ connections 2670, where M<=N. Thus, for example, when N=8 and M=8, the serial links 2676B are able to send/receive data to/from IC 2610 at the same rate data is being sent/received by memories 2650-2658. DQ signals received/sent by IC 2610 from/to DQ buffers 2660-2668 can be sent/received to/from memories 2640-2648 in parallel. Internally generated DQ signals (i.e., data bound from/to processor 2612) sent/received by IC 2610 can be sent/received to/from memories 2640-2648 in parallel via links 2674B. Accordingly, memories 2640-2648 can be configured to operate as processor memory 2524. DQ buffers 2660-2668 may be controlled by IC 2610, using one or more buffer control signals 2677B, to send/receive data on link 2676B and/or capture DQ data.

Processor 2612 can communicate with a memory controller by emulating a range of memory (i.e., an aperture). The memory controller can communicate with memories 2640-2648 via IC 2610. The memory controller can communicate data to memories 2640-2648 via a broadcast write received by IC 2610. The broadcast write data can be received by IC 2610 via DQ buffers 2660-2668 as describe previously. Processor 2612 (or IC 2610) can send/receive data via DQ connections 2670 to/from the memory controller. C/A connections 2680 can be buffered by IC 2610 and distributed separately to each rank 2640-2648 and 2650-2658.

Thus it can be seen in FIG. 26B and FIG. 27B a first rank of memory 2640-2648 on memory module 2601 is connected in parallel (i.e., ×8) to IC 2610 (and thereby coupled in parallel to processor 2612). This first rank 2640-2648 may act as dedicated memory for processor 2612 (i.e., like processor memory 2524). A second rank 2650-2658 is connected in parallel to the DQ buffers 2660-2668 to act as operating system (OS) visible memory (i.e., like CPU memory 2523). In this solution, one of the memory ranks 2650-2658 is configured as OS visible memory. A second of the memory ranks 2640-2648 is configured as memory dedicated for use by IC 2610. Processor 2612 may also use local memory 2614 to perform its assigned tasks.

Two unidirectional (one read data, one write data) high-speed serial connections between the DQ buffers 2660-2668 and IC 2610 provide for communication between the memory controller and IC 2610. This allows data captured by the DQ buffers (registers) 2660-2668 to be sent/received in parallel to/from memories 2650-2658 (i.e., the CPU memory 2523 rank) while being simultaneously sent/received to/from IC 2610 (and thereby processor 2612) via serial links 2676B. Serial links 2676B can operate at, for example, 8 times the clock rate of the DQ links 2675 to the memories 2650-2658. It should also be understood that, in some embodiments, links 2676B can use single-ended signaling and other embodiments use differential signaling. Likewise, in some embodiments, links 2676B can be unidirectional and in other embodiments links 2676B can be bidirectional.

In an embodiment, it should be understood that memory module 2601 includes a memory interface (e.g., C/A connections 2680) configured to interface to a memory controller (e.g., memory controller 2514 and/or memory controller 144.) Memory module 2601 includes an integrated circuit device (e.g., IC 2610) that is coupled to the memory interface. The integrated circuit device includes a processor (e.g., processor 2612), a first command/address interface coupled to the processor (e.g., the interface coupled to links 2682) and a first data interface (e.g., the interface coupled to links 2674B). The first command/address interface and the first data interface are configured to connect to a first plurality of dynamic memory integrated circuits. The integrated circuit device also includes a second command/address interface coupled to the processor and configured to connect to a second plurality of dynamic memory integrated circuits (e.g., the interface coupled to links 2681).

Memory module 2601 also includes the first plurality of dynamic memory integrated circuits (e.g., memories 2640-2648), the second plurality of dynamic memory integrated circuits (e.g., memories 2650-2658), and at least one data buffer integrated circuit (e.g., one or more of DQ buffers 2660-2668). The first plurality of dynamic memory integrated circuits are coupled to the first command/address interface (e.g., by links 2682). The first plurality of dynamic memory integrated circuits are also coupled to the first data interface (e.g., by links 2674B). The second plurality of dynamic memory integrated circuits are coupled to the second command/address interface (e.g., by links 2681). Because the DQ pins of the first plurality of dynamic memory integrated circuits are coupled to the first data interface, the first plurality of dynamic memory integrated circuits are not directly accessible to a memory controller. However, because the DQ pins of the first plurality of dynamic memory integrated circuits are coupled to the first data interface, the first plurality of dynamic memory integrated circuits are directly accessible by IC 2610 (and thereby directly accessible by processor 2612).

The at least one data buffer integrated circuit is coupled to the second plurality of dynamic memory integrated circuits (e.g., by links 2675). The at least one data buffer integrated circuit is coupled to the memory interface (e.g., DQ connections 2670). The at least one data buffer integrated circuits are each coupled to the integrated circuit device by at least a read serial link and a write serial link (e.g., links 2676B).

The at least one data buffer integrated circuit may communicate data from the integrated circuit device in response to a transaction on the memory interface that is directed to a memory aperture associated with the integrated circuit device (for example, as described previously). The at least one data buffer integrated circuit may transfer data to and from memories 2650-2658 at a first information rate (e.g., the DDR3 byte rate) and the links 2676B may be configured to transfer data to and from the integrated circuit device at a second information rate that is at least the first information rate (i.e., the DDR3 byte rate or higher—or equivalently, a bit rate of 8× the DDR3 byte rate, or higher). In various embodiments, serial links 2676B may operate at other multipliers (e.g., 4× or 16×) and at, or more than, the data rates of other memory technologies mentioned herein (e.g., DDR4, DDR5, etc.) The links 2676B may be serial links, or may have a width greater than one bit so long as the second information rate of the links 2676B is at least the first information rate. The integrated circuit device may include a local memory interface that is coupled to the processor. This local memory interface may be coupled to at least one integrated circuit memory device.

In an embodiment, memory module 2601 may be operated similar to memory module 2600 to read and write data from a first memory rank (e.g., memories 2650-2658). However, because DQ signals of the second rank of memory (e.g., memories 2640-2648) on memory module 2601 are directly coupled to the integrated circuit device (e.g., IC 2610), IC 2610 (and thereby processor 2612) can directly access (i.e., read and write) the second rank of memory without the intermediate step of storing the data the at least one data buffer integrated circuit (e.g., DQ buffers 2660-2668). Thus, the second rank of memory may be referred to as being "dedicated" to the processor while the first rank of memory operates in a "standard" fashion.

Figure 26C:
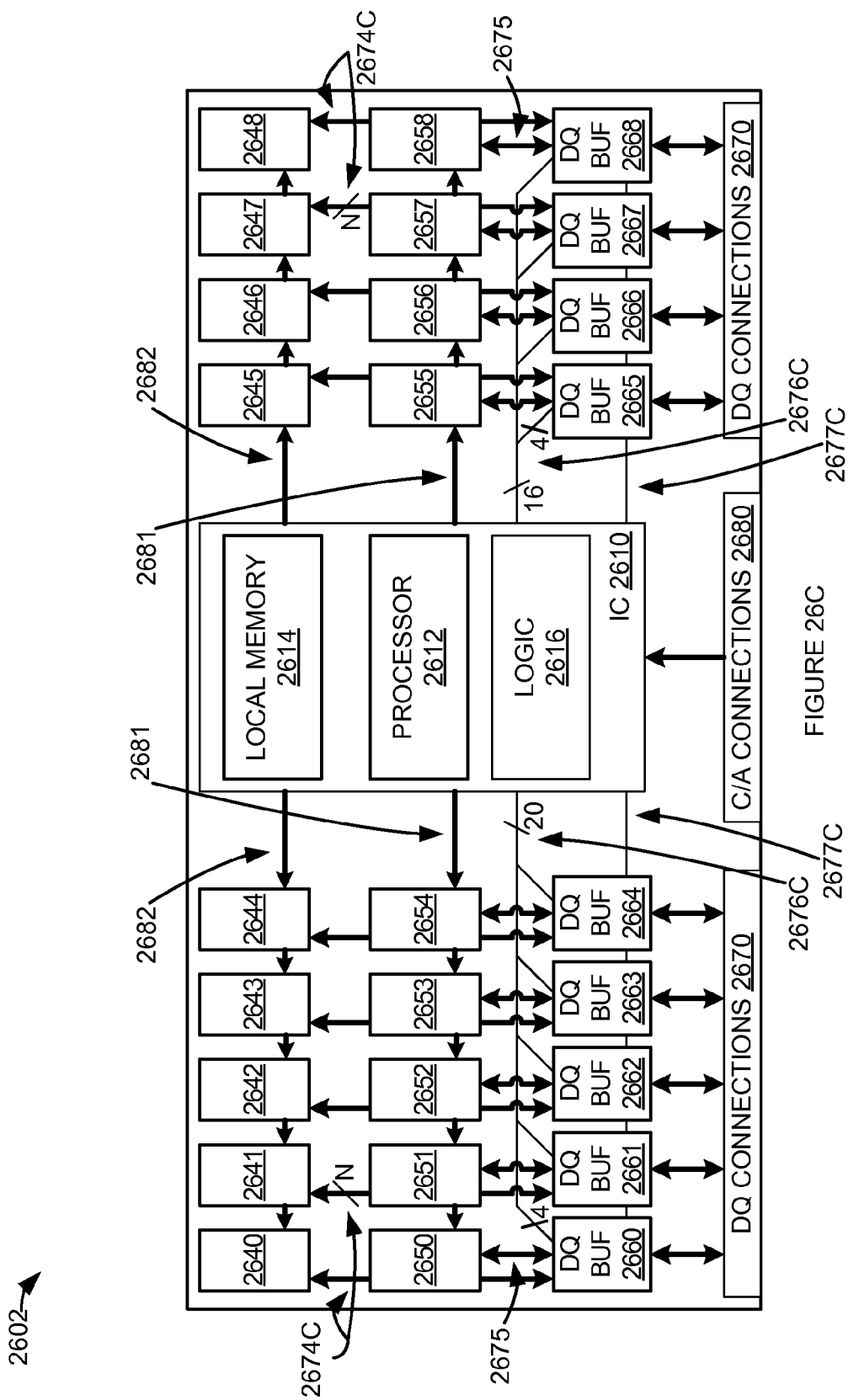
FIG. 26C is a block diagram illustrating a compute accelerated memory module with flexible memory.
Figure 27C:
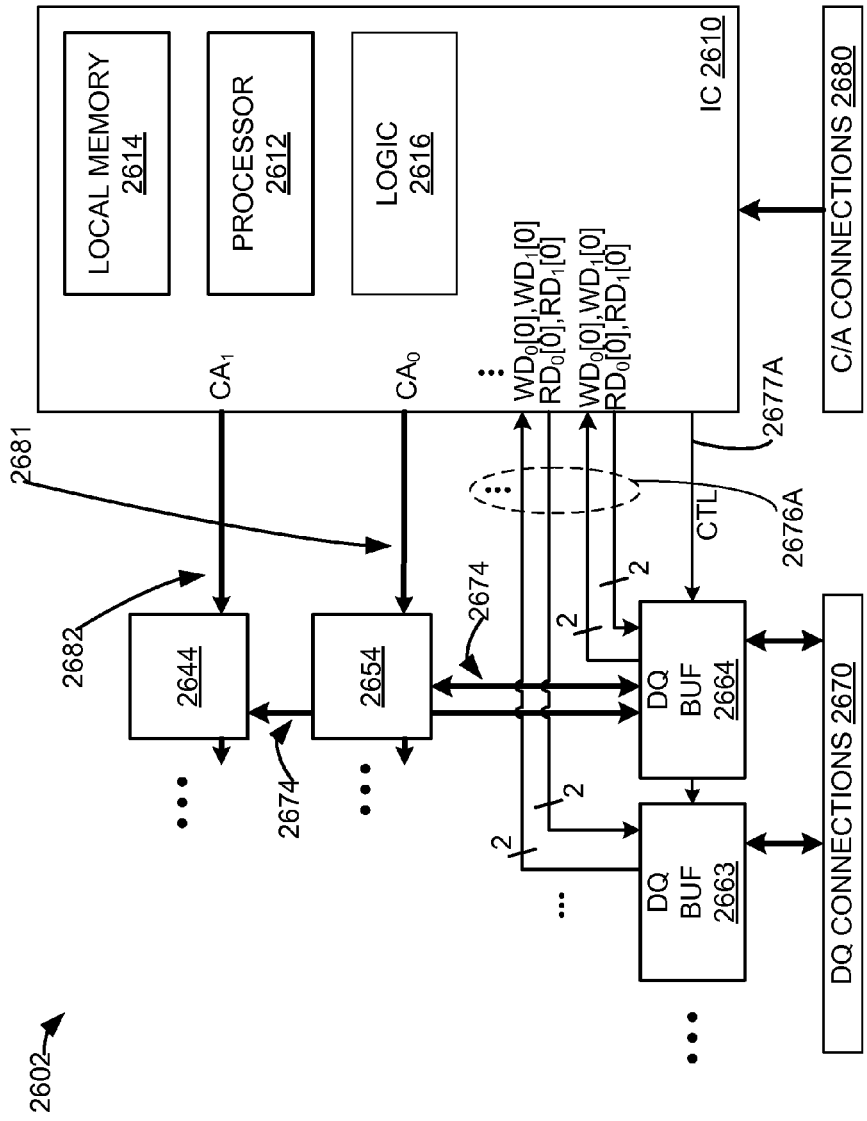
FIG. 27C is a block diagram illustrating further detail of a compute accelerated memory module with flexible memory.

FIG. 26C is a block diagram illustrating a compute accelerated memory module with flexible memory. FIG. 27C is a block diagram illustrating further detail of a compute accelerated memory module. Memory module 2602 illustrated in FIG. 26C and FIG. 27C may be used as one or more of memory modules 2520, memory modules 2525, and/or memory modules 2526, discussed herein. Memory module 2602 comprises IC 2610, first rank of memory 2640-2648, second rank of memory 2650-2658, DQ buffers 2660-2668, DQ connections 2670, and C/A connections 2680. IC 2610 can include local memory 2614, processor 2612, and logic 2616.

In the configuration shown in FIG. 26C and FIG. 27C, C/A signals received at C/A connections 2680 are buffered by IC 2610 and sent to memories 2650-2658 via links 2681. C/A signals received at C/A connections 2680 can be buffered by IC 2610 and sent to memories 2640-2648 via links 2682. C/A signals sent to memories 2640-2648 via links 2682 can also be internally generated by IC 2610 so that processor 2612 can access memories 2640-2648. DQ signals received/sent by DQ buffers 2660-2668 from DQ connections 2670 are sent/received to/from memories 2650-2658 via N bit wide links. DQ signals received/sent by DQ buffers 2660-2668 from DQ connections 2670 and/or IC 2610 are sent/received to/from memories 2640-2648 via N bit wide links 2674A. DQ signals received/sent by DQ buffers 2660-2668 from DQ connections 2670 and/or memories 2640-2648 are sent/received to/from IC 2610 via high speed unidirectional serial links 2676C. In an embodiment, there are four serial links 2676C per DQ buffer 2660-2668—two for sending data to IC 2610, and two for receiving data from IC 2610. These serial links 2676C operate at, for example, at least N times the rate of DQ connections 2670. Thus, for example, when N=8, the serial links 2676C are able to send/receive data to/from IC 2610 at least the same rate, or faster, than data is being simultaneously sent/received by DQ connections 2670 and memories 2640-2648.

Processor 2612 can communicate with a memory controller by emulating a range of memory (i.e., an aperture). Processor 2612 (or IC 2610) can send/receive data via the DQ lines to/from the memory controller. C/A signal lines 2680 can be buffered by IC 2610 and distributed separately to each rank 2640-2648 and 2650-2658. C/A signals 2682 can be internally generated by IC 2610 so that processor 2612 can access memories 2640-2648.

In this configuration, one of the memory ranks 2650-2658 is configured as OS visible memory. A second of the memory ranks 2640-2648 can be configured as memory dedicated for use by IC 2610, or as OS visible memory. Processor 2612 may also use local memory 2614 to perform its assigned tasks.

Two unidirectional (one read data, one write data) high-speed serial connections between DQ buffers 2660-2668 and the processor can provide for communication between the memory controller and IC 2610. Two additional unidirectional (one read data, one write data) high-speed serial connections between DQ buffers 2660-2668 and IC 2610 can provide for communication between processor 2612 and the dedicated memory rank 2640-2648 (if so configured). The additional high-speed serial connections can be made possible by repurposing IC 2610 pins that served as DQ pins for the dedicated memory configuration. It be understood that, in some embodiments, links 2676C can use single-ended signaling and other embodiments use differential signaling. Likewise, in some embodiments, links 2676C can be unidirectional and in other embodiments links 2676C can be bidirectional.

From the foregoing, it should be understood that C/A connections 2680 and/or DQ connections 2670 comprise a memory interface configured to interface with a memory controller. Integrated circuit device 2610 is coupled to this interface. Integrated circuit device 2610 includes a processor 2612, an interface configured to connect to a first rank of dynamic memory integrated circuit devices 2640-2648, and an interface configured to connect to a second rank of dynamic memory integrated circuit device 2650-2658. Memory module 2602 includes a first rank of dynamic memory integrated circuit devices 2640-2648. Memory module 2602 can be configured by IC 2610, and the way it controls DQ buffers 2660-2668, to make this first rank of dynamic memory integrated circuit devices 2640-2648 either accessible or inaccessible to the memory controller. Memory module 2602 also includes a second rank of dynamic memory integrated circuit devices 2640-2648. Memory module 2602 can be configured by IC 2610, and the way it controls DQ buffers 2660-2668, to make this second rank of dynamic memory integrated circuit devices 2650-2658 either accessible or inaccessible to the memory controller. DQ buffers 2660-2668 are coupled to both the first rank of dynamic memory integrated circuit devices 2640-2648 and the second rank of dynamic memory integrated circuit devices 2650-2658. DQ buffers 2660-2668 are coupled to IC 2610 by links 2676C. These links 2676C may comprise at least one serial read link and at least one serial write link. In an embodiment, links 2676C include two serial read links and two serial write links for each DQ buffer 2660-2668. The links 2676C should be configured to transfer data to and from each DQ buffer 2660-2668 at an information rate that is at least the information rate each DQ buffer 2660-2668 is transferring data to the first rank of dynamic memory integrated circuit devices 2640-2648 and the second rank of dynamic memory integrated circuit devices 2650-2658. In this manner, all of the information transferred to and from the first rank of dynamic memory integrated circuit devices 2640-2648 and the second rank of dynamic memory integrated circuit devices 2650-2658 may be transferred to IC 2610. This provides IC 2610 the ability to "snoop" all of the data being sent to and from the first rank of dynamic memory integrated circuit devices 2640-2648 and the second rank of dynamic memory integrated circuit devices 2650-2658.

Memory module 2602 may respond to transactions on C/A connections 2680 that are directed to a memory aperture associated with IC 2610 by communicating data from IC 2610 to DQ connections 2670. Integrated circuit device 2610 may also include a local memory interface that is configured to connect to a local memory 2614. Memory module 2602 may include a local memory 2614 device that is coupled to this local memory interface.

In an embodiment, it should be understood that memory module 2602 includes a memory interface (e.g., C/A connections 2680) configured to interface to a memory controller (e.g., memory controller 2514 and/or memory controller 144.) Memory module 2602 includes an integrated circuit device (e.g., IC 2610) that is coupled to the memory interface. The integrated circuit device includes a processor (e.g., processor 2612), a first command/address interface coupled to the processor and configured to connect to a first plurality of dynamic memory integrated circuits (e.g., the interface coupled to links 2681), and a second command/address interface coupled to the processor and configured to connect to a first plurality of dynamic memory integrated circuits (e.g., the interface coupled to links 2682).

Memory module 2602 also includes the first plurality of dynamic memory integrated circuits (e.g., memories 2650-2658), the second plurality of dynamic memory integrated circuits (e.g., memories 2640-2648), and at least one data buffer integrated circuit (e.g., one or more of DQ buffers 2660-2668). The first plurality of dynamic memory integrated circuits are coupled to the first command/address interface (e.g., by links 2681). The second plurality of dynamic memory integrated circuits are coupled to the second command/address interface (e.g., by links 2682). The at least one data buffer integrated circuit is coupled to the first plurality of dynamic memory integrated circuits (e.g., by links 2674C) and the second plurality of dynamic memory integrated circuits (e.g., by links 2675). The at least one data buffer integrated circuit is coupled to the memory interface (e.g., DQ connections 2670). The at least one data buffer integrated circuit are each coupled to the integrated circuit device by at least a read serial link and a write serial link (e.g., links 2676C).

The at least one data buffer may communicate data from the integrated circuit device in response to a transaction on the memory interface that is directed to a memory aperture associated with the integrated circuit device (for example, as described previously). The at least one data buffer may transfer data to and from memories 2650-2658 and 2640-2648 at a first information rate (e.g., the DDR3 byte rate) and the links 2676C may be configured to transfer data to and from the integrated circuit device at a second information rate that is at least the first information rate (e.g., the DDR3 byte rate or higher—or equivalently, a bit rate of 16× the DDR3 byte rate, or higher). In various embodiments, serial links 2676C may operate at other multipliers (e.g., 4× or 16×) and at, or more than, the data rates of other memory technologies mentioned herein (e.g., DDR4, DDR5, etc.) The links 2676C may be serial links, or may have a width greater than one bit, so long as the second information rate of the links 2676C is at least the first information rate. The integrated circuit device may include a local memory interface that is coupled to the processor. This local memory interface may be coupled to at least one integrated circuit memory device.

In another embodiment, an integrated circuit device (e.g., IC 2610) receives, from a memory interface (e.g., C/A connections 2680), a first memory command directed to a first rank of dynamic memory integrated circuit devices disposed on the memory module (such as a read command directed to an address stored in memories 2640-2648). The integrated circuit device can include a processor (e.g., processor 2612). For example, IC 2610 may receive, via C/A connections 2680, a memory read command from a memory controller. This memory read command may select memories 2640-2648. IC 2610 may relay this command to memories 2640-2648 thereby initiating a read burst from memories 2640-2648. The integrated circuit device may receive, from the memory interface, a second memory command directed to a second rank of dynamic memory integrated circuit devices disposed on the memory module (such as a read command directed to an address stored in memories 2650-2658). For example, IC 2610 may receive, via C/A connections 2680, a memory read command from a memory controller. This memory read command may select memories 2650-2658. IC 2610 may relay this command to memories 2650-2658 thereby initiating a read burst from memories 2650-2658.

In response to the first memory command, data from the first rank of dynamic memory integrated circuit devices that is associated with the first memory command is stored in at least one data buffer integrated circuit. For example, in response to a read command directed to an address stored in memories 2640-2648, DQ buffers 2660-2668 may latch (store) the read data output by memories 2640-2648 as a response to the read command (as relayed by IC 2610).

Under the control of the integrated circuit device, the data associated with the first memory command is communicated from the at least one data buffer integrated circuit to the memory interface such that the first rank of dynamic memory integrated circuit devices are accessible to the memory controller. For example, IC 2610 may use one or more buffer control signals 2677C to cause DQ buffers 2660-2668 to output the read data they latched onto DQ connections 2670. The memory controller can receive this read data from DQ buffers 2660-2668 thereby completing a read access, of memories 2640-2648, by the memory controller.

The integrated circuit device may receive, from the memory interface, a second memory command directed to the first rank of dynamic memory integrated circuit devices (e.g., a second read command directed to an address stored in memories 2640-2648). This memory read command may or may not select memories 2640-2648. IC 2610 may optionally relay this command to memories 2640-2648 thereby initiating a read burst from memories 2640-2648. IC 2610 may, for example, intercept this read command and not relay it to memories 2640-2648 in order to reduce power consumption, or use the memory cycles associated with this command for its own purposes.

In response to the second memory command, data from the integrated circuit that is associated with the second memory command is stored in at least one data buffer integrated circuit. For example, in response to a read command directed to an aperture associated with IC 2610, IC 2610 may send, via links 2676C, data to DQ buffers 2660-2668 to be latched (stored).

Under the control of the integrated circuit device, the data associated with the second memory command is communicated from the at least one data buffer integrated circuit to the memory interface such that data processed by the processor is accessible to the memory controller. For example, IC 2610 may use one or more buffer control signals 2677C to cause DQ buffers 2660-2668 to output the data received from IC 2610 via links 2676C. This data may have been processed by processor 2612. The memory controller can receive this read data from DQ buffers 2660-2668 thereby completing a read access, by the memory controller, of the aperture associated with IC 2610 (and thereby also associated with processor 2612).

The integrated circuit device may also control the at least one data buffer integrated circuit to communicate the data associated with the first memory command to the integrated circuit. For example, IC 2610 may use one or more buffer control signals 2677C to cause DQ buffers 2660-2668 to output the read associated with the first memory command onto one or more links 2676C. In this manner, IC 2610 can "snoop" the all or part of the data associated with memory transactions that read memories 2640-2648.

The integrated circuit device may also be coupled to a memory that its processor uses as a local memory or cache. This cache may be used to cache data stored in the first rank of dynamic memory integrated circuit devices. The data supplied to the at least one data buffer integrated circuit may have been stored in this local memory (or cache) prior to being sent by the integrated circuit device to the at least one data buffer integrated circuit. For example, IC 2610 may satisfy the read of the aperture associated with IC 2610 using data that was stored in local memory 2614 at a time prior to the read of the aperture by the memory controller. Similar to the access steps described above, a third memory command may cause data stored in a second rank of dynamic memory integrated circuit devices to be stored in the at least one data buffer integrated circuit. For example, data stored in memories 2650-2658 may be read by the memory controller using similar steps to previously described for accessing (and snooping) memories 2640-2648.

A write to the first rank of dynamic memory integrated circuit devices is performed in a similar manner to a read, except with the data flows reversed. In other words, to perform a write to memories 2640-2648: (1) a write command is received by IC 2610 via C/A connections 2680 and relayed to memories 2640-2648; (2) the write data is latched from DQ connections 2670 into DQ buffers 2660-2668; and, (3) the write data is communicated to memories 2640-2648 via links 2675 at the appropriate time. Likewise, a write to the aperture associated with the integrated circuit device is performed in a similar manner to a read with the data flows reversed. In other words, to perform a write to the aperture associated with IC 2610: (1) a write command is received by IC 2610 via C/A connections 2680 and may optionally be relayed to memories 2640-2648; (2) the write data is latched from DQ connections 2670 into DQ buffers 2660-2668; and, (3) the write data is communicated to IC 2610 via links 2677C. This write operation gives processor 2612 and any other part of IC 2610 access to data being written to the aperture associated with IC 2610. IC 2610 can also snoop data being written to memories 2640-2648.

Memory module 2602 may receive a memory command directed to memories 2640-2648. This memory command may be received by IC 2610. In response to this memory command, memories 2640-2648 may output data associated with the command and DQ buffers 2660-2668 may store that data. IC 2610 may then control DQ buffers 2660-2668 to communicate this data to DQ connections 2670. This allows memories 2640-2648 to be accessible to a memory controller coupled to memory module 2602. IC 2610 may also control DQ buffers 2660-2668 to communicate this data to IC 2610 via links 2676C. This allows IC 2610 to snoop data read from memories 2640-2648.

Memory module 2602 may receive a second memory command directed to memories 2640-2648. This second memory command may also be received by IC 2610. This second memory command may be directed to an aperture associated with IC 2610. In response to this memory command, integrated circuit 2610 may output second data associated with the second command (e.g., via links 2676C) and DQ buffers 2660-2668 may store that second data. IC 2610 may then control DQ buffers 2660-2668 to communicate this second data to DQ connections 2670. This allows data processed by processor 2612 to be accessible to a memory controller coupled to memory module 2602.

IC 2610 may send a third memory command to memories 2650-2658. This third memory command may instruct memories 2650-2658 to retrieve third data from memories 2650-2658. In response to this memory command, memories 2650-2658 may output third data associated with the third memory command and DQ buffers 2660-2668 may store that third data. IC 2610 may then control DQ buffers 2660-2668 to communicate this third data to DQ connections 2670. This allows memories 2650-2658 to be accessible to a memory controller coupled to memory module 2602.

IC 2610 may originate and send a fourth memory command to memories 2650-2658. This fourth memory command may instruct memories 2650-2658 to retrieve fourth data from memories 2650-2658. In response to this fourth memory command, memories 2650-2658 may output fourth data associated with the fourth memory command and DQ buffers 2660-2668 may store that fourth data. IC 2610 may then control DQ buffers 2660-2668 to communicate this fourth data to IC 2610 via links 2676C. This allows memories 2650-2658 to be accessible to processor 2612.

Memory module 2602 may receive a memory command directed to memories 2640-2648. This memory command may be received by IC 2610. In response to this memory command, data associated with the command may arrive at DQ connections 2670 and DQ buffers 2660-2668 may store that data. IC 2610 may then control DQ buffers 2660-2668 to communicate this data to memories 2640-2648. This allows memories 2640-2648 to be accessible to a memory controller coupled to memory module 2602. IC 2610 may also control DQ buffers 2660-2668 to communicate this data to IC 2610 via links 2676C. This allows IC 2610 to snoop data written to memories 2640-2648.

Memory module 2602 may receive a second memory command directed to memories 2640-2648. This second memory command may also be received by IC 2610. This second memory command may be directed to an aperture associated with IC 2610. To complete this memory command, second data associated with the second memory command may arrive at DQ connections 2670 and DQ buffers 2660-2668 may store that second data. IC 2610 may then control DQ buffers 2660-2668 to communicate this second data to IC 2610 via links 2676C. This allows processor 2612 to access the second data sent by the memory controller coupled to memory module 2602.

IC 2610 may originate and send a third memory command to memories 2650-2658. This third memory command may instruct memories 2650-2658 to store third data in memories 2650-2658. In correspondence to this third memory command, IC 2610 may output (e.g., via links 2676C) third data associated with the third memory command and DQ buffers 2660-2668 may store that third data. IC 2610 may then control DQ buffers 2660-2668 to communicate this third data to memories 2650-2658. This allows memories 2650-2658 to be write accessible to processor 2612.

IC 2610 may send a fourth memory command to memories 2650-2658. This fourth memory command may instruct memories 2650-2658 to store fourth data in memories 2650-2658. To complete this fourth memory command, fourth data associated with the fourth command may arrive at DQ connections 2670 and DQ buffers 2660-2668 may store that fourth data. IC 2610 may then control DQ buffers 2660-2668 to communicate this fourth data to IC memories 2650-2658. This allows memories 2650-2658 to be write accessible to the memory controller coupled to memory module 2602.

Figure 28:
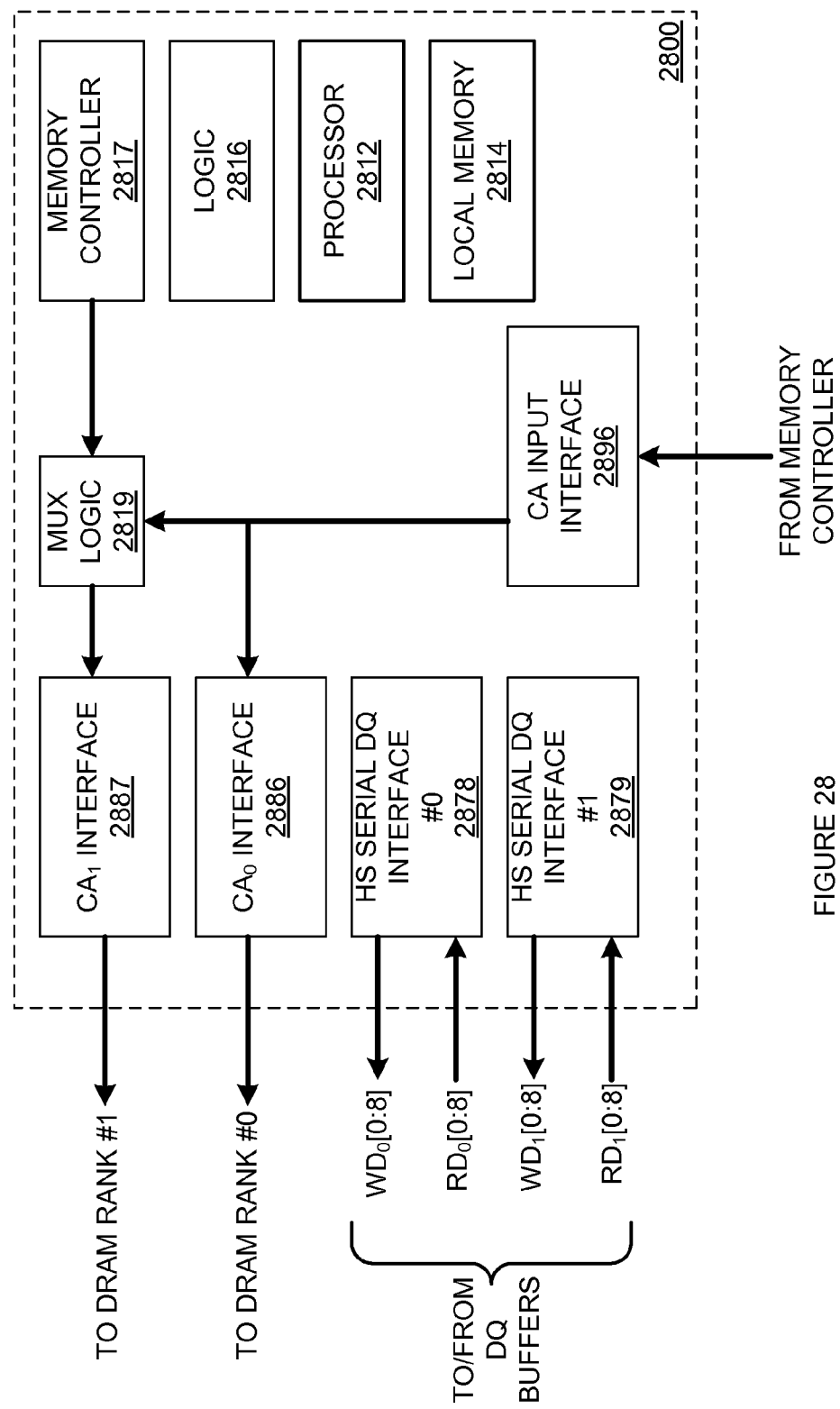
FIG. 28 is a block diagram illustrating a subsystem for a memory module.

FIG. 28 is a block diagram illustrating a subsystem for a memory module. In FIG. 28, subsystem 2800 comprises processor 2812, local memory 2814, logic 2816, memory controller 2817, CA input interface 2896, multiplexor (MUX) logic 2819, $CA_0$ interface 2886, $CA_1$ interface 2887, high-speed (HS) serial DQ interface #0 2878, and HS serial DQ interface #1 2879. $CA_0$ interface 2886 is shown to be for coupling to a DRAM bank (DRAM bank #0). $CA_1$ interface 2887 is shown to be for coupling to a DRAM bank (DRAM bank #1). HS serial DQ interfaces #0 2878 and #1 2879 are shown to be for coupling to DQ buffers. As can be seen in FIG. 28, MUX logic 2819 allows $CA_1$ interface to be controlled by either CA input interface 2896 or memory controller 2817. Thus, subsystem 2800 can either buffer CA signals received via CA input interface 2896, or internally generate CA signals (by memory controller 2817) in order to access memory coupled to $CA_1$ interface 2887. Memory controller 2817 may generate CA signals in response to requests from processor 2812. Accordingly, it can be seen that subsystem 2800 may be used as IC 2610 in memory modules 2600, 2601, and/or 2602.

As described herein, one or more memories 2571-2573 can be configured as memory dedicated for use by processors 2561-2563, respectively, or as OS visible memory. When a memory 2571-2573 is dedicated for use as OS (e.g., CPU 2512) visible memory, it has been described as "standard mode." In other words, the memory 2571-2573 is operating as if its respective memory module 2551-2553 was a standard memory module. When a memory 2571-2573 is dedicated for use by the respective processor 2561-2563 on it respective module 2551-2553, it has been described as "dedicated mode." In other words, a memory 2571-2573 is "dedicated" to its respective processor 2561-2563. In particular, as described herein, a memory 2571-2573 can be either under the control of the CPU 2512, or under the control of a respective processor 2561-2563 on the memory module. To maintain compatibility with at least some memory controllers 2514, each memory 2571-2573 should not be allowed to be under the control of both CPU 2512 and a processor 2561-2563 at the same time.

The process of transitioning between modes begins when an operator or program running on system 2502 decides to change the mode of at least one module 2551-2553. A signal is sent to an operating system routine that takes different actions depending on whether the mode change is from standard to dedicated, or dedicated to standard.

The following list details a process of transitioning at least one module 2551-2553 from dedicated mode to standard mode. For the purposes of this discussion, memory 2571 on module 2551 is transitioning from being dedicated to memory 2571 to being under the control of CPU 2512. In addition, if the data in memory 2571 is to be preserved, before beginning the transitioning process detailed below, assume that processor 2561 has flushed any caches (e.g., caches outside or inside of processor 2612) holding data bound for memory 2571.

(1) Determine which processor 2561 memory pages stored in memory 2571 have data being used by processor 2561. Processor 2561 can determine which memory pages stored in memory 2571 have data by examining memory management data structures (e.g., page table entries or memory allocation structures) used by processor 2561.

(2) At least the memory pages stored in memory 2571 that have data are removed or copied out of memory 2571. This can be done by storing the data in memory 2571 to disk. If it is not necessary to preserve the data stored in memory 2571, the active memory pages stored in memory 2571 may be cleared. The data in memory 2571 may be stored to disk or other nonvolatile storage. This nonvolatile storage may be a solid-state disk drive or other nonvolatile storage disposed on module 2551 (described below). The data in memory 2571 may be stored in another memory (not shown in FIG. 25C) that is under the control of processor 2561. The memory receiving the data may be on the same module 2551 as processor 2561, or a different module (e.g., module 2552 or module 2553).

(3) Processor 2561 releases ownership of pages. Processor 2561 may release its ownership of the pages in memory 2571 by marking page table entries (PTEs) or memory allocation data structures as unavailable to processor 2561.

(4) Once processor 2561 has release ownership of pages the pages in memory 2571, processor 2561 notifies CPU 2512 that memory pages on memory 2571 are available to be allocated.

(5) CPU 2512 proceeds through its initialization process for pages to be allocated by the CPU 2512. For example, CPU 2512 may perform its page table initialization for memory 2571. CPU 2512 and/or memory controller 2514 may also perform some initialization and/or basic maintenance operations, such as calibration of a memory channel or other routine memory initialization routines (e.g., zeroing, testing, etc.) before the CPU 2512 begins allocating pages.

(6) At this point, the mode switch of memory 2571 from being dedicated to processor 2561 to being under the control of CPU 2512 is complete. CPU 2512 can now allocate pages in memory 2571.

The following list details a process of transitioning at least one module 2551-2553 from standard mode to dedicated mode. For the purposes of this discussion, memory 2571 is transitioning from being under the control of CPU 2512 to being dedicated to processor 2561.

(1) Determine which CPU 2512 memory pages stored in memory 2571 have data being used by CPU 2512. CPU 2512 can determine which memory pages stored in memory 2571 have data by examining memory management data structures (e.g., CPU 2512 page table entries or OS memory allocation structures).

(2) Identify the physical pages corresponding to memory 2571 that are to be allocated by CPU 2512 for exclusive use by processor 2561.

(3) Deallocate the physical pages corresponding to memory 2571. This may be accomplished by executing a page fault routine to cause one or more of these physical pages stored in memory 2571 to be copied to disk (or another location in memory that is accessible to CPU 2512).

(4) Once all of the physical pages that were stored on memory 2571 are cleared (or copied to disk so they can be cleared or re-used), the CPU 2512 page table entries are marked to indicate that they cannot be allocated by CPU 2512.

(5) Once memory 2571 is cleared, CPU 2512 notifies processor 2561 that it can use memory 2571. Processor 2561 may also perform some initialization and/or basic maintenance operations, such as calibration of a memory channel before processor 2561 can begin allocating pages.

(6) At this point, the mode switch of memory 2571 from being dedicated to CPU 2512 to being under the control of processor 2561 is complete. Processor 2561 can now allocate pages in memory 2571.

CPU 2512, and/or processor 2561 may use virtual addressing. When using virtual addressing, the process steps above include identifying pages that are in physical memory stored in memory 2571 and deallocating them from physical memory. To accomplish this, the page table entries corresponding to memory 2571 should be updated to indicate that the pages are no longer available to be allocated.

With virtual memory (a.k.a., virtual addressing), more than one process can be using a physical page at the same time. This is one way that shared memory can be implemented. When clearing out a physical page (e.g. faulting it out to disk), each virtual page across all processes should be tracked down to make sure that all processes know that the physical page is no longer available and/or valid.

Linux implement a reverse mapping data structure called an "object-based reverse mapping" structure. This data structure allows all virtual pages that map to a physical page to be identified via a doubly-linked list structure that is associated with one physical page. Each time a physical page is cleared out/faulted out to disk, the reverse mapping data structure associated with that page is traversed (by CPU 2512 and/or processor 2561), and each virtual page entry that points to that physical page is modified to denote that the virtual page is no longer mapped to physical memory. If the page is faulted out to disk, then the next time a process refers to that memory, a page fault will occur, and the page will be brought back into memory in a different page frame. Since the pages corresponding to memory 2571 have been marked as unavailable/not-allocable to CPU 2512 or processor 2561, the page will be brought back into memory that is not under the control of processor 2561 or CPU 2512, respectively. In this way, the process of clearing data in physical pages from memory 2571 being controlled by the CPU 2512 or processor 2561 can utilize existing page faulting mechanisms, as well as their existing page table structures.

Table 1 further describes a process of transitioning memory 2571 from dedicated mode to standard mode. Again assume that if the data in memory 2571 is to be preserved, before beginning the transitioning process detailed below, processor 2561 will flush any caches holding data bound for memory 2571.

TABLE 1

(1) Determine which memory 2571 pages processor 2561 has data in
    a. processor 2561 can look at processor 2561's memory management structures
(2) Clear out memory 2571 (store data to disk, clear out pages)
    a. Can page data out to disk
    b. Can terminate programs running on processor 2561 that use memory 2571 and/or wait until these programs end
(3) Identify physical addresses associated with memory 2571
    a. This identification depends on CPU 2512/memory controller 2514 mapping of CPU 2512 physical addresses to modules 2551-2553.
    b. This mapping of CPU 2512 physical addresses to modules 2551-2553 may be documented in system guides for system 2502.
(4) Identify CPU 2512 physical frames associated with CPU 2512 physical addresses identified in step (3)
    a. This is determined by the CPU 2512's Page Table Entries (PTEs)
    b. If processor 2561 is using virtual addressing, identify all virtual pages that map to each physical frame
        i. Can use reverse mapping
        ii. Update each PTE to indicate that all virtual pages mapping to the identified physical pages are unmapped
(5) Update CPU 2512 PTEs so frames are available to CPU 2512
    a. perform necessary page table initialization
(6) Once all frames are available on a module 2551, signal CPU 2512 that it can allocate them
    a. CPU 2512 or memory controller 2514 may need to perform some initialization and basic maintenance operations such as calibration of the memory channel connected to modules 2551-2553 before CPU 2512 begins allocating pages
(7) Mode switch complete. CPU 2512 can now allocate pages in memory 2571

Table 2 further describes a process of transitioning memory 2571 from standard mode to dedicated mode. Note that the existing processes on CPU 2512 can keep running. The process detailed in Table 2 may occur in the background to threads currently running on CPU 2512.

TABLE 2

(1) Determine which memory 2571 pages are to be allocated to processor 2561.
(2) Determine what data the pages to be allocated to processor 2561 in memory 2571 have from CPU 2512 processes.
(3) CPU 2512 can use operating system mapping functions (e.g., object-based reverse mapping structure)
(4) Identify physical addresses associated with memory 2571
    a. Depends on system 2502 mapping
    b. Documented in system 2502 guides
(5) Identify the physical frames associated with the physical addresses identified in step (4)
    a. This is determined by CPU 2512's Page Table Entries (PTEs)
(6) Determine if the physical frames identified in step (5) are occupied with data
    a. Check PTEs to see if there is a valid mapping
(7) Fault out occupied physical frames to disk
    a. Use existing OS mechanism to fault out pages
    b. Use reverse mapping to identify virtual pages that map to each TABLE 2-continued physical frame (can be multiple virtual pages per physical frame)
  c. Update PTEs to signify virtual addresses are no longer in physical frames
(8) Once all physical pages are cleared, mark page table entries to indicate that these pages cannot be allocated by the CPU 2512
(9) Notify processor 2561 that it owns memory 2571 once they are cleared
  a. processor 2561 may need to perform some initialization and basic maintenance operations like calibration of the memory channel before IC 2610 begins allocating pages
(10) Mode switch complete, processor 2561 can now begin allocating pages in memory 2571

Memories 2571-2573 can be configured as memory dedicated for use by processors 2561-2563, respectively, or as OS visible memory on a rank by rank basis. In particular, as described herein, memory rank 2640-2648 can be either under the control of the CPU 2512, or under the control of IC 2610 on the memory module. To maintain compatibility with at least some memory controllers 2514, the memory rank 2640-2648 should not be allowed to be under the control of both the CPU 2512 and IC 2610 at the same time.

The process of transitioning between modes begins when an operator or program running on system 2502 decides to change the mode of at least one module 2602. A signal is sent to an operating system routine that takes different actions depending on whether the mode change is from standard to dedicated, or dedicated to standard.

The following list details a process of transitioning at least one module 2602 from dedicated mode to standard mode. For the purposes of this discussion, memory rank 2640-2648 is transitioning from being dedicated to IC 2610 to being under the control of CPU 2512. In addition, if the data in memory rank 2640-2648 is to be preserved, before beginning the transitioning process detailed below, assume that IC 2610 has flushed any caches (e.g., local memory 2614 or cache(s) inside of processor 2612) holding data bound for memory rank 2640-2648.

(1) Determine which IC 2610 memory pages stored in memory rank 2640-2648 have data being used by IC 2610. IC 2610 and/or processor 2612 can determine which memory pages stored in memory rank 2640-2648 have data by examining memory management data structures (e.g., page table entries or memory allocation structures) used by processor 2612.
(2) At least the memory pages stored in memory rank 2640-2648 that have data are removed or copied out of memory rank 2640-2648. This can be done by storing the data in memory rank 2640-2648 to disk. If it is not necessary to preserve the data stored in memory rank 2640-2648, the active memory pages stored in memory rank 2640-2648 may be cleared. The data in memory rank 2640-2648 may be stored to disk or other nonvolatile storage. This nonvolatile storage may be a solid-state disk drive or other nonvolatile storage disposed on module 2602 (described below). The data in memory rank 2640-2648 may be stored in another memory rank (e.g., memory rank 2650-2658) that is under the control of IC 2610. The memory rank receiving the data may be on the same module 2602 as IC 2610, or a different module.
(3) IC 2610 releases ownership of pages. IC 2610 may release its ownership of the pages on memory rank 2640-2648 by marking page table entries (PTEs) or memory allocation data structures as unavailable to IC 2610.
(4) Once IC 2610 has release ownership of pages the pages on memory rank 2640-2648, IC 2610 notifies CPU 2512 that memory pages on memory rank 2640-2648 are available to be allocated.
(5) CPU 2512 proceeds through its initialization process for pages to be allocated by the CPU 2512. For example, CPU 2512 may perform its page table initialization for memory rank 2640-2648. CPU 2512 and/or memory controller 2514 may also perform some initialization and/or basic maintenance operations, such as calibration of a memory channel or other routine memory initialization routines (e.g., zeroing, testing, etc.) before the CPU 2512 begins allocating pages.
(6) At this point, the mode switch of memory rank 2640-2648 from being dedicated to IC 2610 to being under the control of CPU 2512 is complete. CPU 2512 can now allocate pages in memory rank 2640-2648.

The following list details a process of transitioning at least one module 2602 from standard mode to dedicated mode. For the purposes of this discussion, memory rank 2640-2648 is transitioning from being under the control of CPU 2512 to being dedicated to IC 2610.

(1) Determine which CPU 2512 memory pages stored in memory rank 2640-2648 have data being used by CPU 2512. CPU 2512 can determine which memory pages stored in memory rank 2640-2648 have data by examining memory management data structures (e.g., CPU 2512 page table entries or OS memory allocation structures).
(2) Identify the physical pages corresponding to memory rank 2640-2648 that are to be allocated by CPU 2512 for exclusive use by IC 2610.
(3) Deallocate the physical pages corresponding to memory rank 2640-2648. This may be accomplished by executing a page fault routine to cause one or more of these physical pages stored in memory rank 2640-2648 to be copied to disk (or another location in memory that is accessible to CPU 2512).
(4) Once all of the physical pages that were stored on memory rank 2640-2648 are cleared (or copied to disk so they can be cleared or re-used), the CPU 2512 page table entries are marked to indicate that they cannot be allocated by CPU 2512.
(5) Once memory rank 2640-2648 is cleared, CPU 2512 notifies IC 2610 that it can use memory rank 2640-2648. IC 2610 may also perform some initialization and/or basic maintenance operations, such as calibration of a memory channel before the IC 2610 can begin allocating pages.

(6) At this point, the mode switch of memory rank 2640-2648 from being dedicated to CPU 2512 to being under the control of IC 2610 is complete. IC 2610 can now allocate pages in memory rank 2640-2648.

CPU 2512, IC 2610, and/or processor 2612 may use virtual addressing. When using virtual addressing, the process steps above include identifying pages that are in physical memory stored in memory rank 2640-2648 and deallocating them from physical memory. To accomplish this, the page table entries corresponding to memory rank 2640-2648 should be updated to indicate that the pages are no longer available to be allocated.

With virtual memory (a.k.a., virtual addressing), more than one process can be using a physical page at the same time. This is one way that shared memory can be implemented. When clearing out a physical page (e.g. faulting it out to disk), each virtual page across all processes should be tracked down to make sure that all processes know that the physical page is no longer available and/or valid.

out/faulted out to disk, the reverse mapping data structure associated with that page is traversed (by CPU 2512 and/or processor 2612), and each virtual page entry that points to that physical page is modified to denote that the virtual page is no longer mapped to physical memory. If the page is faulted out to disk, then the next time a process refers to that memory, a page fault will occur, and the page will be brought back into memory in a different page frame. Since the pages corresponding to memory rank 2640-2648 have been marked as unavailable/not-allocable to CPU 2512 or processor 2612, the page will be brought back into memory that is not under the control of IC 2610 or CPU 2512, respectively. In this way, the process of clearing data in physical pages from memory rank 2640-2648 being controlled by the CPU 2512 or IC 2610 can utilize existing page faulting mechanisms, as well as their existing page table structures.

Table 3 further describes a process of transitioning memory rank 2640-2648 from dedicated mode to standard mode. Again assume that if the data in memory rank 2640-2648 is to be preserved, before beginning the transitioning process detailed below, IC 2610 will flush any caches (e.g., local memory 2614 or cache(s) inside of processor 2612) holding data bound for memory rank 2640-2648.

TABLE 3

(1) Determine which memory rank 2640-2648 pages IC 2610 has data in
    a. IC 2610 can look at processor 2612's memory management structures
(2) Clear out memory rank 2640-2648 (store data to disk, clear out pages)
    a. Can page data out to disk
    b. Can terminate programs running on processor 2612 that use memory rank 2640-2648 and/or wait until these programs end
(3) Identify physical addresses associated with memory rank 2640-2648
    a. This identification depends on CPU 2512/memory controller 2514 mapping of CPU 2512 physical addresses to modules 2520.
    b. This mapping of CPU 2512 physical addresses to modules 2520 may be documented in system guides for system 2500.
(4) Identify CPU 2512 physical frames associated with CPU 2512 physical addresses identified in step (3)
    a. This is determined by the CPU 2512's Page Table Entries (PTEs)
    b. If IC 2610 is using virtual addressing, identify all virtual pages that map to each physical frame
        i. Can use reverse mapping
        ii. Update each PTE to indicate that all virtual pages mapping to the identified physical pages are unmapped
(5) Update CPU 2512 PTEs so frames are available to CPU 2512
    a. perform necessary page table initialization
(6) Once all frames are available on a module 2520, signal CPU 2512 that it can allocate them
    a. CPU 2512 or memory controller 2514 may need to perform some initialization and basic maintenance operations such as calibration of the memory channel connected to modules 2520 before CPU 2512 begins allocating pages
(7) Mode switch complete. CPU 2512 can now allocate pages in memory rank 2640-2648

Linux implement a reverse mapping data structure called an "object-based reverse mapping" structure. This data structure allows all virtual pages that map to a physical page to be identified via a doubly-linked list structure that is associated with one physical page. Each time a physical page is cleared Table 2 further describes a process of transitioning memory rank 2640-2648 from standard mode to dedicated mode. Note that the existing processes on CPU 2512 can keep running. The process detailed in Table 4 may occur in the background to threads currently running on CPU 2512.

TABLE 4

(1) Determine which memory rank 2640-2648 pages are to be allocated to IC 2610/processor 2612.
(2) Determine what data the pages to be allocated to IC 2610 in memory rank 2640-2648 have from CPU 2512 processes.
(3) CPU 2512 can use operating system mapping functions (e.g., object-based reverse mapping structure)
(4) Identify physical addresses associated with memory rank 2640-2648
    a. Depends on system 2500 mapping
    b. Documented in system 2500 guides TABLE 4-continued

- (5) Identify physical frames associated with the physical addresses identified in step (4)
    - a. This is determined by CPU 2512's Page Table Entries (PTEs)
- (6) Determine if the physical frames identified in step (5) are occupied with data
    - a. Check PTEs to see if there is a valid mapping
- (7) Fault out occupied physical frames to disk
    - a. Use existing OS mechanism to fault out pages
    - b. Use reverse mapping to identify virtual pages that map to each physical frame (can be multiple virtual pages per physical frame)
    - c. Update PTEs to signify virtual addresses are no longer in physical frames
- (8) Once all physical pages are cleared, mark page table entries to indicate that these pages cannot be allocated by the CPU 2512
- (9) Notify IC 2610 that it owns the memory rank 2640-2648 once they are cleared
    - a. IC 2610 may need to perform some initialization and basic maintenance operations like calibration of the memory channel before IC 2610 begins allocating pages
- (10) Mode switch complete, IC 2610 can now begin allocating pages in memory rank 2640-2648

Figure 29:
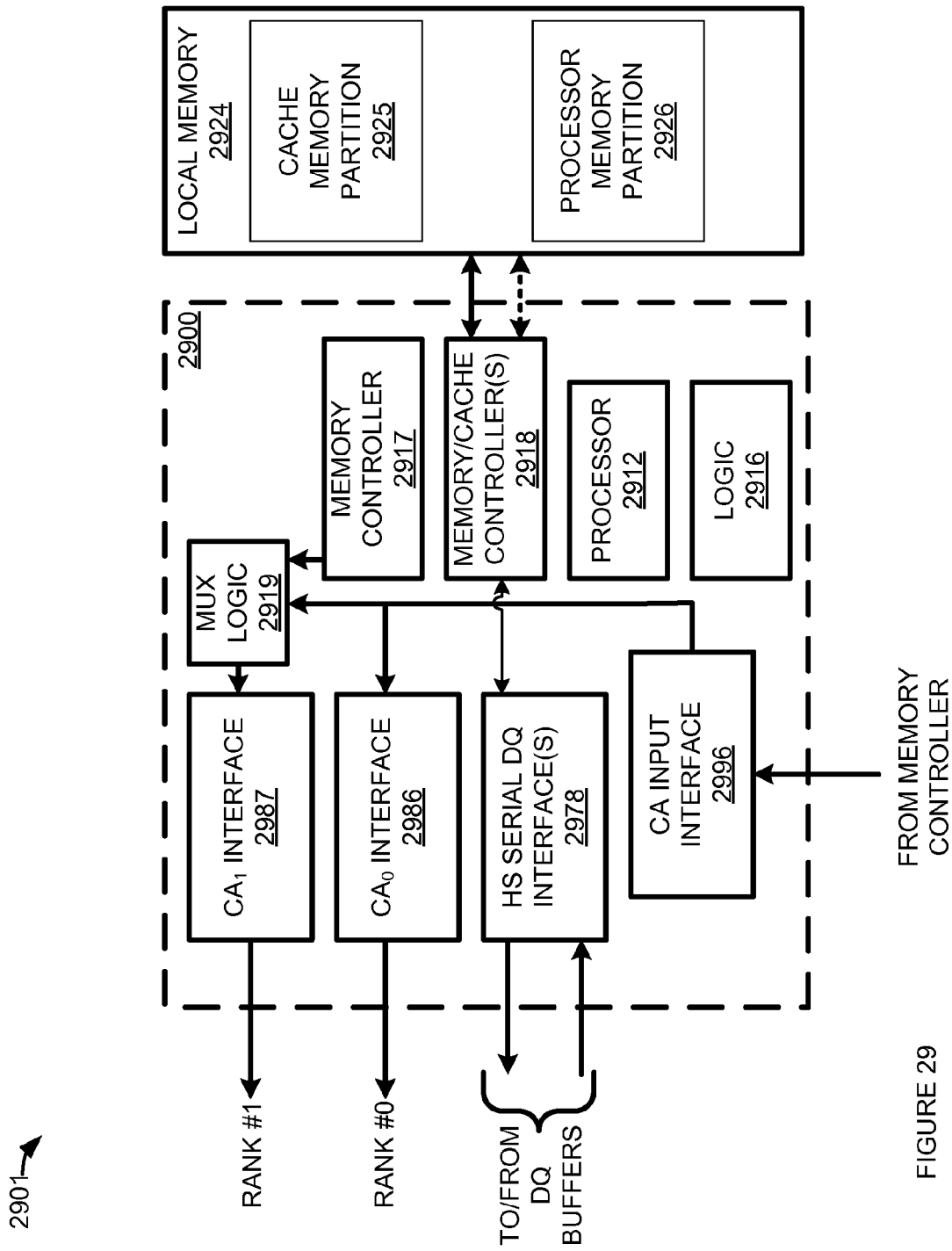
FIG. 29 is a block diagram illustrating a subsystem for a memory module.

FIG. 29 is a block diagram illustrating a subsystem for a memory module. In FIG. 29, subsystem 2901 comprises subsystem 2900 and local memory 2924. Subsystem 2900 comprises processor 2912, logic 2916, memory controller 2917, CA input interface 2996, multiplexor (MUX) logic 2919, $CA_0$ interface 2986, $CA_1$ interface 2987, and high-speed (HS) serial DQ interface(s) 2978. Subsystem 2900 also includes memory/cache controller(s) 2918. Memory/cache controller 2918 is operatively coupled to local memory 2924. Local memory 2924 includes a cache memory partition 2925 and a processor memory partition 2926. Local memory 2924 may be operatively coupled to subsystem 2900 by one or more memory channels. Accordingly, it can be seen that subsystem 2900 may be used as IC 2610 in memory modules 2600, 2601, and/or 2602 and that subsystem 2901 may be disposed on memory modules 2600, 2601, and/or 2602.

In an embodiment, local memory 2924 is a different type of dynamic memory than the dynamic memory coupled to $CA_0$ interface 2986 and/or $CA_1$ interface 2987. For example, the type of dynamic memory coupled to the $CA_1$ interface 2987 may be DDR3 and the type of memory connected as local memory 2924 may be XDR. Thus, accesses via the $CA_1$ interface and accesses to local memory 2924 may have similar latency (e.g., latency ratio ranges of, for example, 0.5-1.5, 0.7-1.3, or 0.9-1.1) but local memory 2924 may be accessed with significantly higher throughput (i.e., information rate). For example, a local memory 2924 accessed via 4 XDR memory channels may be accessed with 4-6 times (a.k.a., 4× to 6×) the bandwidth as a single DDR3 memory channel. Other bandwidth ratio ranges may be, for example, 2×-8×, 4×-9×, 3×-5×, and 3×-10×. Other examples of types of memory that may typically be coupled to $CA_0$ interface 2986 and/or $CA_1$ interface 2987 include, but are not limited to, DDR3, DDR4, and DDR5. Other examples of higher bandwidth types of memory that may typically be connected as local memory 2924 include, but are not limited to, XDR, XDR2, GDDR3, GDDR4, and GDDR5. Local memory 2924 may be, or include, a stack of memory devices such as a through-silicon-via (TSV) stack and/or a hybrid memory cube (HMC).

In an embodiment, local memory 2924 can be partitioned (or entirely dedicated for one use or the other) into a processor memory partition 2926 for use as a fast scratch pad memory and into a cache memory partition 2925 for use as a cache to the much larger memory coupled to $CA_0$ interface 2986 and/or $CA_1$ interface 2987. In other words, either or both of cache memory partition 2925 and processor memory partition 2926 may be a proper subset of local memory 2924 and used for their corresponding purposes, respectively.

It may be more advantageous for all of local memory 2924 to serve as cache for rank #1. For example, in a graphics application where there are a lot of textures to process, a large cache memory partition 2925 to stream texture data to one or more processors 2912 may be very useful. On the other hand, if the application is computational intensive, then having a large processor local memory partition 2926 may be useful as a scratch pad memory. Accordingly, how local memory 2924 is split between cache memory partition 2925, processor memory partition 2926, or other uses (not shown in FIG. 29) is application specific and can be reconfigured dynamically. In an embodiment, memory/cache controller 2918 implements a write-through cache replacement policy as it manages cache memory partition 2925.

Open pages of the memory coupled to the $CA_0$ interface 2986 and/or $CA_1$ interface 2987 can be mapped to open pages of local memory 2924. Data from the open pages of the memory coupled to the $CA_0$ interface 2986 and/or $CA_1$ interface 2987 can be copied to local memory 2924 during idle periods of the memory coupled to the $CA_0$ interface 2986 and/or $CA_1$ interface 2987.

In an embodiment, when subsystem 2901 (and thus, subsystem 2900) is disposed on a memory module (e.g., memory modules 2520, 2525, 2526, 2600, 2601, and/or 2602) subsystem 2900 is coupled to a memory interface configured to interface to a memory controller. Subsystem 2900 includes processor 2912, $CA_1$ interface 2987, and memory/cache controller 2918. $CA_1$ interface 2987 is coupled to processor 2912 and configured to connect to a first type of dynamic memory integrated circuit devices (e.g., DDR3). Memory/cache controller 2918 is coupled to processor 2912 and configured to connect to a second type of dynamic memory integrated circuit devices (e.g., XDR). The type of dynamic memory integrated circuit devices coupled to the $CA_1$ interface can have a latency that is similar, within a specified range of ratios, or approximately equal to the latency of the type of dynamic memory integrated circuit devices used for local memory 2924. Subsystem 2900 can use at least part of (or all of—i.e., a proper subset) of local memory 2924 as cache memory (i.e., cache memory partition 2925) for the dynamic memory integrated circuit devices coupled to the $CA_1$ interface.

The size of cache memory partition 2925 and/or processor memory partition 2926 may be reallocated in response to commands received from a memory controller via a memory interface. In other words, commands sent to an aperture corresponding to subsystem 2900 may be used to control the size of cache memory partition 2925 and/or processor memory partition 2926, and/or the ratio of the sizes of cache memory partition 2925 to the size of processor memory partition 2926. The size of cache memory partition 2925 and/or processor memory partition 2926 may be reallocated in response to processor 2912. For example, processor 2912 may determine that more or less cache is needed and instruct memory/cache controller 2918 to set or alter the size of cache memory partition 2925 and/or processor memory partition 2926.

In an embodiment, a memory module having subsystem 2901 (e.g., memory modules 2520, 2525, 2526, 2600, 2601, and/or 2602) can have a memory interface to connect to a memory channel. This memory module can have first dynamic memory integrated circuits coupled to $CA_1$ which have a first access latency and a first access information rate. Since subsystem 2901 is also included on this memory module, local memory 2924 can be present on the memory module. Local memory 2924 can have a second access latency which can be approximately equal to the first access latency. The first access information rate can be substantially less than the access information rate of local memory 2924. Subsystem 2900 includes memory/cache controller 2918. Memory/cache controller 2918 can copy data from an open page(s) of the first dynamic memory integrated circuits to open page(s) of local memory 2924 during idle periods of the first dynamic memory integrated circuits.

In an embodiment, subsystem 2900 caches data from at least one open page of the memory coupled to the $CA_1$ interface into at least one open page of local memory 2924 (and in cache memory partition 2925, in particular). Subsystem 2900 does this caching during an idle period of the memory coupled to the $CA_1$ interface. Subsystem 2900 can receive a request for data stored in the memory coupled to the $CA_1$ interface from processor 2912. Memory/cache controller 2918 (or logic 2916) can determine that this request can be satisfied using cached data stored in local memory 2924. Memory/cache controller 2918 can satisfy this request with data stored in local memory 2924 (and in cache memory partition 2925, in particular). In an embodiment, the access latency of the memory coupled to the $CA_1$ interface is approximately equal to the access latency of local memory 2924. In an embodiment, the access information rate to retrieve data from the memory coupled to the $CA_1$ interface is substantially less than the access information rate to retrieve data from local memory 2624. The size of cache memory partition 2925 and/or processor memory partition 2926 can be changed in response to processor 2912 and/or commands received from a memory controller. Open pages of the memory coupled to the $CA_1$ interface can be mapped to open pages of local memory 2924.

Figure 30:
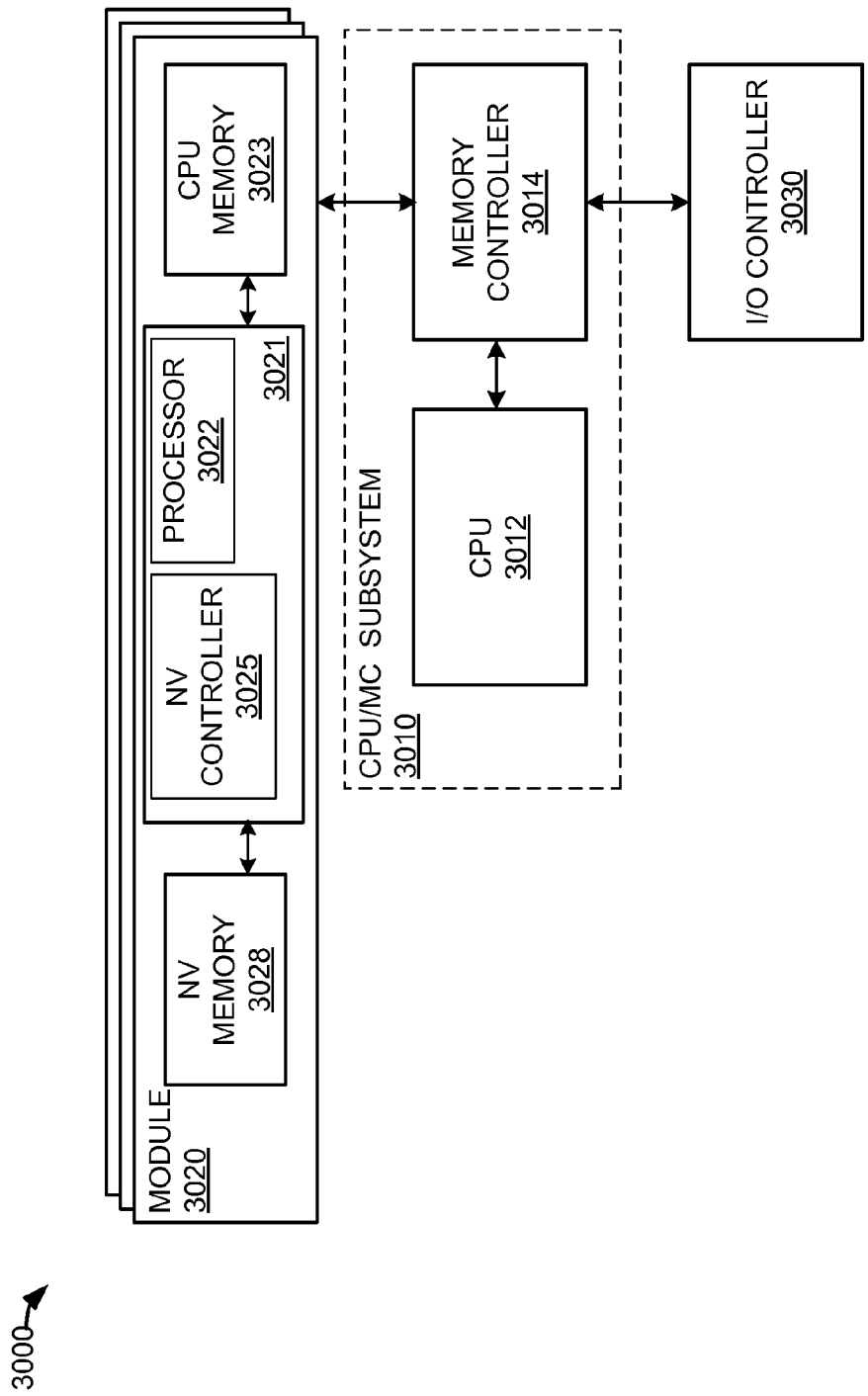
FIG. 30 is an illustration of a hybrid flash/DRAM memory module.

FIG. 30 is an illustration of a hybrid flash/DRAM memory module. In FIG. 30, computer system 3000 comprises CPU/memory controller subsystem 3010, I/O controller 3030, and memory modules 3020. CPU/memory controller subsystem 3010 includes CPU 3012 coupled to memory controller 3014. One or more memory modules 3020 are coupled to memory controller 3014 in subsystem 3010. Each memory module 3020 includes integrated circuit device 3021, CPU memory 3023, and nonvolatile memory 3028. Integrated circuit device 3021 includes a nonvolatile memory controller 3025 and processor 3022. CPU memory 3023 typically contains instructions and/or data used by the CPU 3012. Nonvolatile memory 3028 typically contains instructions and/or data used by CPU 3012 and/or processor 3022. CPU memory 3023 can be dynamic memory integrated circuits. Integrated circuit device 3021 can include other functionality. Accordingly, it should be understood that integrated circuit device 3021 may correspond to IC 2610 in memory modules 2600, 2601, and/or 2602 and that module 3020 may be an embodiment of memory modules 2600, 2601, and/or 2602.

The module 3020 illustrated in FIG. 30 includes a multiple time programmable nonvolatile memory 3028. Flash memory controller 3025 manages/controls nonvolatile memory 3028. Thus, module 3020 can have a combination of DRAM and nonvolatile RAM. Nonvolatile memory 3028 may be configure/controlled as a solid-state disk (SSD). Flash memory controller 3025 may include (or be) an SSD controller (with or without an additional processor). The SSD on module 3020 may be accessed by CPU 3012 via the memory channel which typically has higher bandwidth than an I/O bus.

Typically, nonvolatile memory 3028 (a.k.a., flash or flash memory) is seen as less reliable than DRAM. Thus, it is expected that one or more flash chips may fail while the DRAM chips (i.e., CPU memory 3023) on module 3020 are all still functional. Accordingly, nonvolatile memory 3028 may be placed in one or more sockets, or be accessed via a connector. This allows nonvolatile memory 3028 to be replaced easily when a failure occurs. Thus, module 3020 does not need to be scrapped when a failure occurs in nonvolatile memory 3028. Since DRAM is relatively expensive compared to flash, replacing the flash upon a flash failure may make economic sense.

When nonvolatile memory 3028 is configured as an SSD, the SSD on module 3020 may be accessed directly by a processor 3022. Integrated circuit device 3021 may include a serial-ATA (SATA), serial attached SCSI (SAS), eSATA, PATA, IEEE 1394, USB (all revisions), SCSI Ultra, FiberChannel, Infiniband, Thunderbolt, or other industry standard I/O interfaces (such as PCI-Express—PCIe) to interface to the external nonvolatile memory 3028 via an external flash controller (not shown in FIG. 30). Integrated circuit device 3021 may include a network processor unit (NPU) such as a TCP offload engine (TOE), a protocol translator (e.g., TCP over SATA, TCP over PCI-Express, accelerated SCSI interconnect, etc.), and/or a protocol packet translator. These arrangements may save pincount on integrated circuit device 3021. Advances in packaging technology may allow integrated circuit device 3021 to incorporate the external controller and to interface with nonvolatile memory 3028 with a native nonvolatile memory interface. Processor 3022 and/or integrated circuit device 3021 and an SSD on integrated circuit device 3021 may communicate via an SATA interface. Processor 3022 and/or integrated circuit device 3021 and an SSD on integrated circuit device 3021 may communicate via a SAS, eSATA, PATA, IEEE 1394, USB (all revisions), SCSI Ultra, FiberChannel, Infiniband, Thunderbolt, or other industry standard I/O interface (such as PCI-Express—PCIe). Module 3020 may include a SATA connector for communicating with an SSD/HDD external to the module 3020. Module 3020 may include a SAS, eSATA, PATA, IEEE 1394, USB (all revisions), SCSI Ultra, FiberChannel, Infiniband, Thunderbolt, PCIe or other industry standard I/O connector for communicating with an SSD/HDD external to the module 3020.

It should be understood that integrated circuit device 3021 may include additional processing functions and/or specialized processors. For example, integrated circuit device 3021 may include fixed function graphics processing units, encryption/decryption accelerators/offload engines (e.g., for implementing/accelerating SSL, AEC, DEC, etc.), and media format encoders/decoders (e.g., JPEG, DVX, AVI, MP2, MP3, MP4, Blu-ray, HD-DVD, DVD, etc.). It should also be understood that module 3020 may be coupled to enterprise storage type systems such as those with a longer storage latency than a local SSD/HDD. For example, module 3020 may be coupled to external disks, external disk arrays, RAID arrays, tape drives, optical drives, and the like.

Figure 31:
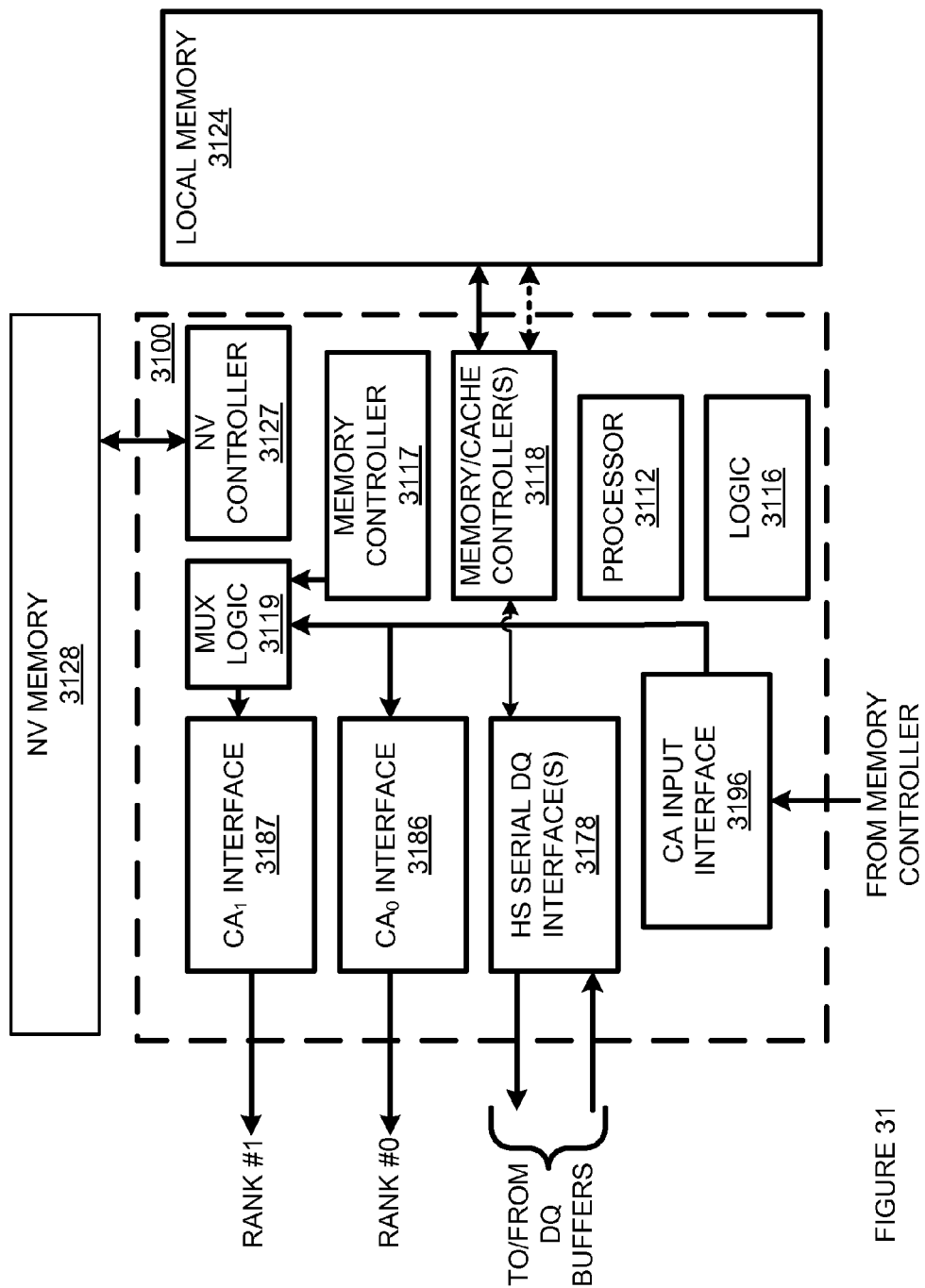
FIG. 31 is a block diagram illustrating a hybrid flash/DRAM compute subsystem.

FIG. 31 is a block diagram illustrating a hybrid flash/DRAM memory module compute subsystem. In FIG. 31, NV subsystem 3101 comprises subsystem 3100, local memory 3124, and nonvolatile memory 3128. Subsystem 3100 comprises processor 3112, logic 3116, memory controller 3117, CA input interface 3196, multiplexor (MUX) logic 3119, $CA_0$ interface 3186, $CA_1$ interface 3187, HS serial DQ interface(s) 3178, and nonvolatile memory controller 3127. Subsystem 3100 also includes memory/cache controller(s) 3118. Memory/cache controller 3118 is operatively coupled to local memory 3124. Local memory 3124 may include a cache memory partition and a processor memory partition. Local memory 3124 may be operatively coupled to subsystem 3100 by one or more memory channels. It should be understood that subsystem 3101 may be included on a memory module 3020. Thus, it can be seen that subsystem 3100 may be used as IC 2610 in memory modules 2600, 2601, and/or 2602 and that subsystem 3101 may be disposed on memory modules 3020, 2600, 2601, and/or 2602.

In an embodiment, a memory module having subsystem 3101 (e.g., memory modules 3020, 2520, 2525, 2526, 2600, 2601, and/or 2602) can have a memory interface configured to connect with a memory controller. Subsystem 3100 may be an integrated circuit device that is coupled to the memory interface. Subsystem 3100 includes processor 3112, $CA_1$ interface 3187, nonvolatile memory controller 3127, and an interface to nonvolatile memory 3128. $CA_1$ interface 3187 is configured to connect to a first type of dynamic memory integrated circuit devices. Nonvolatile memory controller 3127 is coupled to processor 3112. The interface to nonvolatile memory 3128 is configured to couple nonvolatile memory controller 3127 to at least one nonvolatile memory integrated circuit device. A plurality of the first type of dynamic memory integrated circuit devices is coupled to $CA_1$ interface 3187. At least one nonvolatile memory integrated circuit device is coupled to subsystem 3100 via the interface to nonvolatile memory 3128.

Subsystem 3101 may also include a local memory 3124. This local memory 3124 may comprise at least one of a second type of dynamic memory integrated circuit device. Local memory 3124 may connect to subsystem 3100 via an interface. This interface may couple local memory 3124 to processor 3112 via memory/cache controller 3118. Local memory 3124 may be used to cache data stored in the dynamic memory integrated circuit devices coupled to $CA_1$ interface 3187. Subsystem 3101 may include an SSD controller coupled to processor 3112 and nonvolatile memory controller 3127. Subsystem 3101 may include a SATA controller coupled to processor 3112 and nonvolatile memory controller 3127. Nonvolatile memory 3128 may store an operating system that processor 3112 can boot up and execute. This operating system may be a different operating system than, for example, CPU 3012 boots and runs. The memory module may receive instructions via the memory interface that cause processor 3112 to perform operations on data. Subsystem 3100 may return the results of these operation via the memory interface.

In an embodiment, a memory module having subsystem 3101 (e.g., memory modules 3020, 2520, 2525, 2526, 2600, 2601, and/or 2602) can have a memory interface to connect to a memory channel. This memory module may include a plurality of dynamic memory integrated circuits. The memory module may have a nonvolatile memory 3128 comprising at least one nonvolatile memory integrated circuit device. The memory module may include subsystem 3100. Subsystem 3100 includes processor 3112, $CA_1$ interface 3187, NV controller 3127, and CA input interface 3196, and High-speed (HS) serial DQ interface 3178. $CA_1$ interface 3187 is coupled to the plurality of dynamic memory integrated circuits. NV controller 3127 is coupled to nonvolatile memory 3128 via an interface.

In an embodiment, subsystem 3100 receives a memory command from a memory controller coupled to CA input interface 3196. In response to this memory command, subsystem 3100 stores data in the plurality of dynamic memory integrated circuits coupled to $CA_1$ interface 3187 and/or a plurality of dynamic memory integrated circuits coupled to $CA_0$ interface 3186. In response to a command from processor 3112, subsystem 3100 stores data in nonvolatile memory 3128.

Figure 32:
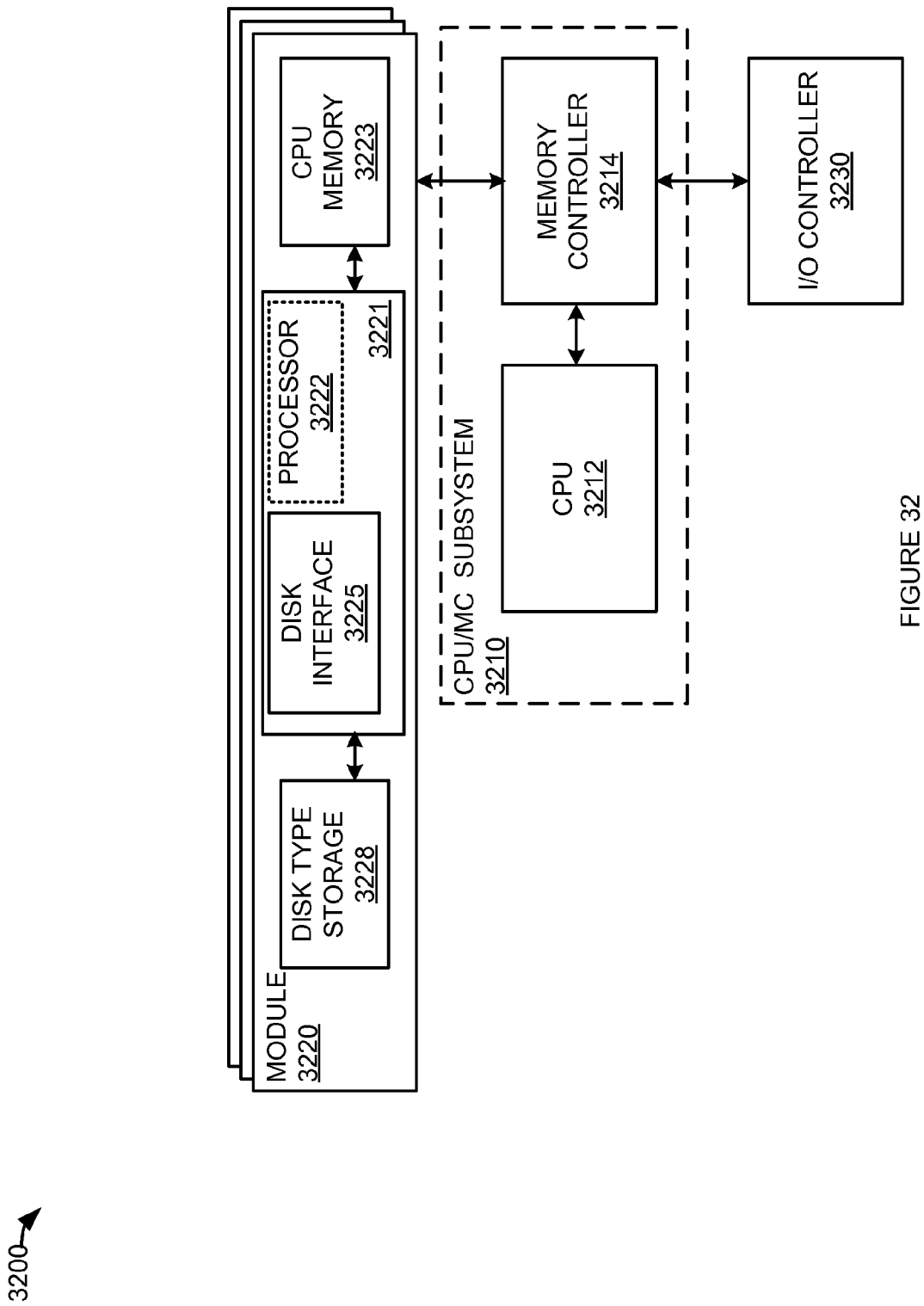
FIG. 32 is an illustration of a hybrid disk type nonvolatile storage and DRAM memory module.

FIG. 32 is an illustration of a hybrid disk type nonvolatile storage and DRAM memory module. In FIG. 32, computer system 3200 comprises CPU/memory controller subsystem 3210, I/O controller 3230, and memory modules 3220. CPU/memory controller subsystem 3210 includes CPU 3212 coupled to memory controller 3214. One or more memory modules 3220 are coupled to memory controller 3214 in subsystem 3210. Each memory module 3220 includes integrated circuit device 3221, CPU memory 3223, and disk type storage 3228. Integrated circuit device 3221 includes a disk interface 3225 and processor 3222. CPU memory 3223 typically contains instructions and/or data used by the CPU 3212. Disk type storage 3228 typically contains instructions and/or data used by CPU 3212 and/or processor 3222. CPU memory 3223 can be dynamic memory integrated circuits. Integrated circuit device 3221 can include other functionality. Accordingly, it should be understood that integrated circuit device 3221 may correspond to IC 2610 in memory modules 2600, 2601, and/or 2602 or subsystems 2800, 2900, and/or 3100 and that module 3220 may be an embodiment of memory modules 3020, 2600, 2601, and/or 2602.

The module 3220 illustrated in FIG. 30 includes disk type storage 3228. Disk type storage may be, or include, but is not limited to, a solid-state disk drive, flash memory controlled and organized as a disk type mass storage device (e.g., a USB memory stick), or a small form-factor magnetic disk drive (e.g., a 1.8" or smaller hard disk drive).

Disk interface 3225 manages/controls disk type storage 3228. Thus, module 3220 can have a combination of DRAM and disk type storage 3228. Disk interface 3225 may include (or be) an SSD controller (with or without an additional processor). Disk interface 3225 on module 3220 may be accessed by CPU 3212 via the memory channel which typically has higher bandwidth than an I/O bus.

Disk type storage 3228 may be accessed directly by a processor 3022. In other words, disk type storage 3228 may be accessed by a processor 3022 without passing the data/address through memory controller 3214 or relying upon CPU 3212. Disk interface 3225 may be or include an SATA interface. Processor 3222 and/or integrated circuit device 3221 and disk type storage 3228 may communicate via an SATA interface. Module 3220 may include a SATA connector for communicating with an SSD/HDD external to the module 3220.

Figure 33:
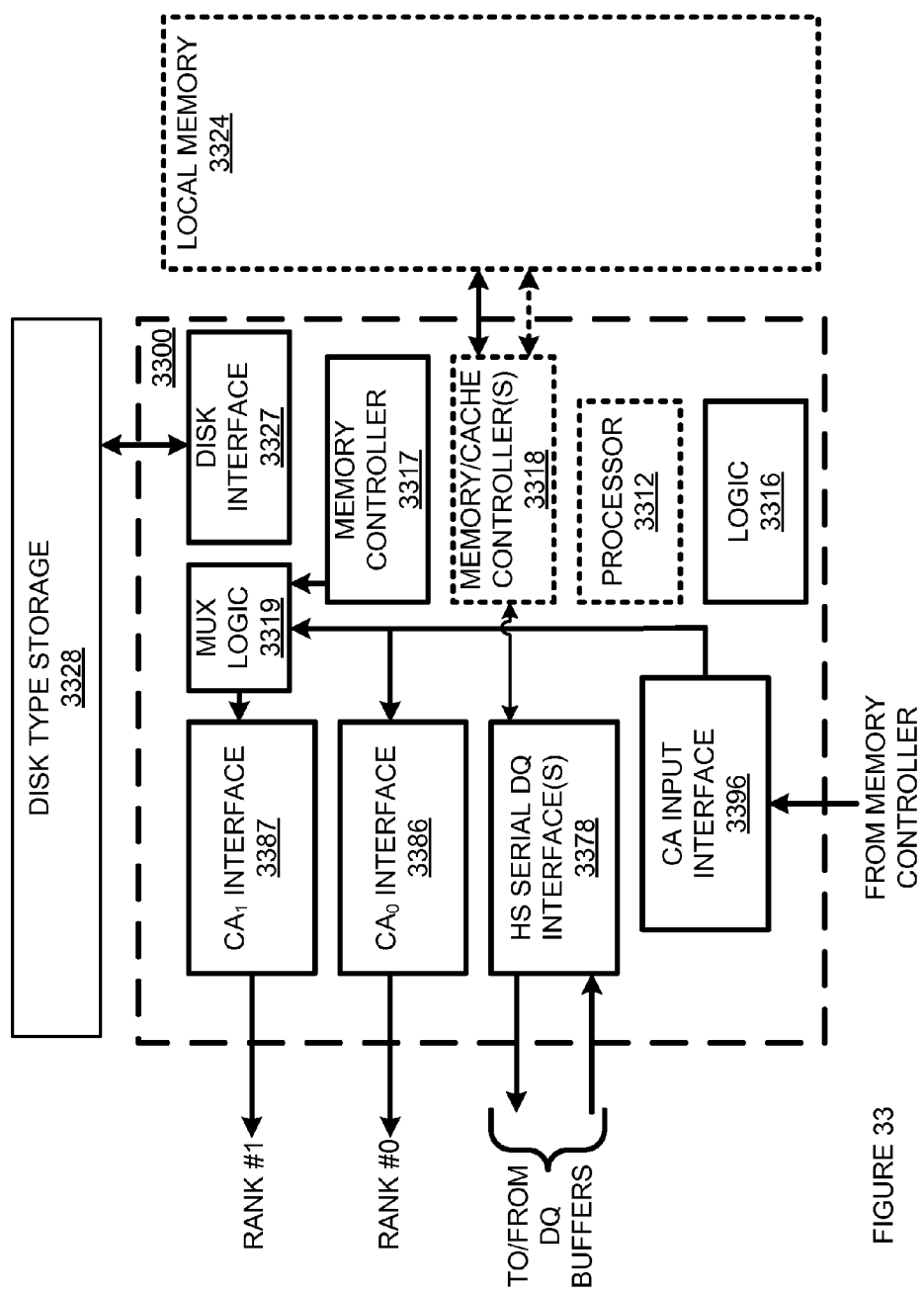
FIG. 33 is a block diagram illustrating a hybrid disk type nonvolatile storage and DRAM memory module compute subsystem.

FIG. 33 is a block diagram illustrating a hybrid disk type nonvolatile storage and DRAM memory module compute subsystem. In FIG. 33, subsystem 3301 may comprise subsystem 3300, optional local memory 3324, and disk type storage 3328. Subsystem 3300 comprises logic 3316, memory controller 3317, CA input interface 3396, multiplexor (MUX) logic 3319, $CA_0$ interface 3386, $CA_1$ interface 3387, HS serial DQ interface(s) 3378, and disk interface 3327. Subsystem 3300 may optionally include processor 3312 and memory/cache controller(s) 3318. If included, memory/cache controller 3318 is operatively coupled to local memory 3324 (if included). Local memory 3324 may be operatively coupled to subsystem 3300 by one or more memory channels. Local memory 3324 may be accessed by one or more memory channels. It should be understood that subsystem 3301 may be included on a memory module 3220. Thus, it can be seen that subsystem 3300 may be used as IC 2610 in memory modules 2600, 2601, and/or 2602 and that subsystem 3301 may be disposed on memory modules 3020, 3220, 2600, 2601, and/or 2602.

In an embodiment, a memory module having subsystem 3301 (e.g., memory modules 3020, 3220, 2520, 2525, 2526, 2600, 2601, and/or 2602) can have a memory interface configured to connect with a memory controller. Subsystem 3300 may be an integrated circuit device that is coupled to the memory interface. Subsystem 3300 includes $CA_1$ interface 3387 and disk interface 3327. $CA_1$ interface 3387 is configured to connect to a first type of dynamic memory integrated circuit devices. Disk interface 3327 may be coupled to processor 3312 (if present). A plurality of the first type of dynamic memory integrated circuit devices are coupled to $CA_1$ interface 3387. At least one disk type storage device 3328 coupled to subsystem 3100 via the disk interface 3327.

Subsystem 3301 may also include a local memory 3324. This local memory 3324 may comprise at least one of a second type of dynamic memory integrated circuit device. Local memory 3324 may connect to subsystem 3300 via an interface. This interface may couple local memory 3324 (if present) to processor 3112 (if present) via memory/cache controller 3318 (if present). Local memory 3324 may be used to cache data stored in the dynamic memory integrated circuit devices coupled to $CA_1$ interface 3387. Disk type storage 3328 may store an operating system that processor 3312 (if present) can boot up and execute. The memory module may receive instructions via the memory interface that cause processor 3312 (if present) to perform operations on data. Subsystem 3300 may return the results of these operations via the memory interface.

In an embodiment, a memory module having subsystem 3301 (e.g., memory modules 3020, 3220, 2520, 2525, 2526, 2600, 2601, and/or 2602) can have a memory interface to connect to a memory channel. This memory module may include a plurality of dynamic memory integrated circuits. The memory module may have disk type storage 3328. The memory module may include subsystem 3300. Subsystem 3300 includes $CA_1$ interface 3387, disk interface 3327, and CA input interface 3396, and High-speed (HS) serial DQ interface 3378. $CA_1$ interface 3387 is coupled to the plurality of dynamic memory integrated circuits. Disk interface 3327 is coupled to disk type storage 3328 via an interface.

In an embodiment, subsystem 3300 receives a memory command from a memory controller coupled to CA input interface 3396. In response to this memory command, subsystem 3300 stores data in the plurality of dynamic memory integrated circuits coupled to $CA_1$ interface 3387 and/or a plurality of dynamic memory integrated circuits coupled to $CA_0$ interface 3386. In response to a command by processor 3312, subsystem 3300 can store data in disk type storage 3328.

Figure 34:
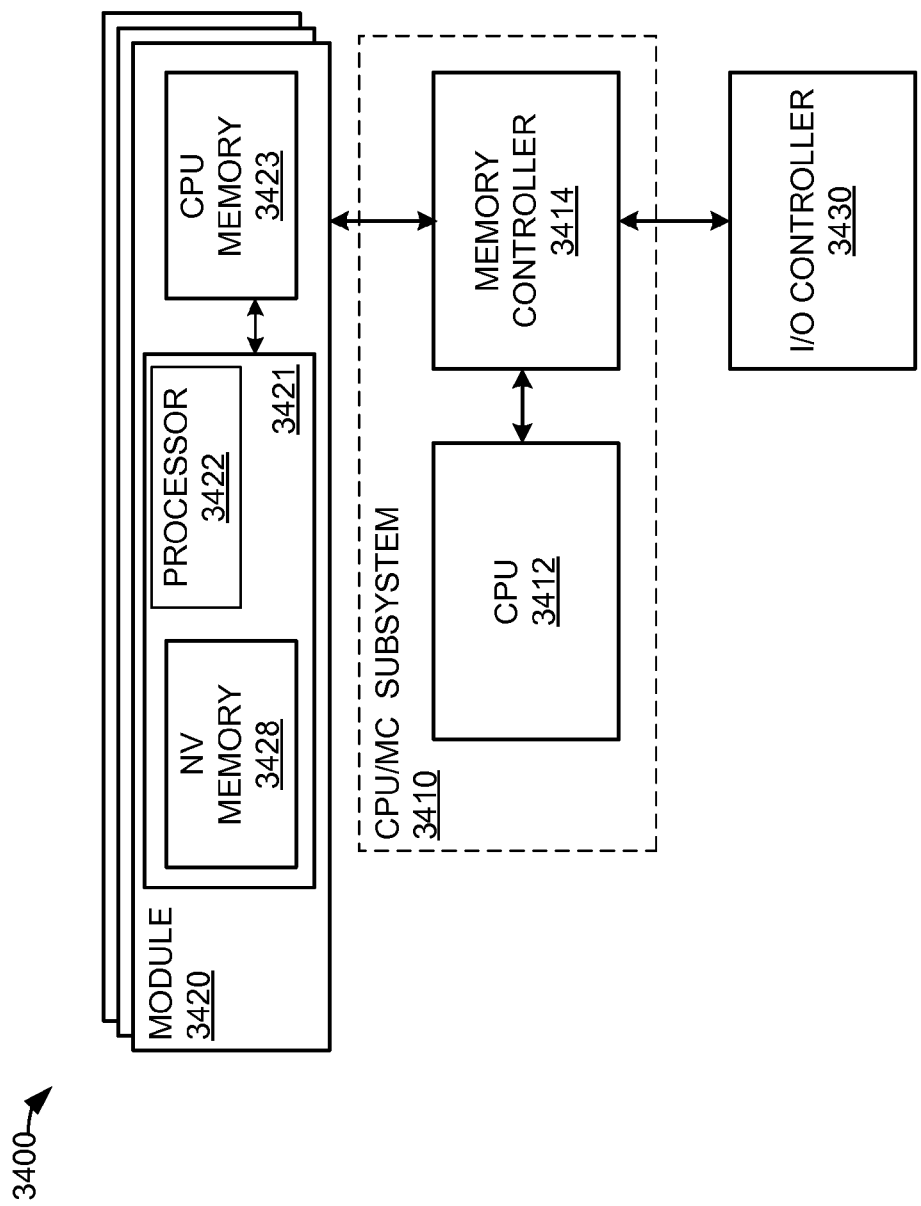
FIG. 34 is an illustration of a hybrid flash/DRAM memory module.

FIG. 34 is an illustration of a hybrid flash/DRAM memory module. In FIG. 34, computer system 3400 comprises CPU/memory controller subsystem 3410, I/O controller 3430, and memory modules 3420. CPU/memory controller subsystem 3410 includes CPU 3412 coupled to memory controller 3414.

One or more memory modules 3420 are coupled to memory controller 3414 in subsystem 3410. Each memory module 3420 includes integrated circuit device 3021 and CPU memory 3423. Integrated circuit device 3421 includes nonvolatile memory 3428 and processor 3422. CPU memory 3423 typically contains instructions and/or data used by the CPU 3412. CPU memory 3423 can be dynamic memory integrated circuits. Integrated circuit device 3421 can include other functionality. Accordingly, it should be understood that integrated circuit device 3421 may correspond to IC 2610 in memory modules 2600, 2601, and/or 2602 or subsystems 2800, 2900, 3100 and/or 3300 and that module 3420 may be an embodiment of memory modules 3020, 3220, 2600, 2601, and/or 2602.

Since nonvolatile memory 3428 is included in integrated circuit device 3421, nonvolatile memory 3428 may be accessed directly by a processor 3022. Integrated circuit device 3421 may include an SATA interface. Processor 3422 and/or integrated circuit device 3421 and an SSD on integrated circuit device 3421 may communicate via an SATA interface. Module 3420 may include a SATA connector for communicating with an SSD/HDD external to the module 3420.

Figure 35:
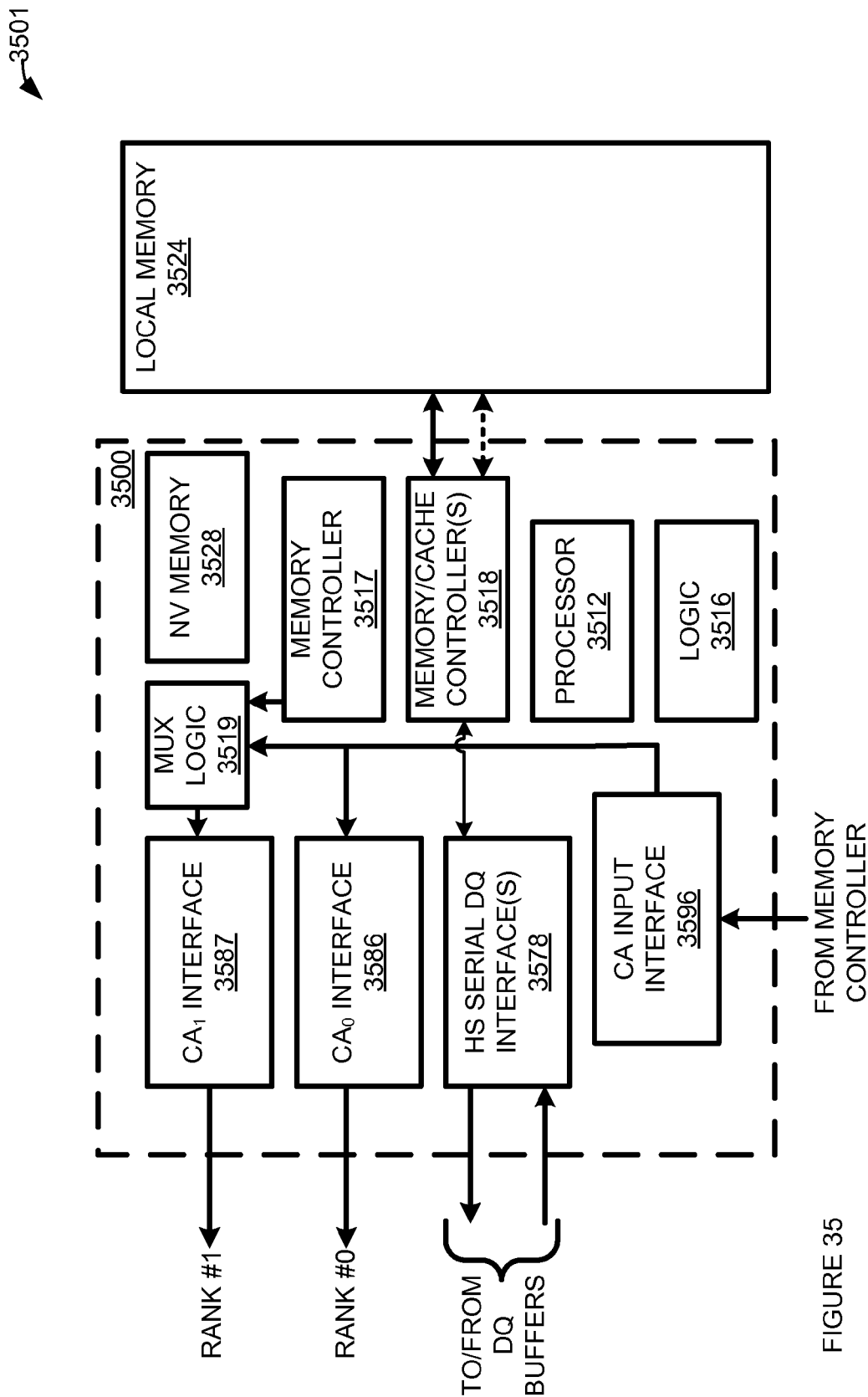
FIG. 35 is a block diagram illustrating a hybrid flash/DRAM compute subsystem.

FIG. 35 is a block diagram illustrating a hybrid flash/DRAM memory module compute subsystem. In FIG. 35, subsystem 3501 comprises subsystem 3500 and local memory 3524. Subsystem 3500 comprises processor 3512, logic 3516, memory controller 3517, CA input interface 3596, multiplexor (MUX) logic 3519, $CA_0$ interface 3586, $CA_1$ interface 3587, high-speed (HS) serial DQ interface(s) 3578, and nonvolatile memory 3528. Subsystem 3500 also includes memory/cache controller(s) 3518. Memory/cache controller 3518 is operatively coupled to local memory 3524. Local memory 3524 may be operatively coupled to subsystem 3500 by one or more memory channels. It should be understood that subsystem 3501 may be included on a memory module 3420. Thus, it can be seen that subsystem 3500 may be used as IC 2610 in memory modules 2600, 2601, and/or 2602 and that subsystem 3501 may be disposed on memory modules 3020, 3220, 3240, 2600, 2601, and/or 2602.

In an embodiment, a memory module having subsystem 3501 (e.g., memory modules 3020, 3220, 3420, 2520, 2525, 2526, 2600, 2601, and/or 2602) can have a memory interface configured to connect with a memory controller. Subsystem 3500 may be an integrated circuit device that is coupled to the memory interface. Subsystem 3500 includes a processor 3512, $CA_1$ interface 3587, and nonvolatile memory 3528. $CA_1$ interface 3587 is configured to connect to a first type of dynamic memory integrated circuit devices. Nonvolatile memory 3528 is coupled to processor 3512. A plurality of the first type of dynamic memory integrated circuit devices is coupled to $CA_1$ interface 3587.

Subsystem 3501 may also include a local memory 3524. This local memory 3524 may comprise at least one of a second type of dynamic memory integrated circuit device. Local memory 3524 may connect to subsystem 3500 via an interface. This interface may couple local memory 3524 to processor 3512 via memory/cache controller 3518. Local memory 3524 may be used to cache data stored in the dynamic memory integrated circuit devices coupled to $CA_1$ interface 3587. Nonvolatile memory 3528 may store an operating system that processor 3512 can boot up and execute. The memory module may receive instructions via the memory interface that cause processor 3512 to perform operations on data. Subsystem 3500 may return the results of these operations via the memory interface.

In an embodiment, a memory module having subsystem 3501 (e.g., memory modules 3020, 3220, 3420, 2520, 2525, 2526, 2600, 2601, and/or 2602) can have a memory interface to connect to a memory channel. This memory module may include a plurality of dynamic memory integrated circuits. The memory module may include subsystem 3500. Subsystem 3500 includes processor 3512, $CA_1$ interface 3187, NV controller 3527, CA input interface 3596, High-speed (HS) serial DQ interface 3578, and nonvolatile memory 3528. $CA_1$ interface 3587 is coupled to the plurality of dynamic memory integrated circuits.

In an embodiment, subsystem 3500 receives a memory command from a memory controller coupled to CA input interface 3596. In response to this memory command, subsystem 3500 stores data in the plurality of dynamic memory integrated circuits coupled to $CA_1$ interface 3587 and/or a plurality of dynamic memory integrated circuits coupled to $CA_0$ interface 3586. In response to a command from processor 3512, subsystem 3500 stores data in nonvolatile memory 3528.

Memory modules 3020, 3220, 3420, 2520, 2525, 2526, 2600, 2601, and/or 2602 can each include an integrated circuit device that can have one or more processing cores. Memory modules 3020, 3220, and 3420 include some form of nonvolatile memory. This nonvolatile memory may be placed on one side of modules 3020, 3220, and 3420. This nonvolatile memory may function as an SSD. The nonvolatile functioning as an SSD may hold an operating system that is booted and executed by one or more processing cores. Thus, it should be understood that modules 3020, 3220, and 3420 can be viewed as self-contained computer systems.

Systems with modules 3020, 3220, or 3420 (e.g., system 3000, system 3200, and system 3400) have architectural properties that help the performance of applications running, for example, MapReduce, Hadoop, Databases, and In-Memory Databases (IMDB). These architectural properties include, for example, the use of sequential and parallel computing cores in the IC 3021, IC 3221, and/or 3421. IC 3021, IC 3221, and/or 3421 can contain both traditional CPU type cores and GPU type cores. This allows modules 3020, 3220, or 3420 to store MapReduce data and process it in an effective and efficient manner. Research indicates that parallel compute cores can be useful for MapReduce tasks, and the integration of both traditional CPU type cores and GPU type cores on the modules 3020, 3220, or 3420 can provide programmers/systems with CPU type compute resources and GPU type compute resources as needed.

Another architectural property is the use of nonvolatile memory as an SSD. This can increase IOPS (I/Os Per Second) and provide a mechanism for fast checkpointing, logging, restart, and recovery. MapReduce, Hadoop and databases are typically designed to manipulate large amounts of data. The incorporation of an SSD improves I/O performance. Splitting the memory in system 3000, system 3200, and/or system 3400 and dedicating a relatively large amount of main memory/storage to each compute engine (i.e., each of IC 3021, IC 3221, and/or 3421—which each can have multiple cores) can change the ratio of compute and storage capacity and/or bandwidth in a way that can be more favorable to MapReduce, Hadoop, and/or databases. Having multiple compute engines (one on each of modules 3020, 3220, or 3420) can also change the ratio of compute and storage capacity and/or bandwidth in a way that can be more favorable to MapReduce/Hadoop and databases. Another architectural property is the use of high capacity and high bandwidth memory and SSD storage on the modules 3020, 3220, or 3420. This can improve query performance and query caching for database applications.

Figure 36A:
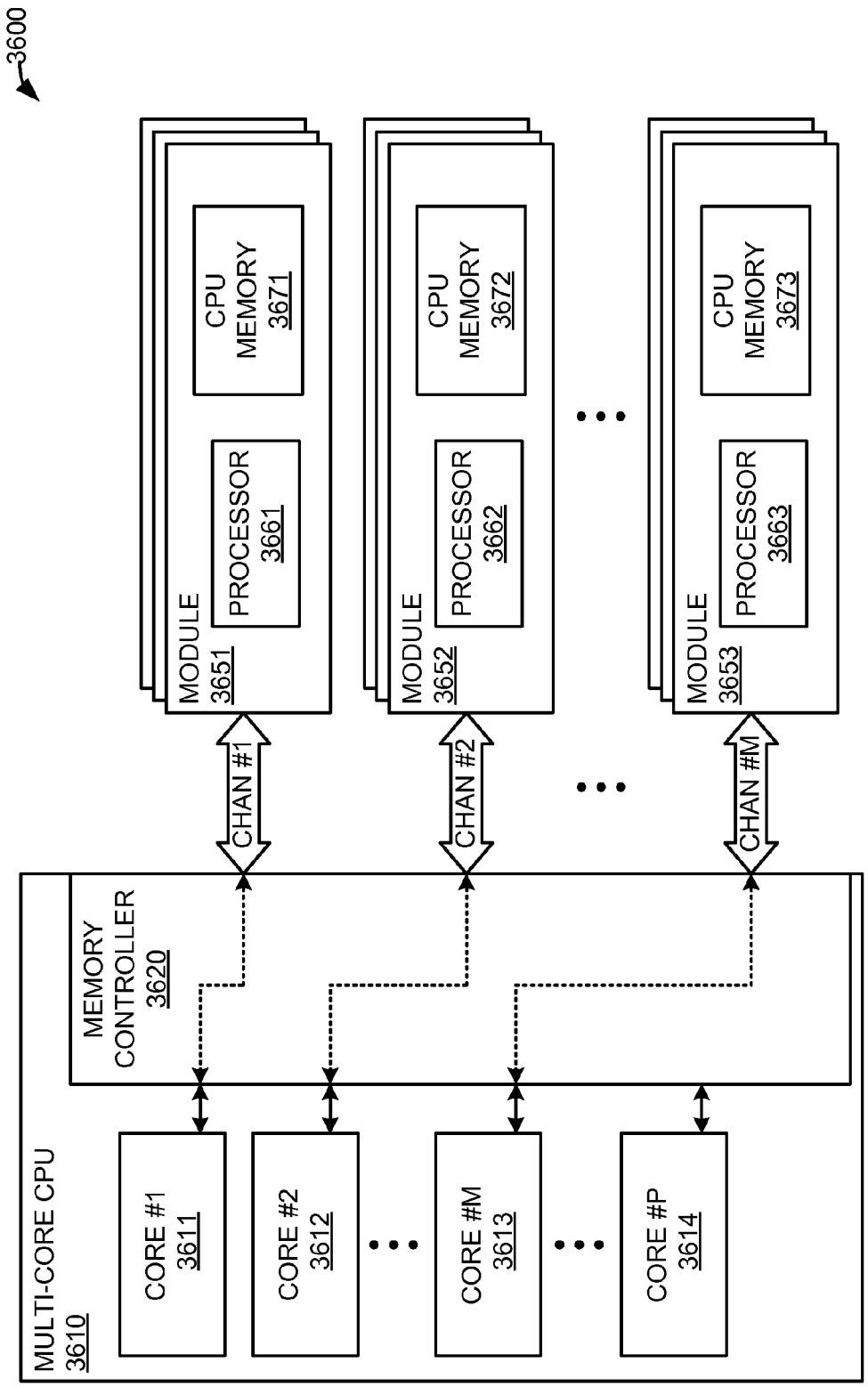
FIG. 36A is a block diagram of a multi-core computer system.

FIG. 36A is a block diagram of a multi-core computer system. In FIG. 36A, system 3600 comprises multi-core CPU 3610, memory modules 3651, memory modules 3652, and memory modules 3653. Multi-core CPU 3610 includes P number of processor cores 3611-3614 and memory controller 3620. Memory controller 3620 has M number of memory channels. One or more memory modules 3651 are coupled to memory controller 3620 via a first memory channel. One or more memory modules 3652 are coupled to memory controller 3620 via a second memory channel. One or more memory modules 3653 are coupled to memory controller 3620 via an $M^{th}$ memory channel.

Each memory module 3651 includes a processor 3661 and memory 3671. Memory 3671 typically contains instructions and/or data used by the CPU 3610 and/or processor 3661. Each memory module 3652 includes a processor 3662 and memory 3672. Memory 3672 typically contains instructions and/or data used by the CPU 3610 and/or processor 3662. Each memory module 3653 includes a processor 3663 and memory 3673. Memory 3673 typically contains instructions and/or data used by the CPU 3610 and/or processor 3663.

In FIG. 36A, processor core #1 3611 is shown operatively coupled to memory modules 3651 via memory controller 3620 and memory channel #1. Processor core #2 3612 is shown operatively coupled to memory modules 3652 via memory controller 3620 and memory channel #2. Processor core #M 3613 is shown operatively coupled to memory modules 3653 via memory controller 3620 and memory channel #M. Processor core #P 3614 is shown operatively coupled to memory controller 3620. Processor cores 3611-3614 can have different functions (e.g., DSP, GPU, CPU, etc.) and/or execute different processes and/or applications at the same time. In an embodiment, each processor core 3611-3614 can connect with any memory channel #1-#M.

System 3600 determines how many cores are in CPU 3610. In other words, via a system call or other method, CPU 3610 determines that there are P number of processor cores in CPU 3610. System 3600 also determines how many memory channels memory controller 3620 is using to communicated with memory modules 3651-3653. In other words, via a system call or other method, system 3600 determines that there are M number of memory channels being used to communicate with memory modules 3651-3653. The number M may remain relatively static. However, M may change between system startups as more memory channels are populated and/or depopulated with memory modules 3651-3653.

System 3600 selects a group of M number of processor cores 3611-3613. These cores will be each used to communicate with one set of memory modules 3651-3653 via a single memory channel (i.e., each selected processor core 3611-3613 will communicate via one of M memory channels). Thus, the number of cores selected is, in an embodiment, equal to the number of memory channels having memory modules 3651-3653 that have processors 3661-3663, respectively.

Each of the selected group of processor cores (i.e., processor core #1 3611 through processor core #M 3613) is assigned to communicate with at least one processor 3661-3663 on the memory modules 3651-3653 coupled to each of the M number of memory channels. In other words, processor core #1 3611 is assigned to communicate with the at least one processor 3661 on memory modules 3651 via memory channel #1. Processor core #2 3612 is assigned to communicate with the at least one processor 3662 on memory modules 3652 via memory channel #2, and so on, for all of the M number of processor cores 3611-3613 in the selected group (and M number of memory channels with memory modules 3651-3653 having processors 3661-3663).

There can be M+X number of memory channels supported by memory controller 3620, where X is a number of memory channels that do not have any memory modules 3651-3653 having processors 3661-3663. However, since they do not have any processors 3661-3663 on at any of these memory modules, a processor core 3611-3614 is not assigned to those memory channels (not shown in FIG. 36A). In addition, the above discussion assumes that P is greater than or equal to M. If M>P, then M−P processor cores 3611-3614 can be assigned to communicate with the at least one processor 3661-3663 on memory modules 3651-3653 via a plurality of memory channels. However, in an embodiment, the M−P processor cores 3611-3614 that are assigned to communicate via more than one memory channel are assigned to each communicate via the same number of memory channels. In other words, in this embodiment, the load of communicating with the at least one processor 3661-3663 on memory modules 3651-3653 via a plurality of memory channels may be distributed equally to the M−P processor cores 3611-3614 that are assigned to communicate via more than one memory channel.

Each of the selected group of M processor cores 3611-3613 can communicate with the at least one processor 3661-3663 by writing to an address aperture associated with the at least one processor 3661-3663. Memory modules 3651-3653 can include a memory interface configured to interface with memory controller 3620 via one of the M memory channels. Memory modules 3651-3653 can include an integrated circuit device coupled to this memory interface. This integrated circuit device can include a first processor that is one of the at least one processors 3661-3663. The integrated circuit device can include an interface that is coupled to the first processor and configured to connect to a first type of dynamic memory integrated circuit devices. Memory modules 3651-3653 can include a rank of first type of dynamic memory integrated circuit devices coupled to the first interface of the integrated circuit device. The integrated circuit device may have a second interface coupled to the first processor and is configured to connect to a second type of dynamic integrated circuit devices. Memory modules 3651-3653 may further include at least one of the second type of dynamic memory integrated circuit devices coupled to the second interface (e.g., local memory, described previously).

Processor cores 3611-3614 can communicate with the at least one processor 3661-3663 by reading from, and writing to, an address aperture associated with the at least one processor 3661-3663. CPU 3610 (and/or processor cores 3611-3614) can be configured to use any cache policy supported by processor CPU 3610 to read from, and write to, this address aperture (or portions thereof). However, it should be understood that, in an embodiment, the most useful cache policies may be limited to configuring the address aperture (or portions thereof) to be treated by CPU 3610 as uncacheable memory (UC), write combining memory (WC), or write back (WB). In an embodiment, these cache policies may be combined with the use of certain instructions (e.g., fence instructions, streaming load instructions, and/or streaming write instructions) to achieve an optimal (e.g., highest) communication bandwidth between processor cores 3611-3614 (and/or CPU 3610) and at least one processor 3661-3663.

In an embodiment, when the address aperture (or portions thereof) are configured to be treated as WC or WB, a minimum burst size may be used to achieve an optimal (e.g., highest) communication bandwidth between processor cores 3611-3614 (and/or CPU 3610) and at least one processor 3661-3663. In other words, small burst sizes (e.g., less than a certain, implementation dependent, number of column addresses per burst) may result in less than optimal communication bandwidth between processor cores 3611-3614 (and/or CPU 3610) and at least one processor 3661-3663. Larger sizes (e.g., greater than a certain, implementation dependent, number of column addresses per burst) may approach (or approximate) an optimal (e.g., highest) communication bandwidth between processor cores 3611-3614 (and/or CPU 3610) and at least one processor 3661-3663. Assigning additional processor cores 3611-3614 to communicate with the at least one processor 3661-3663 (e.g., when P>M) on a single memory channel may also increase the communication bandwidth between CPU 3610 and the at least one processor 3661-3663.

Figure 36B:
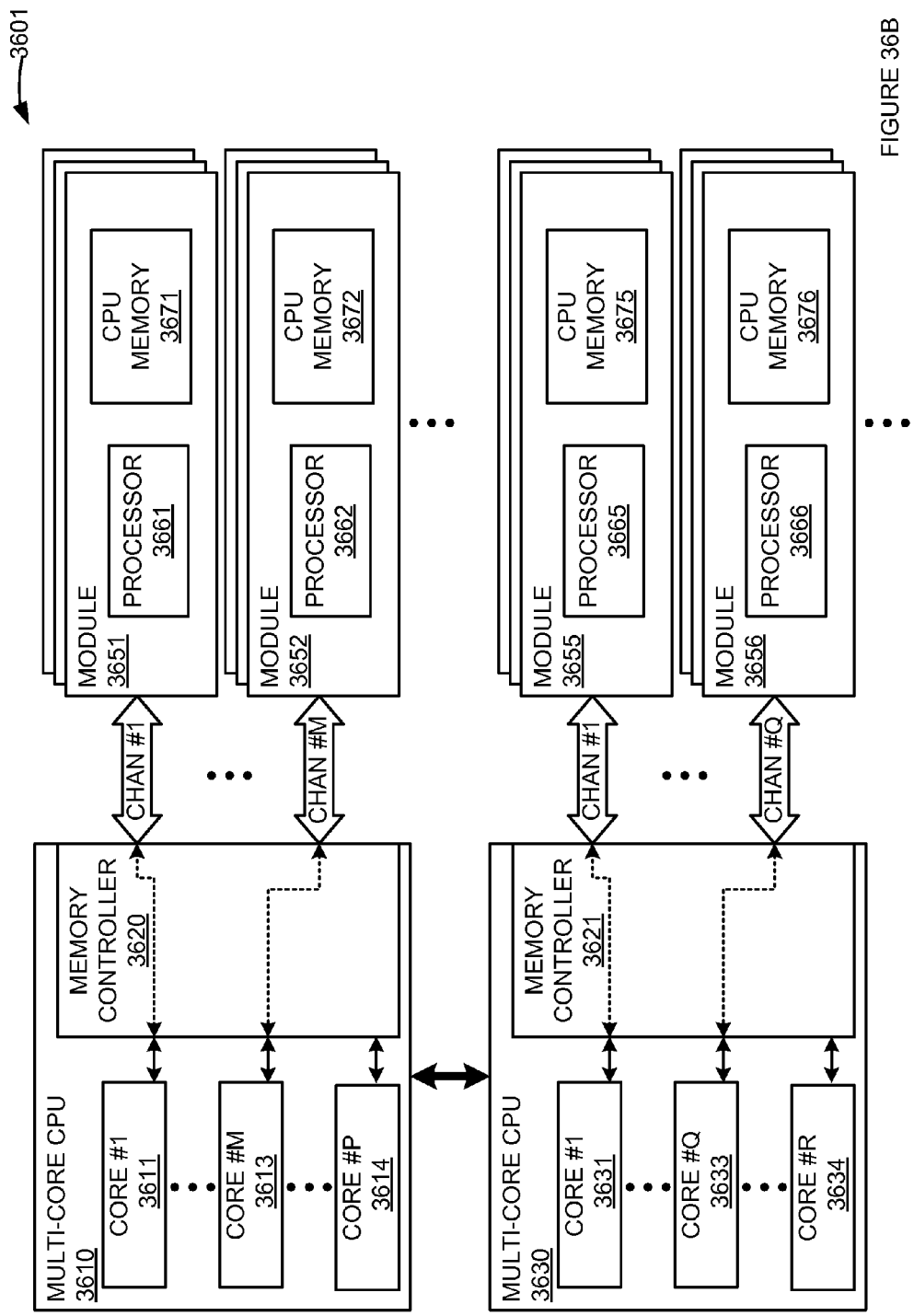
FIG. 36B is a block diagram of a multi-socket multi-core computer system.

FIG. 36B is a block diagram of a multi-socket multi-core computer system. In FIG. 36B, system 3601 comprises multi-core CPU 3610, multi-core CPU 3630, memory modules 3651, memory modules 3652, memory modules 3655, and memory modules 3656. Multi-core CPU 3610 includes P number of processor cores 3611-3614 and memory controller 3620 (processor core 3612 is not shown in FIG. 36B). Memory controller 3620 has M number of memory channels. One or more memory modules 3651 are coupled to memory controller 3620 via a first memory channel. One or more memory modules 3652 are coupled to memory controller 3620 via an $M^{th}$ memory channel. Multi-core CPU 3630 includes R number of processor cores 3631-3634 and memory controller 3621 (processor core 3632 is not shown in FIG. 36B). Memory controller 3621 has Q number of memory channels. One or more memory modules 3655 are coupled to memory controller 3621 via a first memory channel. One or more memory modules 3656 are coupled to memory controller 3621 via a $Q^{th}$ memory channel. Multi-core CPU 3610 is operatively coupled to multi-core CPU 3630.

Each memory module 3651 includes a processor 3661 and memory 3671. Memory 3671 typically contains instructions and/or data used by CPU 3610, processor 3661, and/or CPU 3630. Each memory module 3652 includes a processor 3662 and memory 3672. Memory 3672 typically contains instructions and/or data used by the CPU 3610, processor 3662, and/or CPU 3630. Each memory module 3655 includes a processor 3665 and memory 3675. Memory 3675 typically contains instructions and/or data used by the CPU 3630, processor 3665, and/or CPU 3610. Each memory module 3656 includes a processor 3666 and memory 3676. Memory 3676 typically contains instructions and/or data used by the CPU 3630, processor 3666, and/or CPU 3610.

In FIG. 36B, processor core #1 3611 is shown operatively coupled to memory modules 3651 via memory controller 3620 and memory channel #1. Processor core #M 3613 is shown operatively coupled to memory modules 3652 via memory controller 3620 and memory channel #M. Processor core #P 3614 is shown operatively coupled to memory controller 3620. In an embodiment, each processor core 3611-3614 can connect with any memory channel #1-#M and/or #1-#Q.

Processor core #1 3631 is shown operatively coupled to memory modules 3655 via memory controller 3621 and memory channel #1. Processor core #Q 3633 is shown operatively coupled to memory modules 3656 via memory controller 3621 and memory channel #Q. Processor core #R 3634 is shown operatively coupled to memory controller 3621. In an embodiment, each processor core 3611-3614 can connect with any memory channel #1-#M and/or #1-#Q. Processor cores 3611-3614 and/or processor cores 3631-3634 can have different functions (e.g., DSP, GPU, CPU, etc.) and/or execute different processes and/or applications at the same time.

System 3601 determines how many cores are in CPU 3610 and CPU 3630. In other words, via a system call or other method, CPU 3610 or CPU 3630 determines that there are P number of processor cores in CPU 3610 and R number of processor cores in CPU 3630. System 3601 determines how many memory channels memory controller 3620 is using to communicate with memory modules 3651-3652. System 3601 determines how many memory channels memory controller 3621 is using to communicate with memory modules 3655-3656. In other words, via a system call or other method, system 3601 determines that there are M number of memory channels being used to communicate with memory modules 3651-3652 and Q number of memory channels being used to communicate with memory modules 3655-3656. The numbers M and Q may remain relatively static. However, M and/or Q may change between system startups as more memory channels are populated and/or depopulated with memory modules 3651-3652 and 3655-3656.

System 3601 selects a group of M number of processor cores 3611-3613 from CPU 3610. These cores in CPU 3610 will be each used to communicate with one set of memory modules 3651-3652 via a single memory channel (i.e., each selected processor core 3611-3613 will communicate via one of M memory channels). Thus, the number of cores selected in CPU 3610 is, in an embodiment, equal to the number of memory channels having memory modules 3651-3652 that have processors 3661-3662, respectively. System 3601 selects a group of Q number of processor cores 3631-3633 from CPU 3630. These cores in CPU 3630 will be each used to communicate with one set of memory modules 3655-3656 via a single memory channel (i.e., each selected processor core 3631-3633 will communicate via one of Q memory channels). Thus, the number of cores selected in CPU 3630 is, in an embodiment, equal to the number of memory channels having memory modules 3655-3656 that have processors 3665-3666, respectively.

Each of the selected group of processor cores in CPU 3610 (i.e., processor core #1 3611 through processor core #M 3613) is assigned to communicate with at least one processor 3661-3662 on the memory modules 3651-3652 coupled to each of the M number of memory channels coupled to CPU 3610. In other words, processor core #1 3611 is assigned to communicate with the at least one processor 3661 on memory modules 3651 via memory channel #1, and so on, for all of the M number of processor cores 3611-3613 in the selected group (and M number of memory channels with memory modules 3651-3652 having processors 3661-3662). Each of the selected group of processor cores in CPU 3630 (i.e., processor core #1 3631 through processor core #Q 3633) is assigned to communicate with at least one processor 3665-3666 on the memory modules 3655-3656 coupled to each of the Q number of memory channels coupled to CPU 3630. In other words, processor core #1 3631 is assigned to communicate with the at least one processor 3665 on memory modules 3655 via memory channel #1, and so on, for all of the Q number of processor cores 3631-3633 in the selected group (and Q number of memory channels with memory modules 3655-3656 having processors 3665-3666). Thus, it should be understood that each of the cores 3611-3613 in multi-core CPU 3610 is assigned to communicate via a memory channel that resides on CPU 3610. Likewise, each of the cores 3631-3633 in multi-core CPU 3630 is assigned to communicate via a memory channel that resides on CPU 3630.

There can be M+X number of memory channels supported by memory controller 3620, where X is a number of memory channels that do not have any memory modules 3651-3653 having processors 3661-3663. However, since they do not have any processors 3661-3663 on at any of these memory modules, a processor core 3611-3614 is not assigned to those memory channels (not shown in FIG. 36B). There can be M+Y number of memory channels supported by memory controller 3621, where Y is a number of memory channels that do not have any memory modules 3655-3656 having processors 3665-3666. However, since they do not have any processors 3665-3666 on at any of these memory modules, a processor core 3631-3634 is not assigned to those memory channels (not shown in FIG. 36B). In addition, the above discussion assumes that P is greater than or equal to M and R is greater than or equal to Q. If M>P or Q>R, then M-P processor cores 3611-3614 and/or Q-R processor cores 3631-3634 can be assigned to communicate via a plurality of memory channels. However, in an embodiment, the M-P processor cores 3611-3614 and/or Q-R processor cores 3631-3634 that are assigned to communicate via more than one memory channel are assigned to each communicate via the same number of memory channels. In other words, in this embodiment, the load of communicating with the at least one processor 3661-3662 and/or 3665-3666 on memory modules 3651-3653 and 3655-3656, respectively, via a plurality of memory channels is distributed equally to the M-P processor cores 3611-3614 and the Q-R processor cores 3631-3634, respectively, that are assigned to communicate via more than one memory channel.

Each of the selected group of M processor cores 3611-3613 on CPU 3610 can communicate with the at least one processor 3661-3662 by writing to an address aperture associated with the at least one processor 3661-3662. Memory modules 3651-3652 can include a memory interface configured to interface with memory controller 3620 via one of the M memory channels. Memory modules 3651-3652 can include an integrated circuit device coupled to this memory interface. This integrated circuit device can include a first processor that is one of the at least one processors 3661-3662. The integrated circuit device can include an interface that is coupled to the first processor and configured to connect to a first type of dynamic memory integrated circuit devices. Memory modules 3651-3652 can include a rank of first type of dynamic memory integrated circuit devices coupled to the first interface of the integrated circuit device. The integrated circuit device may have a second interface coupled to the first processor and is configured to connect to a second type of dynamic integrated circuit devices. Memory modules 3651-3652 may further include at least one of the second type of dynamic memory integrated circuit devices coupled to the second interface (e.g., local memory, described previously).

Each of the selected group of Q processor cores 3631-3633 on CPU 3630 can communicate with the at least one processor 3665-3666 by writing to an address aperture associated with the at least one processor 3665-3666. Memory modules 3655-3656 can include a memory interface configured to interface with memory controller 3621 via one of the Q memory channels. Memory modules 3655-3656 can include an integrated circuit device coupled to this memory interface. This integrated circuit device can include a first processor that is one of the at least one processors 3665-3666. The integrated circuit device can include an interface that is coupled to the first processor and configured to connect to a first type of dynamic memory integrated circuit devices. Memory modules 3655-3656 can include a rank of first type of dynamic memory integrated circuit devices coupled to the first interface of the integrated circuit device. The integrated circuit device may have a second interface coupled to the first processor and is configured to connect to a second type of dynamic integrated circuit devices. Memory modules 3655-3656 may further include at least one of the second type of dynamic memory integrated circuit devices coupled to the second interface (e.g., local memory, described previously).

Processor cores 3611-3614 and processor cores 3631-3634 can communicate with the at least one processor 3661-3662 and processors 3665-2666 by reading from, and writing to, address apertures associated with the at least one processor 3661-3662 and the at least one processor 3665-3666. CPU 3610 and/or CPU 3630 can be configured to use any cache policy supported by processor CPU 3610 and/or CPU 3630, respectively, to read from, and write to, these address apertures (or portions thereof). However, it should be understood that, in an embodiment, the most useful cache policies may be limited to configuring the address aperture (or portions thereof) to be treated by CPU 3610 and/or CPU 3630 as uncacheable memory (UC), write combining memory (WC), or write back (WB). In an embodiment, these cache policies may be combined with the use of certain instructions (e.g., fence instructions, streaming load instructions, and/or streaming write instructions) to achieve an optimal (e.g., highest) communication bandwidth between CPU 3610 and/or CPU 3630 and the at least one processor 3661-3662 and the at least one processor 3665-3666. In addition, when the address aperture (or portions thereof) are configured to be treated as WC or WB, a minimum burst size may be used to achieve an optimal (e.g., highest) communication bandwidth between CPU 3610 and/or CPU 3630 and the at least one processor 3661-3662 and the at least one processor 3665-3666. In other words, small burst sizes (e.g., less than a certain, implementation dependent, number of column addresses per burst) may result in less than optimal communication bandwidth between CPU 3610 and/or CPU 3630 and the at least one processor 3661-3662 and the at least one processor 3665-3666. Larger sizes (e.g., greater than a certain, implementation dependent, number of column addresses per burst) may approach (or approximate) an optimal (e.g., highest) communication bandwidth between CPU 3610 and/or CPU 3630 and the at least one processor 3661-3662 and the at least one processor 3665-3666. Assigning additional processor cores 3611-3614 and/or 3631-3634 on CPU 3610 and/or CPU 3630 to communicate with the at least one processor 3661-3663 and/or 3665-3666 (e.g., when P>M and/or R>Q) on a single memory channel may also increase the communication bandwidth between CPU 3610 and/or CPU 3630 and the at least one processor 3661-3663 and/or 3665-3666.

Figure 37:
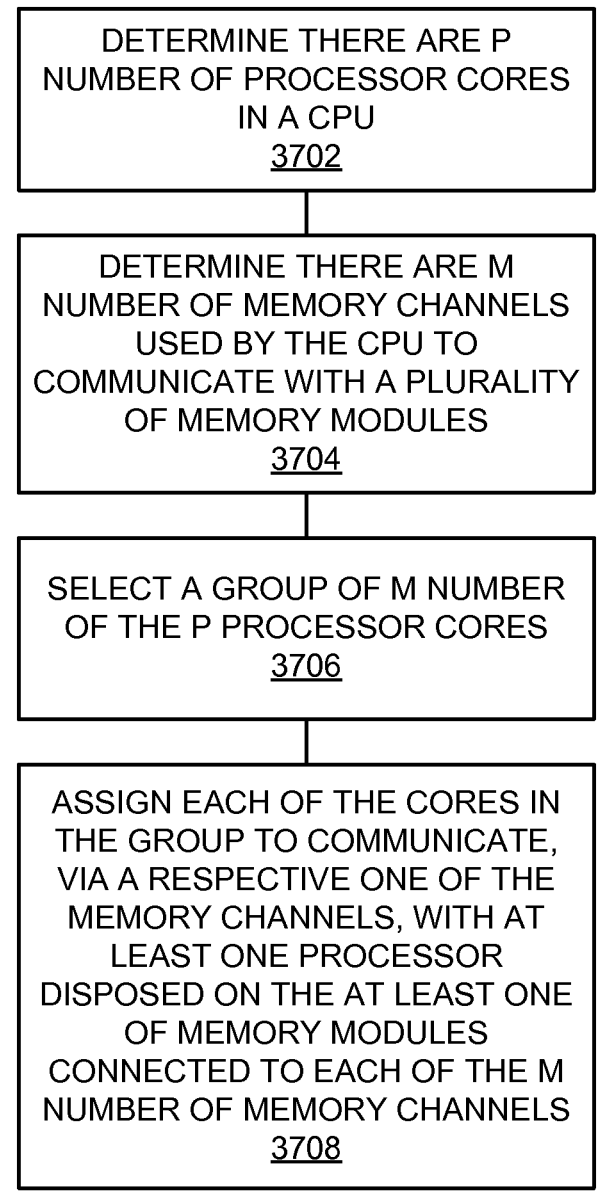
FIG. 37 is a flowchart of a method of communicating with a plurality of memory modules that include processors.

FIG. 37 is a flowchart of a method of communicating with a plurality of memory modules that include processors. The steps illustrated in FIG. 37 may be performed by one or more elements of system 3600. The steps illustrated in FIG. 37 may be performed by one or more elements of system 100, system 700, system 1100, system 2500, system 2501, system 2502, system 2503, system 3000, system 3200, and/or system 3400.

It is determined that there are P number of processor cores in a CPU (3702). For example, an element of CPU 3610 executing software may determine that multi-core CPU 3610 includes P number of processor cores 3611-3614. It is determined that there are M number of memory channels used by the CPU to communicate with a plurality of memory modules (3704). For example, an element of CPU 3610 executing software may determine that memory controller 3620 is coupled to M number of memory channels that have at least one memory module 3651-3653 which also has a processor 3661-3663 on it.

Each of the cores in the group are assigned to communicate, via a respective one of the memory channels, with at least one processor disposed on the at least one of the memory modules coupled to each of the M number of memory channels (3708). For example, an element of CPU 3610 executing software may assign each of processor cores 3611-3613 to communicate with a corresponding at least one processor 3661-3663 via the memory channel coupled to the memory module 3651-3653 holding that at least one processor 3661-3663.

Figure 38:
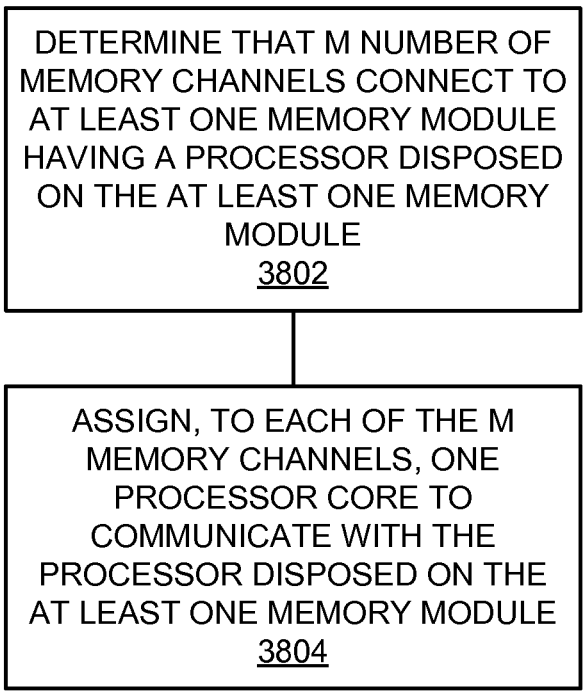
FIG. 38 is a flowchart of a method of communicating with a plurality of memory modules that include processors.

FIG. 38 is a flowchart of a method of communicating with a plurality of memory modules that include processors. The steps illustrated in FIG. 38 may be performed by one or more elements of system 3600. The steps illustrated in FIG. 37 may be performed by one or more elements of system 100, system 700, system 1100, system 2500, system 2501, system 2502, system 2503, system 3000, system 3200, and/or system 3400.

It is determined that M number of memory channels connect to at least one memory module having a processor disposed on the at least one memory module (3802). For example, system 3600 may determine that memory controller 3620 is coupled to M number of memory channels that each have at least one processor disposed on at least one of the memory modules on each of those M channels.

One processor core is assigned to each of the M memory channels. The one processor core is assigned to communicate with the processor disposed on the at least one memory module (3804). For example, system 3600 may assign a single one of each of processor cores 3611-1613 to each of memory channels #1-#M, respectively, to communicate with processor cores 3661-3663, respectively.

Figure 39:
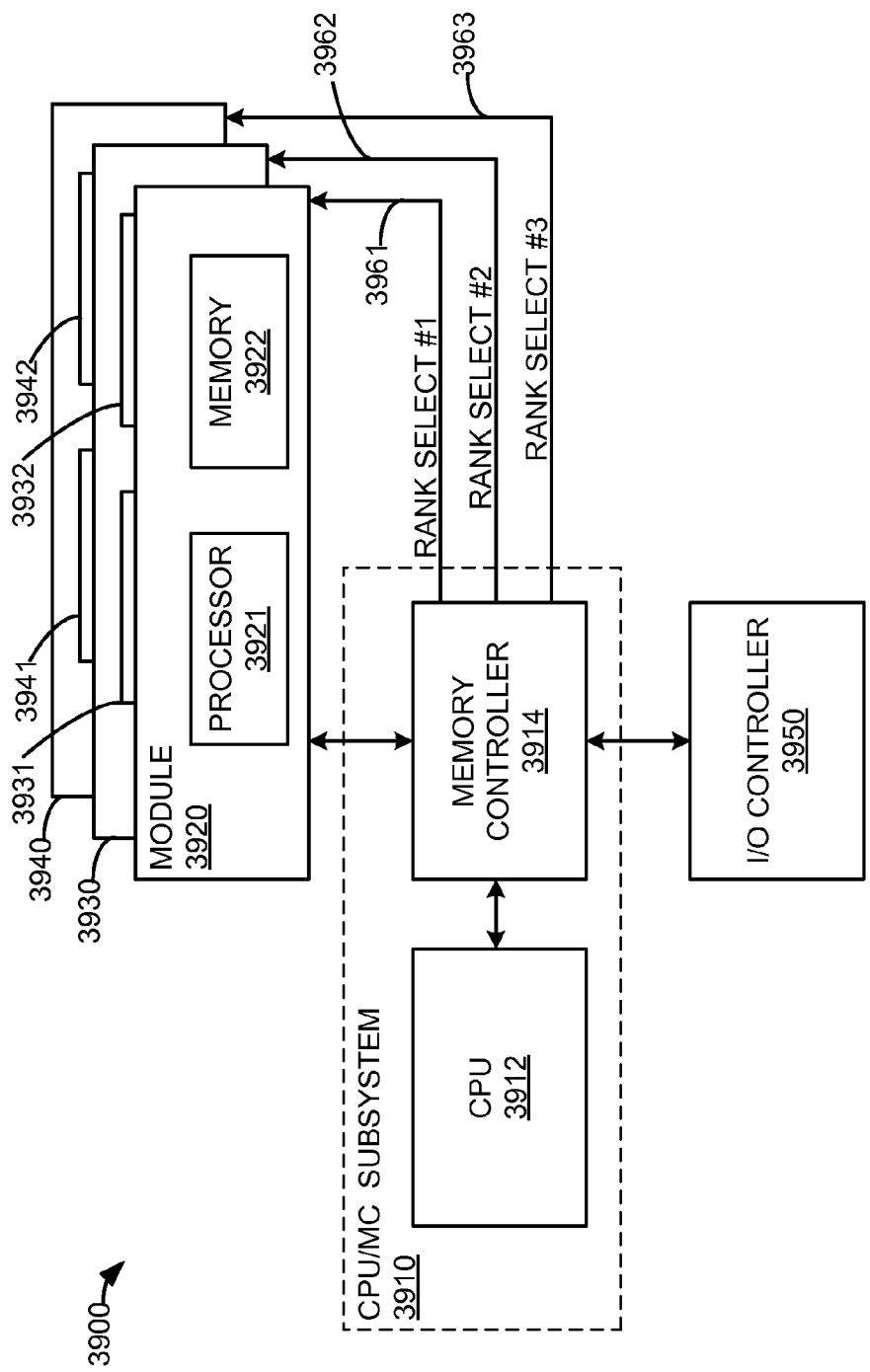
FIG. 39 is a block diagram of a memory module broadcast system.

FIG. 39 is a block diagram of a memory module broadcast system. In FIG. 39, In FIG. 39, computer system 3900 comprises CPU/memory controller subsystem 3910, I/O controller 3950, memory module 3920, memory module 3930, and memory module 3940. CPU/memory controller subsystem 3910 includes a CPU 3912 coupled to a memory controller 3914. Memory module 3920, memory module 3930, and memory module 3940 are coupled to memory controller 3914 in subsystem 3910 via the same memory channel. Memory module 3920 includes a processor 3921 and memory 3922. Memory module 3930 includes a processor 3931 and memory 3932. Memory module 3940 includes a processor 3941 and memory 3942. Memory 3922, memory 3932, and memory 3942 typically contain instructions and/or data used by the CPU 3912 and/or a respective one of processor 3921, processor 3931, and processor 3941.

Memory module 3920 is coupled to memory controller 3914 to receive a first rank select signal 3961 (rank select #1). Memory module 3930 is coupled to memory controller 3914 to receive a second rank select signal 3962 (rank select #2). Memory module 3940 is coupled to memory controller 3914 to receive a third rank select signal 3963 (rank select #3). Each of these rank select signals 3961-3963 is only received by one memory module 3920, 3930, and 3940, respectively. It should be understood that memory modules 3920, 3930, and/or 3940 may receive additional rank select signals (not shown in FIG. 39) that can be used to select additional ranks of memory on modules 3920, 3930, and/or 3940.

When memory controller 3914 sends memory modules 3920, 3930, and 3940 a write command within a configured memory aperture, only the single rank select signal 3961-3963 corresponding to the addressed memory module 3920, 3930, and 3940 is asserted. The other rank select signals rank select signal 3961-3963 are typically deasserted. For example, if memory controller is sending a command to write data to memory module 3930, rank select signal #2 3962 will be asserted. Rank select signal #1 3961 and rank select signal #3 3963 will be deasserted.

When memory controller 3914 send memory modules 3920, 3930, and 3940 a write command having an address within a memory aperture configured for a respective memory module 3920, 3930, and 3940 and the respective rank select signal 3961-3963 asserted, memory modules memory modules 3920, 3930, and 3940 can be configured to store the write data in response to that write command (regardless of the state of that memory module's rank select signal). In other words, one or more of memory modules 3920, 3930, and 3940 can be configured to respond to a write that was directed to a different one of memory modules 3920, 3930, and 3940 coupled to the same memory channel. In this manner, a broadcast write memory aperture may be configured. Broadcast writes and broadcast write apertures are described herein. Thus, for the sake of brevity, they will not be repeated here. In particular, reference is made to the discussions of FIGS. 13, 14, and 17-19 for discussions of broadcast writes and broadcast write apertures.

For example, consider a case where a broadcast aperture has been configured for an address that resides on memory module 3920. Memory module 3930 and memory module 3940 can be configured to store data in response to write commands having addresses within the broadcast aperture even though the rank select signals 3962-3963 sent to memory modules 3930-3940, respectively, are deasserted. When configured with a broadcast aperture, memory module 3930 and memory module 3940 will respond to a write to the broadcast aperture and store the write data. The data written to the broadcast aperture may be stored in memories 3932 and 3942 by memory module 3930 and 3940, respectively. The data written to the broadcast aperture may be stored in a local memory (as described previously) on memory modules 3930 and 3940, respectively.

The write command to the broadcast aperture may include a bank select value. This bank select value may be encoded in order to specify which of memory modules 3920-3940 should store the data associated with the write command. An example of this encoding is further detailed with reference to Table 5. Table 5 gives an example encoding of bank select values and the corresponding one or more of memory modules 3920, 3930, and 3940 that should store the data associated with the write command. It should be understood that even though the bank address is different because of the encoding, the actual location on memory modules 3920, 3930, and 3940 that is written to can be the same for memory modules 3920, 3930, and 3940.

TABLE 5

| | Module Operation in response to write to broadcast aperture | | |
|---|---|---|---|
| Bank select Value | Module 3920 | Module 3930 | Module 3940 |
| 0 | store write data | ignore write | ignore write |
| 1 | ignore write | store write data | ignore write |
| 2 | ignore write | ignore write | store write data |
| 3 | reserved | reserved | reserved |
| 4 | store write data | store write data | ignore write |
| 5 | store write data | ignore write | store write data |
| 6 | ignore write | store write data | store write data |
| 7 | store write data | store write data | store write data |

The write command to the broadcast aperture may include a write enable value. This enable value may be encoded in order to specify which of memory modules 3920-3940 should store the data associated with the write command. An example of this encoding can be detailed with reference to Table 5. Table 5 gives an example encoding of bank select values and the corresponding one or more of memory modules 3920, 3930, and 3940 that should store the data associated with the write command. In this case, however, the write enable value takes the place of the bank select value in Table 5.

Figure 40:
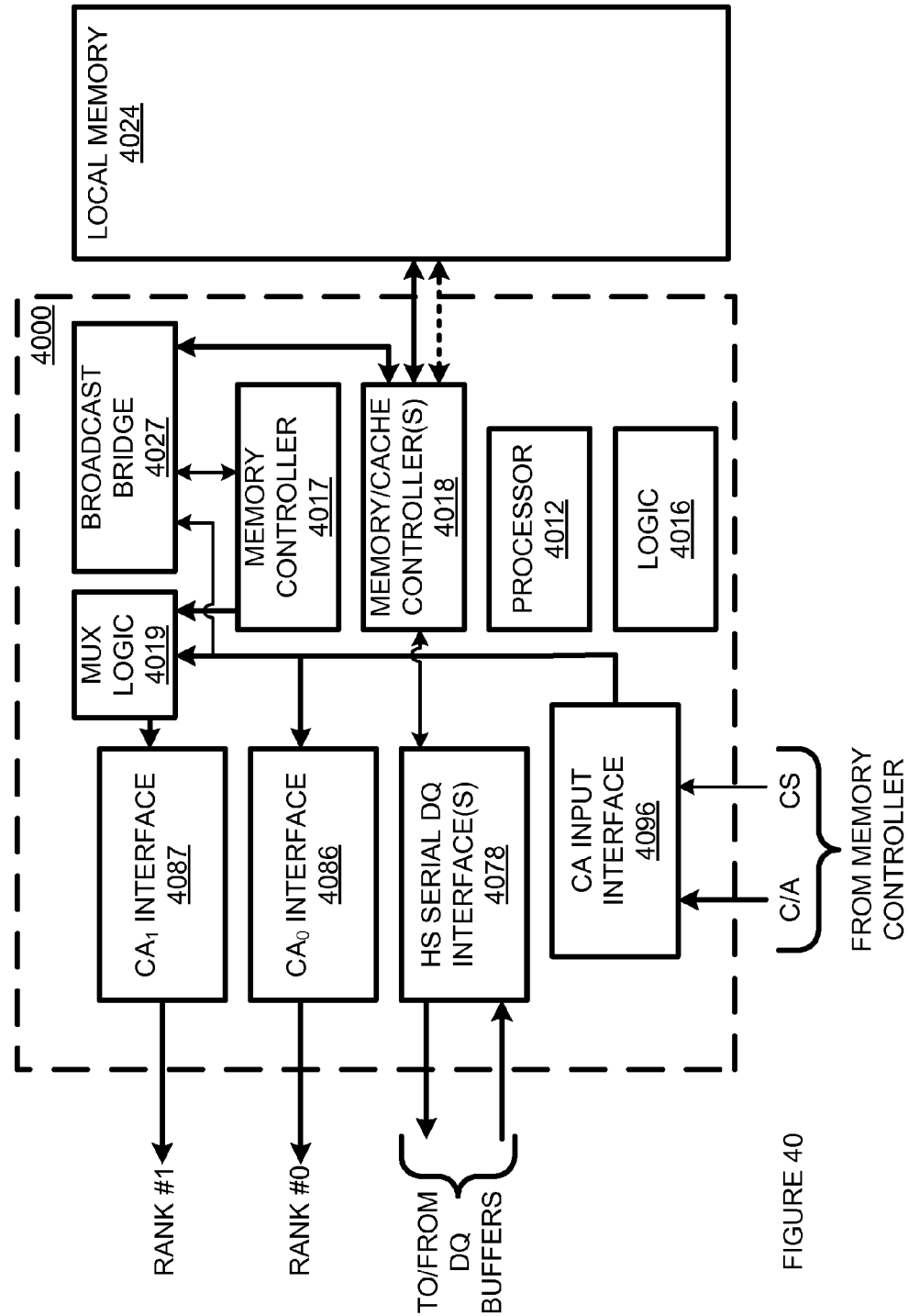
FIG. 40 is a block diagram illustrating a memory module broadcast subsystem.

FIG. 40 is a block diagram illustrating a memory module broadcast subsystem. In FIG. 40, subsystem 4001 comprises subsystem 4000 and local memory 4024. Subsystem 4000 comprises processor 4012, logic 4016, memory controller 4017, CA input interface 4096, multiplexor (MUX) logic 4019, $CA_0$ interface 4086, $CA_1$ interface 4087, and high-speed (HS) serial DQ interface(s) #0 4078, and broadcast bridge 4027. Subsystem 4000 also includes memory/cache controller(s) 4018. Memory/cache controller 4018 is operatively coupled to local memory 4024. Local memory 4024 may be operatively coupled to local memory 4024 by one or more memory channels. It should be understood that subsystem 4001 may be included on one or more memory modules 3920, 3930, and/or 3940. Thus, it can be seen that subsystem 4000 may be used as IC 2610 in memory modules 2600, 2601, and/or 2602 and that subsystem 4001 may be disposed on memory modules 3020, 3220, 3420, 3920, 3930, 3940, 2600, 2601, and/or 2602.

In an embodiment, a memory module having subsystem 4001 (e.g., memory modules 3020, 3220, 3420, 3920, 3930, 3940, 2600, 2601, and/or 2602) can have a memory interface configured to connect with a memory controller. Subsystem 4000 may be an integrated circuit device that is coupled to the memory interface. Subsystem 4000 includes a processor 4012, $CA_1$ interface 4087, and broadcast bridge 4027. $CA_1$ interface 4087 is configured to connect to a first type of dynamic memory integrated circuit devices. A plurality of the first type of dynamic memory integrated circuit devices is coupled to $CA_1$ interface 4087.

Broadcast bridge 4027 is configured to store data in response to a write command on the memory interface having the rank select signal deasserted, and an address with a configured address aperture. Broadcast bridge 4027 may be configured with the address range of the address aperture. Broadcast bridge 4027 can store data according to encoded bank select values (or encoded write enable values) according to, for example, Table 5. Broadcast bridge 4027 can store the data associated with the write command having the rank select signal deasserted in the plurality of the first type of dynamic memory integrated circuit devices coupled to $CA_1$ interface 4087. Broadcast bridge 4027 can store the data associated with the write command (having the rank select signal deasserted) in local memory 4024. In other words, when broadcast bridge 4027 is configured appropriately, the rank select signal is treated as a do not care. For example, when the broadcast aperture is configured to lie within memory module 3920, modules 3930 and 3940 are going to respond regardless of the states of rank select signal #1 3961, rank select signal #2 3962, and rank select signal 3963.

A memory module having subsystem 4001 (e.g., memory modules 3020, 3220, 3420, 3920, 3930, 3940, 2600, 2601, and/or 2602) can have a memory interface to connect to a memory channel. The interface can include a rank select signal. A rank of dynamic memory integrated circuits may be selected by the rank select signal. Subsystem 4000 may be an integrated circuit device that is coupled to the memory interface. Subsystem 4000 includes processor 4012, CA₁ interface 4087, and broadcast bridge 4027. CA₁ interface 4087 can be coupled to the rank of dynamic memory integrated circuits are selected by the rank select signal. CA input interface 4096 can receive commands from a memory controller. CA input interface can receive a rank select signal (CS) that is to select the rank of dynamic memory integrated circuits coupled to CA₁ interface 4087.

Broadcast bridge 4027 can store data in response to a write command from CA input interface 4096. Broadcast bridge 4027 can store data in response to a write command from CA input interface 4096 that has the rank select signal deasserted. Broadcast bridge 4027 can store data in response to a write command from CA input interface 4096 that has the rank select signal deasserted and an address that is within a configured address aperture. Broadcast bridge 4027 can store, in the rank of dynamic memory integrated circuits, data in response to a write command from CA input interface 4096 that has the rank select signal asserted and an address that is within the configured address aperture.

Subsystem 4000 can receive a first memory write command. This first memory write command may be received from a memory controller via a memory interface of a memory module and via CA input interface 4096. The memory interface may include a rank select signal (e.g., a chip select or CS signal). The first memory write command has the rank select signal deasserted. The first memory write command has an address that is within a configured address aperture. In response to the first memory write command, subsystem 4000 can store data in a rank of dynamic memory integrated circuits coupled to CA₁ interface 4087 (or a rank of dynamic memory integrated circuits coupled to the CA₀ interface 4086, or both). Subsystem 4000 may also store data in local memory 4024 in response to the first memory write command.

Subsystem 4000 can, in response to a second memory write command having the rank select signal asserted and an address within the configured aperture, store the associated data in the rank of dynamic memory integrated circuits coupled to CA₁ interface 4087 (or the rank of dynamic memory integrated circuits coupled to CA₀ interface, as appropriate). In other words, subsystem 4000 can be configured to ignore the rank select signal for memory write commands that are within a configured (designated) memory address range (an aperture).

It should be understood that when broadcast bridge 4027 is configured to treat a rank select signal is treated as a do not care, it will respond to addresses that lie on other memory modules. For example, when the broadcast aperture is configured to lie within memory module 3920, modules 3930 and 3940 are going to respond regardless of the states of rank select signal #1 3961, rank select signal #2 3962, and rank select signal 3963. This causes "address aliasing" wherein an access to the broadcast aperture corresponds to locations on different memory modules 3920, modules 3930 and 3940. Since these locations are serving as the broadcast aperture, it is important to ensure that no accesses occur to those locations (unless they are a true access to the broadcast aperture). Address aliasing is described herein with particular reference to FIG. 18 wherein blocks of addresses 1805A are set aside on each module to serve as the broadcast aperture (and not as regular memory).

Figure 41:
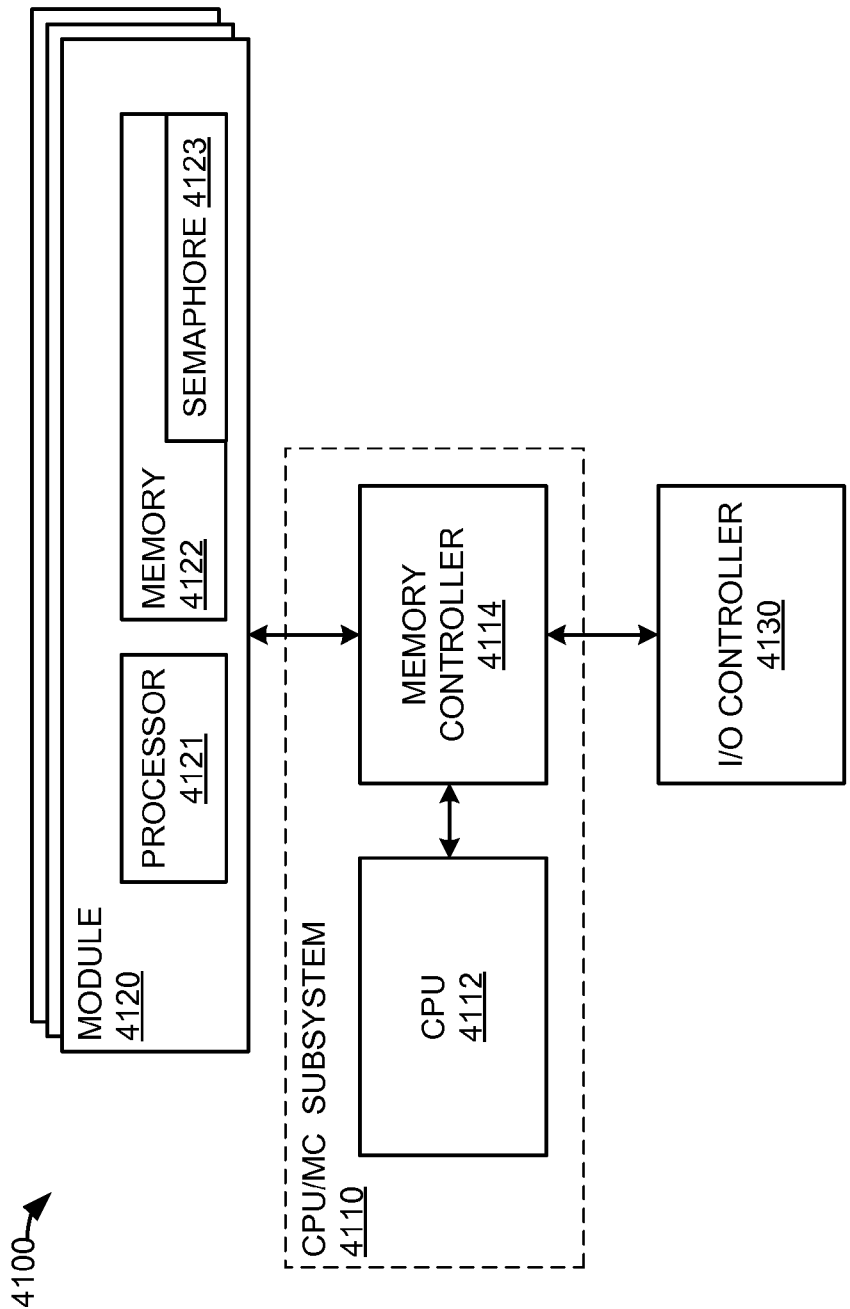
FIG. 41 is a block diagram of a multi-module synchronization system.

FIG. 41 is a block diagram of a multi-module synchronization system. In FIG. 41, computer system 4100 comprises CPU/memory controller subsystem 4110, I/O controller 4130, and memory modules 4120. CPU/memory controller subsystem 4110 includes a CPU 4112 coupled to a memory controller 4114. One or more memory modules 4120 are coupled to memory controller 4114 in subsystem 4110. Each memory module 4120 includes a processor 4121 and memory 4122. Memory 4122 typically contains instructions and/or data used by the CPU 4112 and/or processor 4121.

In FIG. 41, memory 4122 is shown as holding a semaphore 4123 that is accessible to both CPU 4112 and processor 4121. It should be understood that the actual location of semaphore 4123 shown in FIG. 41 is merely an example. Semaphore 4123 can be stored in (and/or read from) CPU 4112, memory controller 4114, processor 4121, local memory associated with processor 4121 (not shown in FIG. 41), cache associated with CPU 4112 (not shown in FIG. 41), or cache associated with processor 4121 (not shown in FIG. 41). In general, semaphore 4123 can be stored in (and/or read from) any location, device, or function that is accessible to both CPU 4112 and processor 4121.

Processor 4121 can write semaphore 4123 to indicate processor 4121 is requesting a resource. Likewise, processors 4121 on other memory modules can write to semaphore locations on their memory modules to request the resource. CPU 4112 iteratively reads semaphore 4123. In response to reads of the semaphore, memory module 4120 sends an indicator (e.g., returning the value written by processor 4121) of the request for the resource to CPU 4112. Memory module 4120 receives a write to the semaphore 4123 that indicates a grant of the request for the resource. Processor 4121 may poll the semaphore location to determine when the write to the semaphore 4123 has occurred.

Figure 42:
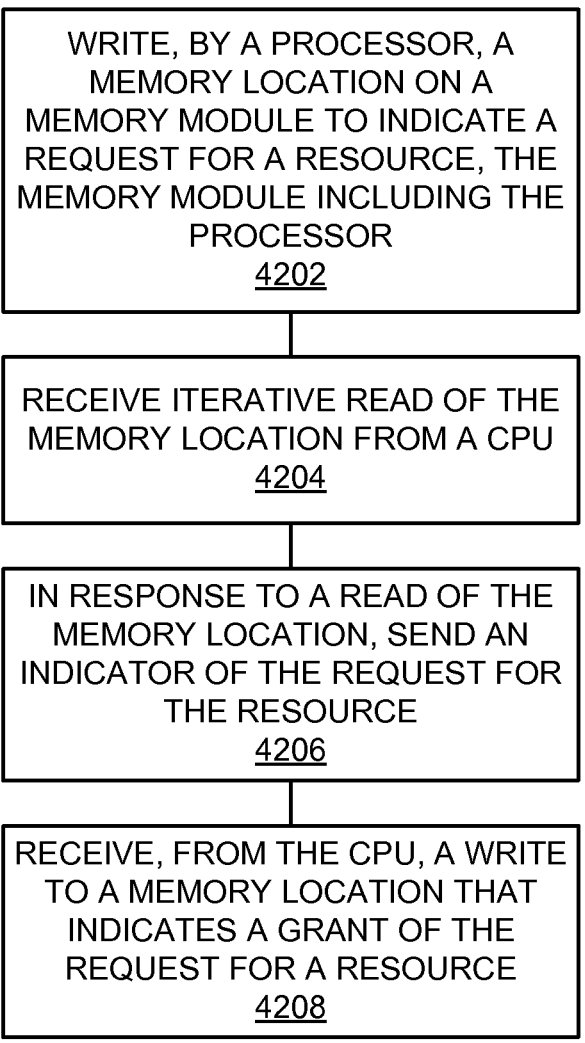
FIG. 42 is a flowchart of a method of implementing a semaphore.

FIG. 42 is a flowchart of a method of implementing a semaphore. The steps illustrated in FIG. 42 may be performed by one or more elements of system 4100. The steps illustrated in FIG. 42 may be performed by one or more elements of system 100, system 700, system 1100, system 2500, system 2501, system 2502, system 2503, system 3000, system 3200, system 3400, and/or system 3600. The steps illustrated in FIG. 42 are described in terms of a semaphore. However, it should be understood that these basic processes can be used to implement other types of mutex's such as locks, barriers, tree barriers, and flags.

A processor included on a memory module writes a memory location on the memory module to indicate a request for a resource (4202). For example, processor 4121 may write semaphore 4123 to indicate a request for a resource. Iterative reads of the memory location are received from a CPU (4204). For example, CPU 4112 may iteratively read semaphore 4123 in order to determine when (and if) processor 4121 has written semaphore 4123 to indicate a request for a resource. In response to a read of the memory location, an indicator of the request for the resource is sent (4206). For example, in response to a read of semaphore 4123, memory module 4120 may send semaphore 4123 (as written by processor 4121) to CPU 4112 via memory controller 4114. A write to a memory location that indicates a grant of the request for a resource is received (4208). For example, memory module 4120 may receive a write to semaphore 4123 (or another location) that indicates the request for a resource has been received.

In general, the procedure described above from implementing a semaphore can be described as using a polling mechanism by CPU 4112. In other words, CPU 4112 periodically reads from a set of memory/storage locations that are spread across modules 4120 (e.g., in memories 4122 and/or processor 4121, etc.) If processor 4121 wants to set a semaphore, processor 4121 writes a predetermined memory/storage location to a known value (e.g., a "1" to indicate processor 4121 wants access to a resource). The CPU 4112, during one of its periodic reads, reads the semaphore from the predetermined memory/storage location and sees that the predetermined memory/storage location has been set to the known value—thus indicating to CPU 4112 that processor 4121 wants something. CPU 4112 can set predetermined memory/storage locations accessible to processor 4121 to indicate things (e.g., a lock has been granted.)

To create a semaphore (i.e., lock), CPU 4112 (or processor 4121) can allocate memory to: (1) implement the semaphore, (2) indicate which process currently has the semaphore, and (3) indicate which processes are requesting the semaphore. The memory allocated to create the semaphore can be allocated statically or dynamically. The memory allocated to implement the lock is preferably allocated in CPU 4112's memory space (i.e., not in memory dedicated to processor 4121). The memory allocated to indicate which processes are requesting the semaphore can be allocated in each processor 4121's memory space (e.g., could be one or more registers on processor 4121, memory dedicated to processor 4121, etc.). One flag for each process running on memory modules 4120 can be allocated (e.g., can be viewed as an array of flags). Additional flags can be allocated if CPU 4112 and processor 4121 need to synchronize processes. A predetermined value indicates which processes can have access to the semaphore. Table 6 contains pseudo-code for initializing the memory to implement the semaphore and indicate which processes are requesting the semaphore.

TABLE 6

Allocate int LockVal
   /* allocate memory to implement the semaphore */
Allocate int LockProc
   /* allocate memory to indicate which process currently has the semaphore TABLE 6-continued Allocate int LockRequest[NumProc]
   /* allocate memory to indicate which processes are requesting the semaphore.
   NumProc equals the number of processes running */
LockVal = 0; ?* Signifies that the lock is currently available */
For ( i=0; i<NumProcs; i++) {
   LockRequest[i]=0;
   /* All LockRequest flags set to 0 (i.e., not requesting lock/semaphore) */
}
/* programs/threads/processes can begin executing */

To request a lock, a process running on a processor 4121 writes a predetermined value (e.g., a "1") in a memory/storage address known and accessible to both processor 4121 and CPU 4112 (e.g., LockRequest[process identification number]). CPU 4112 polls the lock request flags (e.g., each of LockRequest[0 to NumProcs]) to see if any process is requesting the lock. If a process is requesting the lock, CPU 4112 sets the lock to a predetermined value (e.g., "1") to indicate the lock is in use. CPU 4112 also sets the LockProc memory/storage to the process identification number to indicate which process currently has the lock. If other CPU 4112 threads are contending for the lock, setting the LockProc can be done using, for example, a "compare and swap (CAS)" or a "load link/store conditional (LL/SC)" type of instruction. The CPU may then sets a second value (e.g., "2") into the LockRequest[process identification number] location to indicate that the lock has been granted to that process. The process can spin-wait on the LockRequest[process identification number] location for the "grant" value. Alternatively, the process can suspend and resume when awoken by processor 4121 when the lock is granted by CPU 4112. Table 7 contains an example execution timeline of a lock request and grant procedure. Note: ProcID corresponds to the process identification number.

TABLE 7

| | CPU 4112 process | Processor 4121 process |
|---|---|---|
| 1 | | Processes start execution |
| 2 | | Process requests the lock<br>• LockRequest[ProcID]=1 |
| 3 | CPU 4112 polls lock request locations to determine if any process in processors 4121 are requesting the lock (e.g., any LockRequest[ ] locations equal "1")<br>• If any values are set, it indicates at least one process is waiting for (requesting) a lock | Process waits looking for LockRequest[ProcID] == 2<br>• For example, process can spin-wait or wait to be awoken by processor 4121 |
| 4 | When CPU 4112 detects a process is requesting the lock and the lock is available (LockVal is 0)<br>• CPU 4112 sets LockVal to 1<br>• CPU 4112 sets LockProc to the requesting process ID (e.g., LockProc=ProcID)<br>• CPU 4112 sets LockRequest[ProcID] to 2 thereby granting to lock to the process associated with ProcID (This is typically a write to memory/ storage on module 4120) | |
| 5 | | • If process is spin-waiting, process will see that LockRequest[ProcID]==2 and continue forward with lock<br>• If process is suspended, process will be awoken and see that LockRequest[ProcID]==2 and continue forward with lock |

To release a lock, the process running on processor 4121 that was granted the lock writes a predetermined value (e.g., a "0") in a memory/storage address known and accessible to both processor 4121 and CPU 4112 (e.g., LockRequest[process identification number] or a different location). CPU 4112 polls the location to see if the lock has been release (i.e., when the value at the location is set to "0"). CPU 4112 sets the value of the lock (LockVal) to "0" again to indicate the lock is available. CPU 4112 may optionally set LockProc to an unused value (e.g., −1, or NumProcs). Table 8 contains an example execution timeline of a lock release procedure.

TABLE 8

| | CPU 4112 process | Processor 4121 process |
|---|---|---|
| 1 | | Processes releases the lock<br>• Processor 4121 sets LockRequest-[ProcID] = 0 |
| 2 | CPU 4112 polls location to determine if lock has been released (e.g., LockRequest[ProcID]==0) | Process continues executing |
| 3 | CPU 4112 sets LockVal=0 to indicate lock is released<br>• CPU 4112 may not set LockVal=0 if another process is waiting for the lock | |
| 4 | CPU 4112 sets LockProc to an unused value<br>• CPU 4112 may not set LockProc to an unused value if another process is waiting for the lock | |
| 5 | When CPU 4112 detects a process is requesting the lock and the lock is available (LockVal is 0)<br>• CPU 4112 sets LockVal to 1 (if not already 1)<br>• CPU 4112 sets LockProc to the requesting process ID if not already done (e.g., LockProc=ProcID)<br>• CPU 4112 sets LockRequest[ProcID] to 2 thereby granting to lock to the process associated with ProcID (This is typically a write to memory/ storage on module 4120) | |

CPU 4112 and/or processors 4121 may use other data structures and/or algorithms to implement and manage semaphores. For example, CPU 4112 and processor 4121 may use a linked list of request flags instead of an array of request flags (i.e., LockRequest[ ]). In addition, if processor 4121 (or module 4120) has multiple processes waiting for a lock, processor 4121 can request the lock. Processor 4121 can then grant the lock to each waiting process without releasing the lock back to CPU 4112. This decreases the amount of polling CPU 4112 needs to do. CPU 4112 only needs to poll one location associated with each processor 4121 instead of polling one location associated with each process. Since there may be more than one process being executed by each processor 4121, the number of processes is likely to outnumber the number of processors 4121 in system 4100.

A process synchronization function that system 4100 can implement is a barrier. A barrier for a group of threads or processes means any process must stop executing the process at a given barrier point and cannot proceed until all other processes in the group reach this barrier. The barrier synchronization function allows processes running on processors 4121 and/or processor cores in different processors 4121 and/or modules 4120 and/or CPU 4112 to be synchronized.

The barrier synchronization function may be used to prevent race conditions among a group of threads or processes.

To create a barrier, CPU 4112 (or processor 4121) can allocate memory to: (1) track how many processes/cores have reached the barrier, and (2) indicate when processes/cores can proceed past the barrier. The memory allocated to create the barrier can be allocated statically or dynamically. The memory allocated to track how many processes/cores have reached the barrier is preferably allocated in CPU 4112's memory space (i.e., not in memory dedicated to processor 4121). The memory allocated to indicate when processes/cores can proceed past the barrier can be allocated in each processor 4121's memory space (e.g., could be one or more registers on processor 4121, memory dedicated to processor 4121, etc.). One flag for each process running on memory modules 4120 can be allocated (e.g., can be viewed as an array of flags). The memory allocated to indicate when processes/cores can proceed past the barrier can be initialized by CPU 4112 by writes to modules 4120. The memory allocated to indicate when processes/cores can proceed past the barrier can be initialized by processors 4121. The memory allocated to indicate when processes/cores can proceed past the barrier can be initialized by processors 4121 by, for example, initialization calls. Additional flags can be allocated if CPU 4112 and processor 4121 need to synchronize processes. Table 9 contains pseudo-code for initializing the memory to implement barriers. Note: NumProcs is the number of processes to be synchronized.

TABLE 9

Allocate int NumAtBarrier
    /* allocate memory to track how many processes/cores have reached the barrier */
Allocate int BarrierFlags[NumProcs]
    /* allocate memory to indicate when processes/cores can proceed from the barrier*/
NumAtBarrier = 0; /* indicates that no processes have reached the barrier */
For ( i=0; i<NumProcs; i++) {
    BarrierFlags[i]=0;
    /* All BarrierFlags set to 0 (i.e., no processes are at the barrier) */
}
/* programs/threads/processes can begin executing */

To implement barriers, processes begin executing on processors 4121. When a process executing on processor 4121 reaches the barrier, it writes a predetermined value (e.g., 1) to the memory allocated to indicate when processes/cores can proceed past the barrier. This indicates that the process is waiting at the barrier. The process can spin-wait or suspend while it waits for an indicator that communicates when processes/cores can proceed past the barrier. When all processes have reached the barrier, CPU 4112 sets the memory/storage that tracks how many processes/cores have reached the barrier to zero. CPU 4112 also sets all the memory allocated to indicate when processes/cores can proceed past the barrier to a predetermined value (e.g., 0) that indicates that the processes/cores can proceed past the barrier. CPU 4112 may set memory allocated to indicate when processes/cores can proceed past the barrier using a broadcast write, described herein. If the processes were spin-waiting, they see that the memory allocated to indicate when processes/cores can proceed past the barrier has been set to the predetermined value and proceed forward. If the processes were suspended, CPU 4112 may send a signal to processor 4121 to wake up the suspended process. CPU 4112 may send a signal to processor 4121 to wake up the suspended process using a broadcast write, described herein. Table 10 contains an example execution timeline of a lock release procedure.

TABLE 10

| | CPU 4112 process | Processors 4121 process |
|---|---|---|
| 1 | | Processes start execution |
| 2 | CPU 4112 polls known locations (e.g., BarrierFlags) to determine if processes executing on processors 4121 have reached the barrier<br>• If any of the known locations are set to a predetermined value, it indicates a process is waiting at the barrier. CPU 4112 can update the number of processes at the barrier (e.g., NumAtBarrier). | |
| 3 | | When an individual process reaches a barrier:<br>• The barrier flag is set to 1 for that process (e.g., BarrierFlag[ProcID]=1).<br>• BarrierFlag[ProcID]==1 indicates that the process associated with ProcID is waiting at the barrier.<br>• Process waits for BarrierFlag[ProcID]==0 |
| 4 | When CPU 4112 detects that all processes have reached the barrier (i.e., NumAtBarrier==NumProcs):<br>• CPU 4112 sets BarrierFlag[ ] array values to 0 | |
| 5 | | • If a process is spin-waiting, process will see that BarrierFlag[ProcID]==0 and proceed to execute past barrier.<br>• If process is suspended, process will be awoken and see that BarrierFlag[ProcID]==0 and proceed to execute past barrier. |

CPU 4112 and/or processors 4121 may use other data structures and/or algorithms to implement and manage barriers. For example, tree barriers may be implemented. Instead of one barrier flag per core/process, CPU 4112 and/or processors 4121 may use one barrier flag per module 4120 or processor 4121. Processor 4121 may determine (local to module 4120) when all of the participating cores/threads have reached the barrier. When all of the participating cores/threads associated with module 4120 have reached the barrier, processor 4121 may then set the BarrierFlag associated with processor 4121. This can decrease the amount of polling CPU 4112 needs to do. CPU 4112 only needs to poll one location associated with each processor 4121 instead of polling one location associated with each processor 4121. Since there may be more than one process being executed by each processor 4121 that is participating in the barrier, the number of processes is likely to outnumber the number of processors 4121 in system 4100. Alternatively, module 4120 may send an interrupt to CPU 4112 instead of having CPU 4112 poll.

System 4100 may implement flags. Flags allow fine-grained synchronization and concurrency between two or more processes executing on processors 4121 and/or CPU 4112. A process waiting on the flag does not necessarily need to spin-wait or suspend execution. An example use of a flag involves a process (e.g., process B) that need some input from another process (e.g., process A) before process B starts a computation. Process A and process B can communicate the input from process A to process B in a shared region of memory. In addition, process A and process B can communicate using an additional location that acts as a flag. For example, when the flag is a 0 (zero), the input from process A to process B is not in the shared region of memory. When the flag is a 1 (one), the input from process A to process B is stored in the shared region of memory.

For example, process B may loop and/or check for the flag to be set to a 1. If the flag is not set to a 1, process B may do other work. When process A is ready to write data into the shared region of memory, it checks the flag. If the flag is a 0, process A writes data into the shared region of memory and sets the flag to a 1 (for example, by using a compare-and-swap—CAS—instruction or a load-link and store-conditional—LL/SC—pair of instructions.) If the flag is a 1, process A waits until the flag is set to a 0 and then writes data into the shared region of memory and sets the flag to a 1. Process B detects that the flag has been set to a 1. In response, process B reads the data from the shared region of memory into non-shared storage. Process B then sets the flag to a 0 (for example, by using CAS or LL/SC.) Process B may then perform its computation. Process A may write more data into the share space and set the flag back to a 1 before process B is done with its computation.

In the foregoing example, the flag may be associated with the shared region of memory that process A (on CPU 4112) uses to pass data to process B (on module 4120). To create this flag and shared memory region, CPU 4112 (or processor 4121) allocates memory to: (1) implement the flag, and (2) implement the shared region of memory. The memory allocated to create the flag and shared region can be allocated statically or dynamically. The memory allocated to implement the flag is preferably allocated in the process's memory space. The flag is initialized by setting it to a predetermined value (e.g., FlagVal=0). Once the flag is initialized, process A and process B may begin executing. Table 11 contains an example execution timeline of a procedure for using flags.

TABLE 11

| CPU 4112 process | Processors 4121 process |
|---|---|
| 1 | Process B starts execution and periodically checks the flag (i.e., FlagVal) to see if the value is 1<br>• If FlagVal==0, the process may continue other work. |
| 2 When process A is ready to write data into the shared region of memory for process B to use:<br>• Process A checks FlagVal<br>• If FlagVal==0, process A writes data into the shared region of memory and set FlagVal=1.<br>• If FlagVal==1, process A waits until FlagVal==0. After FlagVal changes to 0, process A writes data into the shared region of memory and set FlagVal=1. | |
| 3 | When process B detects that FlagVal==1:<br>• Process B read the data from the shared memory region into non-shared storage<br>• Process B then set FlagVal=0<br>• Process B then performs its computation |
| 4 • Process A may write more data into the shared memory region before process B has completed its computation | |
| 5 | • Process B continues to periodically check FlagVal to see if there is more data to process. |

System 4100 may allocate semaphores, locks, flags, barriers, etc. using page granularity in order to reduce the number of translation look-aside buffer (TLB) entries used. System 4100 may align barrier flags and/or locks at the same address across multiple memory controller 4114 channels. This may allow CPU 4112 to do a single read across the multiple channels when CPU 4112 is polling the align barrier flags and/or locks. For example, consider an arrangement where there are four memory controller 4114 channels each populated with at least one module 4120. In addition, BarrierFlags [0:3] are each mapped to the same address, but on different modules 4120 that are each on a different memory controller 4114 channel. In this case, one read from CPU 4112 to the same address across all the channels (if CPU 4112 supports this operation) will return the values of all of BarrierFlags[0: 3]. This can reduce the number of polling operations by CPU 4112 by a factor of four.

It should also be understood that semaphores, locks, barriers, flags, etc. can be implemented for processes running on (or sharing) a single module 4120 in memory local to module 4120. This eliminates the need for other modules 4120 and/or CPU 4112 to have access to these semaphores, locks, barriers, flags, etc. Locks and barriers may be further optimized by implementing them in a hierarchical manner. For example, once a lock is acquired by a process on a module 4120, all processes executing on that module are given access to the lock before module 4120 releases the lock. In another example, the number of process waiting at a barrier can be updated at the module 4120 level. In other words, module 4120 may wait until all the processes executing on module 4120 have reached the barrier before communicating to CPU 4112 that processes are waiting. This reduces the amount of communication between module 4120 and CPU 4112. Similarly, the "release" signal of a barrier can be communicated by sending one signal to module 4120. Module 4120 then individually sets the indicators associated with each process to indicate the process may proceed past the barrier.

System 4100 may use methods other than polling by CPU 4112 to communicate asynchronously with CPU 4112. For example, module 4120 may send a temperature over threshold error signal. In another example, module 4120 may deliberately create an ECC error when sending data to memory controller 4114. When CPU 4112 receives an indication of the error, CPU 4112 may read a predetermined memory location (or register) on module 4120 to determine if the received error is corresponds to a synchronization event on module 4120 or corresponds to an actual error. If the error indicator corresponds to a synchronization event on module 4120, CPU 4112 can take the proper actions, described herein.

Module 4120 may signal an interrupt causing CPU 4112 to execute an interrupt handler routine. This interrupt handler routine may check memory and/or registers on module 4120 to determine if the interrupt was a request for communication (i.e., a synchronization event) or an interrupt for some other reason.

Figure 43:
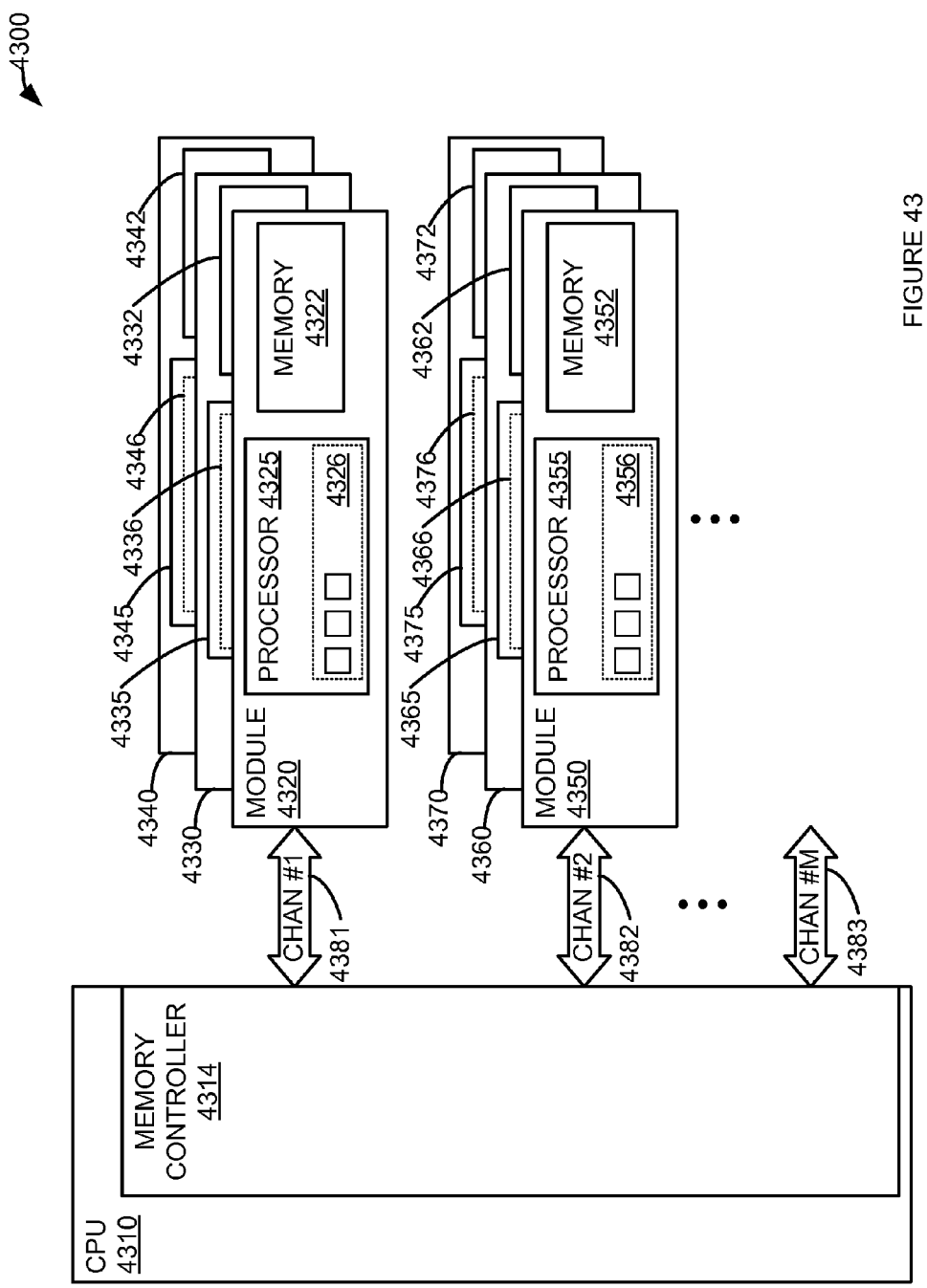
FIG. 43 is a block diagram of a graphics rendering system.

FIG. 43 is a block diagram of a graphics rendering system. In FIG. 43, system 4300 comprises CPU 4310, memory module 4320, memory module 4330, memory module 4340, memory module 4350, memory module 4360, and memory module 4370. CPU 4310 memory controller 4314. Memory controller has M number of memory channels. Memory module 4320, memory module 4330, and memory module 4340 are coupled to memory controller 4314 via a memory channel #1 4381. Memory module 4350, memory module 4360, and memory module 4370 are coupled to memory controller 4314 via a memory channel #2 4382. Additional memory modules (not shown in FIG. 43) can be coupled to memory controller 4314 via additional memory channels (e.g., memory channel #M 4383).

Each memory module 4320, 4330, 4340, 4350, 4360, and 4370 includes a processor 4325, 4335, 4345, 4355, 4365, and 4375, respectively. Each processor 4325, 4335, 4345, 4355, 4365, and 4375 includes a plurality of graphics processors 4326, 4336, 4346, 4356, 4366, and 4376, respectively. Each memory module 4320, 4330, 4340, 4350, 4360, and 4370 includes a memory 4322, 4332, 4342, 4352, 4362, and 4372, respectively. Memories 4322, 4332, 4342, 4352, 4362, and 4372 typically contain instructions and/or data used by the CPU 4310 and/or processors 4325, 4335, 4345, 4355, 4365, and 4375, and/or graphics processors 4326, 4336, 4346, 4356, 4366, and 4376.

Vertex and texture data for an entire frame (e.g., frame #N) can be sent to memory modules 4320, 4330, and 4340. This is efficiently performed using a broadcast write to memory modules 4320, 4330, and 4340. Broadcast writes to a broadcast aperture were described previously so they will not be repeated here for the sake of brevity. Once memory modules 4320, 4330, and 4340 hold vertex and texture data, the CPU 4310 can assign or re-assign rendering tasks to processors 4325, 4335, and 4345 and/or graphics processors 4326, 4336, and 4346. In an embodiment, CPU 4310 can assign or re-assign rendering tasks to processors 4325, 4335, and 4345 and/or graphics processors 4326, 4336, and 4346 efficiently because all of the memory modules 4320, 4330, and 4340 (and thus all the processors 4325, 4335, and 4345, and/or graphics processors 4326, 4336, and 4346) have access to all of the data necessary to render the entire frame (or at least enough vertex and texture data to render the portion assigned to memory modules 4320, 4330, and 4340, respectively). This process of dividing up a frame into portions to be rendered individually before combining them back known as Split Frame Rendering (SFR).

The re-assignment of rendering areas in SFR may be based on the amount of time each processor 4325, 4335, and 4345, and/or graphics processor 4326, 4336, and 4346 took to render the previous frame. For example, if a first one of processors 4325, 4335, and 4345, and/or graphics processors 4326, 4336, and 4346 took the longest to render its portion of the frame, and a second one of processors 4325, 4335, and 4345 and/or graphics processors 4326, 4336, and 4346, took the least amount of time, then the area assigned to the first CPU may be reduced, and the area assigned to the second may be increased. Other load balancing techniques may be applied. The re-assignment of rendering areas in SFR may be based on other metrics associated with processor 4325, 4335, and 4345, and/or graphics processor 4326, 4336, and 4346. These metrics may include processor 4325, 4335, and 4345 instructions or cycles, memory usage, power usage, or other cost functions.

Vertex and texture data for another entire frame (e.g., frame #N+1) can be sent to all of the memory modules 4350, 4360, and 4370. This is efficiently performed using a broadcast write to memory modules 4350, 4360, and 4370. Note that this broadcast write is performed on a different memory channel (i.e., channel #2 4382) than the broadcast write used to send vertex and texture data to memory modules 4320, 4330, and 4340 to render frame #N. Once all of all of the memory modules 4350, 4360, and 4370 hold all of the vertex and texture data, the CPU 4310 can assign or re-assign rendering tasks to processors 4355, 4365, and 4375, and/or graphics processors 4356, 4366, and 4376. CPU 4310 can assign or re-assign rendering tasks to processors 4355, 4365, and 4375, and/or graphics processors 4356, 4366, and 4376 efficiently because all of the memory modules 4350, 4360, and 4370 (and thus all the processors 4355, 4365, and 4375, and/or graphics processors 4356, 4366, and 4376) have access to all of the data necessary to render the entire frame.

Alternate Frame Rendering (AFR) is a technique where the set of processing units are divided up into groups to work on multiple frames concurrently in a round-robin fashion (e.g., frame #N and frame #N+1 are worked on concurrently). SFR and AFR may be mixed across memory modules memory modules 4320, 4330, 4340, 4350, 4360, and 4370 and graphics processors 4326, 4336, 4346, 4356, 4366, and 4376. For example, groups of memory modules 4320, 4330, and 4340 on the same memory channel 4381 may be assigned to render frame #N. Memory modules 4350, 4360, and 4370 may be assigned to render frame #N+1. In this example, AFR is used across memory channels while SFR is used within a single memory channel Within each of the frames being rendered within a group of memory modules on the same memory channel, graphics processors 4326, 4336, and 4346 may be assigned rendering tasks according to SFR. The areas assigned to each of the graphics processors 4326, 4336, and 4346 within a memory module group may be reassigned.

For example, consider a system in which within each processors 4325, 4335, and 4345 there are eight graphics processors 4326, 4336, and 4346, respectively. If load analysis from the last frame indicates that most of the computations were performed at the lower half of the screen, then an example dynamic load assignment would be to split the current frame into three horizontal strips. The first memory modules 4320 will take the top part of the frame (where there is less geometry to render); the second memory modules 4330 will take the next lower part, with the third memory modules 4340 taking the last portion. Within each memory modules 4320, 4330, 4340, the load is balanced equally by splitting it into 8 tiles with one of each of the eight graphics processors 4326, 4336, and 4346 assigned to a respective tile. This would result in maximizing throughput and reducing latency of the graphics system. This creates a hierarchal division of work having AFR across the channels 4381-4383, dynamic SFR between memory modules 4320, 4330, and 4340 within a given channel 4381, and static SFR within a processors 4325, 4335, and 4345. It should be understood that within each memory modules 4320, 4330, 4340, the load is may be balanced across an odd number, as well as an even number, of tiles.

AFR across the channels 4381-4383 can also be applied to stereoscopic rendering (i.e., 3-D rendering). For example, where half the interleaved frames go to the left eye view and the rest going to the right eye view, the following assignment can be made: for frame #1, channel 1 4381 is assigned to render the left eye view and channel 2 4382 is assigned to render the right eye view; for frame #2, channel 1 4381 is assigned to render the left eye view and channel 2 4382 is assigned to render the right eye view, and so on. Example assignments for a four channel system are given in Table 12 and Table 13. Table 12 gives an example assignment where half of a scene with interleaved lines is the left eye view and the rest are the right eye view. Table 13 gives an example where the frame rate is fast enough to dedicate all of the lines in a scene to a particular eye.

TABLE 12

| Frame | Channel | Assignment |
|---|---|---|
| 1 | 1 | Left eye view |
|  | 2 | Right eye view |
| 2 | 3 | Left eye view |
|  | 4 | Right eye view |
| 3 | 1 | Left eye view |
|  | 2 | Right eye view |
| 4 | 3 | Left eye view |
|  | 4 | Right eye view |
| etc. | etc. | etc. |

TABLE 13

| Frame | Channel | Assignment |
|---|---|---|
| 1 | 1 | Left eye view |
| 2 | 2 | Right eye view |
| 3 | 3 | Left eye view |
| 4 | 4 | Right eye view |
| etc. | etc. | etc. |

It should be understood that the examples given in Tables 12 and 13 can be applied to other numbers of channels (e.g., N channels).

Figure 44A:
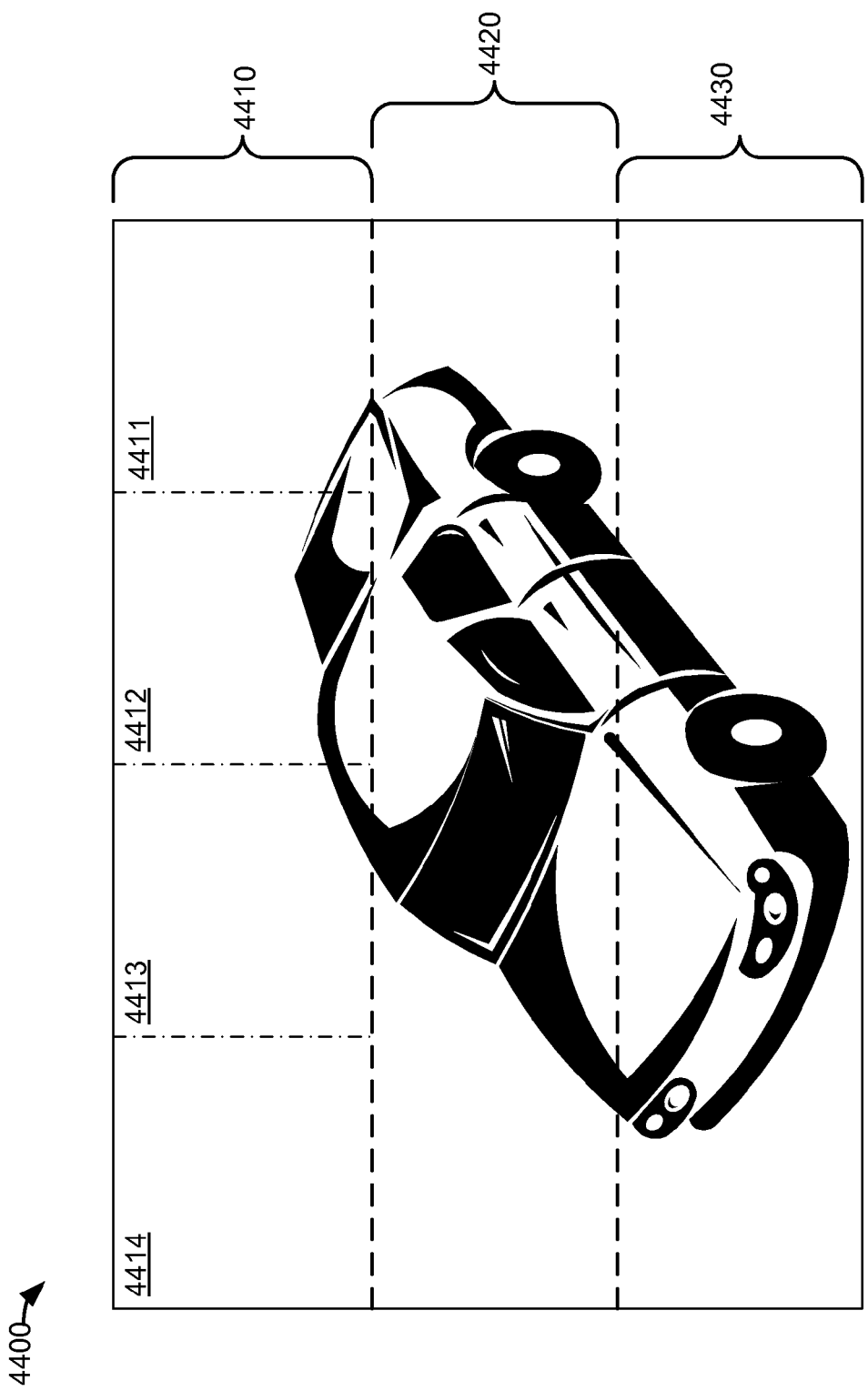
FIG. 44A is an illustration of rendering assignments for a first frame.
Figure 44B:
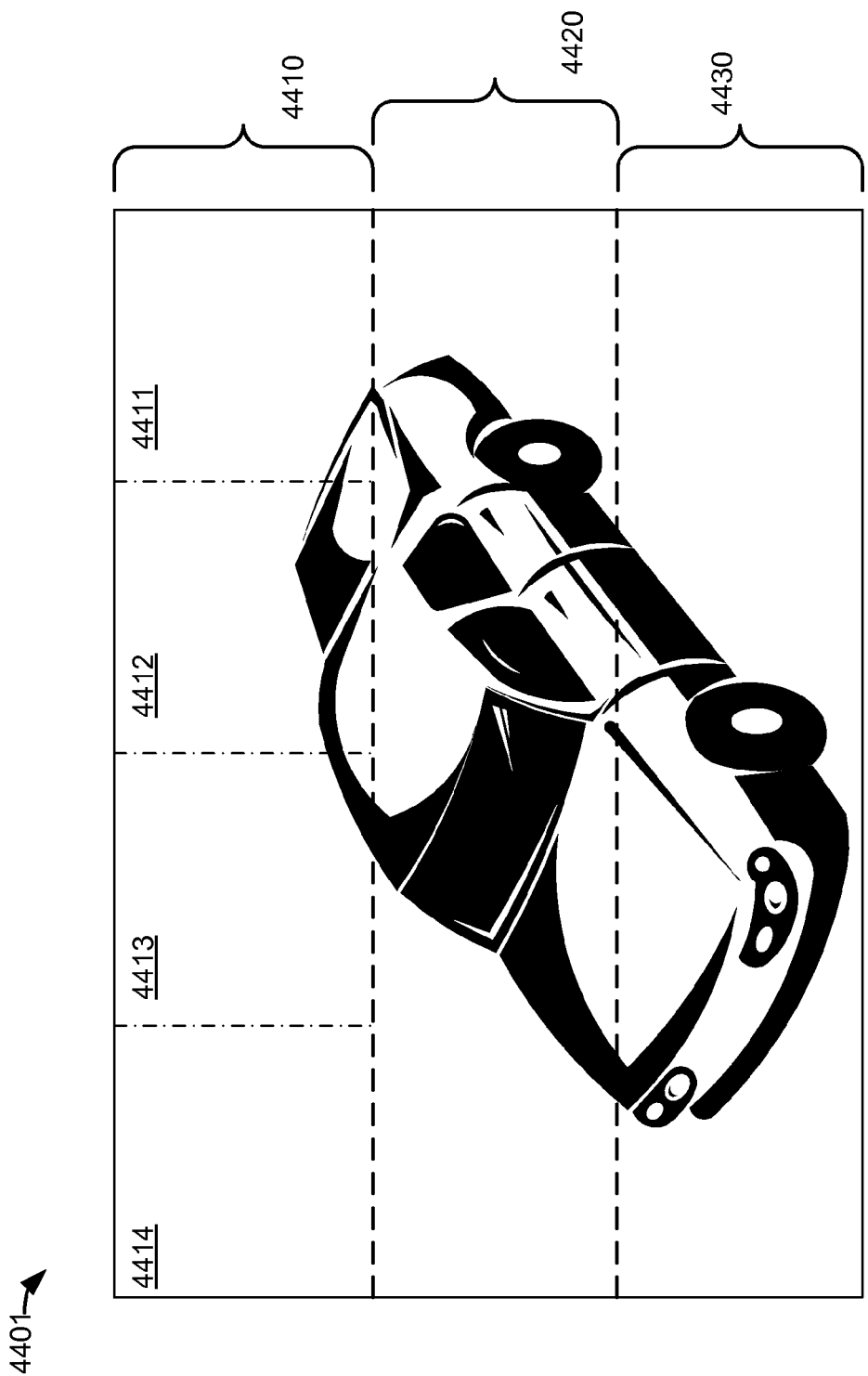
FIG. 44B is an illustration of rendering assignment for a second frame.

FIG. 44A is an illustration of rendering assignments for a first frame. FIG. 44B is an illustration of rendering assignment for a second frame. In FIG. 44A, memory module 4320 has been assigned to render the top portion of the frame 4410. Memory module 4330 has been assigned to render the middle portion of the frame 4420. Memory module 4340 has been assigned to render the bottom portion of the frame 4430. Within memory module 4320, each of the graphics processors 4326 has been assigned equal size portions 4411, 4412, 4413, and 4414 of the top portion of the frame. Memory modules 4330 and 4340 also have graphics processors 4336 and 4346, respectively, that are each assigned to portions of 4420 and 4430, respectively.

FIG. 44B is an illustration of rendering assignment for a second frame after dynamic SFR has been applied. Note that the top portion of the frame 4410 encompasses more area than it did in FIG. 44A. However, within the top portion of the frame 4410, the areas assigned to each of graphics processors 4326 are equal in area (though now larger than in the first frame). Between frames, the horizontal lines dividing portions 4410, 4420, and 4430 will move up and down (thus altering the respective areas rendered by memory modules 4320, 4330, and 4340) based on a load analysis from at least the previous frame.

It should be understood that the process of rendering frames, or portions of frames, can be done using rasterization techniques. It should also be understood that the process of rendering frames, or portions of frames, can be done using ray tracing techniques. Ray tracing is a technique for generating an image by tracing the path of light through pixels in an image plane. As the light path is traced, the effects on the light of its encounters with virtual objects are simulated.

When rendering using ray tracing, light rays are cast from the eye view into an environment represented by a bounding volume hierarchy (BVH). A BVH is a spatial data structure representation of the objects in the scene. A BVH is typically constructed in such a way to speed look up of ray to object intersection in logarithmic time complexity. As a ray traverses the scene and collides with objects represented by the BVH, the material component for that object is picked up at the ray-object intersection. Using either conventional ray tracing or a refined method such as stochastic ray tracing, each ray can then either be absorbed into the environment, reflected or possibly refracted from the object. The reflection model used could be a bidirectional reflectance distribution function (BRDF) or possibly some other reflectance model.

Some rays can bounce once (in the case it got absorbed). Others rays can bounce multiple time in a recursive manner, with each bounce accumulating (and blending) more color information associated with the ray. At the end of this process, each ray will now contain the color information of the objects it interacted with. This information can be sent to a processor to be used to render the final image. Rays that completely missed any object can be discarded. Because light rays (at least in computer graphics) do not interfere with one another, the ray tracing process is highly parallelizable.

In an embodiment, CPU 4310 may construct a BVH for a frame. This BVH may be transferred to modules 4320, 4330, 4340, 4350, 4360, and/or 4370. The BVH may be transferred to one or more of modules 4320, 4330, 4340, 4350, 4360, and/or 4370 using a broadcast write. In an embodiment, modules 4320, 4330, 4340, 4350, 4360, and 4370 can all have identical copies of the BVH model. CPU 4310 can then allocate (cast) the tracing of rays among modules 4320, 4330, 4340, 4350, 4360, and/or 4370. Each of modules 4320, 4330, 4340, 4350, 4360, and/or 4370 can process the rays allocated to that module 4320, 4330, 4340, 4350, 4360, and/or 4370, respectively. Because the processing of each ray is independent of the other rays, there is no need to pass information between modules 4320, 4330, 4340, 4350, 4360, and 4370. After each of modules 4320, 4330, 4340, 4350, 4360, and 4370 has finished processing its allocation of rays, the results may be sent to CPU 4310. In an embodiment, in order to reduce communication between CPU 4310 and modules 4320, 4330, 4340, 4350, 4360, and 4370, each module 4320, 4330, 4340, 4350, 4360, and 4370 may cast its own rays.

For a subsequent frame, if only the perspective of the eye view has changed (i.e., the viewpoint is moving through a static scene), the BVH on each of modules 4320, 4330, 4340, 4350, 4360, and 4370 will not need to be updated. Instead, a new set of rays can be casted for the new viewpoint location. If an object has changed shape for the subsequent frame, then a new BVH can be constructed (e.g., by CPU 4310) and sent to modules 4320, 4330, 4340, 4350, 4360, and 4370.

Within each module 4320, 4330, 4340, 4350, 4360, and 4370, each ray is traced through the BVH. At the end of a hit, a ray is reflected, refracted, or absorbed with the object it intersect. After a few bounces, rays may lose any spatial coherency from its initial vector. Since each ray traced through the BVH results in memory reads, memory accesses may also become incoherent. Some bookkeeping can be done within each module 4320, 4330, 4340, 4350, 4360, and 4370 to coalesced errant rays (i.e., rays that are cache misses) until enough requests are accumulated to a particular memory address to make a memory read worthwhile. Limiting memory access can be the key to high performance.

For a particular frame, there can be imbalances in which a module 4320, 4330, 4340, 4350, 4360, and 4370 finishes earlier than others. The module 4320, 4330, 4340, 4350, 4360, and 4370 that finished last can limit the maximum frame rate. Various heuristic methods can be employed to balance loading among modules 4320, 4330, 4340, 4350, 4360, and 4370.

It should be understood that ray tracing can be used with stereoscopic views as well. However, instead of tracing through the BVH for a single viewpoint, rays are traced for two viewpoints (i.e., left and right eye views).

Figure 45:
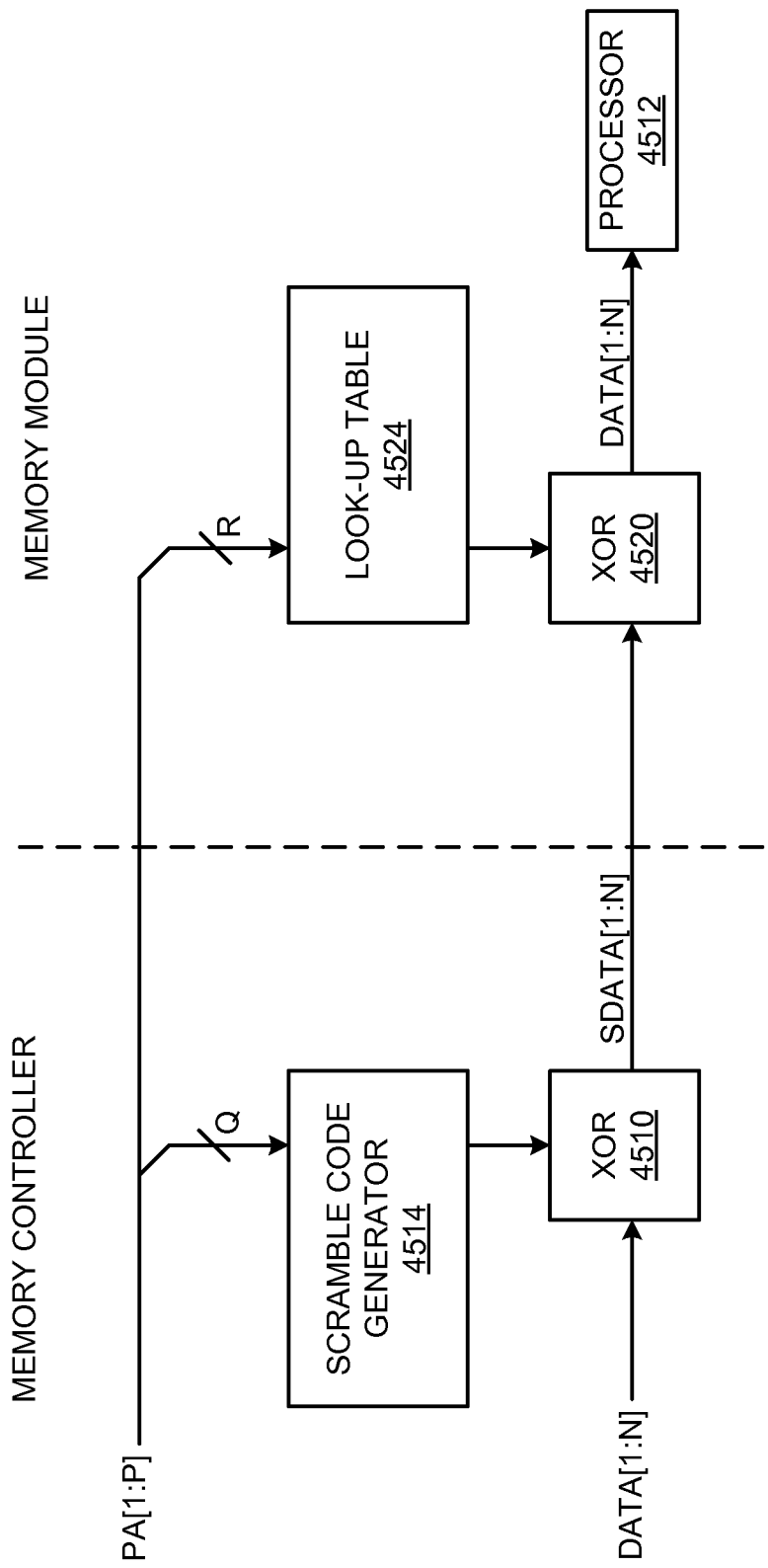
FIG. 45 is a block diagram illustrating a memory interface that descrambles a scrambled memory interface.

FIG. 45 is a block diagram illustrating a memory interface that descrambles a scrambled memory interface. In FIG. 45, a memory controller comprises a scramble code generator 4514 and XOR 4510. For example memory controller 2514, memory controller 3014, memory controller 3214, memory controller 3414, memory controller 3620, memory controller 3621, memory controller 3914, memory controller 4114, and/or memory controller 4314 may comprises a scramble code generator 4514 and XOR 4510 to scramble data sent across a memory channel. A memory module comprises a look-up table 4524, XOR 4520, and a processor 4512. Scramble code generator is operable coupled to XOR 4520. XOR 4520 receives data (DATA[1:N] to be sent to the memory module. Thus, XOR scrambles DATA[1:N] by exclusive-ORing it with a scramble code generated by scramble code generator 4524. Scramble code generator 4524 may generate the scramble code based on a Q number of bits subset of a physical address (PA[1:P]). The output of XOR 4520 is a scrambled data (SDATA[1:N]).

Look-up table 4524 may use an R number of bits subset of the physical address to output a reverse function that, when XOR'd with SDATA[1:N] reverses the scrambling of DATA [1:N]. Typically, the reverse function output by look-up table 4524 is the same scramble code output by scramble code generator 4524. XOR 4520 receives the output of look-up table 4524. XOR 4520 outputs descrambled data (i.e., DATA [1:N]) to processor 4512. Look-up table 4524 may also be used to scramble data to be sent from processor 4512 to the memory controller.

In an embodiment, the memory controller scrambles data sent to the memory module using a Linear Feedback Shift Register (LFSR) or the like, in order to reduce the likelihood of "bad" data patterns (e.g., DATA[0:N] all "0"'s for 8 word burst.) The LFSR is seeded with a Q bit subset of the address bits.

The memory controller may also map physical addresses to Bank, row, column addresses in a manner that is not perfectly sequential (e.g., the PA to chip select, Bank, row, column address translations do not have necessarily have all of the column addresses mapping 1:1 with corresponding PA bits.) In other words, a physical address PA[N:0] may map to a channel address of, for example, Row[15:0], CS[2:0], Col[9], Bank[2:0], Col[8:3], CH[1:0].

To descramble the data, a look-up table 4524 size write of all "0"'s is performed to the memory module. The scrambled data from this write is received by the memory module and stored in a pattern buffer. The pattern buffer (i.e. look-up table 4524) provides a 1:1 correspondence between the addresses received during the write, and the pattern used to scramble the data to be stored at those addresses. Thus, XORing the pattern data stored in look-up table 4524 for a particular address with data sent/received will scramble/unscramble the data.

Figure 46:
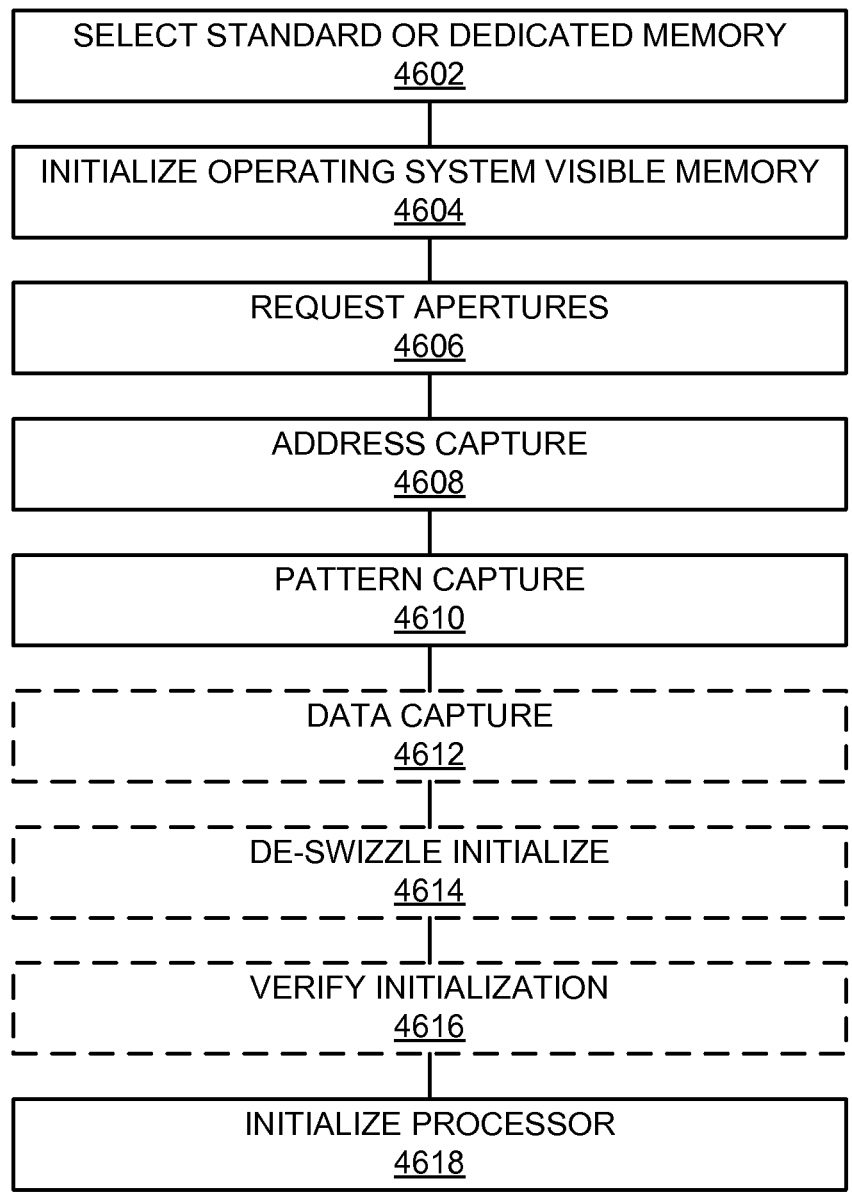
FIG. 46 is a flowchart illustrating a training and initialization sequence for communication between a host processor and memory module.

FIG. 46 is a flowchart illustrating a training and initialization sequence for communication between a host processor and memory module. One or more steps illustrated in FIG. 46 may be used to initialize one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, system 4700, and/or look-up table 4524, and/or their components. Standard or dedicated memory is selected (4602). For example, module 2551 may be configured such that memory 2571 is to act one of either CPU memory 123 or processor memory 124. Operating system visible memory is initialized (4604). For example, module 2551 may initialize memory 2571. Apertures are requested (4606). For example, CPU 2512, under the control of driver software, may request a range of memory from the operating system. This range of memory can be used to communicate with processor 2561. Addresses are captured (4608). For example, CPU 2512, under the control of driver software, may make accesses to the aperture using a "walking 1's" pattern for the address. This pattern (or others) allows processor 2561 to determine the physical address to aperture address translation (i.e., swizzle).

Scramble patterns are captured (4610). For example, CPU 2512, under the control of driver software, may perform an aperture sized write of all "0"'s to the memory module. The scrambled data from this write is received by the memory module and stored in a pattern buffer. Data is captured (4612). For example, CPU 2512, under the control of driver software, may write data to the aperture using a "walking 1's" pattern. This pattern (or others) allows processor 2561 to determine whether the DQ bits have been re-arranged (i.e., swizzled). The de-swizzle logic is initialized (4614). The initialization is verified (4616). The processor is initialized (4618).

Figure 47:
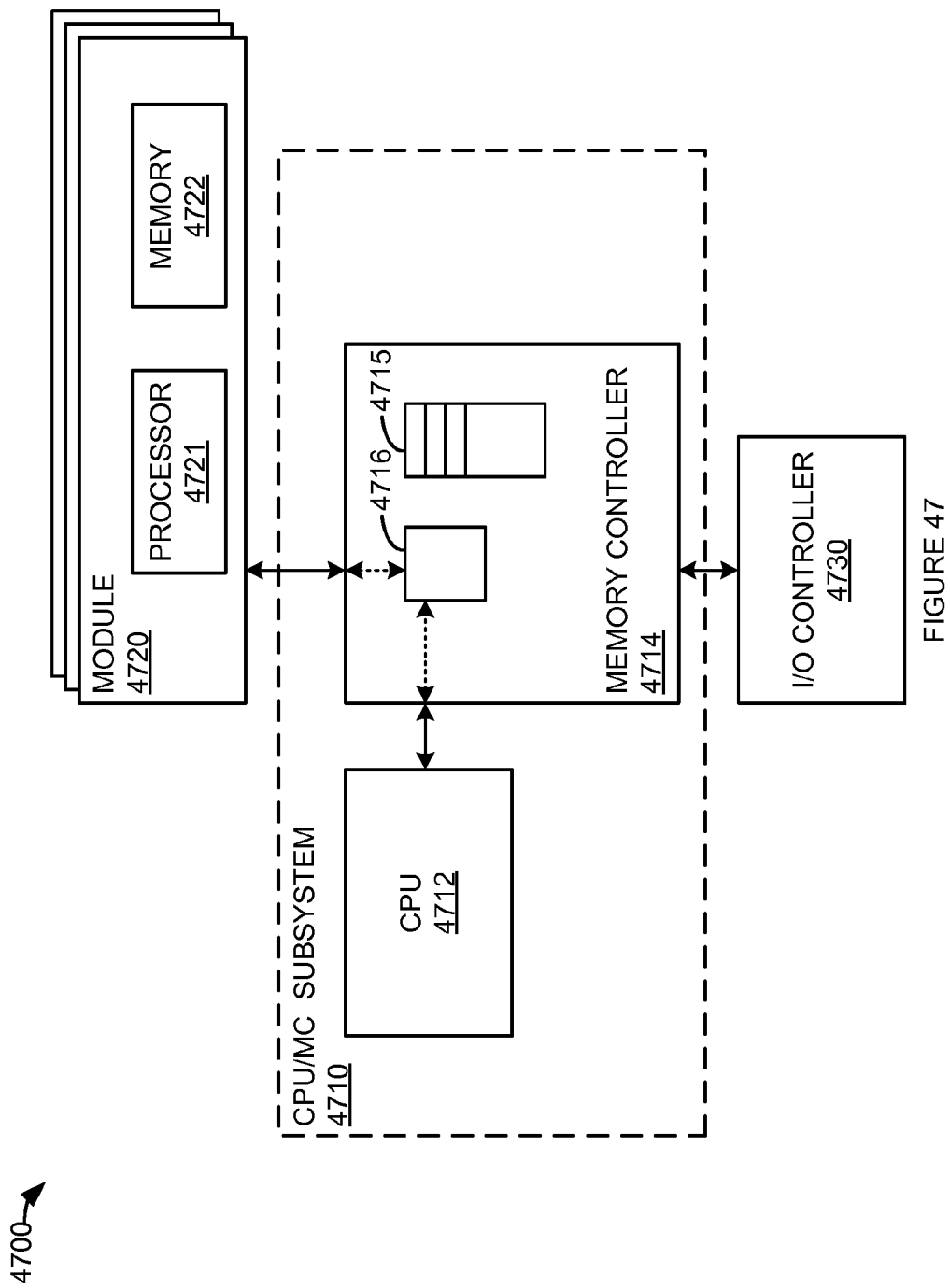
FIG. 47 is a block diagram of a system with an aperture enabled memory controller.

FIG. 47 is a block diagram of a system with an aperture enabled memory controller. In FIG. 47 computer system 4700 comprises CPU/memory controller subsystem 4710, I/O controller 4730, and memory modules 4720. CPU/memory controller subsystem 4710 includes a CPU 4712 coupled to a memory controller 4714. One or more memory modules 4720 are coupled to memory controller 4714 in subsystem 4710. Each memory module 4720 includes a processor 4721 and memory 4722. Memory 4722 typically contains instructions and/or data used by the CPU 4712 and/or processor 4721. Memory controller 4714 includes aperture address registers 4715 and scrambler 4716.

CPU 4712 can control memory controller 4714 to distribute particular processing tasks (such as graphical processing tasks) to processors 4721, and can perform certain processing tasks itself. These tasks may include data to be processed and/or instructions to be executed. Although three memory modules 4720 are shown in FIG. 47, alternate system may contain any number of memory modules coupled to memory controller 4714. The ability to add and remove memory modules 4720 can provide an upgradeable and scalable memory and computing architecture. CPU 4712 may communicate with processor 4721 by reading from, and writing to, an address aperture associated with processor 4721. The data sent to, and read from, modules 4720 may be scrambled by scrambler 4716. In an embodiment, memory controller 4714 scrambles data sent to memory module 4720 using a LFSR, or the like, in order to reduce the likelihood of "bad" data patterns The LFSR may be seeded with a subset of the address bits.

Aperture address registers 4715 may be written by CPU 4712 to define ranges of addresses on modules 4720 that will not have scrambled data sent to (or received from) modules 4720. Pairs of register may specify start and end addresses for aperture range. Memory controller 4714 can disable scrambler 4716 for the addresses in the range. Memory controller 4714 may also disable ECC checks/generation for the addresses in the range. CPU 4512, under the control of driver software, may program aperture address registers after receiving address ranges for apertures to be used to communicate with modules 4720 from the operating system An embodiment includes method of operating a memory module. The steps of this embodiment may be performed by one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and/or their components. From a memory interface and at an integrated circuit device, a first memory command directed to a first rank of dynamic memory disposed on a memory module is received, the memory interface configured to interface with a memory controller, the integrated circuit device disposed on the memory module and including a processor. For example, IC 2610 (which includes processor 2612 and is disposed on module 2600) may receive, from C/A connections 2680 (which are coupled to a memory controller), a memory command directed to memory rank 2650-2658. In response to the first memory command, and in at least one data buffer integrated circuit, data from the first rank that is associated with the first memory command is stored. For example, data read from memory rank 2650-2658 in response to the memory command may be stored in DQ buffers 2660-2668.

Under the control of the integrated circuit device, the data associated with the first memory command is communicated from the at least one data buffer to the memory interface such that the first rank is accessible to the memory controller. For example, IC 2610 may control DQ buffers 2660-2668 to communicate the data read from memory rank 2650-2658 to DQ connections 2670. Since DQ connections 2670 are also coupled to the memory controller, communicating the data read from memory rank 2650-2658 to DQ connections 2670 in response to the memory command allows memory rank 2650-2658 to be read accessible to the memory controller.

From the memory interface and at the integrated circuit device, a second memory command directed to the first rank is received. For example, IC 2610 may receive, from C/A connections 2680, a second memory command that is directed to memory rank 2650-2658. In response to the second memory command, and in the at least one data buffer integrated circuit, data received from the integrated circuit device that is associated with the second memory command is stored. For example, IC 2610, in response to the second memory command, may send data which has been processed by processor 2612 to be stored in DQ buffers 2660-2668. This data may be sent via links 2676A.

Under the control of the integrated circuit device, the data associated with the second memory command is communicated from the at least one data buffer to the memory interface such that data processed by the processor is accessible to the memory controller. For example, IC 2610 may control DQ buffers 2660-2668 to communicate data processed by processor 2612 to DQ connections 2670. Since DQ connections 2670 are also coupled to the memory controller, communicating the data received from IC 2610 to DQ connections 2670 in response to the second memory command allows the data processed by processor 2612 to be read accessible to the memory controller. IC 2610 may also control DQ buffers 2660-2668 to communicate, to IC 2610, the data from memory rank 2650-2658 that was associated with the first memory command.

An embodiment includes a method of operating a memory module. The steps of this embodiment may be performed by one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and/or their components. From a memory interface and at an integrated circuit device, a first memory command directed to a first rank of dynamic memory disposed on a memory module is received, the memory interface configured to interface with a memory controller, the integrated circuit device disposed on the memory module and including a processor. For example, IC 2610 (which includes processor 2612 and is disposed on module 2600) may receive, from C/A connections 2680 (which are coupled to a memory controller), a memory command directed to memory rank 2650-2658. In response to the first memory command, and in at least one data buffer integrated circuit, data from the memory interface that is associated with the first memory command is stored. For example, in response to the memory command, data received from DQ connections 2670 may be stored in DQ buffers 2660-2668.

Under the control of the integrated circuit device, the data associated with the first memory command is communicated from the at least one data buffer to the first rank such that the first rank is accessible to the memory controller. For example, IC 2610 may control DQ buffers 2660-2668 to communicate the data received from DQ connections 2670 to memory rank 2650-2658. Since DQ connections 2670 are coupled to the memory controller, communicating the data received from DQ connections 2670 to memory rank 2650-2658 in response to the memory command allows memory rank 2650-2658 to be write accessible to the memory controller.

From the memory interface and at the integrated circuit device, a second memory command directed to the first rank is received. For example, IC 2610 may receive, from C/A connections 2680, a second memory command that is directed to memory rank 2650-2658. In response to the second memory command, and in the at least one data buffer integrated circuit, data that is associated with the second memory command and was received from the memory interface is stored. For example, IC 2610, in response to the second memory command, may control DQ buffers 2660-2668 to store data received from DQ connections 2670.

Under the control of the integrated circuit device, the data associated with the second memory command is communicated from the at least one data buffer to the integrated circuit device such that the processor can access the data associated with the second memory command. For example, IC 2610 may control DQ buffers 2660-2668 to communicate data received from DQ connections 2670 to IC 2610. Receiving the data associated with the second memory command at IC 2610 allows processor 2612 to access the data from the memory controller that is associated with the second memory command. IC 2610 may also control DQ buffers 2660-2668 to communicate, to IC 2610, the data from that was associated with the first memory command.

An embodiment includes a method of operating a memory module. The steps of this embodiment may be performed by one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and/or their components. From a memory interface and at an integrated circuit device, a first memory command directed to a first rank of dynamic memory disposed on a memory module is received, the memory interface configured to interface with a memory controller, the integrated circuit device disposed on the memory module and including a processor, the memory module including a second rank of dynamic memory. For example, IC 2610 which includes processor 2612 and is disposed on module 2601 (and module 2601 includes a first rank of memory 2650-2658 and a second rank of memory 2640-2648) may receive, from C/A connections 2680 (which are coupled to a memory controller), a memory command directed to memory rank 2650-2658. In response to the first memory command, and in at least one data buffer integrated circuit, data from the first rank that is associated with the first memory command is stored. For example, data read from memory rank 2650-2658 in response to the memory command may be stored in DQ buffers 2660-2668.

Under the control of the integrated circuit device, the data associated with the first memory command is communicated from the at least one data buffer to the memory interface such that the first rank is accessible to the memory controller. For example, IC 2610 may control DQ buffers 2660-2668 to communicate the data read from memory rank 2650-2658 to DQ connections 2670. Since DQ connections 2670 are also coupled to the memory controller, communicating the data read from memory rank 2650-2658 to DQ connections 2670 in response to the memory command allows memory rank 2650-2658 to be read accessible to the memory controller.

From the memory interface and at the integrated circuit device, a second memory command directed to the first rank is received. For example, IC 2610 may receive, from C/A connections 2680, a second memory command that is directed to memory rank 2650-2658. In response to the second memory command, and in the at least one data buffer integrated circuit, data received from the integrated circuit device that is associated with the second memory command is stored. For example, IC 2610, in response to the second memory command, may send data which has been processed by processor 2612 to be stored in DQ buffers 2660-2668. This data may be sent via links 2676A.

Under the control of the integrated circuit device, the data associated with the second memory command is communicated from the at least one data buffer to the memory interface such that data processed by the processor is accessible to the memory controller. For example, IC 2610 may control DQ buffers 2660-2668 to communicate data processed by processor 2612 to DQ connections 2670. Since DQ connections 2670 are also coupled to the memory controller, communicating the data received from IC 2610 to DQ connections 2670 in response to the second memory command allows the data processed by processor 2612 to be read accessible to the memory controller. IC 2610 may also control DQ buffers 2660-2668 to communicate, to IC 2610, the data from memory rank 2650-2658 that was associated with the first memory command.

A third memory command that is to retrieve data stored in the second rank for processing by the integrated circuit is sent to the second rank. For example, IC 2610 may send a memory command to memory rank 2640-2648. This memory command may be to retrieved data previously stored in memory rank 2640-2648. This memory command may be sent via links 2682. The data retrieved may be received via links 2674B.

An embodiment includes a method of operating a memory module. The steps of this embodiment may be performed by one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and/or their components. From a memory interface and at an integrated circuit device, a first memory command directed to a first rank of dynamic memory disposed on a memory module is received, the memory interface configured to interface with a memory controller, the integrated circuit device disposed on the memory module and including a processor. For example, IC 2610, which includes processor 2612 and is disposed on module 2601 (and module 2601 includes a first rank of memory 2650-2658 and a second rank of memory 2640-2648) may receive, from C/A connections 2680 (which are coupled to a memory controller), a memory command directed to memory rank 2650-2658. In response to the first memory command, and in at least one data buffer integrated circuit, data from the memory interface that is associated with the first memory command is stored. For example, in response to the memory command, data received from DQ connections 2670 may be stored in DQ buffers 2660-2668.

Under the control of the integrated circuit device, the data associated with the first memory command is communicated from the at least one data buffer to the first rank such that the first rank is accessible to the memory controller. For example, IC 2610 may control DQ buffers 2660-2668 to communicate the data received from DQ connections 2670 to memory rank 2650-2658. Since DQ connections 2670 are coupled to the memory controller, communicating the data received from DQ connections 2670 to memory rank 2650-2658 in response to the memory command allows memory rank 2650-2658 to be write accessible to the memory controller.

From the memory interface and at the integrated circuit device, a second memory command directed to the first rank is received. For example, IC 2610 may receive, from C/A connections 2680, a second memory command that is directed to memory rank 2650-2658. In response to the second memory command, and in the at least one data buffer integrated circuit, data that is associated with the second memory command and was received from the memory interface is stored. For example, IC 2610, in response to the second memory command, may control DQ buffers 2660-2668 to store data received from DQ connections 2670.

Under the control of the integrated circuit device, the data associated with the second memory command is communicated from the at least one data buffer to the integrated circuit device such that the processor can access the data associated with the second memory command. For example, IC 2610 may control DQ buffers 2660-2668 to communicate data received from DQ connections 2670 to IC 2610. Receiving the data associated with the second memory command at IC 2610 allows processor 2612 to access the data from the memory controller that is associated with the second memory command. IC 2610 may also control DQ buffers 2660-2668 to communicate, to IC 2610, the data from that was associated with the first memory command.

A third memory command that is to store data processed by the integrated circuit is sent to the second rank. For example, IC 2610 may send a memory command to memory rank 2640-2648. This memory command may be to store data processed by integrated circuit 2610 in memory rank 2640-2648. This memory command may be sent via links 2682. The data stored may be sent via links 2674B.

FIGS. 52A and 52B are a flowchart illustrating a method of operating a memory module. The steps illustrated in FIGS. 52A and 52B may be performed by one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and/or their components. From a memory interface and at an integrated circuit device, a first memory command directed to a first rank of dynamic memory disposed on a memory module is received, the memory interface configured to interface with a memory controller, the integrated circuit device disposed on the memory module and including a processor, the memory module including a second rank of dynamic memory. For example, IC 2610 which includes processor 2612 and is disposed on module 2602 (and module 2602 includes a first rank of memory 2650-2658 and a second rank of memory 2640-2648) may receive, from C/A connections 2680 (which are coupled to a memory controller), a memory command directed to memory rank 2650-2658. In response to the first memory command, and in at least one data buffer integrated circuit, data from the first rank that is associated with the first memory command is stored. For example, data read from memory rank 2650-2658 in response to the memory command may be stored in DQ buffers 2660-2668.

Under the control of the integrated circuit device, the data associated with the first memory command is communicated from the at least one data buffer to the memory interface such that the first rank is accessible to the memory controller. For example, IC 2610 may control DQ buffers 2660-2668 to communicate the data read from memory rank 2650-2658 to DQ connections 2670. Since DQ connections 2670 are also coupled to the memory controller, communicating the data read from memory rank 2650-2658 to DQ connections 2670 in response to the memory command allows memory rank 2650-2658 to be read accessible to the memory controller.

From the memory interface and at the integrated circuit device, a second memory command directed to the first rank is received. For example, IC 2610 may receive, from C/A connections 2680, a second memory command that is directed to memory rank 2650-2658. In response to the second memory command, and in the at least one data buffer integrated circuit, data received from the integrated circuit device that is associated with the second memory command is stored. For example, IC 2610, in response to the second memory command, may send data which has been processed by processor 2612 to be stored in DQ buffers 2660-2668. This data may be sent via links 2676C.

Under the control of the integrated circuit device, the data associated with the second memory command is communicated from the at least one data buffer to the memory interface such that data processed by the processor is accessible to the memory controller. For example, IC 2610 may control DQ buffers 2660-2668 to communicate data processed by processor 2612 to DQ connections 2670. Since DQ connections 2670 are also coupled to the memory controller, communicating the data received from IC 2610 to DQ connections 2670 in response to the second memory command allows the data processed by processor 2612 to be read accessible to the memory controller. IC 2610 may also control DQ buffers 2660-2668 to communicate, to IC 2610, the data from memory rank 2650-2658 that was associated with the first memory command.

By the integrated circuit device, a third memory command that is to retrieve data stored in the second rank is sent to the second rank. For example, IC 2610 may send a memory command to memory rank 2640-2648. This memory command may be to retrieved data previously stored in memory rank 2640-2648. This memory command may be sent via links 2682. In response to the third memory command, and in at least one data buffer integrated circuit, data from the second rank that is associated with the third memory command is stored. For example, data read from memory rank 2640-2648 in response to the third memory command may be stored in DQ buffers 2660-2668.

Under the control of the integrated circuit device, the data associated with the third memory command is communicated from the at least one data buffer to the memory interface such that the second rank is accessible to the memory controller. For example, IC 2610 may control DQ buffers 2660-2668 to communicate the data read from memory rank 2640-2648 to DQ connections 2670. Since DQ connections 2670 are also coupled to the memory controller, communicating the data read from memory rank 2640-2648 to DQ connections 2670 in response to the memory command allows memory rank 2640-2648 to be read accessible to the memory controller.

By the integrated circuit device, a fourth memory command that is to retrieve data stored in the second rank is sent to the second rank. For example, IC 2610 may send a memory command to memory rank 2640-2648. This memory command may be to retrieved data previously stored in memory rank 2640-2648. This memory command may be sent via links 2682. In response to the fourth memory command, and in at least one data buffer integrated circuit, data from the second rank that is associated with the fourth memory command is stored. For example, data read from memory rank 2640-2648 in response to the fourth memory command may be stored in DQ buffers 2660-2668.

Under the control of the integrated circuit device, the data associated with the fourth memory command is communicated from the at least one data buffer to the integrated circuit device such that the second rank is accessible to integrated circuit device. For example, IC 2610 may control DQ buffers 2660-2668 to communicate the data read from memory rank 2640-2648 to IC 2610. DQ buffers 2660-2668 may communicate the data read in response to the fourth memory command via links 2676C.

An embodiment includes a method of operating a memory module. The steps of this embodiment may be performed by one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and/or their components. From a memory interface and at an integrated circuit device, a first memory command directed to a first rank of dynamic memory disposed on a memory module is received, the memory interface configured to interface with a memory controller, the integrated circuit device disposed on the memory module and including a processor. For example, IC 2610, which includes processor 2612 and is disposed on module 2601 (and module 2601 includes a first rank of memory 2650-2658 and a second rank of memory 2640-2648) may receive, from C/A connections 2680 (which are coupled to a memory controller), a memory command directed to memory rank 2650-2658. In response to the first memory command, and in at least one data buffer integrated circuit, data from the memory interface that is associated with the first memory command is stored. For example, in response to the memory command, data received from DQ connections 2670 may be stored in DQ buffers 2660-2668.

Under the control of the integrated circuit device, the data associated with the first memory command is communicated from the at least one data buffer to the first rank such that the first rank is accessible to the memory controller. For example, IC 2610 may control DQ buffers 2660-2668 to communicate the data received from DQ connections 2670 to memory rank 2650-2658. Since DQ connections 2670 are coupled to the memory controller, communicating the data received from DQ connections 2670 to memory rank 2650-2658 in response to the memory command allows memory rank 2650-2658 to be write accessible to the memory controller.

From the memory interface and at the integrated circuit device, a second memory command directed to the first rank is received. For example, IC 2610 may receive, from C/A connections 2680, a second memory command that is directed to memory rank 2650-2658. In response to the second memory command, and in the at least one data buffer integrated circuit, data that is associated with the second memory command and was received from the memory interface is stored. For example, IC 2610, in response to the second memory command, may control DQ buffers 2660-2668 to store data received from DQ connections 2670.

Under the control of the integrated circuit device, the data associated with the second memory command is communicated from the at least one data buffer to the integrated circuit device such that the processor can access the data associated with the second memory command. For example, IC 2610 may control DQ buffers 2660-2668 to communicate data received from DQ connections 2670 to IC 2610. Receiving the data associated with the second memory command at IC 2610 allows processor 2612 to access the data from the memory controller that is associated with the second memory command. IC 2610 may also control DQ buffers 2660-2668 to communicate, to IC 2610, the data from that was associated with the first memory command.

By the integrated circuit, a third memory command that is to store data in the second rank is sent to the second rank. For example, IC 2610 may send a memory command to memory rank 2640-2648. This memory command may be to store data processed by integrated circuit 2610 in memory rank 2640-2648. This memory command may be sent via links 2682.

In correspondence to the third memory command, and in at least one data buffer integrated circuit, data received from the integrated circuit device that is associated with the third memory command is stored. For example, data associated with the third memory command may be received by DQ buffers 2660-2668 from IC 2610 and stored. The data associated with the third memory command may be received by DQ buffers 2660-2668 via links 2676C.

Under the control of the integrated circuit device, the data associated with the third memory command is communicated from the at least one data buffer to the second rank such that the second rank is accessible to the memory controller. For example, IC 2610 may control DQ buffers 2660-2668 to communicate the data received from IC 2610 to memory rank 2640-2648. This allows memory rank 2640-2648 to be write accessible to IC 2610.

By the integrated circuit, a fourth memory command that is to store data in the second rank is sent to the second rank. For example, in response to a memory command received from a memory controller, IC 2610 may send a memory command to memory rank 2640-2648. This memory command may be to store data from the memory controller in memory rank 2640-2648. This memory command may be sent via links 2682.

In correspondence to the fourth memory command, and in at least one data buffer integrated circuit, data received from the memory interface that is associated with the fourth memory command is stored. For example, data associated with the fourth memory command may be received by DQ buffers 2660-2668 from DQ connections 2670 and stored.

Under the control of the integrated circuit device, the data associated with the fourth memory command is communicated from the at least one data buffer to the second rank such that the second rank is accessible to the memory controller. For example, IC 2610 may control DQ buffers 2660-2668 to communicate the data received DQ connections 2670 to memory rank 2640-2648. This allows memory rank 2640-2648 to be write accessible to the memory controller.

An embodiment includes a method of operating a memory module. The steps of this embodiment may be performed by one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and/or their components. Data from at least one open page of a plurality of dynamic memory integrated circuits is cached into at least one open page of at least one dynamic memory integrated circuit during an idle period of the plurality of dynamic memory integrated circuits. For example, system 2900 using memory/cache controller 2918 may cache open pages from memories connected to $CA_1$ interface 2987 using local memory 2924. Memory/cache controller 2918 may copy data to/from the memories connected to $CA_1$ interface 2987 during idle periods of the memories connected to $CA_1$ interface 2987.

A request for data stored in the plurality of dynamic memory integrated circuits having a first access latency and a first access information rate is received. For example, system 2900 may receive, from processor 2912, a request for data stored at an address that corresponds to memories connected to $CA_1$ interface 2987. The memories connected to $CA_1$ interface 2987 can be accessed by system 2900 at a given, implementation dependent and typically fixed, access latency and access information rate.

It is determined that the request for data can be satisfied using cached data stored in the at least one dynamic memory integrated circuit, the at least one dynamic memory integrated circuit having a second information rate, the first access latency and the second access latency being approximately equal, the first access information rate being substantially less than the second access information rate. For example, memory/cache controller 2918 may determine that a request for data at an address that corresponds to memories connected to $CA_1$ interface 2987 can be satisfied using cached data stored in local memory 2924 (and in cache memory partition 2925, in particular). Local memory 2924 can be accessed by system 2900 at a given, implementation dependent and typically fixed, access latency and access information rate. The access latency of local memory 2924 may be approximately equal to the access latency of the memories connected to $CA_1$ interface 2987. However, the information rate (i.e., bandwidth) of local memory 2924 may be substantially greater than the information rate of the memories connected to $CA_1$ interface 2987. For example, if local memory 2924 is accessed via 4 XDR memory channels and the memories connected to $CA_1$ interface 2987 constitute a single DDR3 memory channel, local memory 2924 may be accessed with 4-6 times (a.k.a., 4× to 6×) the bandwidth as the memories connected to $CA_1$ interface 2987.

An embodiment includes a method of operating a memory module. The steps of this embodiment may be performed by one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and/or their components. At an integrated circuit device, a memory command from a memory controller connected to a memory interface of a memory module is received; the integrated circuit device has a processor, a first interface, a second interface, and a third interface. The first interface is connected to a plurality of dynamic memory integrated circuits. The second interface is connected to at least one nonvolatile memory integrated circuit device. The third interface received the memory command from the memory controller. For example, integrated circuit device 3021 may receive from memory controller 3014 (which is coupled to a memory interface of module 3020) a memory command. Integrated circuit device 3021 may be, for example, system 3100. System 3100 has $CA_0$ interface 3186 and $CA_1$ interface 3187 that may be connected to CPU memory 3023. System 3100 has NV controller 3127 (which can correspond to NV controller 3025) to interface to NV memory 3128 (which can correspond to NV memory 3028). System 3100 has CA input interface 3196 which can receive the memory command from memory controller 3014.

In response to the memory command, data is stored in the plurality of dynamic memory integrated circuits. For example, in response to a command received via CA input interface 3196 from memory controller 3014, system 3100 may store data in dynamic memory integrated circuits connected to $CA_0$ interface 3186 or $CA_1$ interface 3187 (e.g., CPU memory 3023).

In response to a command from the processor, data is stored in at least one nonvolatile memory integrated circuit device. For example, system 3100 may store, in response to processor 3112 (or processor 3022) and in NV memory 3128, data stored in CPU memory 3023, local memory 3124, and/or dynamic memory connected to $CA_0$ interface 3186 and $CA_1$ interface 3187.

An embodiment includes a method of operating a memory module. The steps of this embodiment may be performed by one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and/or their components. At an integrated circuit device, a memory command from a memory controller connected to a memory interface of a memory module is received; the integrated circuit device has a processor, a first interface, a second interface, and a third interface. The first interface is connected to a plurality of dynamic memory integrated circuits. The second interface is connected to at least one disk type mass storage device. The third interface received the memory command from the memory controller. For example, integrated circuit device 3221 may receive from memory controller 3214 (which is coupled to a memory interface of module 3220) a memory command. Integrated circuit device 3221 may be, for example, system 3300. System 3300 has $CA_0$ interface 3386 and $CA_1$ interface 3387 that may be connected to CPU memory 3223. System 3300 has disk interface 3327 (which can correspond to disk interface 3225) to interface to disk type storage 3328 (which can correspond to disk type storage 3228). System 3300 has CA input interface 3396 which can receive the memory command from memory controller 3214.

In response to the memory command, data is stored in the plurality of dynamic memory integrated circuits. For example, in response to a command received via CA input interface 3396 from memory controller 3214, system 3300 may store data in dynamic memory integrated circuits connected to $CA_0$ interface 3386 or $CA_1$ interface 3387 (e.g., CPU memory 3223).

In response to a command from the processor, data is stored in at least one disk type mass storage device. For example, system 3300 may store, in response to processor 3312 (or processor 3322) and in disk type storage 3328, data stored in CPU memory 3223, local memory 3324, and/or dynamic memory connected to $CA_0$ interface 3386 and $CA_1$ interface 3387.

An embodiment includes a method of operating a memory module. The steps of this embodiment may be performed by one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and/or their components. At an integrated circuit device, a memory command from a memory controller connected to a memory interface of a memory module is received; the integrated circuit device has a solid-state disk controller circuit, a first interface, a second interface, and a third interface. The first interface is connected to a plurality of dynamic memory integrated circuits. The second interface is connected to at least one nonvolatile memory integrated circuit device. The third interface received the memory command from the memory controller. For example, integrated circuit device 3021 may receive from memory controller 3014 (which is coupled to a memory interface of module 3020) a memory command. Integrated circuit device 3021 may be, for example, system 3100. System 3100 has $CA_0$ interface 3186 and $CA_1$ interface 3187 that may be connected to CPU memory 3023. System 3100 has NV controller 3127 (which may be a solid-state disk controller circuit and can correspond to NV controller 3025) to interface to NV memory 3128 (which can correspond to NV memory 3028). System 3100 has CA input interface 3196 which can receive the memory command from memory controller 3014.

In response to the memory command, data is stored in the plurality of dynamic memory integrated circuits. For example, in response to a command received via CA input interface 3196 from memory controller 3014, system 3100 may store data in dynamic memory integrated circuits connected to $CA_0$ interface 3186 or $CA_1$ interface 3187 (e.g., CPU memory 3023).

In response to a command from the solid-state disk controller circuit, data is stored in at least one nonvolatile memory integrated circuit device. For example, system 3100 may store, in NV memory 3128, and in response to a solid-state disk controller circuit that is, or is included in, NV controller 3127, data stored in CPU memory 3023, local memory 3124, and/or dynamic memory connected to $CA_0$ interface 3186 and $CA_1$ interface 3187.

An embodiment includes a method of operating a memory module. The steps of this embodiment may be performed by one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and/or their components. At an integrated circuit device, a memory command from a memory controller connected to a memory interface of a memory module is received; the integrated circuit device has a processor, a first interface, a second interface, and a nonvolatile memory. The first interface is connected to a plurality of dynamic memory integrated circuits. The second interface received the memory command from the memory controller. For example, integrated circuit device 3421 may receive from memory controller 3414 (which is coupled to a memory interface of module 3420) a memory command. Integrated circuit device 3421 may be, for example, system 3500. System 3500 has $CA_0$ interface 3586 and $CA_1$ interface 3587 that may be connected to CPU memory 3423. System 3500 has NV memory 3528 (which can correspond to NV memory 3428). System 3500 has CA input interface 3596 which can receive the memory command from memory controller 3414.

In response to the memory command, data is stored in the plurality of dynamic memory integrated circuits. For example, in response to a command received via CA input interface 3596 from memory controller 3414, system 3500 may store data in dynamic memory integrated circuits connected to $CA_0$ interface 3586 or $CA_1$ interface 3587 (e.g., CPU memory 3023).

In response to a command from the processor, data is stored in at least one nonvolatile memory integrated circuit device. For example, system 3500 may store, in response to processor 3512 (or processor 3422) and in NV memory 3528, data stored in CPU memory 3423, local memory 3524, and/or dynamic memory connected to $CA_0$ interface 3586 and $CA_1$ interface 3587.

An embodiment includes a method of operating a memory module. The steps of this embodiment may be performed by one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and/or their components. At an integrated circuit device, a first memory write command is received from a memory controller connected to a memory interface of the memory module; the memory interface including a rank select signal; the first memory write command having the rank select signal deasserted; the first memory write command having an address within a configured address aperture; the integrated circuit device having a processor, a first interface and a second interface; the first interface connected to a plurality of dynamic memory integrate circuits; the second interface receiving the memory write command from the memory controller. For example, a module 3920 may include system 4000 that receives from memory controller 3914 connected to a memory interface of the module 3920, a write command. The memory interface of the module includes rank select #1 3961 (e.g., chip select—CS). The memory write command received from memory controller 3914 may have rank select #1 3961 deasserted. The memory write command received from memory controller 3914 may also have an address within an address range configured as a broadcast aperture. System 400 has $CA_0$ interface 3586 and $CA_1$ interface 3587 that may be connected to memory 3922 and a processor 4012.

In response to the first memory write command, data is stored in the plurality of dynamic memory integrated circuits. For example, in response to the memory write command received from memory controller 3914 with rank select #1 3961 deasserted, system 4000 stores data associated with that write command. System 4000 may store data associated with that write command to memory 3922, local memory 4024, or another location (e.g., inside processor 4012).

An embodiment includes a method of operating a plurality of memory modules. The steps of this embodiment may be performed by one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and/or their components. Via a first channel and at a first integrated circuit device disposed on a first memory module, a first memory write command having a first rank select signal deasserted is received. For example, a system 4000 disposed on memory module 3920 may receive from memory controller 3914 a memory write command having rank select signal #1 3961 deasserted.

In response to the first memory write command, first graphics data is stored in a first plurality of dynamic memory integrated circuits that can be selected by asserting the first rank select signal. For example, system 4000 (and more particularly broadcast bridge 4027) disposed on memory module 3920 may store graphics data in dynamic memory integrated circuits coupled $CA_1$ interface 4087 even though rank select signal #1 3961 received as part of the memory write command is deasserted. The dynamic memory integrated circuits coupled $CA_1$ interface 4087 can be selected by asserting rank select signal #1 3961. System 4000 disposed on memory module 3920 may store the graphics data in dynamic memory integrated circuits coupled $CA_1$ interface 4087 even though rank select signal #1 3961 is deasserted because the memory write command is directed to a range of addresses configured as a broadcast aperture.

Via the first channel and at a second integrated circuit device disposed on a second memory module, the first memory write command having a second rank select signal asserted is received. For example, a system 4000 disposed on memory module 3930 may receive from memory controller 3914 the memory write command having rank select signal #2 3962 asserted.

In response to the first memory write command, the first graphics data is stored in a second plurality of dynamic memory integrated circuits that are selected by asserting the second rank select signal. For example, system 4000 (and more particularly broadcast bridge 4027) disposed on memory module 3930 may store graphics data in dynamic memory integrated circuits coupled $CA_1$ interface 4087 of system 4000 disposed on memory module 3930 based on rank select signal #2 3962 being asserted.

The first integrated circuit device is configured to render a first portion of a frame. For example, CPU 3912 may configure processor 3921 to render a first portion of a frame based on the graphics data in dynamic memory integrated circuits coupled $CA_1$ interface 4087 of system 4000 that is disposed on module 3920.

The second integrated circuit device is configured to render a second portion of a frame. For example, CPU 3912 may configure processor 3931 to render a second portion of a frame based on the graphics data in dynamic memory integrated circuits coupled $CA_1$ interface 4087 of system 4000 that is disposed on module 3930.

An embodiment includes a method of operating a plurality of memory modules. The steps of this embodiment may be performed by one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and/or their components. A scene of graphics data is sent to a first plurality of memory modules; the first plurality of memory modules each including at least one of a first plurality of graphics processors; each of the first plurality of memory modules coupled to a first memory channel. For example, CPU 4310 may send a scene of graphics data to module 4320, module 4330, and 4340. CPU 4310 may send the scene of graphics data to graphics data to module 4320, module 4330, and 4340 using a write to a broadcast aperture associated with memory channel #1 4381. Module 4320, module 4330, and 4340 each have at least one processor 4325, 4335, and 4345, respectively.

The scene of graphics data is sent to a second plurality of memory modules; the second plurality of memory modules each including at least one of a second plurality of graphics processors; each of the second plurality of memory modules coupled to a second memory channel. For example, CPU 4310 may send a scene of graphics data to module 4350, module 4360, and 4370. CPU 4310 may send the scene of graphics data to graphics data to module 4350, module 4360, and 4370 using a write to a broadcast aperture associated with memory channel #2 4382. Module 4350, module 4360, and 4370 each have at least one processor 4355, 4365, and 4375, respectively.

The first plurality of graphics processor are configured to process a first frame of graphics data; the first frame to be rendered being based on the scene of graphics data. For example, at least one of processors 4355, 4365, and 4375 may be configured to render a first frame of graphics data that is based on the scene of graphics data. The second plurality of graphics processor are configured to process a second frame of graphics data; the second frame to be rendered being based on the scene of graphics data. For example, at least one of processors 4355, 4365, and 4375 may be configured to render a second frame of graphics data that is based on the scene of graphics data.

The foregoing discussions included various memory and nonvolatile memory elements. A variety of resistive state memory devices can be used as implementations of these memory and non-volatile memory elements (i.e., memory elements that retain stored data in an absence of electrical power). Examples of non-volatile memory include but are not limited to MRAM devices (including spin torque MRAM devices) and resistive random access memory (RRAM) devices.

RRAM devices are configured to change resistive states in response to data operations performed on the RRAM device (e.g., a two-terminal memory element or memory cell), whether by application of write voltages or write currents. Write signals (e.g., write voltages or write currents) may be applied as pulses (e.g., uni-polar or bi-polar pulses) having pulse widths, magnitudes, shapes, and durations configured to change a resistive state of the memory element. Example RRAM technologies include phase change memory (PCM) devices, conductive bridge (CBRAM) memory devices, MEMRISTOR memory devices, memristive memory devices, filamentary RRAM devices, interfacial RRAM devices, RRAM devices that require a forming step, memory devices that utilize mobile metal ion transport and/or motion to change resistive states, non-MRAM memory devices that utilize at least one tunnel oxide layer or at least one tunnel barrier layer (e.g., at least one tunneling layer) in conjunction with at least one other layer of material (e.g., an ion reservoir) that is in contact with or is electrically in series with the tunneling layer, memory devices that utilize mobile ions (e.g., oxygen ions), memory devices for which current flow through the device is a non-linear function of a voltage applied across terminals of the device (i.e., a non-linear I-V characteristic), memory devices for which a resistance of the device is a non-linear function of a voltage applied across terminals of the device, just to name a few.

RRAM devices can be single level cells (SLC) that store only one-bit of data or can be multi-level cells (MLC) that store at least two-bits of data. Typical RRAM devices are read by applying a read signal, such as a read voltage across terminals of the device and sensing a signal (e.g., a read current) whose magnitude is indicative of a value of data stored in the RRAM device (e.g., logic "0" or "1" for SLC, or logic "00", "01", "10", or "11" for MLC). The read signal can be applied as a voltage pulse similar to that described above for the write signal.

In some configurations, a RRAM cell may include an optional selection device such as a non-ohmic device, a metal-insulator-metal (MIM) device, one or more transistors (FET or BJT), or one or more diodes (e.g., PIN, P/N, Zener, Schottky, etc). Example of RRAM memory cells having selection devices include but are not limited to 1T-1R, 2T-1R, 1D-1R, and 2D-1R, where T=Transistor, D=Diode, and R=Resistive Change Memory Element. The selection device can be configured to block or substantially attenuate current flow through a RRAM cell for voltages other than data operation voltages that are electrically coupled with the cell. Therefore, when a RRAM cell is not selected for a data operation (e.g., read or write), zero or substantially no current flows through the cell. Half-selected or un-selected RRAM cells in an array configuration are one example of cells that are not selected for a data operation. Use of a selection device can reduce leakage currents and/or other stray currents that could interfere with or reduce a signal-to-noise-ratio (S/N) associated with a signal from RRAM cell(s) that are selected for a data operation (e.g., a read signal from a selected cell). For sensing circuitry (e.g., sense amps) a high S/N is desirable in order to accurately sense a read signal in the presence of noise generated during the read operation by cells that are not being read. Further, use of a selection device can reduce power consumption and waste heat dissipation due to the aforementioned leakage currents and/or other stray currents. The selection device is optional and its use is application dependent. Moreover, RRAM devices having a non-linear I-V characteristic may be implemented without a selection device.

RRAM devices can be configured in an orderly structure such as a cross-point array or a two-terminal cross-point array, and in some implementations, the array can be monolithically fabricated (e.g., back-end-of-the-line (BEOL)) directly above circuitry (e.g., CMOS circuitry) on a semiconductor die (e.g., a silicon die on a wafer), such that all circuitry for accessing and performing data operations (e.g., read, write, program, erase, restore, wear leveling, etc.) and optionally other circuitry such as memory controllers, processors, ALU's, CPU's, DSP's, etc., are first fabricated front-end-of-the-line (FEOL) on a semiconductor substrate (e.g., a silicon die). The RRAM devices are subsequently vertically fabricated BEOL directly above the FEOL portion such that the FEOL and BEOL portions form a die that is a unitary whole comprised of monolithically integrated and inseparable circuitry (FEOL) and memory (BEOL) structures. The BEOL portion can include multiple memory layers or planes with each layer or plane including one or more arrays.

The systems and devices described above may be implemented in computer systems, integrated circuits, or stored by computer systems. The systems described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and their components. These software descriptions may be: algorithmic, behavioral, register transfer, logic component, transistor, and layout geometry-level descriptions. Moreover, the software descriptions may be stored on non-transitory storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, Blu-Ray, and so on.

Figure 48:
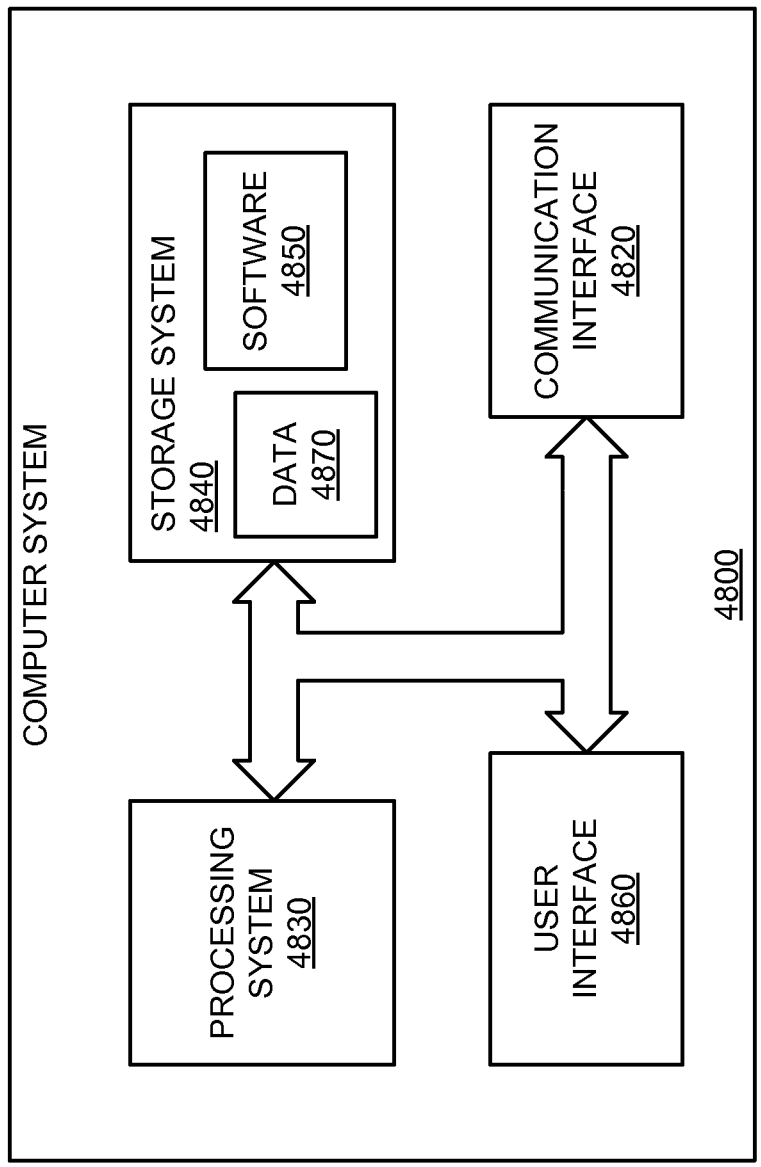
FIG. 48 illustrates a block diagram of a computer system.

FIG. 48 illustrates a block diagram of a computer system. Computer system 4800 includes communication interface 4820, processing system 4830, storage system 4840, and user interface 4860. Processing system 4830 is operatively coupled to storage system 4840. Storage system 4840 stores software 4850 and data 4870. Computer system 4800 may include one or more elements of system 100, system 700, system 1100, system 2500, system 2501, system 2502, system 2503, module 2600, module 2601, module 2602, subsystem 2800, subsystem 2900, subsystem 2901, system 3000, subsystem 3100, subsystem 3101, system 3200, subsystem 3300, subsystem 3301, system 3400, subsystem 3500, subsystem 3501, system 3600, system 3900, subsystem 4000, subsystem 4001, system 4100, system 4300, and/or system 4700, and their components that implement the methods, circuits, subsystems, and/or systems described herein. Processing system 4830 is operatively coupled to communication interface 4820 and user interface 4860. Computer system 4800 may comprise a programmed general-purpose computer. Computer system 4800 may include a microprocessor. Computer system 4800 may comprise programmable or special purpose circuitry. Computer system 4800 may be distributed among multiple devices, processors, storage, and/or interfaces that together comprise elements 4820-4870.

Communication interface 4820 may comprise a network interface, modem, port, bus, link, transceiver, or other communication device. Communication interface 4820 may be distributed among multiple communication devices. Processing system 4830 may comprise a microprocessor, microcontroller, logic circuit, or other processing device. Processing system 4830 may be distributed among multiple processing devices. User interface 4860 may comprise a keyboard, mouse, voice recognition interface, microphone and speakers, graphical display, touch screen, or other type of user interface device. User interface 4860 may be distributed among multiple interface devices. Storage system 4840 may comprise a disk, tape, integrated circuit, RAM, ROM, EEPROM, flash memory, network storage, server, or other memory function. Storage system 4840 may include computer readable medium. Storage system 4840 may be distributed among multiple memory devices.

Processing system 4830 retrieves and executes software 4850 from storage system 4840. Processing system 4830 may retrieve and store data 4870. Processing system 4830 may also retrieve and store data via communication interface 4820. Processing system 4830 may create or modify software 4850 or data 4870 to achieve a tangible result. Processing system 4830 may control communication interface 4820 or user interface 4860 to achieve a tangible result. Processing system 4830 may retrieve and execute remotely stored software via communication interface 4820.

Software 4850 and remotely stored software may comprise an operating system, utilities, drivers, networking software, and other software typically executed by a computer system. Software 4850 may comprise an application program, applet, firmware, or other form of machine-readable processing instructions typically executed by a computer system. When executed by processing system 4830, software 4850 or remotely stored software may direct computer system 4800 to operate.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Moreover, the foregoing descriptions focus primarily on read access, but these embodiments likewise support write access, as will be well understood by those of skill in the art.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, after reading this disclosure variations of these embodiments will be apparent to those of ordinary skill in the art. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. A dual-inline memory module (DIMM) comprising:
a module interface configured to receive module data into the DIMM using parallel data channels;
a non-volatile flash memory bank; and
one or more integrated circuits, including a processor or controller, configured to receive the module data using the parallel data channels before the module data is provided to either the non-volatile flash memory bank or a volatile random access memory (VRAM) bank and to enable the module data to be written to the VRAM bank, read from the VRAM bank, and written to the non-volatile flash memory bank,
wherein the one or more integrated circuits are configured to translate between a first addressing scheme employed by the VRAM bank and a second addressing scheme employed by the non-volatile flash memory bank,
wherein the one or more integrated circuits are configured to enable:
the module data to be written to the VRAM bank employing the first addressing scheme,
the module data written to the VRAM bank employing the first addressing scheme to be read,
the module data read from the VRAM bank to be translated from the first addressing scheme employed by the VRAM bank to the second addressing scheme employed by the non-volatile flash memory bank, and
the module data translated to the second addressing scheme employed by the non-volatile flash memory bank to be written to the non-volatile flash memory bank employing the second addressing scheme.

2. The DIMM of claim 1, wherein the VRAM bank is located outside of the integrated circuit.

3. The DIMM of claim 1, wherein the VRAM bank includes dynamic data rate (DDR) memory and the non-volatile flash memory bank includes a solid state disk (SSD).

4. The DIMM of claim 1, wherein the integrated circuit further comprises a buffer.

5. The DIMM of claim 4, wherein the buffer further comprises:
a write buffer including a write data queue circuit; and
a read buffer including a read data queue circuit.

6. The DIMM of claim 4, wherein the integrated circuit is configured to enable:
the module data to be written from the buffer to the VRAM bank;
the module data to be read from the VRAM bank into the buffer; and
the module data to be written from the buffer to the non-volatile flash memory bank.

7. The DIMM of claim 1, wherein the integrated circuit further comprises:
a peripheral processor configured to execute commands; and
a controller configured to translate between the first addressing scheme employed by the VRAM bank and the second addressing scheme employed by the non-volatile flash memory bank according to instructions from the peripheral processor.

8. The DIMM of claim 1, further comprising a bridge circuit configured to enable the module data to be read from or written to the non-volatile flash memory bank.

9. The DIMM of claim 8, wherein the bridge circuit is configured to perform serialization or deserialization operations.

10. The DIMM of claim 9, wherein the bridge circuit is located within the integrated circuit.

11. A dual-inline memory module (DIMM) comprising:
a module interface configured to receive module data into the DIMM using parallel data channels;
a non-volatile flash memory bank; and
means for one or more integrated circuits, including a processor or controller, configured to receive the module data using the parallel data channels before the module data is provided to either the non-volatile flash memory bank or a volatile random access memory (VRAM) bank and to enable the module data to be written to the VRAM bank, read from the VRAM bank, and written to the non-volatile flash memory bank,
wherein the one or more integrated circuits are configured to translate between a first addressing scheme employed by the VRAM bank and a second addressing scheme employed by the non-volatile flash memory bank,
wherein the one or more integrated circuits are configured to enable:
the module data to be written to the VRAM bank employing the first addressing scheme,
the module data written to the VRAM bank employing the first addressing scheme to be read,
the module data read from the VRAM bank to be translated from the first addressing scheme employed by the VRAM bank to the second addressing scheme employed by the non-volatile flash memory bank, and
the module data translated to the second addressing scheme employed by the non-volatile flash memory bank to be written to the non-volatile flash memory bank employing the second addressing scheme.

12. The DIMM of claim 11, wherein the means for an integrated circuit further comprises a buffer.

13. The DIMM of claim 11, further comprising a bridge circuit configured to enable the module data to be read from or written to the non-volatile flash memory bank.

14. A system comprising:
a central processing unit (CPU) with a memory controller configured to direct delivery of module data from the CPU to module memory using parallel data channels; and
a dual-inline memory module (DIMM) configured to receive the module data from the CPU, including:
a module interface configured to receive the module data into the DIMM using parallel data channels,
a non-volatile flash memory bank, and
one or more integrated circuits, including a processor or controller, configured to receive the module data using the parallel data channels before the module data is provided to either the non-volatile flash memory bank or a volatile random access memory (VRAM) bank and to enable the module data to be written to the VRAM bank, read from the VRAM bank, and written to the non-volatile flash memory bank,
wherein the one or more integrated circuits are configured to translate between a first addressing scheme employed by the VRAM bank and a second addressing scheme employed by the non-volatile flash memory bank,
wherein the one or more integrated circuits are configured to enable:

the module data to be written to the VRAM bank employing the first addressing scheme, the module data written to the VRAM bank employing the first addressing scheme to be read, the module data read from the VRAM bank to be translated from the first addressing scheme employed by the VRAM bank to the second addressing scheme employed by the non-volatile flash memory bank, and the module data translated to the second addressing scheme employed by the non-volatile flash memory bank to be written to the non-volatile flash memory bank employing the second addressing scheme.

15. The system of claim 14 wherein the integrated circuit further comprises a buffer.

16. The system of claim 14, further comprising a bridge circuit configured to enable the module data to be read from or written to the non-volatile flash memory bank.

17. The system of claim 16, wherein the bridge circuit is configured to perform serialization or deserialization operations.

* * * * *